(12) United States Patent
Aiba et al.

(10) Patent No.: US 7,049,756 B2
(45) Date of Patent: May 23, 2006

(54) CAPACITIVE LOAD DRIVING CIRCUIT, CAPACITIVE LOAD DRIVING METHOD, AND APPARATUS USING THE SAME

(75) Inventors: Masahiko Aiba, Nara (JP); Takasumi Wada, Nara (JP); Hirokazu Fujita, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 136 days.

(21) Appl. No.: 10/482,219

(22) PCT Filed: Jan. 27, 2003

(86) PCT No.: PCT/JP03/00754

§ 371 (c)(1),
(2), (4) Date: Dec. 30, 2003

(87) PCT Pub. No.: WO03/064161

PCT Pub. Date: Aug. 7, 2003

(65) Prior Publication Data

US 2004/0169545 A1   Sep. 2, 2004

(30) Foreign Application Priority Data

Jan. 28, 2002 (JP) ............................. 2002-019123
Jan. 20, 2003 (JP) ............................. 2003-011577
Jan. 20, 2003 (JP) ............................. 2003-011609

(51) Int. Cl.
*H05B 37/00* (2006.01)
*G09G 5/00* (2006.01)

(52) U.S. Cl. ................. 315/172; 315/176; 315/227 R; 345/213

(58) Field of Classification Search ................ 315/167, 315/169.1, 169.2, 169.3, 169.4, 173, 362, 315/172, 175–176, 227 R; 345/211–212, 345/51–52, 213; H05B 37/00; G09G 5/00
See application file for complete search history.

(56) References Cited

U.S. PATENT DOCUMENTS

| 4,866,349 A | 9/1989 | Weber et al. ............. 315/169.4 |
| 5,006,739 A * | 4/1991 | Kimura et al. .............. 327/112 |
| 5,081,400 A * | 1/1992 | Weber et al. ............. 315/169.4 |

(Continued)

FOREIGN PATENT DOCUMENTS

JP        63-247051 A    10/1988

(Continued)

*Primary Examiner*—Thuy Vinh Tran
(74) *Attorney, Agent, or Firm*—Birch, Stewart, Kolasch & Birch, LLP

(57) ABSTRACT

A capacitive load driving circuit (1) for charging and discharging a capacitive load (11) is provided with a voltage divider (5) for dividing a power supply voltage (VH) into a plurality of different voltages (V1–V9), a plurality of condensers (2a–i) to which the voltages (V1–V9) are respectively charged as terminal voltages, and a switch (7) for switching connections between the capacitive load (11) and the condensers (2a–i), the switch (7) sequentially connecting the condensers (2a–i) in an ascending order of the terminal voltages so that electrostatic energy is supplied to the capacitive load (11) when the capacitive load (11) is charged, the switch (7) sequentially connecting the condensers (2a–i) in a descending order of the terminal voltages so that electrostatic energy is collected from the capacitive load (11) when the capacitive load (11) is discharged. With this, it is possible to provide a capacitive load drive circuit having a simple circuit configuration and capable of efficiently collecting and reusing energy accumulated in the capacitive load, and a capacitive load driving method.

130 Claims, 81 Drawing Sheets

U.S. PATENT DOCUMENTS

| | | | | |
|---|---|---|---|---|
| 5,264,752 | A * | 11/1993 | Savicki | 310/316.03 |
| 6,188,395 | B1 * | 2/2001 | Yatabe | 345/211 |
| 6,380,690 | B1 * | 4/2002 | Inada | 315/169.3 |
| 6,501,467 | B1 * | 12/2002 | Miyazaki | 345/210 |
| 6,579,139 | B1 * | 6/2003 | Mishima et al. | 445/24 |

FOREIGN PATENT DOCUMENTS

| | | |
|---|---|---|
| JP | 02-087189 | 3/1990 |
| JP | 9-275345 A | 10/1997 |
| JP | 09-322560 | 12/1997 |
| JP | 10-329321 | 12/1998 |
| JP | 11-170529 | 6/1999 |
| JP | 11-206191 | 7/1999 |
| JP | 11-314364 | 11/1999 |
| JP | 11-326863 | 11/1999 |
| JP | 11-352459 | 12/1999 |
| JP | 2000-148099 A | 5/2000 |
| JP | 2000-218782 | 8/2000 |
| JP | 2000-238245 | 9/2000 |
| JP | 2001-010043 | 1/2001 |
| JP | 2001-022329 | 1/2001 |
| JP | 2001-121697 A | 5/2001 |
| JP | 2001-301157 A | 10/2001 |

* cited by examiner

FIG. 3 (a) SYNC

FIG. 3 (b) STATES OF SWITCH

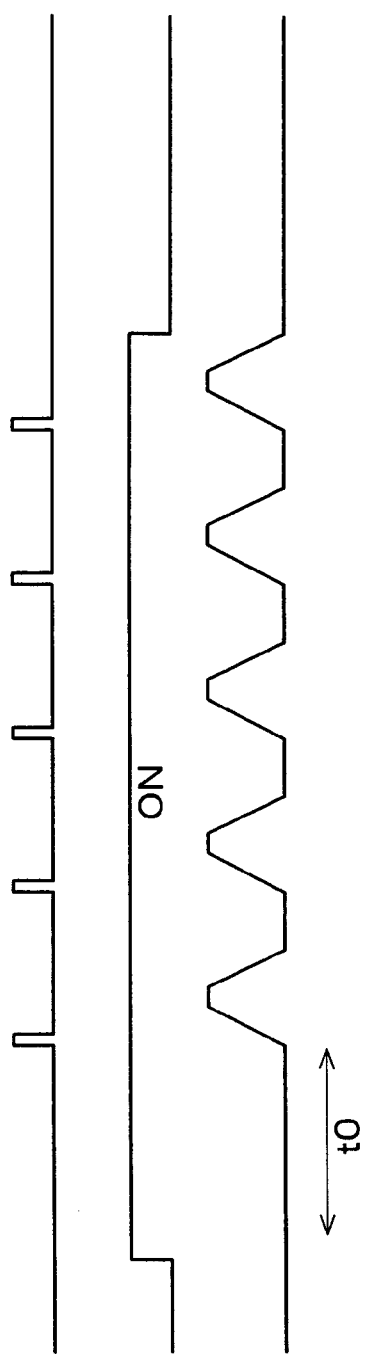
FIG. 5 (a) SYNC
FIG. 5 (b) Q
FIG. 5 (c) V

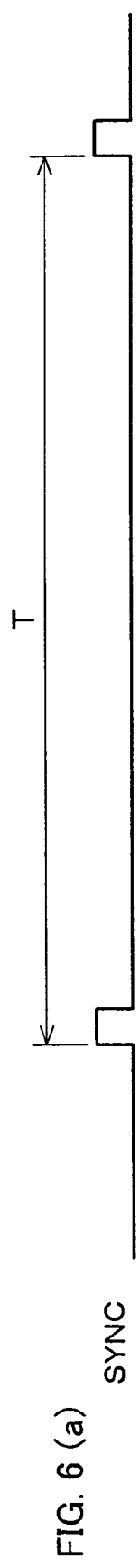
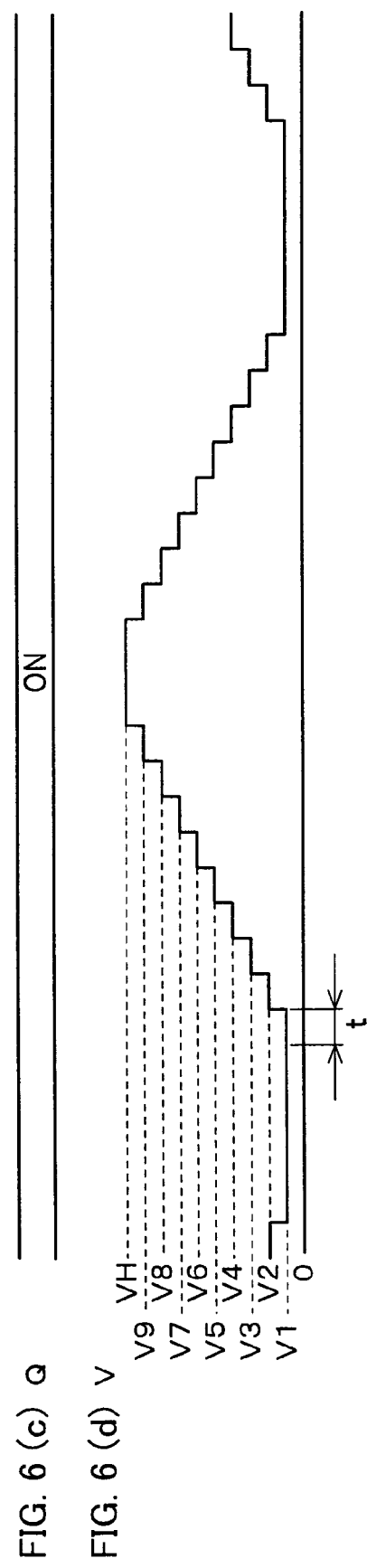
FIG. 6 (a) SYNC
FIG. 6 (b) STATES OF SWITCH
FIG. 6 (c) Q
FIG. 6 (d) V

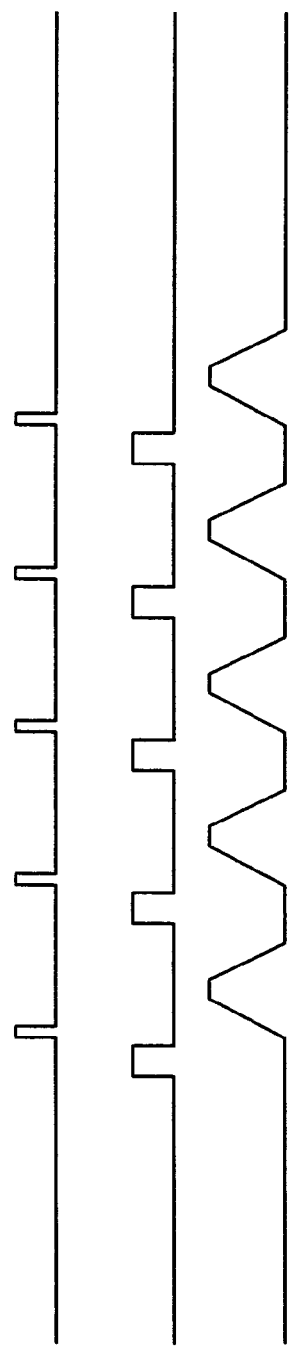
FIG. 9 (a) SYNC
FIG. 9 (b) Q
FIG. 9 (c) V

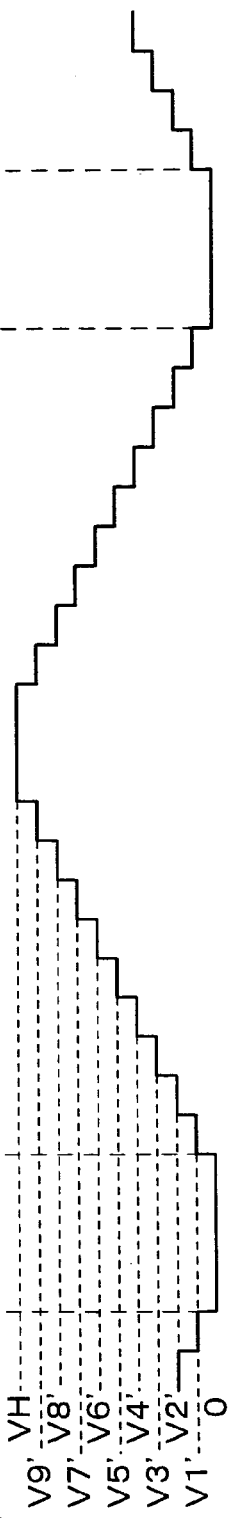
FIG. 10 (a) SYNC
FIG. 10 (b) STATES OF SWITCH
FIG. 10 (c) Q
FIG. 10 (d) V FIG. 14 (a) VA 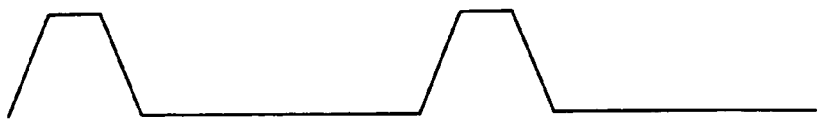
FIG. 14 (b) VB 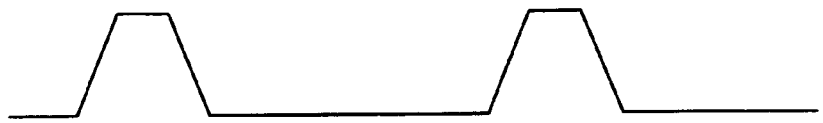
FIG. 14 (c) VC 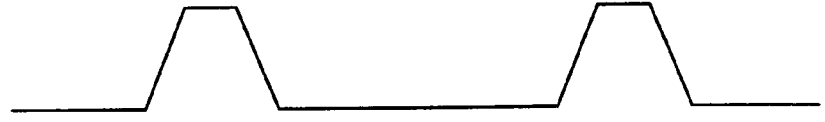

FIG. 16 (a) VA 
FIG. 16 (b) VB 
FIG. 16 (c) VC 

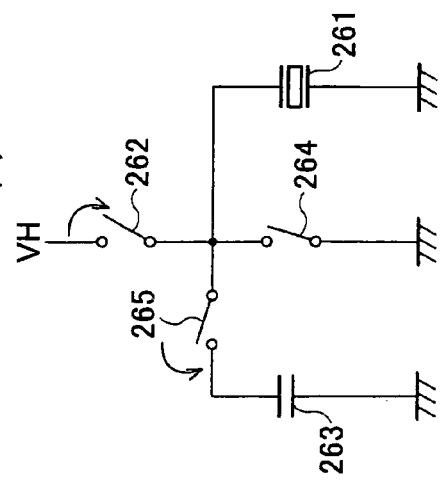
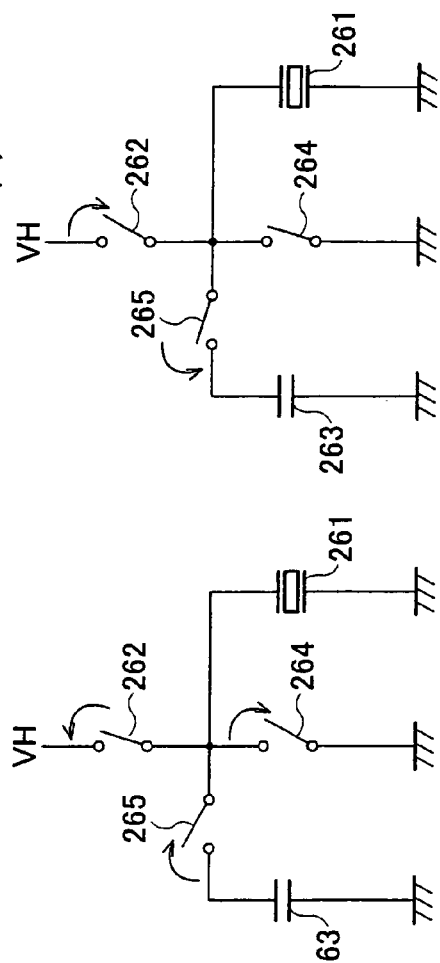
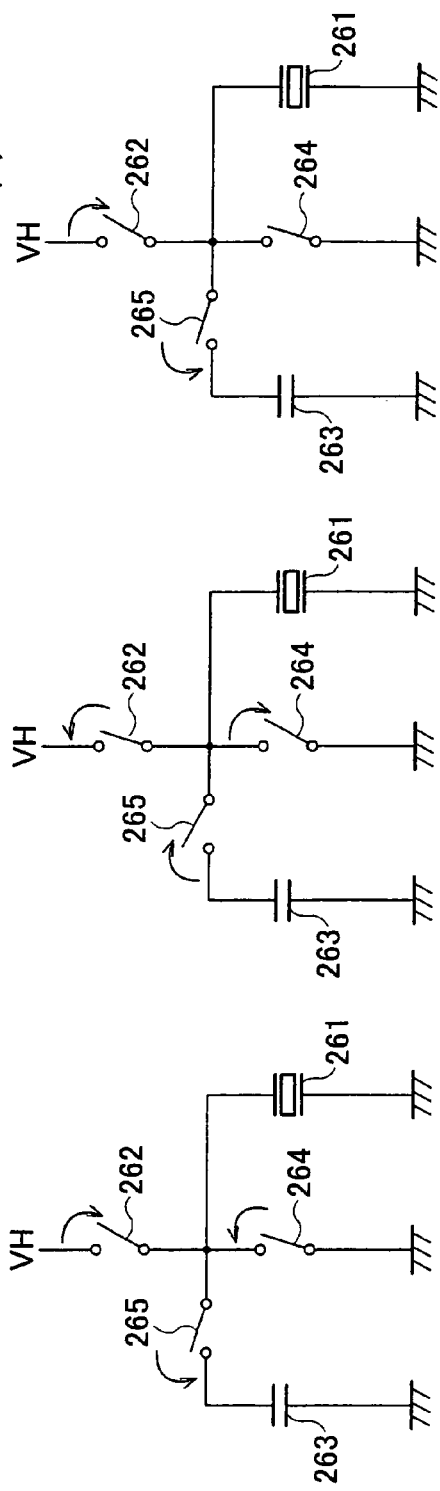
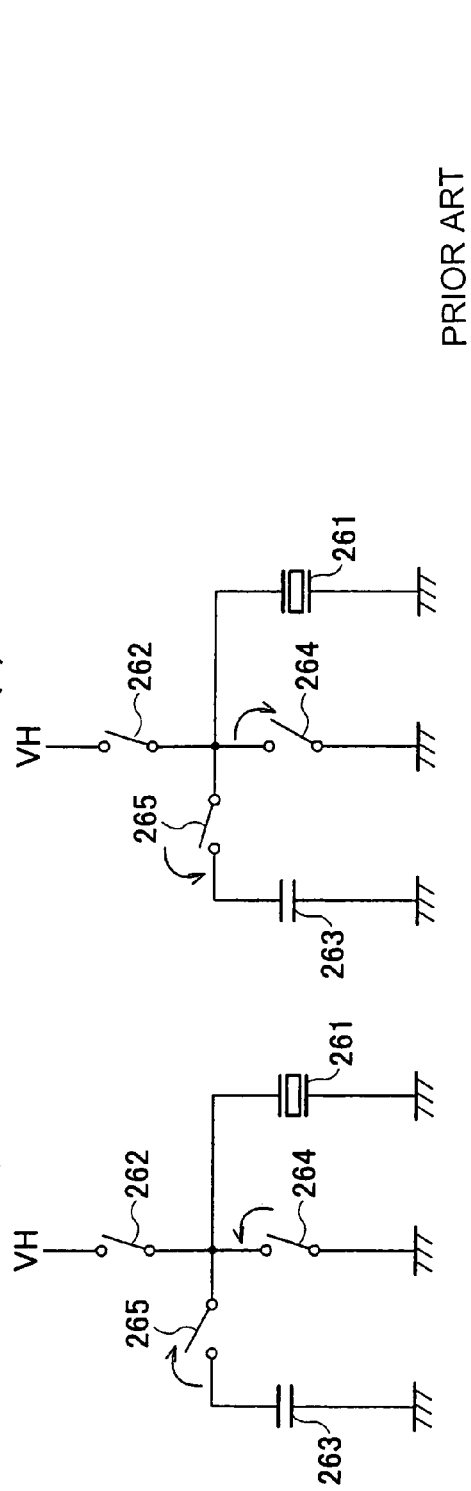
PRIOR ART

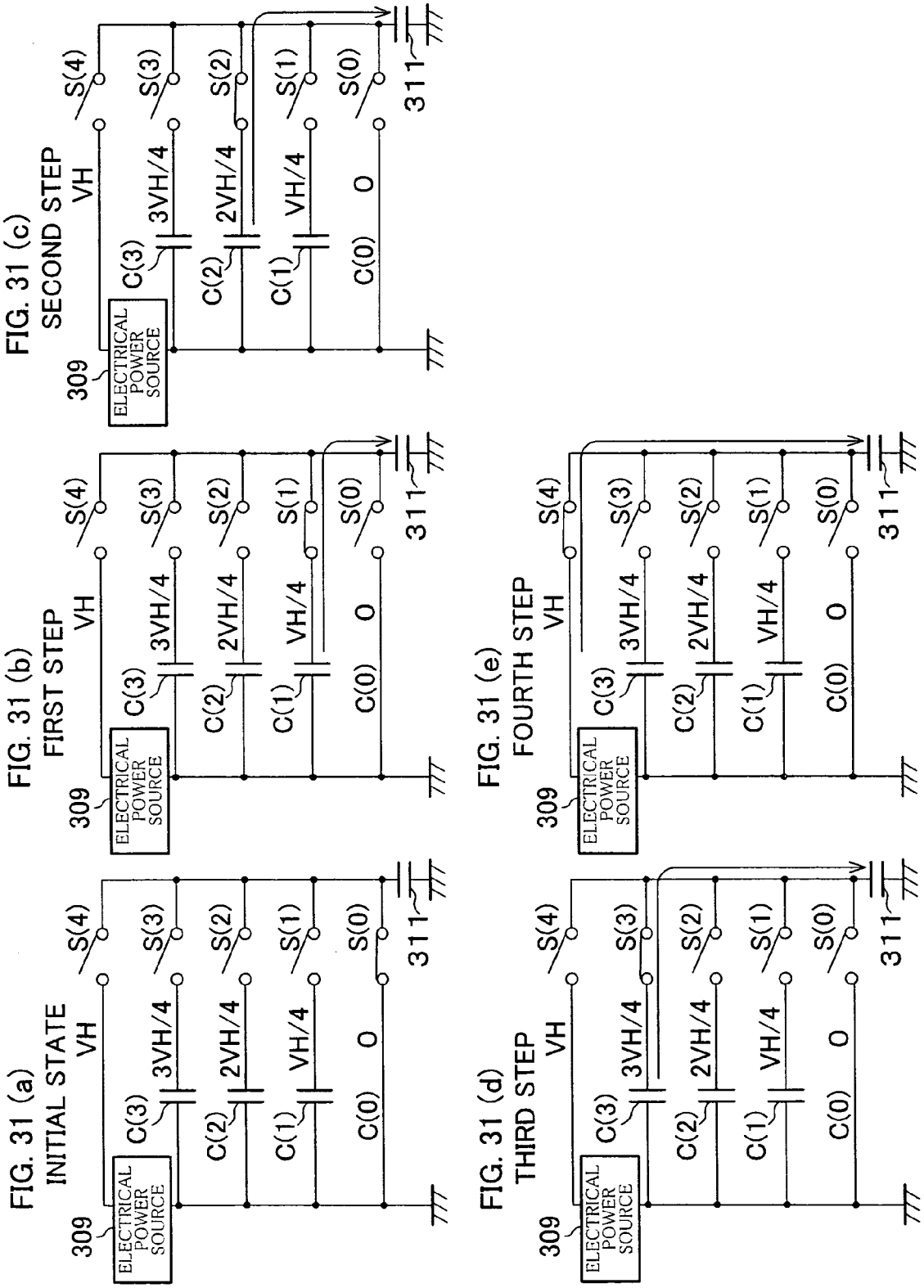

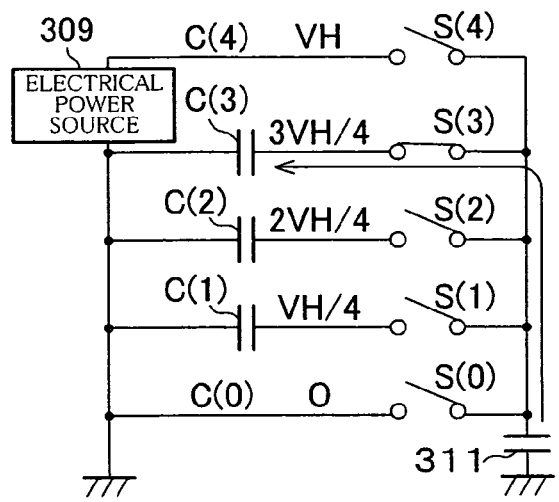
FIG. 32 (a) FIFTH STEP
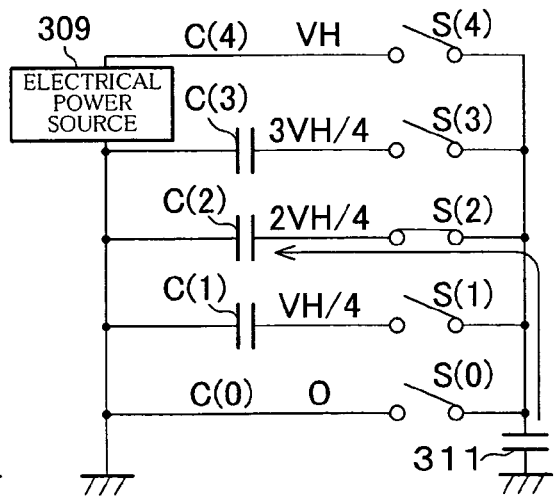
FIG. 32 (b) SIXTH STEP
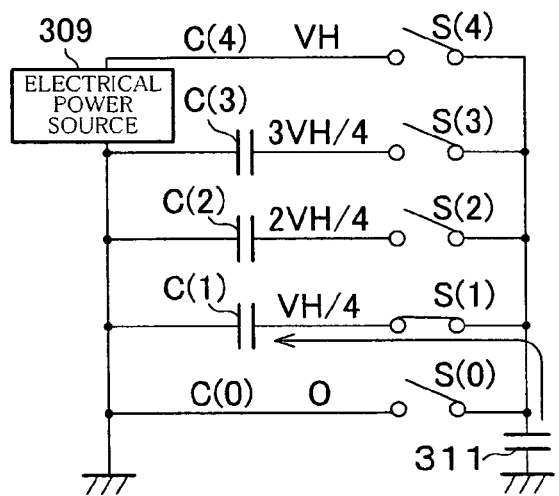
FIG. 32 (c) SEVENTH STEP
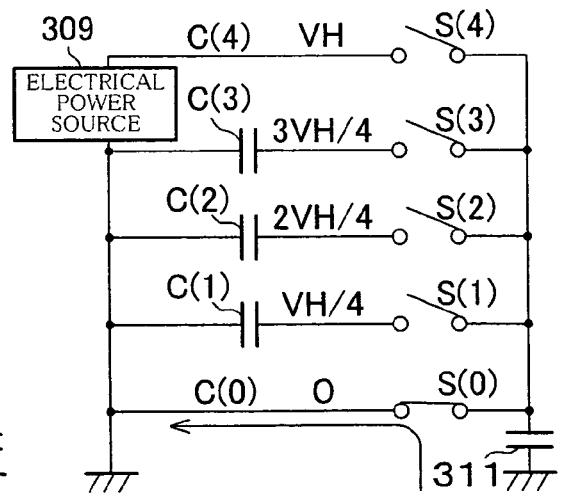
FIG. 32 (d) EIGHTH STEP FIG. 70 (a) SYNC
FIG. 70 (b) Q
FIG. 70 (c) V

FIG. 71 (a) SYNC

FIG. 71 (b) STATES OF SWITCH

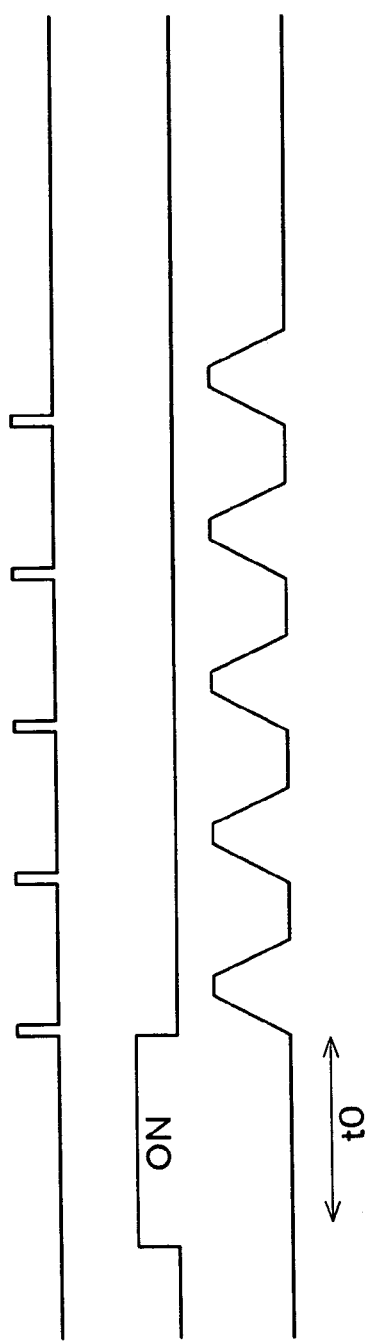

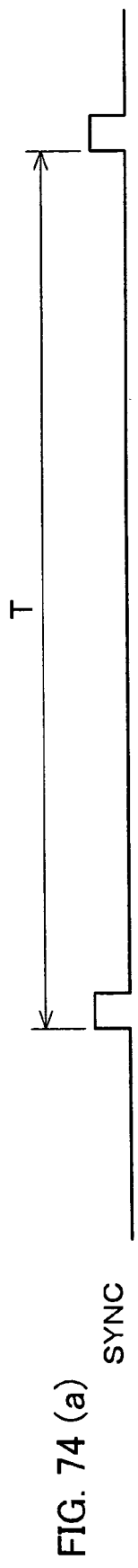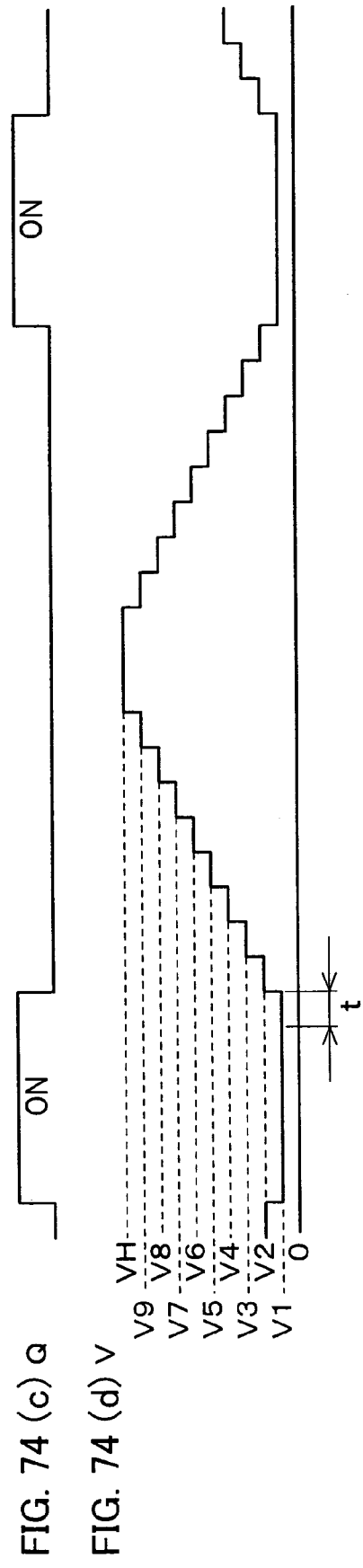

CAPACITIVE LOAD DRIVING CIRCUIT, CAPACITIVE LOAD DRIVING METHOD, AND APPARATUS USING THE SAME

CROSS-REFERENCE TO RELATED APPLICATIONS

This Nonprovisional application is a national stage application filed under 35 U.S.C. 371 of the international application PCT/JP03/00754 filed Jan. 27, 2003, which claims priority under 35 U.S.C. § 119(a) on Patent Application Nos. 2002-19123 filed in Japan on Jan. 28, 2002, 2003-11577 filed in Japan on Jan. 20, 2003 and 2003-11609 filed in Japan on Jan. 20, 2003, the entire contents of which are hereby incorporated by reference.

BACKGROUND OF THE INVENTION

Field of the Invention

The present invention relates to a capacitive load drive circuit and a capacitive load driving method for driving a capacitive load; and an apparatus using the same. More specifically, the present invention relates to (A) a capacitive load drive circuit for driving a capacitive load, which is provided in an image forming apparatus that uses a piezoid and an electrostatic drive electrode to jet out ink, the piezoid and the electrostatic drive electrode being capacitive loads, a discharge electrode of a plasma display, a drive circuit of a liquid crystal display, or the like, (B) a capacitive load driving method, and (C) an apparatus using the same (in particular, apparatus that includes a capacitive load and a capacitive load drive circuit), such as an image forming apparatus, a display apparatus, a voltage pulse generating apparatus, and a DC-AC converter. The present invention particularly relates to a capacitive load drive circuit and a capacitive load driving method that are capable of reducing electrical power consumption; and an apparatus using the same, such as an image forming apparatus, a display apparatus, and a voltage pulse generating apparatus, and a DC-AC converter.

BACKGROUND ART

Conventionally known ink-jet printers include an ink-jet printer that uses a piezoid to jet out ink (see Patent Document 1 (Japanese Unexamined Patent Publication No. 247051/1988, Tokukaisho 63-247051, published on Oct. 13, 1988) and Patent Document 2 (Japanese Unexamined Patent Publication No. 10043/2001, Tokukai 2001-10043, published on Jan. 16, 2001), for example), an ink-jet printer employing an electrostatic method, and an ink-jet printer employing a thermal method (see Patent Document 3 (Japanese Unexamined Patent Publication No. 238245/2000, Tokukai 2000-238245, published on Sep. 5, 2000), for example).

In an ink-jet printer that uses a piezoid to jet out ink, the piezoid is provided to a pressure generating chamber which is connected to a nozzle orifice of an ink-jet head. In accordance with a voltage applied as a drive signal to the piezoid which is a capacitive load, the piezoid is caused to repeat charging and discharging, thereby jetting out ink from the nozzle orifice. Here, a capacitive load drive circuit that drives such a capacitive load will be discussed.

FIG. 25 shows a capacitive load drive circuit employing a push-pull method, as an example of the conventional capacitive load drive circuit as described above. As shown in a circuit diagram of FIG. 25($a$), the capacitive load drive circuit is connected to a condenser CL which is a capacitive load. With respect to a principle voltage V which is applied to the capacitive load drive circuit, the condenser CL is driven under the control of a transistor Vupd provided at a charge path for supplying energy to the condenser CL, and a transistor Vdwnd provided at a discharge path for removing energy from the condenser CL.

FIGS. 25($b$) and 25($c$) are waveform charts showing waveforms of control signals for respectively controlling the operation of the transistors Vupd and Vdwnd. When the two transistors Vupd and Vdwnd operate in response to the control signals shown in FIGS. 25($b$) and 25($c$), a terminal voltage V0 of the condenser CL changes as time elapses as shown in FIG. 25($d$), and a current Ic flowing through a resistance R changes as time elapses as shown in FIG. 25($e$).

Namely, in the push-pull method as shown in FIG. 25($a$), the transistor Vupd is switched ON to supply a charge current to the capacitive load via the charge path, and then the transistor Vdwnd is switched ON to discharge all of the electric charge to the ground via the discharge path.

In the conventional capacitive load drive circuit, all of the electric charge which is accumulated in the condenser CL is discharged to the ground. In other words, all of the electrostatic energy accumulated in the condenser CL is discarded, resulting in a problem of large power consumption. For example, when a frequency f of Vupd is 126 kHz, a capacitance CL of the condenser CL is 0.1 μF, and a principle voltage V is 20 V, an average power supply current is as follows.

$$f \times CL \times V = 0.2520\ A$$

Accordingly, electrical power consumption is 5.04 W.

For this reason, suggested is a capacitive load drive circuit that collects the electric charge discharged from the capacitive load and reuses the collected electric charge to charge the capacitive load, aiming to reduce the electrical power consumption. For example, Patent Document 4 (Japanese Unexamined Patent Publication No. 314364/1999, Tokukaihei 11-314364, published on Nov. 16, 1999) discloses a record head drive circuit. This record head drive circuit during printing operation uses a discharge current discharged from the piezoid (piezoelectric vibrating element) to charge a secondary power source (secondary battery or large-capacity capacitor) by a mutual induction effect produced by a magnetic circuit, and reuses the electric charge accumulated in the secondary power source to charge the piezoid.

A further known technique is to use LC resonance to collect electrical power in a drive circuit that drives a discharge cell of a plasma display panel (see Patent Document 5 (U.S. Pat. No. 4,866,349, published on Sep. 12, 1989)). An example of the drive circuit that uses the LC resonance to collect electrical power from the discharge cell will be explained with reference to FIG. 28. Note that, in FIG. 28, Cd is a capacitive component (capacitive load) of the plasma display panel which is the capacitive load, Css is a condenser, S1 through S4 are switches, L is an inductor, D1 and D2 are rectifying diodes, and 2V0 is a power supply terminal which supplies a power supply voltage 2V0.

First, an initial potential V0 is initially supplied to the condenser Css. Here, it is assumed that the potential of Cd is initially 0. Further, it is assumed that a capacitance Css of the condenser Css is sufficiently larger than a capacitance Cd of the capacitive load Cd.

Next, the charging and discharging operation of the capacitive load Cd in the above arrangement will be explained with reference to FIG. 29. FIG. 29 shows changes in a terminal voltage V of the capacitive load Cd, and states of the switches S1 through S4. Note that, the switches S1 through S4 are turned OFF except during the periods "On" as indicated in FIG. 29.

When charging, only the switch S1 is turned ON among the switches S1 through S4. Then, a current from the condenser Css flows into the capacitive load Cd via the inductor L, so as to charge the capacitive load Cd (①j in FIG. 29). Due to the LC resonance, the capacitive load Cd is charged so as to have the terminal voltage V of not less than V0 (②j in FIG. 29). The rectifying diode D1 prevents the inversion of current, so that the terminal voltage V of the capacitive load Cd is clamped (③j in FIG. 29). Following this, the switch S1 is turned OFF, and then the switch S3 is turned ON. With this, the capacitive load Cd is charged to have the terminal voltage V of 2V0 (④j in FIG. 29).

When discharging, the switch S3 is turned OFF, and then the switch S2 is turned ON. With this, a current from the condenser Cd flows into the condenser Css via the inductor L, so as to discharge the capacitive load Cd and charge the condenser Css (⑤j in FIG. 29). Due to the LC resonance, the capacitive load Cd is discharged so as to have the terminal voltage V of less than V0 (⑥j in FIG. 29). The rectifying diode D2 prevents the inversion of current, so that the terminal voltage V of the capacitive load Cd is cramped (⑦j in FIG. 29). Following this, the switch S2 is turned OFF, and then the switch S4 is turned ON. With this, the capacitive load Cd is discharged to have the terminal voltage V of 0 (⑧j in FIG. 29). In this manner, this arrangement can collect electrical power from the capacitive load Cd to the condenser Css using the LC resonance.

Further, a prior example shows that a plurality of inductors L are selectively used in a circuit which collects electrical power using the LC resonance as described above (see Patent Document 6 (Japanese Unexamined Patent Publication No. 87189/1990, Tokukaihei 2-87189, published on Mar. 28, 1990; Japanese Patent No. 2771523)).

Further, Patent Document 7 (Japanese Unexamined Patent Publication No. 170529/1999, Tokukaihei 11-170529, published on Jun. 29, 1999) and Patent Document 8 (Japanese Unexamined Patent Publication No. 218782/2000, Tokukai 2000-218782, published on Aug. 2, 2000) describe a circuit in which an inductor is inserted to collect energy.

Further, another known method is that, when a capacitive load is discharged, electric charge is accumulated in a condenser and is discharged to the ground only for an amount that exceeds the accumulating capacity of the condenser, and when the capacitive load is charged, the electric charge accumulated in the condenser is reused to charge a piezoid. Only an amount of electric charge to charge up the piezoid form the level of the electric charge thus accumulated is supplied from a power source. For example, Patent Document 9 (Japanese Unexamined Patent Publication No. 322560/1997, Tokukaihei 9-322560, published on Dec. 12, 1997; Japanese Patent No. 3120210) discloses a technique to reuse a part of electric charge charged to a capacitive load in a drive circuit of a capacitive load such as an EL (electroluminescence) element. In this technique, a condenser is provided in the drive circuit; and when the capacitive load is discharged, only a remaining portion of the charged electric charge is discharged after a part of the charged electric charge is sent to the condenser, and the capacitive load starts charging after the electric charge moved to the condenser is sent back to the capacitive load, thereby reusing a part of electric charge charged to the capacitive load in the drive circuit of the capacitive load. As a method to collect and reuse electrostatic energy, Patent Document 9 discloses a method in which a condenser 263 collects and reuses electrostatic energy from a capacitive load (EL element) 261, as shown in FIG. 26.

Next, the operation of the capacitive load drive circuit disclosed in Patent Document 9 will be concretely explained with reference to FIG. 27. Note that, to make the operation principle easily understandable, a drive voltage generating circuit as described in Patent Document 9 is schematically shown with a power supply terminal VH having a power supply voltage VH, and ON/OFF control of the drive voltage generating circuit as described in Patent Document 9 is schematically shown with a switch 262, in FIGS. 26 and 27.

First, the capacitive load 261 and the regenerative condenser 263 are initially grounded via the switches 264 and 265 which are turned ON, as shown in FIG. 26(a). Here, the switch 262 is turned OFF so as to stop a drive voltage from being supplied from the power supply terminal VH (drive voltage generating circuit; not shown) into the capacitive load 261.

Next, as shown in FIG. 27(b), the switches 264 and 265 are turned OFF, and then the switch 262 is turned ON. Accordingly, the power supply terminal VH outputs the power supply voltage VH to the capacitive load 261 via the switch 262 which is turned ON, so as to charge the capacitive load 261 with the power supply voltage VH from the power supply terminal VH. This raises a terminal potential of the capacitive load 261 so as to be equal to the power supply voltage VH.

Next, as shown in FIG. 27(c), the switch 262 is turned OFF; and the switch 265 is turned ON. This stops the drive voltage from being supplied from the power supply terminal VH to the capacitive load 261; and connects one end of the capacitive load 261 with the condenser 263. As a result, a part of the electric charge charged in the capacitive load 261 moves to the condenser 263 so that the capacitive load 261 is discharged and the condenser 263 collects the part of electrostatic energy accumulated in the capacitive load 261.

Next, as shown in FIG. 27(d), the switch 265 is turned OFF, and then the switch 264 is turned ON. With this, remaining electric charge in the capacitive load 261 is discharged to the ground (power supply terminal; not shown) via the switch 264. In other words, the remaining energy in the capacitive load 261 is consumed via the switch 264. Namely, with this step, a voltage of the capacitive load 261 becomes equal to a ground potential.

Further, in order that the capacitive load 261 having an initial electric charge of "0" can reuse the electrostatic energy collected in the condenser 263, the switch 264 is turned OFF, and then the switch 265 is turned ON, as shown in FIG. 27(e). With this, the electric charge charged in the condenser 263 moves to the capacitive load 261, so that electrical power is fed back from the condenser 263 to the capacitive load 261.

After this, the capacitive load 261 is driven by repeating the operation of FIGS. 27(b) through 27(e). In this way, a part of the electric charge emitted (discharged) from the capacitive load 261 is collected to the condenser 263 and is sent back to the capacitive load 261, so that electrical power is regenerated in the capacitive load 261.

Note that, also known are techniques to reduce electrical power consumption by collecting and reusing electric charge accumulated in a liquid crystal display panel (see Patent Document 10 (Japanese Unexamined Patent Publication No.

326863/1999, Tokukaihei 11-326863, published on Nov. 26, 1999), Patent Document 11 (Japanese Unexamined Patent Publication No. 352459/1999, Tokukaihei 11-352459, published on Dec. 24, 1999), and Patent Document 12 (Japanese Unexamined Patent Publication No. 22329/2001, Tokukaihei 2001-22329, published on Jan. 26, 2001)).

Further, Patent Document 13 (Japanese Unexamined Patent Publication No. 206191/1999, Tokukaihei 11-206191, published on Jul. 26, 1999) discloses a motor control circuit.

However, the power regenerating circuit which uses the mutual induction effect with respect to a magnetic circuit, as described in Patent Document 4, cannot efficiently collect and reuse the electrostatic energy accumulated in the capacitive load because of the conversion efficiency of the mutual induction effect and the efficiency of a charge circuit.

The record head drive circuit of Patent Document 4 uses the mutual induction between inductances to generate an induced electromotive force from a current discharged from the piezoid, and the generated induced electromotive force is charged to the secondary battery or the large-capacity condenser. With this arrangement, the electrostatic energy can be collected and reused repeatedly. On the other hand, because of the need for the inductances, leads to a complicated configuration, and loss of electrostatic energy due to a DC resistive component of the inductances and loss due to the efficiency of the mutual induction between the inductances. This results in lowered efficiency in collecting electric charge. Further, together with loss due to the charge circuit which uses the induced electromotive force to charge the secondary battery or the large-capacity condenser, the total system has a collection efficiency of 50% at most.

The arrangements of Patent Documents 5 and 6 have problems as described below.

First, the arrangement of Patent Document 5 is only applicable to usage in which a capacitance value of the capacitive load to be driven is fixed or almost fixed. In other words, in case many piezoids in an ink-jet head are driven, for example, the capacitance value of the capacitive load widely varies depending on the number of piezoids for jetting out ink. Further, in a plasma display, the number of light-emitting elements to be illuminated widely varies the capacitance value of the capacitive load in case a drive circuit drives many light-emitting elements. In the arrangement of Patent Document 5, changes in the capacitance value of the capacitive load vary a frequency of the LC resonance, thereby varying operation characteristics of the circuit. When the capacitive load has a large capacitance value, in particular, there is a possibility that the rising of the waveform delay, thereby hindering the terminal voltage of the capacitive load from rising to a predetermined voltage in a period in which the switch S1 is turned ON. This results in a lowered regeneration ratio. For this reason, it is difficult to apply the arrangement of Patent Document 5 in order to drive the capacitive load whose capacitance value widely changes, such as a capacitive component of an ink-jet head using a piezoid, for example. Of course, the circuit of Patent Document 5 may be provided to each piezoid of the ink-jet head. In this case, however, it is necessary to provide many inductors L, resulting in an extremely large circuit scale.

The above problems could be solved by continuously varying the inductances L of the inductors L in accordance with the changes in the capacitance value of the capacitive load, but it is difficult to continuously vary the inductances L of the inductors L.

Further, the arrangement of Patent Document 6 in which the plurality of inductors L are switched over can solve the above problems to a certain extent, but the circuit scale-accordingly becomes large because the plurality of inductors L are provided. Namely, this arrangement can be applied to only a limited range of usage.

Further, the arrangements employing the inductor L (coil) have common problems such as a large circuit scale, difficulty in arranging circuits due to leak of magnetic flux, and high costs.

Further, Patent Documents 7 and 8 do not describe a technique to collect and reuse electrostatic energy.

The capacitive load drive circuit of Patent Document 9 has problems such that efficiency of the condenser in collecting electric charge is low, and thus power regeneration efficiency of the capacitive load (ratio of regenerated electrical power to initial electrical power) is low.

Namely, in the step of FIG. 27($b$), a terminal potential V(Cd) of the capacitive load 261 is as follows:

$$V(Cd)=VH$$

When a part of energy of the capacitive load 261 is collected by the condenser 263 in the step 27($c$), the terminal potential V(Cd) of the capacitive load 261 and a terminal voltage V(Cs) of the condenser 263 are as follows:

$$V(Cd)=V(Cs)=\{Cd/(Cd+Cs)\}VH,$$

where Cd is the capacitance of the capacitive load 261, and Cs is the capacitance of the condenser 263. For example, when the capacitance of the capacitive load 261 equals to the capacitance of the condenser 263, a voltage VH/2 is supplied to the condenser 263.

The voltage V(Cd) which is supplied to the capacitive load 261 in the step of FIG. 27($e$) is as follows.

$$V(Cd)=\{Cd\cdot Cs/(Cd+Cs)^2\}VH$$

For example, when the capacitance of the capacitive load 261 equals to the capacitance of the condenser 263, a voltage VH/4 is supplied to the capacitive load 261. The maximum power regeneration ratio can be achieved when the terminal potential V(Cd) of the capacitive load 261 after the power regeneration is at the maximum. Here, a regeneration ratio Re of the voltage with respect to an initial voltage VH is as follows.

$$Re=Cd\cdot Cs/(Cd+Cs)^2$$

This expression is alternatively expressed as below, using a capacitance ratio of the capacitive load 261 to the condenser 263, X=Cd/Cs.

$$Re=X/(1+X)^2$$

Accordingly, the power regeneration ratio is maximum when X=1, namely when the capacitance of the capacitive load 261 equals to the capacitance of the condenser 263.

$$Re=1/(1+1)^2=¼$$

Therefore, the arrangement of Patent Document 7 theoretically has a maximum regeneration ratio of 25%. After charging and discharging are repeated, reusing efficiency becomes much lower than 25% due to remaining electric charge.

Note that, with the arrangements of Patent Documents 8 through 10, the electric charge accumulated in the liquid crystal display panel cannot be efficiently collected and reused. Further, Patent Document 13 does not describe any technique to collect and reuse electrostatic energy.

SUMMARY OF THE INVENTION

In view of the foregoing problems, an object of the present invention is to provide a capacitive load drive circuit having a simple circuit configuration and capable of efficiently collecting and reusing energy accumulated in a capacitive load; a capacitive load driving method; and an apparatus such as an image forming apparatus, which is provided with a capacitive load and a capacitive load drive circuit and which consumes lower electrical power.

In order to solve the foregoing problems, a capacitive load of the present invention for charging and discharging a capacitive load is characterized by including a plurality of energy accumulating elements for dividedly accumulating electrostatic energy supplied from a power source; and switching means for selectively connecting the capacitive load and the plurality of energy accumulating elements, (A) when charging the capacitive load, the switching means selectively connecting the capacitive load and the plurality of energy accumulating elements so that the plurality of energy accumulating elements sequentially supply electrostatic energy to the capacitive load, and (B) when discharging the capacitive load, the switching means selectively connecting the capacitive load and the plurality of energy accumulating elements so that the plurality of energy accumulating elements sequentially collect electrostatic energy from the capacitive load.

With this arrangement, the plurality of energy accumulating elements sequentially supply electrostatic energy to the capacitive load, and the plurality of energy accumulating elements sequentially collect electrostatic energy from the capacitive load, thereby collecting and reusing energy highly efficiently. Further, the above capacitive load drive circuit is so arranged that the electrostatic energy accumulated in the energy accumulating elements is directly collected, thereby only requiring a simple circuit configuration. With this arrangement, it is possible to reduce energy consumed during the cycle of charging and discharging the capacitive load, and using a simple circuit it is possible to achieve the collection efficiency of electrical power in accordance with the number of the electrostatic energy accumulating elements.

Further, with the arrangement, a waveform can be shaped by changing the switching time. Thus, even when the capacitance of the capacitive load changes, this does not affect the rate of rise (slew rate) of the total waveform, thereby achieving stable operation.

In order to solve the foregoing problems, a capacitive load drive circuit of the present invention for charging and discharging a capacitive load is characterized by including a plurality of energy accumulating elements to which a plurality of different initial potentials are respectively applied; a reference potential terminal to which either a reference power supply potential from a power source or a ground potential is applied as a reference potential; and switching means for selectively connecting (A) the energy accumulating elements and the reference potential terminal with (B) the capacitive load, one of the plurality of energy accumulating elements being a first energy accumulating element having a first initial potential which is not 0, one of the plurality of energy accumulating elements being a second energy accumulating element having a second initial potential whose polarity is the same as a polarity of the first initial potential and whose absolute value is larger than an absolute value of the first initial potential, the reference potential being either (a) the ground potential, (b) a potential which has the same polarity as the first initial potential supplied from the power source and which has a smaller absolute value than the first initial potential, or (c) a potential whose polarity is reverse to the polarity of the first initial potential supplied form the power source, the switching means carrying out (i) a first charging step of selectively connecting the capacitive load with the reference potential terminal and then selectively connecting the capacitive load with the first energy accumulating element so as to change, toward the first initial potential, a terminal voltage of the capacitive load, (ii) a second charging step of selectively connecting the capacitive load with the second energy accumulating element so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order. Further, the capacitive load drive circuit may be so arranged that the reference potential terminal is a ground terminal having the ground potential; the switching means is a plurality of switching elements, which are respectively provided between (A) the ground terminal and the plurality of energy accumulating elements and (B) the capacitive load, for selectively connecting (A) the ground terminal and the plurality of energy accumulating elements with (B) the capacitive load; and at least the accumulating element that has an initial potential whose absolute value is largest among the plurality of accumulating elements is connected with the power source directly or indirectly (via a circuit).

In order to solve the foregoing problems, a capacitive load drive circuit of the present invention for charging and discharging a capacitive load is characterized by including a power supply terminal to which a power supply potential from a power source is applied; a plurality of energy accumulating elements to which a plurality of different initial potentials are respectively applied; and switching means for selectively connecting (A) the energy accumulating elements and the power supply terminal with (B) the capacitive load, one of the plurality of energy accumulating elements being a first energy accumulating element having a first initial potential whose polarity is the same as a polarity of the power supply potential and whose absolute value is smaller than an absolute value of the power supply potential, one of the plurality of energy accumulating elements being a third energy accumulating element having either (a) a potential whose polarity is the same as the polarity of the first initial potential and whose absolute value is smaller than the absolute value of the first initial potential, (b) a ground potential, or (c) a third initial potential whose polarity is reverse to the polarity of the first initial potential, the switching means carrying out (i) a first charging step of selectively connecting the capacitive load with the third energy accumulating element and then selectively connecting the capacitive load with the first energy accumulating element so as to change, toward the first initial potential, a terminal voltage of the capacitive load, (ii) a second charging step of selectively connecting the capacitive load with the power supply terminal so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

In order to solve the foregoing problems, a capacitive load drive circuit of the present invention for charging and discharging a capacitive load is characterized by including a plurality of energy accumulating elements to which a plurality of different initial potentials are respectively applied; and switching means for selectively connecting the plurality of energy accumulating elements with the capacitive load, one of the plurality of energy accumulating elements being a first energy accumulating element having a first initial potential which is not 0, one of the plurality of energy accumulating elements being a second energy accumulating element whose absolute value is larger than an absolute value of the first initial potential, one of the plurality of energy accumulating elements being a third energy accumulating element having either a potential whose polarity is the same as a polarity of the first initial potential and whose absolute value is smaller than the absolute value of the first initial potential, a ground potential, or a third initial potential whose polarity is reverse to the polarity of the first initial potential, the switching means carrying out (i) a first charging step of selectively connecting the capacitive load with the third energy accumulating element and then selectively connecting the capacitive load with the first energy accumulating element so as to change, toward the first initial potential, a terminal voltage of the capacitive load, (ii) a second charging step of selectively connecting the capacitive load with the second energy accumulating element so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

The capacitive load drive circuit may be arranged so as to further include a ground terminal having the ground potential, the switching means being a plurality of switching elements, which are respectively provided between (A) the ground terminal and the plurality of energy accumulating elements and (B) the capacitive load, for selectively connecting (A) the ground terminal and the plurality of energy accumulating elements with (B) the capacitive load, at least the accumulating element that has an initial potential whose absolute value is largest among the plurality of accumulating elements being directly or indirectly connected with the power source. Further, the capacitive load drive circuit may be so arranged that the switching means is a plurality of switching elements, which are respectively provided between the plurality of energy accumulating elements and the capacitive load, for selectively connecting the plurality of energy accumulating elements with the capacitive load, at least the accumulating element that has an initial potential whose absolute value is largest among the plurality of accumulating elements is directly or indirectly connected with the power source.

In order to solve the foregoing problems, a capacitive load drive circuit of the present invention for charging and discharging a capacitive load is characterized by including a power supply terminal to which a power supply potential from a power source is applied; a reference potential terminal to which either a reference power supply potential supplied from a reference power source which is different from the power supply potential or a ground potential is applied as a reference potential; a plurality of first energy accumulating elements to which initial potentials are respectively applied, the initial potentials being different from one another and being between the reference potential and the power supply potential; and switching means for selectively connecting (A) the reference potential terminal, the plurality of energy accumulating elements, and the power supply terminal with (B) the capacitive load, the switching means carrying out the steps of (1) connecting the capacitive load with the reference potential terminal and then sequentially connecting the capacitive load with the first energy accumulating elements in an order of the initial potentials from the initial potential closest to the reference potential, so as to change, toward the power supply potential, a terminal voltage of the capacitive load, (2) selectively connecting the capacitive load with the power supply terminal so as to increase an absolute value of the terminal voltage of the capacitive load, and (3) selectively connecting the capacitive load with the first energy accumulating elements in an order of the initial potentials from the initial potential closest to the power supply potential, so as to decrease the absolute value of the terminal voltage of the capacitive load and so as to regenerate electrostatic energy to be accumulated in the first energy accumulating elements, the thus regenerated electrostatic energy being approximately equal to electrostatic energy as accumulated in the first energy accumulating elements before the step (1), the steps (1) through (3) being carried out in this order.

With these arrangements, when decreasing the absolute value of the terminal voltage of the capacitive load so as to discharge the capacitive load, it is possible to regenerate electrostatic energy accumulated in the first energy accumulating elements to be approximately equal to electrostatic energy as accumulated in the first energy accumulating elements before supplying energy to the capacitive load. Therefore, the first energy accumulating elements do not apparently consume energy, thereby regenerating electrical power highly efficiently.

In these arrangements, a DC power source may be connected to the first energy accumulating element via a resistance circuit, the DC power source supplying energy into the first energy accumulating element so as to prevent a voltage drift of the first energy accumulating element caused by the charging and discharging of the capacitive load.

With this, it is possible to prevent the voltage drift, thereby improving the electrical power regeneration ratio.

The capacitive load drive circuit that employs the DC power source for preventing the voltage drift is preferably arranged so that a drive pulse having a predetermined cycle is applied to the capacitive load; and a time constant determined by a resistance value of the resistance circuit and a capacitive component of the first energy accumulating element is larger than the cycle of the drive pulse applied to the capacitive load, by 50 times or more. Further, the capacitive load drive circuit that employs the DC power source for preventing the voltage drift is preferably arranged so that a drive pulse having a predetermined cycle is applied to the capacitive load; the switching means carries out a charging step of selectively connecting the capacitive load to different points so as to supply electrostatic energy to the capacitive load, the charging step being repeated in a plurality of times within one cycle of the drive pulse; and the following relationship is satisfied:

$$3 \times Tp \% Rs \cdot Cs \% 6 \times Tp, \text{ where } N=2;$$

$$3 \times Tp \% Rs \cdot Cs \% 7 \times Tp, \text{ where } N=3;$$

$$3 \times Tp \% Rs \cdot Cs \% 8 \times Tp, \text{ where } N=4; \text{ and}$$

$$3 \times Tp \% Rs \cdot Cs \% 10 \times Tp, \text{ where } N\hat{\ }5,$$

where Cs is a capacitive component of the first energy accumulating element, Tp is the cycle of the drive pulse applied to the capacitive load, Rs is a resistance value of an energy supplying path from the DC power source to the first energy accumulating element, and N is the number of repeating the charging step during the cycle of the drive pulse.

The capacitive load drive circuit as arranged above may be so arranged that (A) the capacitive load drive circuit for generating a positive pulse in which each of the energy accumulating elements has an initial potential whose polarity is positive and (B) the capacitive load drive circuit for generating a negative pulse in which each of the energy accumulating elements has an initial potential whose polarity is negative are connected in parallel.

In this case, a terminal having a potential closest to the ground potential consumes (A) energy supplied from the electrostatic energy accumulating element having the highest positive initial potential (for generating a positive pulse), (B) energy supplied from the energy supplied from the electrostatic energy accumulating element having the lowest negative initial potential (for generating a negative pulse), and (C) energy supplied from the electrostatic energy accumulating element having the lowest potential on the (−) pulse generating side.

In order to solve the foregoing problems, an apparatus of the present invention which includes a capacitive load and a capacitive load drive circuit for charging and discharging the capacitive load is characterized in that the capacitive load drive circuit includes a power supply terminal to which a power supply potential is applied from a power source; a reference potential terminal to which either a reference power supply potential supplied from the power source which is different from the power supply potential, or a ground potential is applied as a reference potential; an energy accumulating element to which an initial potential between the reference potential and the power supply potential is applied; and switching means for selectively connecting (A) the reference potential terminal, the energy accumulating element, and the power supply terminal with (B) the capacitive load, the switching means carrying out (i) a first charging step of connecting the capacitive load with the reference potential terminal and then connecting the capacitive load with the energy accumulating element, (ii) a second charging step of selectively connecting the capacitive load with the power supply terminal, and (iii) a discharging step of connecting the capacitive load with the energy accumulating element, the steps (i) through (iii) being carried out in this order, the following relationship being satisfied:

$$Cd/Cs \% 0.164 \{Ts/(R \cdot Cd)\}^{0.2198}, \text{ if } Ts/(R \cdot Cd) < 2.5;$$

and $$Cd/Cs \% 0.2, \text{ if } Ts/(R \cdot Cd) \hat{\ } 2.5,$$

where Cs is a capacitive component of the energy accumulating element, Cd is a capacitance of the capacitive load, Ts is a time during which the energy accumulating element is kept connected to the capacitive load, and R is a resistance value of charge and discharge paths of the energy accumulating element with respect to the capacitive load, the charge and discharge paths including switching means.

Further, in order to solve the foregoing problems, an apparatus of the present invention which includes a capacitive load and a capacitive load drive circuit for charging and discharging the capacitive load is characterized in that the capacitive load drive circuit includes a power supply terminal to which a power supply potential is applied from a power source; a reference potential terminal to which either a reference power supply potential supplied from the power source which is different from the power supply potential, or a ground potential is applied as a reference potential; a plurality of energy accumulating elements to which initial potentials are respectively applied, the initial potentials being different from one another and being between the reference potential and the power supply potential; and switching means for selectively connecting (A) the reference potential terminal, the plurality of energy accumulating elements, and the power supply terminal with (B) the capacitive load, the switching means carrying out (i) a first charging step of connecting the capacitive load with the reference potential terminal and then sequentially connecting the capacitive load with the energy accumulating elements in an order of the initial potentials from the initial potential closest to the reference potential, (ii) a second charging step of selectively connecting the capacitive load with the power supply terminal, and (iii) a discharging step of sequentially connecting the capacitive load with the energy accumulating elements in an order of the initial potentials from the initial potential closest to the power supply potential, the steps (i) through (iii) being carried out in this order, the following relationship being satisfied:

$$Cd/Cs \% 0.164 \{Ts/(R \cdot Cd)\}^{0.2198}, \text{ if } Ts/(R \cdot Cd) < 2.5;$$

and $$Cd/Cs \% 0.2, \text{ if } Ts/(R \cdot Cd) \hat{\ } 2.5,$$

where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including switching means.

With these arrangements, when decreasing the absolute value of the terminal voltage of the capacitive load so as to discharge the capacitive load, it is possible to regenerate electrostatic energy accumulated in the first energy accumulating elements to be approximately equal to electrostatic energy as accumulated in the first energy accumulating elements before supplying energy to the capacitive load. Therefore, the first energy accumulating elements do not apparently consume energy, thereby regenerating electrical power highly efficiently.

Further, with these arrangements, the voltage of the capacitive load reaches 90% of the final attainment voltage (final voltage attained by the capacitive load after repeating the first through third steps infinitely) during the first through third steps. With this, change in the voltages of the energy accumulating elements due to the flowing of electric charge from the energy accumulating elements to the capacitive load is reduced, and the electrical power regeneration ratio in generating pulses is improved, thereby further reducing the electrical power consumption. Further, change in the voltages of the energy accumulating elements due to the generation of one pulse is reduced. This allows to generate a next pulse without correcting the voltage change.

The apparatus of the present invention (apparatus having two stages) that employs the energy accumulating element is preferably arranged so that the following relationship is satisfied:

$$SR ≧ V/(R·Cd)*(-0.0002y^4+0.001y^3+0.009y^2-0.100y+0.386),$$

where Cd is the capacitance of the capacitive load, R is the resistance value of the charge and discharge paths of the energy accumulating element with respect to the capacitive load, the charge and discharge paths including the switching means, Ts is the time during which the energy accumulating element is kept connected to the capacitive load, V is a final attainment voltage, SR is a slew rate (rate of rise from 10% to 90%) of a waveform of a generated voltage, and y=Ts/(R·Cd).

The apparatus of the present invention (apparatus having two stages) that employs the energy accumulating element is preferably arranged so that the following relationship is satisfied:

$$50(V/\mu sec) ≧ V/(R·Cd)*(-0.0002y^4+0.001y^3+0.009y^2-0.100y+0.386),$$

where Cd is the capacitance of the capacitive load, R is the resistance value of the charge and discharge paths of the energy accumulating element with respect to the capacitive load, the charge and discharge paths including the switching means, Ts is the time during which the energy accumulating element is kept connected to the capacitive load, V is the final attainment voltage, and y=Ts/(R·Cd).

The apparatus of the present invention (apparatus having three or more stages) that employs the plurality of energy accumulating elements is preferably arranged so that the following relationship is satisfied:

$$SR ≧ V/(R·Cd)*(0.0008y^4-0.012y^3+0.071y^2-0.229y+0.414), \text{ when } N=3;$$

$$SR ≧ V/(R·Cd)*(0.0023y^4-0.028y^3+0.138y^2-0.336y+0.434), \text{ where } N=4; \text{ and}$$

$$SR ≧ V/(R·Cd)*(0.0026y^4-0.032y^3+0.153y^2-0.356y+0.413), \text{ where } N\hat{\,}5,$$

where Cd is the capacitance of the capacitive load, R is the resistance value of the charge and discharge paths of the energy accumulating elements with respect to the capacitive load, the charge and discharge paths including the switching means, Ts is the time during which the energy accumulating elements are kept connected to the capacitive load, V is a final attainment voltage, N is the number of times each of the energy accumulating elements repeats a charging step during a cycle of a drive pulse, the SR is a slew rate (rate of rise from 10% to 90%) of a waveform of a generated voltage, and y=Ts/(R·Cd).

The apparatus of the present invention (apparatus having three or more stages) that employs the plurality of energy accumulating elements is preferably arranged so that the following relationship is satisfied:

$$50(V/\mu sec) ≧ V/(R·Cd)*(0.0008y^4-0.012y^3+0.071y^2-0.229y+0.414), \text{ where } N=3;$$

$$50(V/\mu sec) ≧ V/(R·Cd)*(0.0023y^4-0.028y^3+0.138y^2-0.336y+0.434), \text{ where } N=4; \text{ and}$$

$$50(V/\mu sec) ≧ V/(R·Cd)*(0.0026y^4-0.032y^3+0.153y^2-0.356y+0.413), \text{ when } N\hat{\,}5,$$

where Cd is the capacitance of the capacitive load, R is the resistance value of the charge and discharge paths of the energy accumulating elements with respect to the capacitive load, the charge and discharge paths including the switching means, Ts is the time during which the energy accumulating elements are kept connected to the capacitive load, V is the final attainment voltage, N is the number of times each of the energy accumulating elements repeats the charging step during the cycle of the drive pulse, and y=Ts/(R·Cd).

With this arrangement, it is possible to stably operate the drive waveform generating circuit by satisfying a slew rate required for a waveform to be generated with respect to the circuit parameters and the time to keep connecting. In particular, when a high-speed slew rate is required as in an ink-jet printer, ink can be stably jetted out by setting the lower limit of the slew rate to 50 (V/µsec). Therefore, with this arrangement, it is possible to apply a pulse having a steep waveform, thereby achieving a good response of the apparatus.

Note that, in the above inequities, the value of the right side (for example, $V/(R·Cd)*(-0.0002y^4+0.001y^3+0.009y^2-0.100y+0.386)$) should be as large as possible within a range that does not exceed the limit of the drive circuit, and the upper limit of the value is not particularly limited.

An apparatus that includes the capacitive load drive circuit as arranged above and a capacitive load charged and discharged by the capacitive load drive circuit is preferably arranged so that the capacitive component of the energy accumulating elements is preferably larger than the capacitance of the capacitive load, by 100 times or more.

The energy accumulating elements to be used in the present invention, such as condensers, depend on the waveform of a pulse to be generated. To obtain a pulse having a waveform whose rising edge is steep, it is preferable that the energy accumulating elements have good frequency characteristics (charge and discharge characteristics) (have a small equivalent resistance R). With this, the energy accumulating elements are switched from one stage to the next only after the voltage of the capacitive load is saturated to a certain extent, thereby achieving a pulse having a waveform whose rising edge is steep. For example, with an arrangement in which the ON resistance of the switching elements connected to the energy accumulating elements is small, the equivalent resistance R can be smaller so as to improve the charge and discharge characteristics of the energy accumulating elements.

When the capacitive component of the energy accumulating elements is not less than the capacitance of the capacitive load by 100 times or more, it is possible to stably operate the drive system. Further, when the capacitive component of the energy accumulating elements is less than the capacitance of the capacitive load by 100 times or more, the potentials of the energy accumulating elements widely change due to energy supply to the capacitive load, causing a significant decrease in the electrical power regeneration ratio.

Note that, a "capacitive load" in the present specification refers to a load whose main component is a capacitance. The capacitive load may be a piezoid (piezoelectric body) provided in an image forming apparatus, etc; an electrostatic drive electrode (electrostatic actuator) provided in an ink-jet head employing an electrostatic method; a discharge electrode of a plasma display of an image forming apparatus; a voltage applying electrode of a liquid crystal display; a piezoelectric actuator (piezoid); a condenser; an electrostatic motor; an electrostatic image forming apparatus; and the like. Further, the capacitive load that consumes a relatively small amount of current may be applied to a DC-AC converting apparatus, a voltage waveform generating apparatus, and the like.

An apparatus that employs the capacitive load and the capacitive load drive circuit in accordance with the present invention may be so arranged that the capacitive load is an electrostatic drive electrode or a piezoid which is provided in an ink-jet head that pressurizes ink so as to jet out the ink in droplets; and the capacitive load drive circuit is a drive circuit for driving the electrostatic drive electrode or the piezoid of the ink-jet head. With this arrangement, the apparatus generates a voltage pulse and simultaneously regenerates electrical power during the cycle of generating the voltage pulse, thereby consuming a small amount of electrical power when driving the piezoid or the electrostatic drive electrode (electrostatic actuator). Therefore, it is possible to provide an image forming apparatus that consumes lower electrical power.

The energy accumulating element may be a secondary battery, a condenser, and the like.

The condenser has an internal resistance smaller than that of the secondary battery, etc. Thus, the loss in the condenser itself is smaller than the secondary battery. Therefore, it is possible to collect and reuse electrostatic energy highly efficiently.

Further, the condenser is not much degraded even after repeating charging and discharging many times and thus has a long life, thereby achieving a long time use.

Further, the condenser generally has more excellent frequency characteristics than the secondary battery. Therefore, it is possible to collect electrostatic energy efficiently even in driving a pulse of about 10 µs.

The condenser is most preferably a film condenser, a tantalum condenser, an electric double layer condenser, a functional polymer condenser, and a ceramic condenser, which are excellent in the above-described characteristics (degradation characteristics after charging and discharging, an internal impedance, and frequency characteristics).

On the other hand, the secondary battery requires a long time to accumulate (charge) electrostatic energy, but can accumulate a relatively large amount of energy, thereby maintaining a voltage for a long time. Thus, the secondary battery can allow the capacitive load drive circuit to operate for a long time without voltage supply from the power source.

The secondary battery may be an alkaline accumulating storage battery such as a nickel-cadmium battery, a nickel-hydrogen battery, and a silver oxide-cadmium battery, as well as a lithium secondary battery such as a manganese-lithium battery, a carbon-lithium battery, a lithium-polymer battery, and a lithium-ion battery. Of the secondary batteries, the lithium-ion battery is preferable because the lithium ion battery does not have memory effects such as the nickel-cadmium battery and the nickel-hydrogen battery, and is suitable for repeating charging and discharging.

Further, the capacitive load drive circuit of the present invention may be arranged so as to further include an energy output path which is connected to a part of the energy accumulating elements, the energy output path supplying to an external element other than the capacitive load the electrostatic energy that the energy accumulating element collects from the capacitive load.

With this arrangement, electrostatic energy collected to the energy accumulating elements can be used by an external element other than the capacitive load from which the electrostatic energy is collected, thereby efficiently reusing the electrostatic energy collected to the energy accumulating elements.

It is preferable that the plurality of energy accumulating elements respectively have terminal voltages which are different from one another; and (A) when charging the capacitive load, the switching means sequentially connects the capacitive load with the energy accumulating elements in an ascending order of absolute values of the terminal voltages and (B) when discharging the capacitive load, the switching means sequentially connects the capacitive load with the energy accumulating elements in a descending order of the absolute values of the terminal voltages.

With this arrangement, the energy accumulating elements are selectively connected sequentially in order of size of their terminal voltages. With this, (A) the flow of energy from the energy accumulating elements to the capacitive load when charging and (B) the flow of energy from the capacitive load to the energy accumulating elements when discharging are canceled out with each other most efficiently. This also reduces an inrush current supplied to the energy accumulating elements and to the capacitive load, thereby reducing energy loss. As a result, it is possible to further reduce electrical power consumption.

The capacitive load drive circuit of the present invention may be so arranged that when discharging the capacitive load, the switching means grounds the capacitive load, after connecting the capacitive load with the energy accumulating element that has the smallest terminal voltage.

With this arrangement, it is possible to minimize the energy consumption because the electrical power consumption of the capacitive load is a value determined by a potential difference between the ground potential and the energy accumulating element that has the terminal voltage of the smallest absolute value. Further, the electric charge accumulated in the energy accumulating elements can be reduced to 0 before the energy accumulating elements are charged, thereby achieving the stable repeating operation of the energy accumulating elements.

The capacitive load drive circuit of the present invention may be so arranged that when discharging the capacitive load, the switching means keeps connecting the capacitive load with the energy accumulating element that has the terminal voltage of a smallest absolute value until the capacitive load starts charging, after connecting the capacitive load with the energy accumulating element that has the terminal voltage of the smallest absolute value.

With this arrangement, the energy accumulated in the capacitive load can be retained and is not discarded, thereby collecting and reusing almost all of the electrostatic energy accumulated in the capacitive load. As a result, it is possible to collect and reuse the electrostatic energy accumulated in the capacitive load. In this case, by supplying electrical power to another circuit from the energy accumulating element that has the terminal voltage of the smallest absolute value, it is possible to collect and reuse the electrostatic energy efficiently while preventing the voltage drift of the energy accumulating element that has the terminal voltage of the smallest absolute value.

Further, the capacitive load drive circuit of the present invention may be arranged so as to further include voltage dividing means for dividing into a plurality of different voltages, the voltage supplied from the power source and for supplying the divided voltages respectively to the energy accumulating elements. The voltage dividing means is provided as initial energy accumulating means for the energy accumulating elements.

With this arrangement, during the cycle of generating a voltage pulse and simultaneously regenerating electrical power by charging and discharging the capacitive load, the voltage dividing means can compulsorily adjust the terminal voltages of the energy accumulating elements to predetermined voltages, even when the amount of electric charge in the energy accumulating elements is not restored to an initial value (value before supplying electrostatic energy) after collecting electrostatic energy from the capacitive load, due to the loss and energy emission at the capacitive load, etc. In particular, by appropriately selecting the capability of the voltage dividing means to correct voltages, the voltage dividing means does not react much during the cycle of generating a voltage pulse and simultaneously regenerating electrical power by charging and discharging the capacitive load, but can prevent the drift during repeat of the cycle of generating a voltage pulse and simultaneously regenerating electrical power. As a result, it is possible to supply a highly stable voltage to the capacitive load, thereby achieving stable repeating operation.

Further, with this arrangement, the plurality of energy accumulating elements can sequentially supply different voltages to the capacitive load so as to sequentially increase the drive voltage of the capacitive load when charging the capacitive load, whereas the plurality of energy accumulating elements sequentially supply different voltages to the capacitive load so as to sequentially decrease the drive voltage of the capacitive load. Therefore, it is possible to obtain a variety of waveforms for the drive voltage by adjusting switching timings of the switching means.

It is more preferable that the voltage dividing means equally divides the voltage supplied from the power source into n (n is not less than 2). With this, (A) the flow of energy from the energy accumulating elements to the capacitive load when charging (B) the flow of energy from the capacitive load to the energy accumulating elements when discharging are almost canceled out with each other most efficiently, and it is also possible to further reduce an inrush current supplied to the energy accumulating elements and to the capacitive load, thereby reducing energy loss.

The capacitive load drive circuit of the present invention may be so arranged that the voltage dividing means includes a plurality of resistors which are connected in series with respect to the power source. With this arrangement, it is possible to realize the voltage dividing means in a simple configuration.

The capacitive load drive circuit that employs the voltage dividing means including the plurality of resistors is preferably arranged so as to further include buffer amplification means, which is provided between (A) the resistors and (B) the energy accumulating elements, for amplifying a current flowing through the resistors and for outputting a voltage that differs from an input voltage so as to adjust to predetermined voltages, the terminal voltages of the energy accumulating elements.

With this arrangement, the buffer amplification means can accurately adjust the terminal voltages of the energy accumulating elements to predetermined voltages, when the voltage divided by the resistors does not become exactly equal to the predetermined voltage, namely, for example, when the amount of electric charge in the energy accumulating elements is not restored to an initial value (value before supplying electrostatic energy) after collecting electrostatic energy from the capacitive load, due to the loss and energy emission at the capacitive load, etc.

Further, with this arrangement, it is possible to reduce currents flowing through the resistors, thereby reducing electrical power consumed by the resistors.

Note that, the buffer amplification means can be realized by an emitter follower.

The capacitive load drive circuit of the present invention may be so arranged that the voltage dividing means includes a constant voltage element, such as a zener diode, for stabilizing the divided voltages.

With this arrangement, the constant voltage means such as a zener diode can accurately adjust the terminal voltages of the energy accumulating elements to predetermined voltages, even when the amount of electric charge in the energy accumulating elements is not restored to an initial value (value before supplying electrostatic energy) after collecting electrostatic energy from the capacitive load, due to the loss and energy emission at the capacitive load, etc. As a result, it is possible to supply a highly stable voltage to the capacitive load, thereby achieving stable repeating operation.

It is preferable that the voltage dividing means employing the constant voltage means such as a zener diode further includes a plurality of constant voltage elements such as zener diodes connected in series between the power source and a ground line; and a resistor is inserted between (A) the constant voltage elements such as zener diodes and (B) the power source or the ground line.

With this arrangement, even when the sum of both terminal voltages (zener voltages in a case of zener diodes) of the constant voltage elements such as zener diodes is not equal to the power supply voltage, the resistor can absorb the difference in the voltages, thereby achieving stable repeating operation at a certain voltage.

The capacitive load drive circuit of the present invention may be so arranged that the voltage dividing means employing the constant voltage elements such as zener diodes includes a first voltage divider and a second voltage divider connected in parallel between the power source and a ground line; each of the first voltage divider and the second voltage divider includes the constant voltage elements such as zener diodes; a pull-up resistor is inserted between the constant voltage elements such as zener diodes and the power source in the first voltage divider; and a pull-down resistor is inserted between the constant voltage elements such as zener diodes and the ground line in the second voltage divider.

With this arrangement, even when the sum of both terminal voltages (zener voltages in a case of zener diodes) of the constant voltage elements such as zener diodes is not equal to the power supply voltage, the pull-up resistor and the pull-down resistor can absorb the difference in the voltages, thereby achieving stable repeating operation at a certain voltage.

It is preferable that a difference between the number of constant voltage elements such as zener diodes included in the first voltage divider and the number of constant voltage elements such as zener diodes included in the second voltage divider is not more than one.

With this arrangement, it is possible to further improve the stability of the terminal voltages of the energy accumulating elements, thereby achieving stable repeating operation.

The capacitive load drive circuit of the present invention that employs the voltage dividing means including the constant voltage element such as a zener diode is preferably arranged so that a current-limit resistor which is inserted between the constant voltage element such as a zener diode and the energy accumulating elements.

With this arrangement, the current-limit resistor appropriately selects the capability of the voltage dividing means to correct voltages, so that the voltage dividing means does not react much during the cycle of generating a voltage pulse and simultaneously regenerating electrical power by charging and discharging the capacitive load, but can prevent the drift during repeat of the cycle of generating a voltage pulse and simultaneously regenerating electrical power. Further, the current-limit resistor can absorb a current suddenly flowing in and out of the capacitive load, and can limit a current flowing into the constant voltage elements such as zener diodes, thereby reducing the workload of the constant voltage elements such as zener diodes.

Further, it is preferable that all of the energy accumulating elements respectively have one ends connected to the power source or the ground line.

With this arrangement, the energy accumulating elements can be respectively separated so as not to interfere with one another. Thus, when a current from the capacitive load flows in and out of a particular energy accumulating element, the voltage change of the particular energy accumulating element does not affect the other energy accumulating elements. Therefore, it is possible to further improve the stability of the terminal voltages of the energy accumulating elements, thereby achieving stable repeating operation.

Further, the capacitive load drive circuit of the present invention is preferably arranged so as to further include a switching section for controlling the supply of electrostatic energy from the power source to the energy accumulating elements, the switching section supplying electrostatic energy from the power source to the energy accumulating elements only during a predetermined period before the capacitive load is charged.

With this arrangement, the power source supplies electrostatic energy to the energy accumulating elements only for a predetermine period. Thus, compared with a case where the power source always supplies electrostatic energy to the energy accumulating elements, it is possible to reduce electrical power consumed by the capacitive load drive circuit, and can particularly reduce electrical power consumed by the resistors in the arrangement that employs the voltage dividing means including the plurality of resistors connected in series with respect to the power source.

Further, the capacitive load drive circuit of the present invention may be arranged so as to further include selecting means which switches over internal connecting states so as to selectively charge or discharge one or some of capacitive loads.

With this arrangement, the selecting means selectively charge or discharge one or some of the capacitive loads, thereby driving a plurality of capacitive loads at different timings.

Further, the capacitive load drive circuit that further employs the selecting means is preferably arranged so that (A) an energy supplying path for supplying to the capacitive load the electrostatic energy that is divided into the plurality of energy accumulating elements and (B) an energy collecting path for collecting the electrostatic energy from the plurality of energy accumulating elements are separately provided; and each of the energy supplying path and the energy collecting path includes the selecting means.

With this arrangement, by separately providing the energy supplying path (charge path) and the energy collecting path, it is possible to simultaneously charge a part of the capacitive loads and discharge the other part of the capacitive loads. With this, it is possible to increase the number of operating the capacitive loads per unit time when driving many capacitive loads at different timings. Therefore, it is possible to operate the capacitive loads at a high speed.

Further, with this arrangement, by separately providing the energy supplying path and the energy collecting path, it is possible to separately optimize the charge characteristic and the discharge characteristic.

Further, the capacitive load drive circuit in which the energy supplying path and the energy collecting path are separately provided is preferably arranged so as to further include rectifying means for rectifying currents of the energy supplying path and the energy collecting path.

With this arrangement, a short-circuit current does not flow in a case of delay in the ON/OFF operation of the switching means and the like, thereby preventing the breakage of the circuit.

It is preferable that the capacitive load drive circuit is used to drive as the capacitive load a piezoid for pressuring ink, the piezoid being provided in an ink-jet head that jets out ink in droplets.

With this arrangement, it is possible to collect and reuse energy highly efficiently when driving the piezoid of the ink-jet head which generally consumes large electrical power, have large consumption of a high dielectric constant (about $expe \approx 4300$, for example) and a large capacitance (80 pF×320 ch=0.0256 μF, for example), and is generally driven at a high repeating frequency (10 kpps to 150 kpps). This especially achieves the effect of reducing electrical power consumption.

In order to solve the foregoing problems, an ink-jet printer of the present invention which includes an ink-jet head that uses a piezoid to pressurize ink so as to jet out the ink in droplets, and a drive circuit for driving the piezoid of the ink-jet head is characterized in that the drive circuit is one of the capacitive load drive circuits as arranged above.

With this arrangement, the plurality of energy accumulating elements sequentially supply electrostatic energy to the piezoid, and the plurality of energy accumulating elements sequentially collect electrostatic energy from the piezoid, thereby collecting and reusing energy highly efficiently. Therefore, it is possible to provide an ink-jet printer that consumes lower electrical power.

An image forming apparatus that employs the capacitive load drive circuit using the cycle of generating a voltage pulse and simultaneously regenerating electrical power generates a voltage pulse and regenerates electrical power during the cycle of generating the pulse. With this, small electrical power is consumed when driving the piezoid or the electrostatic drive electrode (electrostatic actuator). Therefore, it is possible to provide an image forming apparatus that consumes lower electrical power.

A method for driving a capacitive load of the present invention by charging and discharging the capacitive load is characterized by including an accumulating step of dividedly accumulating electrostatic energy in a plurality of energy accumulating elements; a charging step of sequentially supplying the electrostatic energy from the plurality of energy accumulating elements to the capacitive load so as to charge the capacitive load; and a collecting step of discharging the capacitive load so that the plurality of energy accumulating elements sequentially collect the electrostatic energy from the capacitive load.

With this method, the plurality of energy accumulating elements sequentially supply electrostatic energy to the piezoid when charging the capacitive load, and the plurality of energy accumulating elements sequentially collect electrostatic energy from the piezoid when discharging the capacitive load, thereby collecting and reusing energy highly efficiently.

In order to solve the foregoing problems, a method for driving a capacitive load of the present invention by charging and discharging the capacitive load is characterized by including (i) a step of preparing a first energy accumulating element having an first initial potential which is not 0, a second energy accumulating element, and a reference potential terminal to which either (a) a ground potential, (b) a potential supplied from a reference power source which has the same polarity as the first initial potential and which has a smaller absolute value than the first initial potential, or (c) a potential supplied form the reference power source whose polarity is reverse to the polarity of the first initial potential is applied as a reference potential; (ii) an initial potential applying step of applying the first initial potential to the first energy accumulating element, and applying to the second energy accumulating element a second initial potential which has the same polarity as the first initial potential and which has a larger absolute value than the first initial potential; (iii) a first charging step of selectively connecting the capacitive load with the reference potential terminal and then selectively connecting the capacitive load with the first energy accumulating element so as to change, toward the first initial potential, a terminal voltage of the capacitive load; (iv) a second charging step of selectively connecting the capacitive load with the second energy accumulating element so as to increase an absolute value of the terminal voltage of the capacitive load; and (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the first charging step, the steps (iii) through (v) being carried out in this order.

In order to solve the foregoing problems, a method for driving a capacitive load of the present invention by charging and discharging the capacitive load is characterized by including (i) a step of preparing a power supply terminal to which a power supply potential is applied from a power source, a first energy accumulating element, and a third energy accumulating element; (ii) an initial potential applying step of applying to the first energy accumulating element a first initial potential which has the same polarity as the power supply potential and which has a smaller absolute value than the power supply potential, and applying to the third accumulating element either a potential which has the same polarity as the first initial potential and which has a smaller absolute value than the first initial potential, a ground potential, or a third initial potential whose potential is reverse to the polarity of the first initial potential; (iii) a first charging step of selectively connecting the capacitive load with the third energy accumulating element and then selectively connecting the capacitive load with the first energy accumulating element so as to change, toward the first initial potential, a terminal voltage of the capacitive load; (iv) a second charging step of selectively connecting the capacitive load with the power supply terminal so as to increase an absolute value of the terminal voltage of the capacitive load; and (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the first charging step, the steps (iii) through (v) being carried out in this order.

For a fuller understanding of the nature and advantages of the invention, reference should be made to the ensuing detailed description taken in conjunction with the accompanying drawings.

BRIEF DESCRIPTION OF DRAWINGS

FIG. 2(a) is a waveform chart of a synchronizing signal, FIG. 2(b) is a waveform chart of a control voltage of a transistor, and FIG. 2(c) is a waveform chart of a voltage applied to a condenser.

FIG. 3(a) is a waveform chart of the synchronizing signal, FIG. 3(b) is a timing chart showing how the switch operates, FIG. 3(c) is a waveform chart of the control voltage of the transistor, and FIG. 3(d) is a waveform chart of the voltage applied to the condenser.

FIGS. 5(a) through 5(c) are timing charts showing the operation of the capacitive load drive circuit of FIG. 4. FIG. 5(a) is a waveform chart of a synchronizing signal, FIG. 5(b) is a waveform chart of a control voltage of a transistor, and FIG. 5(c) is a waveform chart of a voltage applied to a condenser.

FIGS. 6(a) through 6(d), which show enlarged parts of the timing charts shown in FIGS. 5(a) through 5(c), illustrate how a switch operates. FIG. 6(a) is a waveform chart of the synchronizing signal, FIG. 6(b) is a timing chart showing how the switch operates, FIG. 6(c) is a waveform chart of the control voltage of the transistor, and FIG. 6(d) is a waveform chart of the voltage applied to the condenser.

FIGS. 9(a) through 9(c) are timing charts showing the operation of the capacitive load drive circuit of FIG. 8. FIG. 9(a) is a waveform chart of a synchronizing signal, FIG. 9(b) is a waveform chart of a control voltage of a transistor, and FIG. 9(c) is a waveform chart of a voltage applied to a condenser.

FIGS. 10(a) through 10(d), which show enlarged parts of the timing charts shown in FIGS. 9(a) through 9(c), illustrate how a switch operates. FIG. 10(a) is a waveform chart of the synchronizing signal, FIG. 10(b) is a timing chart showing how the switch operates, FIG. 10(c) is a waveform chart of the control voltage of the transistor, and FIG. 10(d) is a waveform chart of the voltage applied to the condenser.

FIGS. 14(a) through 14(c) are waveform charts showing waveforms of voltages applied to a condenser by the capacitive load drive circuit of FIG. 13. FIG. 14(a) is a waveform chart of a voltage in A phase, FIG. 14(b) is a waveform chart of a voltage in B phase, and FIG. 14(c) is a waveform chart of a voltage in C phase.

FIGS. 16(a) through 16(c) are waveform charts showing waveforms of voltages applied to a condenser by the capacitive load drive circuit of FIG. 15. FIG. 16(a) is a waveform chart of a voltage in A phase, FIG. 16(b) is a waveform chart of a voltage in B phase, and FIG. 16(c) is a waveform chart of a voltage in C phase.

FIG. 25(a) is a circuit diagram showing an arrangement of the capacitive load drive circuit, FIGS. 25(b) and 25(c) are waveform charts showing control voltages for controlling two transistors provided in the capacitive load drive circuit, FIG. 25(d) is a waveform chart of a terminal voltage of a driven condenser, and FIG. 25(e) is a waveform chart of a current flowing across a resistor of the capacitive load drive circuit.

FIGS. 27(a) through 27(e) are circuit diagrams used for explaining the operation of the conventional capacitive load drive circuit of FIG. 26.

FIG. 29 shows a terminal voltage of a capacitive load and states of switches.

FIGS. 31(a) through 31(e) are circuit diagrams used for explaining the operation of the capacitive load drive circuit of FIG. 30.

FIGS. 32(a) through 32(d) are circuit diagrams used for explaining the operation of the capacitive load drive circuit of FIG. 30.

FIG. 51(a) is a graph showing how voltages change, and FIG. 51(b) is a graph showing how a current changes.

FIG. 70(a) is a waveform chart of a synchronizing signal, FIG. 70(b) is a waveform chart of a control voltage of a switch, and FIG. 70(c) is a waveform chart of a voltage applied to a condenser.

FIG. 71(a) is a waveform chart of the synchronizing signal, FIG. 71(b) is a timing chart showing how the switch operates, FIG. 71(c) is a waveform chart of the control voltage of the switch (switching means), and FIG. 71(d) is a waveform chart of the voltage applied to the condenser.

FIGS. 73(a) through 73(c) are timing charts showing an operation example of the capacitive load drive circuit of FIG. 72. FIG. 73(a) is a waveform chart of a synchronizing signal, FIG. 73(b) is a waveform chart of a control voltage of a switch, and FIG. 73(c) is a waveform chart of a voltage applied to a condenser.

FIGS. 74(a) through 74(d) are timing charts showing another operation example of the capacitive load drive circuit of FIG. 72. FIG. 74(a) is a waveform chart of the synchronizing signal, FIG. 74(b) is a timing chart showing how the switch (switching means) operates, FIG. 74(c) is a waveform chart of the control voltage of the switch, and FIG. 74(d) is a waveform chart of the voltage applied to the condenser.

DESCRIPTION OF THE INVENTION

Embodiment 1

Figure 1:
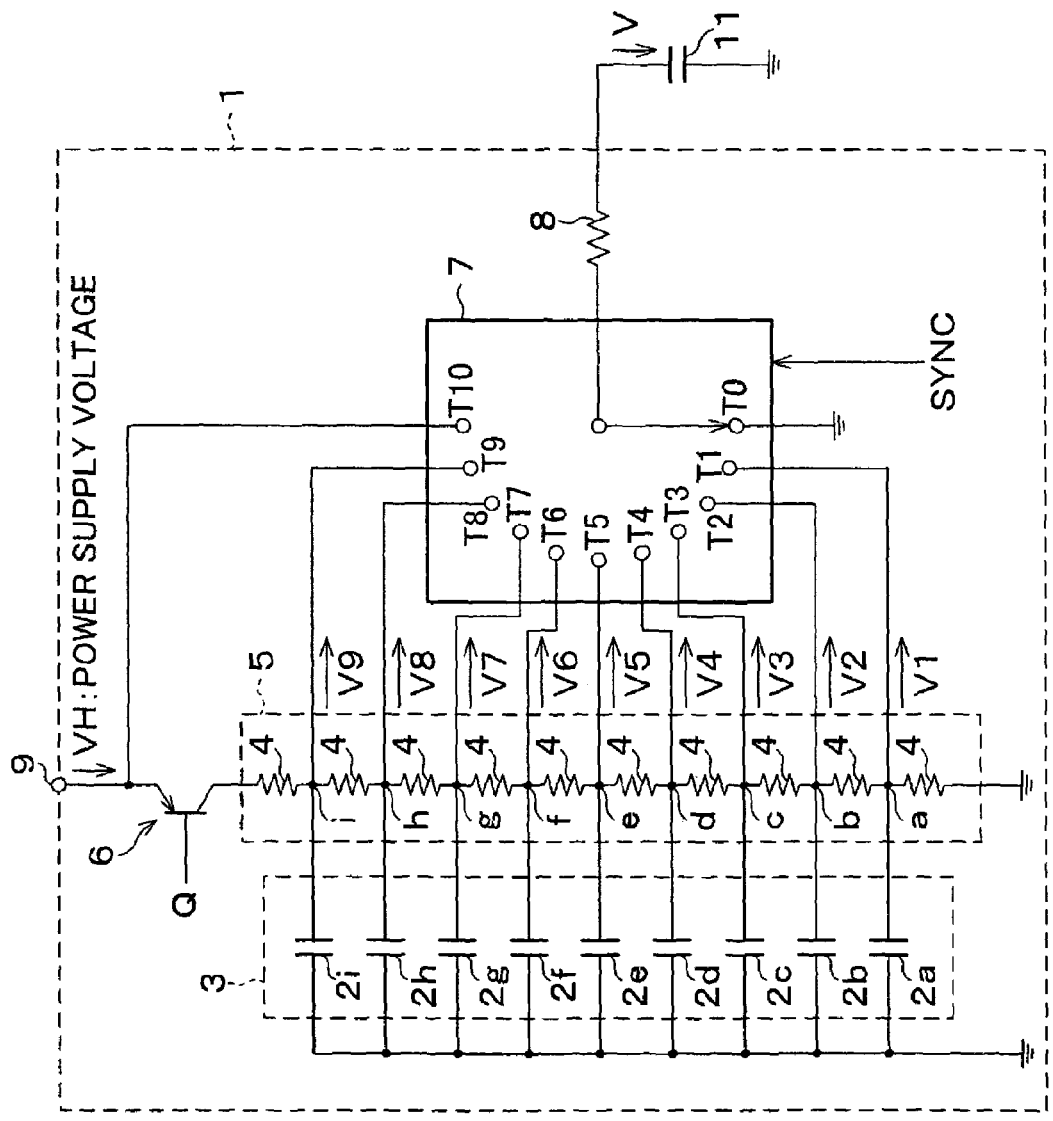
FIG. 1 is a circuit diagram showing an arrangement of a capacitive load drive circuit in accordance with an embodiment of the present invention.
Figure 2:
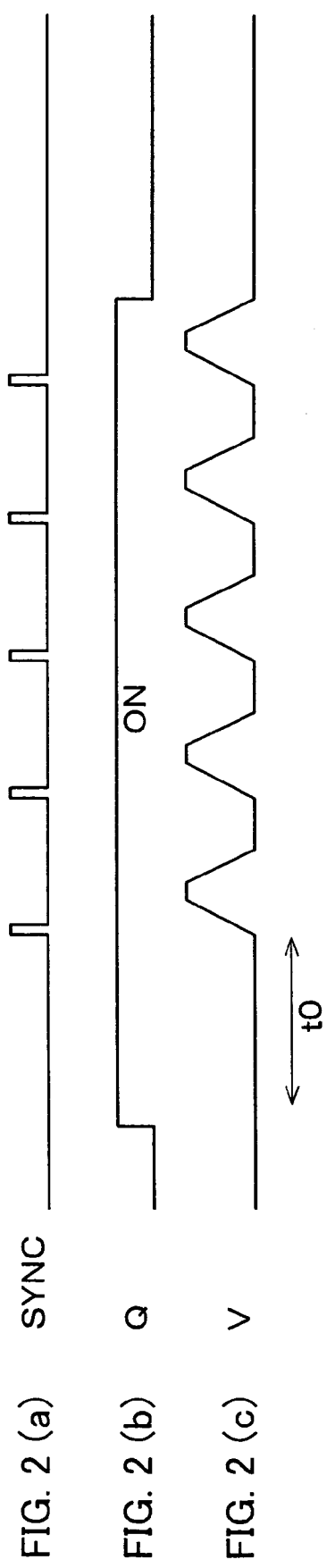
FIGS. 2(a) through 2(c) are timing charts showing the operation of the capacitive load drive circuit of FIG. 1.

The following will explain one embodiment of the present invention with reference to FIGS. 1, 2(*a*) to 2(*c*), and 3(*a*) to 3(*d*).

As shown in FIG. 1, a capacitive load drive circuit 1 of the present embodiment is provided with an accumulating device 3 including nine condensers (energy accumulating elements) 2, a voltage divider (voltage dividing means) 5 including ten resistors 4, a transistor (switching section) 6, a switch (switching means) 7, a resistor 8, and a power supply terminal 9. The capacitive load drive circuit 1 of the present embodiment applies a voltage V to a condenser 11 which is a capacitive load, so as to charge and discharge the condenser 11.

Via the power supply terminal 9, the capacitive load drive circuit 1 is supplied with a power supply voltage VH from a main power source (not shown) provided outside the capacitive load drive circuit 1. The power supply voltage VH supplied through the power supply terminal 9 is applied to the voltage divider 5 via the transistor 6.

The transistor 6 is a switch for connecting/disconnecting the power supply terminal 9 and the voltage divider 5 in response to a control voltage Q. In the present embodiment, the transistor 6 is a PNP type transistor having a emitter connected to the power supply terminal 9, a collector connected to the voltage divider 5, and a base to which the control voltage Q is applied. The transistor 6 is always switched ON when the capacitive load drive circuit 1 is driven. Thus, the capacitive load drive circuit 1 may be arranged without using the transistor 6 so that the power supply terminal 9 is directly connected to the voltage divider 5.

Using the ten resistors 4, the voltage divider 5 divides the power supply voltage VH which is supplied from the external main power source. The voltage divider 5 is so arranged that the ten resistors 4 are directly connected between the power supply terminal 9 and the ground (reference point of potential for the power supply voltage; typically the point at which the potential is 0). These resistors 4 divide the power supply voltage VH, which is supplied from the external main power source, into voltages V1 through V9 which are different from one another. Namely, when the transistor 6 is switched ON to supply a positive power supply voltage VH to the voltage divider 5 (hereinafter referred to as "when electrical power is supplied"), nine connection points a, b, c, d, e, f, g, h, and i between the resistors 4 respectively have voltages V1, V2, V3, V4, V5, V6, V7, V8, and V9 (where 0<V1<V2<V3<V4<V5<V6<V7<V8<V9<VH). More specifically, the voltages V1 through V9 are expressed as VH·R2/(R1+R2), where R1 is a sum of resistance values of the resistors 4 provided between the power supply terminal 9 and the connection point having the voltage in question, and R2 is a sum of resistance values of the resistors 4 provided between the ground and the connection point having the voltage in question. In the present embodiment, each resistor 4 is a resistive element having the same resistance value. Accordingly, the voltages V1 through V9 in the present embodiment are expressed as follows: V1=VH/10, V2=2VH/10, V3=3VH/10, V4=4VH/10, V5=5VH/10, V6=6VH/10, V7=7VH/10, V8=8VH/10, and V9=9VH/10.

The accumulating device 3 is composed of nine condensers 2*a* through 2*i* connected in parallel between the ground and the voltage divider 5. Further, the condensers 2*a*, 2*b*, 2*c*, 2*d*, 2*e*, 2*f*, 2*g*, 2*h*, and 2*i* are respectively connected to the connection points a, b, c, d, e, f, g, h, and i. Accordingly, the voltages V1, V2, V3, V4, V5, V6, V7, V8, and V9, which are prepared by dividing the power supply voltage VH using the voltage divider 5, are respectively applied to the condensers 2*a*, 2*b*, 2*c*, 2*d*, 2*e*, 2*f*, 2*g*, 2*h*, and 2*i* as terminal voltages (voltages of terminals connected to the switch 7), when electrical power is supplied.

In this way, the terminal voltages of the condensers 2*a* through 2*i* of the accumulating device 3 are adjusted to the predetermined voltages V1 through V9, respectively, by the voltage divider 5. As a result, the different terminal voltages V1 through V9 are respectively distributed to the condensers 2a through 2i. With this, the condensers 2a, 2b, 2c, 2d, 2e, 2f, 2g, 2h, and 2i accumulate electric charge (electrostatic energy) corresponding to the voltages V1, V2, V3, V4, V5, V6, V7, V8, and V9, respectively, when electrical power is supplied.

In the present embodiment, the condensers 2a through 2i have the same capacitance (electrostatic capacitance) C which is sufficiently larger than a capacitance CL of the condenser 11. Accordingly, the electric charge accumulated in the condensers 2a, 2b, 2c, 2d, 2e, 2f, 2g, 2h, and 2i are C·V1, C·V2, C·V3, C·V4, C·V5, C·V6, C·V7, C·V8, and C·V9, respectively.

Note that, the capacitance C of the condensers 2a through 2i is preferably larger than the capacitance CL of the condenser 11 by 100 times or more, so as to improve collection efficiency of electrostatic energy.

The accumulating device 3 and the voltage divider 5 are connected to the condenser 11 via the switch 7 and the resistor 8. The switch 7 has eleven contact points T0 through T10, and selectively connects one of the contact points T0 through T10 with an output terminal (terminal connected to the resistor 8). Among the eleven contact points T0 through T10, the contact point T0 is grounded; the contact points T1, T2, T3, T4, T5, T6, T7, T8, and T9 are respectively connected to the condensers 2a, 2b, 2c, 2d, 2e, 2f, 2g, 2h, and 2i; and T10 is connected to the power supply terminal 9. Accordingly, the voltages V1, V2, V3, V4, V5, V6, V7, V8, and V9 are respectively applied to the contact points T0, T1, T2, T3, T4, T5, T6, T7, T8, T9, and T10, when the condenser 11 is driven.

The switch 7 is switched to the contact point T0 in an initial state (state before driving operation starts). During the driving operation, the switch 7 repeats an operation of sequentially switching the contact points from the contact point T0 through the contact point T10 and then from the contact point T10 through the contact point T0. Further, the switch 7 receives a synchronizing signal SYNC for pulse-driving the condenser 11 from a synchronizing signal source (not shown), and carries out the operation of switching the contact points from T0 through T10 in synchronism with the synchronizing signal SYNC. Note that, the synchronizing signal SYNC and timing for switching the contact points T0 through T10 will be detailed later.

The resistor 8 limits a current flowing into the condenser (capacitive load) 11. When the switch 7 is a semiconductor switch, the resistor 8 is inserted equivalently as an ON resistance of the semiconductor switch.

Next, the operation of the capacitive load drive circuit 1 will be explained with reference to FIGS. 2 and 3. Note that, it is assumed here in the following explanation that VH is a positive voltage.

FIGS. 2(a) through 2(c) are timing charts showing the operation of the capacitive load drive circuit 1. FIG. 2(a) is a waveform chart showing a waveform of the synchronizing signal SYNC which is supplied to the switch 7. FIG. 2(b) is a waveform chart showing a waveform of the control voltage Q of the transistor 6, which controls the operation of the transistor 6. FIG. 2(c) is a waveform chart showing a waveform of the voltage V which is applied to the condenser 11.

Figure 29:
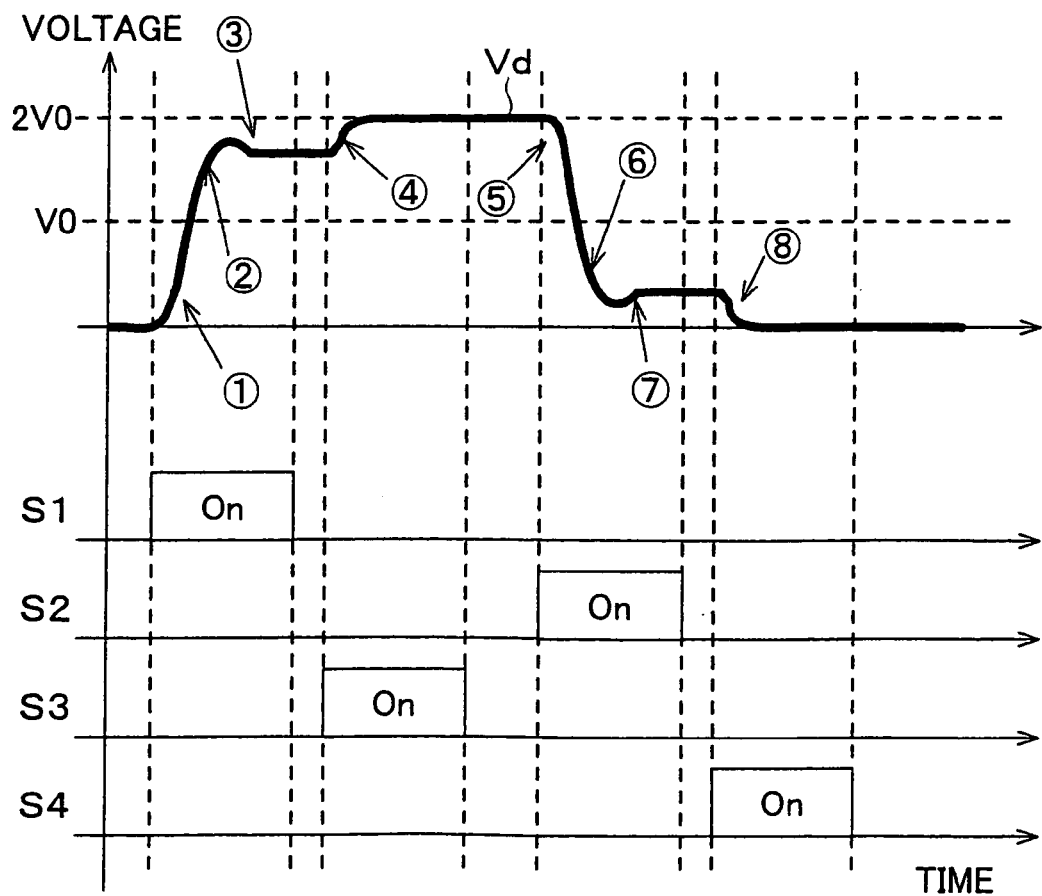
FIG. 29 is a waveform chart used for explaining the operation of the conventional capacitive load drive circuit of FIG. 28.

FIGS. 3(a) through 3(d), which show enlarged parts of the timing charts shown in FIGS. 2(a) through 2(c), illustrate how the switch 7 operates. FIG. 3(a) is an enlarged waveform chart showing a part of the waveform of the synchronizing signal SYNC shown in FIG. 2(a). FIG. 3(b) is a timing chart showing how the switch 7 of FIG. 1 operates, namely, which one of the contact points T0 through T10 is connected to the switch 7. FIG. 3(c) is an enlarged waveform chart showing a part of the waveform of the control voltage Q shown in FIG. 2(b). FIG. 3(d) is an enlarged waveform chart showing a part of the waveform of the voltage V shown in FIG. 29(c).

First, in preparatory operation before starting the driving operation of the condenser 11, the control voltage Q becomes a high level as shown in FIG. 2(b), so as to switch ON the transistor 6. With this, the different predetermined voltages V1 through V9, which are the external power supply voltage VH divided by the voltage divider 5, are applied to the condensers 2a through 2i of the accumulating device 3 as terminal voltages, so as to charge the condensers 2a through 2i. In the present embodiment, the transistor 6 is kept switched ON until the condenser 11 finishes the driving operation. Here, the switch 7 is switched to the contact point T0 so as to ground the condenser 11.

After the preparation in which the terminal voltages of the condensers 2a through 2i are adjusted to the predetermined voltages V1 through V9, the synchronizing signal SYNC is activated as shown in FIG. 2(a), so as to start the driving operation. Here, a period to between a time point when the transistor 6 is switched ON (preparatory operation starting point) and a time point when the synchronizing signal SYNC is activated (driving operation starting point) is preferably set to be not less than 2.5 times a time constant of charging, so as to fully charge the condensers 2a through 2i.

Then, by sequentially switching the switch 7 from the contact point T0 through the contact point T10 in synchronism with the synchronizing signal SYNC, the plurality of different voltages V1 to V9 and VH are applied to the condenser 11 as the voltage V. With this, a pulse voltage stepping up and down in an approximately trapezoidal shape is applied to the condenser 11 as the voltage V, as shown in FIGS. 2(c) and 3(c).

Next, the driving operation of the condenser 11 will be explained in detail. Here, the synchronizing signal SYNC is a pulse signal having a regular cycle T and a pulse width t, as shown in FIG. 3(a). For example, the cycle T is set to 8 μs, and the pulse width t is set to 0.32 μm.

When driving the condenser 11, the switch 7 is switched from the contact point T0 to the contact point T1 in synchronism with rising of the synchronizing signal SYNC. When the switch 7 is switched to the contact point T1, the condenser 2a of the accumulating device 3 is connected to the condenser 11. Here, the terminal voltage of the condenser 2a is V1, whereas the terminal voltage of the condenser 11 is the ground potential. As a result, electrostatic energy (electric charge) is supplied from the condenser 2a to the condenser 11, so as to charge the condenser 11.

Here, the electric charge accumulated in the condenser 2a is C·V1. If it is assumed that the condenser 11 receives electric charge only from the condenser 2a, the voltage V applied to the condenser 11 is expressed as follows:

$$V = C \cdot V1/(C+CL),$$

where CL is a capacitance of the condenser 11. Further, it can be assumed that the voltage V is approximately equal to the predetermined voltage V1 generated by the voltage divider 5, because the capacitance C of the condenser 2a is sufficiently larger than the capacitance CL of the condenser 11. Accordingly, the condenser 2a applies the voltage V1 to the condenser 11 by switching the switch 7 from the contact point T0 to the contact point T1.

After this, the switch 7 is switched from the contact point T1 to the contact point T2, from the contact point T2 to the contact point T3, from the contact point T3 to the contact point T4, from the contact point T4 to the contact point T5, from the contact point T5 to the contact point T6, from the contact point T6 to the contact point T7, from the contact point T7 to the contact point T8, and from the contact point T8 to the contact point T9. By switching the switch 7 in this manner, the condenser 11 is sequentially connected to the condensers 2b through 2i in the ascending order of their terminal voltages. In accordance with this, the condensers 2b through 2i sequentially supply electrostatic energy to the condenser 11, so as to apply the voltages V2 through V9 to the condenser 11 in the ascending order of the voltages, respectively in the same manner that the switch 7 is switched from the contact point T0 to the contact point T1. As a result, the voltage V of the condenser 11 rises to the voltage V9.

Next, when the switch 7 is switched from the contact point T9 to the contact point T10, the condenser 11 is connected to the power supply terminal 9, so that the voltage V applied to the condenser 11 becomes equal to the power supply voltage VH supplied from the outside.

In this way, the voltage V of the condenser 11 rises from 0 to the power supply voltage VH in an approximately stepped-up manner, as shown in FIG. 3(d).

Next, the switch 7 is kept switched to the contact point T10 so as to hold the voltage V. of the condenser 11 at the power supply voltage VH, then the switch 7 is switched from the contact point T10 to the contact point T9. This connects the condenser 2i of the accumulating device 3 to the condenser 11.

Here, the electric charge accumulated in the condenser 2i is $C \cdot V9$. If it is assumed that the condenser 2i receives electric charge only from the condenser 11, the voltage V applied to the condenser 11 is expressed as follows.

$$V = (CL \cdot VH + C \cdot V9)/(C + CL)$$

Further, the voltage V approximately equals to the voltage V9 because the capacitance C of the condenser 2i is sufficiently larger than the capacitance CL of the condenser 11. Accordingly, the condenser 11 is connected to the condenser 2i by switching the switch 7 from the contact point T10 to the contact point T9. As a result, the voltage V of the condenser 11 drops to the predetermined voltage V9 which is adjusted by the voltage divider 5, as shown in FIG. 3(d).

Here, the condenser 2i supplies energy to the condenser 11 during the step of connecting the condenser 11 to the condenser 2i after the condenser 11 is connected to the condenser 2h. Thus, if the accumulating device 3 does not receive energy from any circuit other than the condenser 11 between rising and falling edges of the voltage pulse, strictly speaking, the terminal voltage of the condenser 2i is not V9 but slightly smaller than V9 just before the condenser 11 is connected to the condenser 2i after the condenser 11 is connected to the power supply terminal 9.

However, when the condenser 2i having the terminal voltage slightly smaller than V9 is connected to the condenser 11 which is charged to have the power supply voltage VH, the condenser 2i collects electrostatic energy (electric charge) from the condenser 11 and causes the condenser 11 to discharge, because the terminal voltage of the condenser 11, which is now the power supply voltage VH, is larger than the terminal voltage of the condenser 2i. Here, the voltage of the condenser 2i is restored (regenerated) to a value approximately equal to V9 (value assumable to V9) by collecting energy from the condenser 11.

After this, the switch 7 is switched from the contact point T9 to the contact point T8, from the contact point T8 to the contact point T7, from the contact point T7 to the contact point T6, from the contact point T6 to the contact point T5, from the contact point T5 to the contact point T4, from the contact point T4 to the contact point T3, from the contact point T3 to the contact point T2, and from the contact point T2 to the contact point T1. By switching the switch 7 in this manner, the condenser 11 is connected to the condensers 2a through 2h in the descending order of their terminal voltages. In accordance with this, the condensers 2a through 2h sequentially collect energy from the condenser 11, and the voltages V1 through V8 are applied to the condenser 11 in the descending order of the voltages, respectively in the same manner that the switch 7 is switched from the contact point T10 to the contact point T9.

Finally, when the switch 7 is switched from the contact point T1 to the contact point T0, the condenser 11 is grounded so that the voltage V applied to the condenser 11 becomes 0, which is equal to the ground. The voltage V is set to 0 here so as to reduce the electric charge accumulated in the condenser 11 to 0 for stable repeating operation.

In the manner described above, the voltage V of the condenser 11 drops from the power supply voltage VH to 0 in an approximately stepped-down manner, as shown in FIG. 3(d).

Note that, at the last step-down of the switch 7 (switching from the contact point T1 to the contact point T0), the electric charge accumulated in the condenser 11 is not sent back to the condensers 2a through 2i and are all discarded to the ground. This means that part of electrostatic energy accumulated in the condenser 11 is discarded. In the present embodiment, the voltage V which is applied to the condenser 11 is a maximum of VH, and the voltage V of the condenser 11 at the last step-down of the switch 7 is V1, which equals to VH/10. Hence, the electric charge accumulated in the condenser 11 is CL·VH, and the electric charge which is discharged from the condenser 11 at the last step-down of the switch 7 is CL·VH/10. Accordingly, if the accumulating device 3 does not receive energy from any circuit other than the condenser 11 between rising and falling edges of the voltage pulse, and the condensers 2a through 2i collect all electric charge that is discharged from the condenser 11 except the electric charge at the last step-down of the switch 7, electric charge that the condensers 2a through 2i collect from the condenser 11 is 9CL·VH/10. Namely, the collection efficiency of electrostatic energy is 9/10=90%.

In this way, the applied voltage V of the condenser 11 is stepped up by sequentially switching the switch 7 from the contact point T0 through the contact point T10, and then stepped down by sequentially switching the switch 7 from the contact point T10 through the contact point T0. With this, the condensers 2a through 2i of the accumulating device 3 can supply electrostatic energy to the condenser 11, and can collect most of the electrostatic energy thus accumulated in the condenser 11.

As described above, the capacitive load drive circuit 1 of the present embodiment is so arranged that a voltage of the main power source is divided into n and then accumulated in the accumulating device 3; and the accumulating device 3 supplies electrostatic energy to the condenser 11 and collects electrostatic energy that is discharged from the condenser 11 by switching the connection between the accumulating device 3 and the condenser 11. This realizes highly efficient collection and reusing of energy.

Note that, in the capacitive load drive circuit 1 of the present embodiment, the transistor 6 is always switched ON when the capacitive load drive circuit 1 is driven. However, the transistor 6 may be arranged, as in Embodiment 4 to be described later, that the transistor 6 is switched ON only during a predetermined period between driving periods, so as to supply a power supply voltage to the voltage divider 5; and the transistor 6 is switched OFF when the voltage divider 5 need not receive electrical power, so as to disconnect the voltage divider 5 and the main power source. This can eliminate waste of electrical power consumption due to a current constantly flowing through the voltage divider 5.

Further, the capacitive load drive circuit 1 of the present embodiment is so arranged that the power supply terminal 9 is directly connected to the contact point T10 of the switch 7, but the capacitive load drive circuit 1 may be so arranged that the power supply terminal 9 is connected to the contact point T10 of the switch 7 via the transistor 6.

Embodiment 1A

The following will explain another embodiment of the present invention with reference to FIGS. 69, 70(a) to 70(c), and 71(a) to 71(d). Note that, for convenience, members having the same functions as those used in Embodiment 1 will be given the same reference symbols, and explanation thereof will be omitted here.

A capacitive load drive circuit of the present embodiment has the same arrangement as the capacitive load drive circuit 1 of Embodiment 1 except the following differences.

Figure 69:
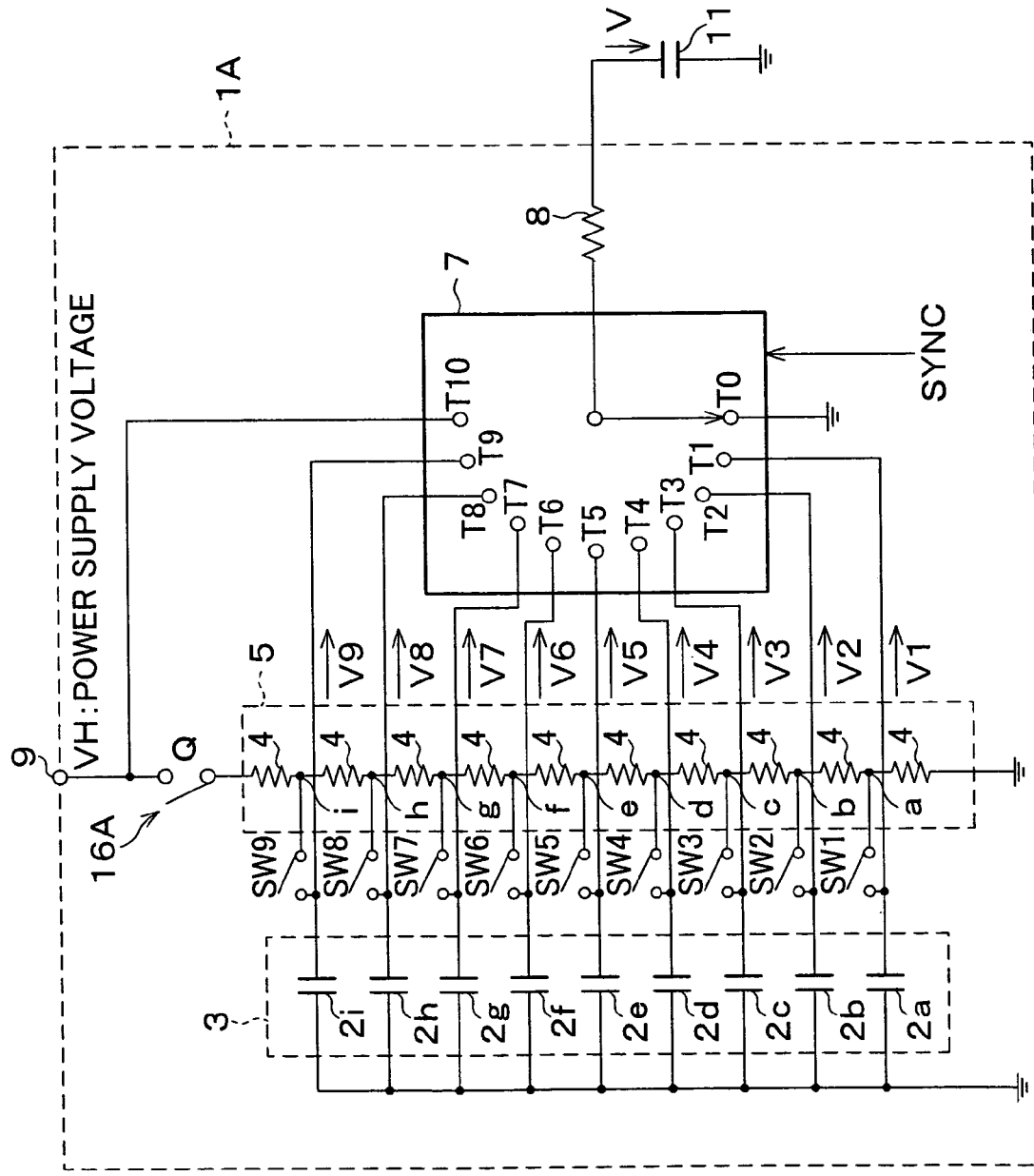
FIG. 69 is a circuit diagram showing an arrangement of a capacitive load drive circuit in accordance with yet another embodiment of the present invention.

As a first difference, switches SW1 through SW9 are respectively provided between (i) nine connection points (voltage dividing points) a through i of the voltage divider 5 and (ii) lines that respectively connect to the contact points T1 through T9 in a capacitive load drive circuit 1A of the present embodiment, as shown in FIG. 69; whereas the nine connection points (voltage dividing points) a through i of the voltage divider 5 are directly connected to the lines that respectively connect to the contact points T1 through T9 in the capacitive load drive circuit 1 of Embodiment 1. The switches SW1 through SW9 are switching sections for controlling the voltage supply from the voltage divider 5 to the condensers 2a through 2i of the accumulating device 3. The switches SW1 through SW9 are switched ON only during a predetermined period before the condenser 11 is charged.

As a second difference, the capacitive load drive circuit 1 of Embodiment 1 is provided with the transistor 6, and operates in accordance with the timing charts shown in FIGS. 2(a) to 2(c), and 3(a) to 3(d), but the capacitive load drive circuit 1A is provided with a switch 16A, instead of the transistor 6, whose operation is controlled by a control voltage Q shown in timing charts 70(a) to 70(c), or 71(a) to 71(d).

Figure 70:
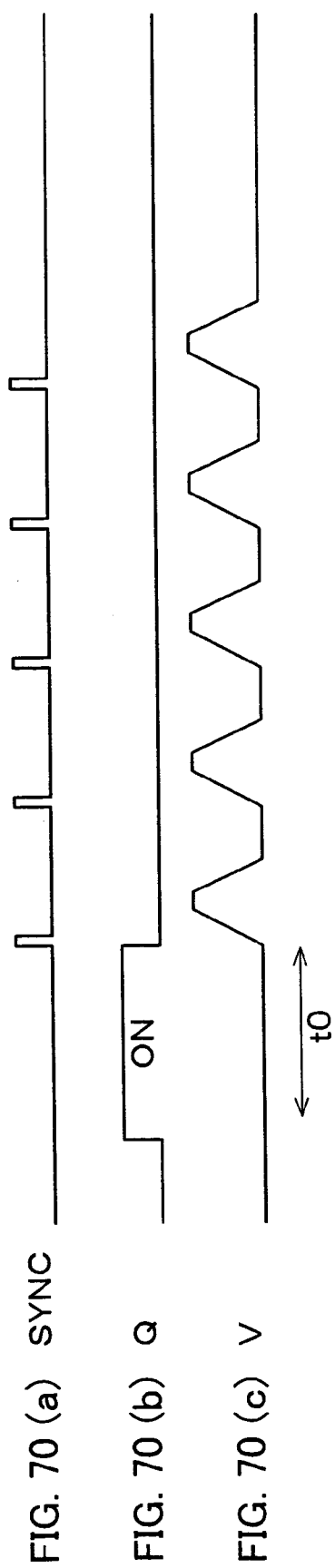
FIGS. 70(a) through 70(c) are timing charts showing an operation example of the capacitive load drive circuit of FIG. 69.

Namely, unlike the transistor 6 of Embodiment 1, the switch 16A is switched ON for a predetermined period to before the condenser 11 starts charging (here, the condenser 11 is connected to the contact point T0 of the switch 7 and thus grounded), as shown in FIGS. 70(a) through 70(c). Note that, the operation of the switches SW1 through SW9 is controlled by a control voltage similar to the control voltage Q of the switch 16A.

In Embodiment 1, the accumulating device 3 is always connected to the voltage divider 5, and a power supply voltage is always supplied to the voltage divider 5 when the capacitive load drive circuit is driven. Accordingly, energy is supplied from another circuit to the accumulating device 3 between the rising and falling edges of the voltage pulse. This energy supply may decrease efficiency of the accumulating device 3 in collecting energy from the condenser 11.

In contrast, energy is not supplied from another circuit to the accumulating device 3 between rising and falling edges of the voltage pulse in the present embodiment, as a result of the foregoing first and second differences. This can prevent lowering of efficiency of the accumulating device 3 in collecting energy from the condenser 11, the lowering caused by the energy supply from the other circuit.

Next, the driving operation of the condenser 11 in the capacitive load drive circuit 1A will be explained with reference to FIGS. 70(a) to 70(c) and FIGS. 71(a) to 71(d). Here, the synchronizing signal SYNC is a pulse signal having a regular cycle T and a pulse width t, as shown in FIG. 70(a). For example, the cycle T is set to 8 μs, and the pulse width t is set to 0.32 μs. Note that, it is assumed here in the following explanation that VH is a positive voltage.

FIGS. 70(a) through 70(c) are timing charts showing an operation example of the capacitive load drive circuit 1A. FIG. 70(a) is a waveform chart showing a waveform of the synchronizing signal SYNC which is supplied to the switch 7. FIG. 70(b) is a waveform chart showing a waveform of the control voltage Q which controls the operation of the switch 16A. FIG. 70(c) is a waveform chart showing a waveform of the voltage V which is applied to the condenser 11.

Figure 71:
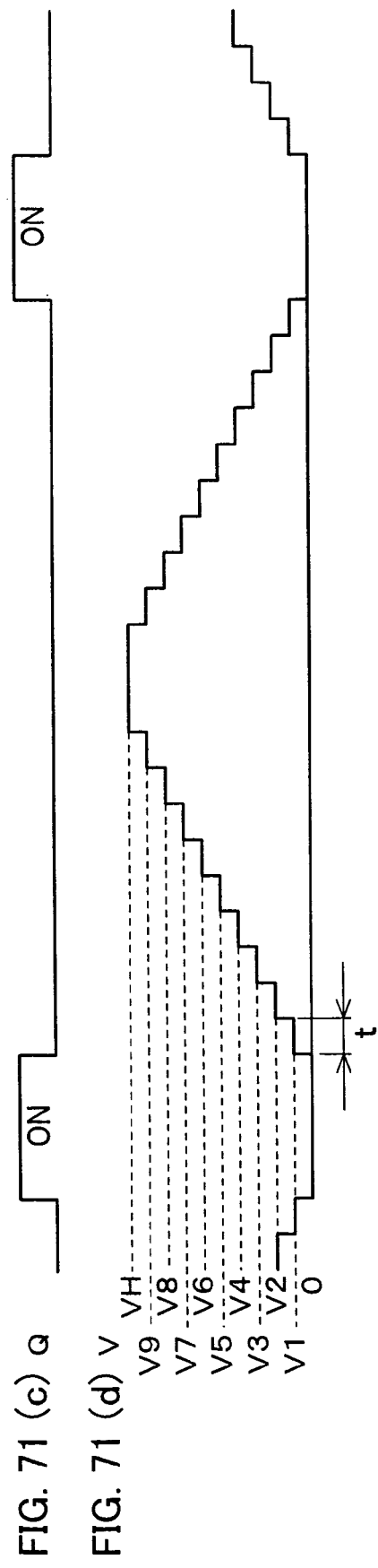
FIGS. 71(a) through 71(d) are timing charts showing another operation example of the capacitive load drive circuit of FIG. 69.

FIGS. 71(a) through 71(d) show another operation example of the capacitive load drive circuit 1A. FIG. 71(a) is an enlarged waveform chart showing a part of the waveform of the synchronizing signal SYNC shown in FIG. 70(a). FIG. 71(b) is a timing chart showing how the switch 7 of FIG. 1 operates, namely, which one of the contact points T0 through T10 is connected. FIG. 71(c) is an enlarged waveform chart showing a part of the waveform of the control voltage Q which controls the operation of the switch 16A. FIG. 71(d) is an enlarged waveform chart showing a part of the waveform of the voltage V shown in FIG. 70(c).

In both the operation example of FIGS. 70(a) through 70(c) and the operation example of FIGS. 71(a) through 71(d), the control voltage Q is turned ON when a pulse is not applied to the condenser 11, but cycles for turning ON the control voltage Q are different from each other. Specifically, the control voltage Q is turned ON every few pulses in the operation example of FIGS. 70(a) through 70(c), whereas the control voltage Q is turned ON every pulse in the operation example of FIGS. 71(a) through 71(d). When an amount of voltage drift is small, the switch 16A may be turned ON (connection state) per few pulses to perform normalization (correction of the terminal voltages of the condensers 2a through 2i), as shown in FIGS. 70(a) through 70(c). When an amount of voltage drift is large, the switch 16A may be turned ON (connection state) per each pulse to perform normalization, as shown in FIGS. 71(a) through 71(d), in order to secure stable operation.

When the condenser 11 is driven, first, the switch 7 is switched from the contact point T0 to the contact point T1, from the contact point T1 to the contact point T2, from the contact point T2 to the contact point T3, from the contact point T3 to the contact point T4, from the contact point T4 to the contact point T5, from the contact point T5 to the contact point T6, from the contact point T6 to the contact point T7, from the contact point T7 to the contact point T8, and from the contact point T8 to the contact point T9, as in Embodiment 1. By switching the switch 7 in this manner, the condensers 2a through 2i sequentially supply electrostatic energy to the condenser 11. Next, when the switch 7 is switched from the contact point T9 to the contact point T10, the voltage V applied to the condenser 11 becomes equal to the power supply voltage VH. In this way, the voltage V of the condenser 11 rises from 0 to the power supply voltage VH in an approximately stepped-up manner, as shown in FIG. 71(d).

Next, the switch 7 is switched from the contact point T10 to the contact point T9. This connects the condenser 2i of the accumulating device 3 to the condenser 11.

Here, the electric charge accumulated in the condenser 2i is $C \cdot V9$, and the condenser 2i substantially receives electric charge only from the condenser 11. The voltage V applied to the condenser 11 is accordingly expressed as follows.

$$V=(CL \cdot VH+C \cdot V9)/(C+CL)$$

Further, the voltage V approximately equals to the voltage V9 because the capacitance C of the condenser 2i is sufficiently larger than the capacitance CL of the condenser 11.

Here, the condenser 2i supplies energy to the condenser 11 during the step of connecting the condenser 11 to the condenser 2i after the condenser 11 is connected to the condenser 2h, and the accumulating device 3 does not receive energy from any circuit other than the condenser 11 between rising and falling edges of the voltage pulse. Thus, strictly speaking, the terminal voltage of the condenser 2i is not V9 but slightly smaller than V9 just before the condenser 11 is connected to the condenser 2i after connected to the power supply terminal 9.

The terminal voltage of the condenser 2i before the condenser 2i is connected to the condenser 11 is approximately V9. Strictly speaking, however, the condenser 2i supplies energy to the condenser 11 during the step of connecting the condenser 11 to the condenser 2i after the condenser 11 is connected to the condenser 2h. As a result, the voltage of the condenser 2i is slightly smaller than V9.

However, when the condenser 2i having the terminal voltage slightly smaller than V9 is connected to the condenser 11 which is charged to have the power supply voltage VH, the condenser 2i collects electrostatic energy (electric charge) from the condenser 11 and causes the condenser 11 to discharge, because the terminal voltage of the condenser 11, which is now the power supply voltage VH, is larger than the terminal voltage of the condenser 2i. Here, the voltage of the condenser 2i is restored (regenerated) to a value approximately equal to V9 (value assumable to V9) by collecting energy from the condenser 11.

After this, the switch 7 is switched from the contact point T9 to the contact point T8, from the contact point T8 to the contact point T7, from the contact point T7 to the contact point T6, from the contact point T6 to the contact point T5, from the contact point T5 to the contact point T4, from the contact point T4 to the contact point T3, from the contact point T3 to the contact point T2, and from the contact point T2 to the contact point T1. In accordance with this, the condensers 2a through 2h sequentially collect energy from the condenser 11. Finally, when the switch 7 is switched from the contact point T1 to the contact point T0, the condenser 11 is grounded so that the voltage V applied to the condenser 11 becomes 0, which is equal to the ground.

In the manner described above, the voltage V of the condenser 11 drops from the power supply voltage VH to 0 in an approximately stepped-down manner, as shown in FIG. 71(d).

Note that, at the last step-down of the switch 7 (switching from the contact point T1 to the contact point T0), the electric charge accumulated in the condenser 11 is not sent back to the condensers 2a through 2i and are all discarded to the ground. This means that part of electrostatic energy accumulated in the condenser 11 is discarded. In the present embodiment, the voltage V which is applied to the condenser 11 is a maximum of VH, and the voltage V of the condenser 11 at the last step-down of the switch 7 is V1, which equals to VH/10. In the present embodiment, the condensers 2a through 2i collect most of the electric charge which is discharged from the condenser 11 except the electric charge at the last step-down of the switch 7, because the accumulating device 3 does not receive energy from any circuit other than the condenser 11 between the rising and falling edges of the voltage pulse. Hence, the electric charge accumulated in the condenser 11 is CL·VH, and the electric charge discharged from the condenser 11 at the last step-down of the switch 7 is CL·VH/10. Namely, the collection efficiency of electrostatic energy is 9/10=90%.

In this way, the applied voltage V of the condenser 11 is stepped up by sequentially switching the switch 7 from the contact point T0 through the contact point T10, and then stepped down by sequentially switching the switch 7 from the contact point T10 through the contact point T0. With this, the condensers 2a through 2i of the accumulating device 3 can supply electrostatic energy to the condenser 11, and can collect most of the electrostatic energy thus accumulated in the condenser 11.

As described above, the capacitive load drive circuit 1A of the present embodiment is so arranged that a voltage of the main power source is divided into n and then accumulated in the accumulating device 3; and the accumulating device 3 supplies electrostatic energy to the condenser 11 and collects electrostatic energy that is discharged from the condenser 11 by switching the connection between the accumulating device 3 and the condenser 11. This realizes highly efficient collecting and reusing of energy.

Further, the condensers 2a through 2i are switched in order of size of their terminal voltages. Because of this, an inrush current supplied to the condensers 2a through 2i and to the condenser 11 is kept low, thereby reducing energy loss. In addition, the condenser 11 can be pulse-driven. Moreover, electrical power consumption can be further reduced by arranging such that the switch 7 has a greater number n of stages for switching over.

Further, the capacitive load drive circuits 1 and 1A of Embodiments 1 and 1A are arranged to have the voltage divider 5 composed of the resistors 4 which are connected in series. With this, the terminal voltages of the condensers 2a through 2i are adjusted to the predetermined voltages V1 through V9. This realizes stable repeating operation.

Note that, in Embodiments 1 and 1A, differences between each possible voltage value for the output voltage V, namely V1–0, V2–V1, V3–V2, V4–V3, V5–V4, V6–V5, V7–V6, V8–V7, V9–V8, VH–V9, are set to be the same value of VH/10, but the differences do not necessarily have the same value. However, the differences having the same value advantageously achieve a high efficiency in energy collection. Moreover, when the differences have the same value, the inrush current supplied to the condensers 2a through 2i and to the condenser 11 is kept further lower.

Further, in Embodiments 1 and 1A, the accumulating device 3 has ten condensers, but the number of condensers is not particularly limited provided that the accumulating device 3 has two or more condensers. Note that, when the accumulating device 3 has n condensers (n is an integer not less than two), the efficiency in collecting electrostatic energy is $n/(n+1)$.

Further, the capacitive load drive circuits 1 and 1A of Embodiments 1 and 1A use contact points T0 through T10 of the switch 7 to generate a sequence of pulses. When a required pulse crest value is lower than VH, however, driving operation can be sufficiently realized by stopping the step-up of the voltage V of the condenser 11 at a certain voltage m·VH/10 (m is an integer not less than 2 and not more than 9) without using all of the contact points of the switch 7. For example, when a required pulse crest value is 9VH/10, only the contact points T0 through T9 of the switch 7 may be used. Likewise, driving operation can be sufficiently carried out by stopping the step-up of the voltage V of the condenser 11 at a certain voltage m·VH/10 (m is an integer not less than 2 and not more than 9). When the step-up of the voltage V of the condenser 11 is stopped at a certain voltage m·VH/10 (m is an integer not less than 2 and not more than 9), the efficiency in collecting electrostatic energy is (m−1)/ m.

In these methods that do not use all of the contact points of the switch 7, the accumulating device 3 includes some condensers (among 2a through 2i) whose energy supply to the condenser 11 and energy collection from the condenser 11 are imbalanced. Thus, it is necessary to correct this imbalance caused by the energy supply from the voltage divider 5 and the like.

Embodiment 1A is a method to reduce electrical power consumption of a system in applying a voltage pulse to the condenser 11 which is a capacitive load. The method has the steps of sequentially supplying energy from the accumulating device 3 to the condenser 11 at a rising edge of the voltage waveform and conversely collecting energy from the condenser 11 to the accumulating device 3 at a falling edge of the voltage waveform. If the accumulating device 3 receives energy from another circuit between rising and falling edges of the voltage pulse, the efficiency of the accumulating device 3 in collecting energy from the condenser 11 decreases.

Accordingly, the imbalance generated in the accumulating device 3 between the energy supply and the energy collection must be corrected when a waveform is not generated for the condenser 11, or must be corrected slowly over a longer time than a time for applying a waveform to the condenser 11.

Further, the rotary switch 7 is used in the capacitive load drive circuits 1 and 1A of Embodiments 1 and 1A, but the switching means may be eleven one-point contact switches provided in parallel, each having one connection point; or a semiconductor switch.

Embodiment 2

Figure 4:
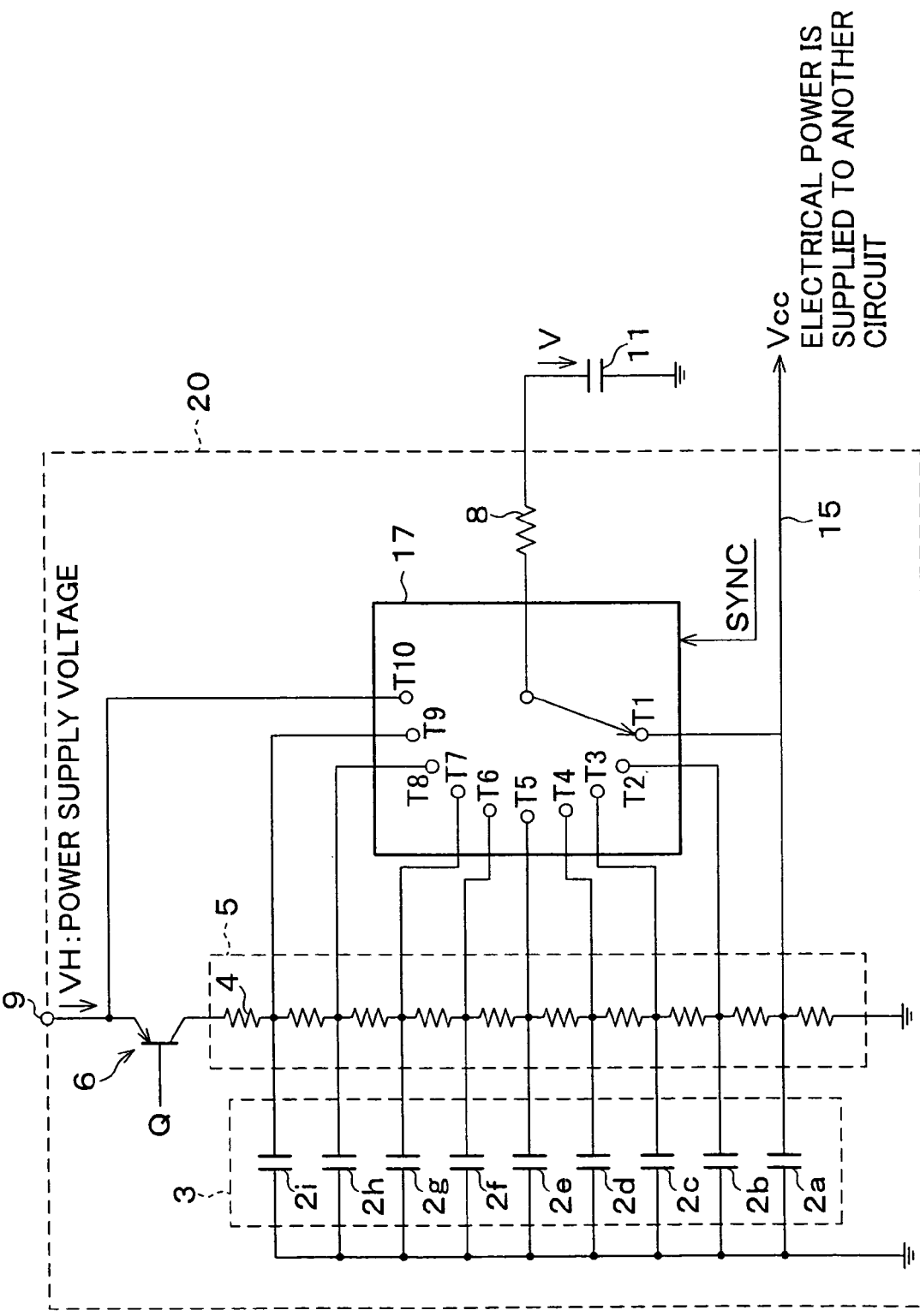
FIG. 4 is a circuit diagram showing an arrangement of a capacitive load drive circuit in accordance with another embodiment of the present invention.

The following will explain a further embodiment of the present invention with reference to FIGS. 4, 5(*a*) to 5(*c*), and 6(*a*) to 6(*d*). Note that, for convenience, members having the same functions as those used in Embodiment 1 will be given the same reference symbols, and explanation thereof will be omitted here.

As shown in FIG. 4, a capacitive load drive circuit 20 of the present embodiment has the same arrangement as the capacitive load drive circuit 1 of Embodiment 1 except that a switch (switching means) 17 is provided instead of the switch 7 of Embodiment 1.

The switch 17 has the same arrangement as the rotary switch 7 of Embodiment 1 except that the contact point T0 is omitted.

Namely, when lowering (discharging) the voltage V of the condenser 11, the switch 7 of Embodiment 1 is switched to the contact point T1 so as to cause the voltage V of the condenser 11 to be the voltage V1, and then switched to the contact point T0 so as to lower the voltage V of the condenser 11 to the potential equal to the ground (0).

In contrast, when lowering (discharging) the voltage V of the condenser 11, the switch 17 of the present embodiment is switched to the contact point T1 so as to cause the voltage V of the condenser 11 to be the voltage V1, and then kept switched to the contact point T1 so as to keep connecting the condenser 11 and the condenser 2a having a smallest terminal voltage until the condenser 11 starts charging again.

Next, the operation of the capacitive load drive circuit 20 will be explained with reference to FIGS. 5 and 6.

FIGS. 5(*a*) through 5(*c*) are timing charts showing the operation of the capacitive load drive circuit 20. FIG. 5(*a*) is a waveform chart showing a waveform of the synchronizing signal SYNC which is supplied to the switch 17. FIG. 5(*b*) is a waveform chart showing a waveform of the control voltage Q of the transistor 6, which controls the operation of the transistor 6. FIG. 5(*c*) is a waveform chart showing a waveform of the voltage V which is applied to the condenser 11.

FIGS. 6(*a*) through 6(*d*), which show enlarged parts of the timing charts shown in FIGS. 5(*a*) through 5(*c*), illustrate how the switch 17 operates. FIG. 6(*a*) is an enlarged waveform chart showing a part of the waveform of the synchronizing signal SYNC shown in FIG. 5(*a*). FIG. 6(*b*) is a timing chart showing how the switch 17 of FIG. 4 operates, namely, which one of the contact points T0 through T10 is connected. FIG. 6(*c*) is an enlarged waveform chart showing a part of the waveform of the control voltage Q shown in FIG. 5(*b*). FIG. 6(*d*) is an enlarged waveform chart showing a part of the waveform of the voltage V shown in FIG. 5(*c*).

Figure 3:
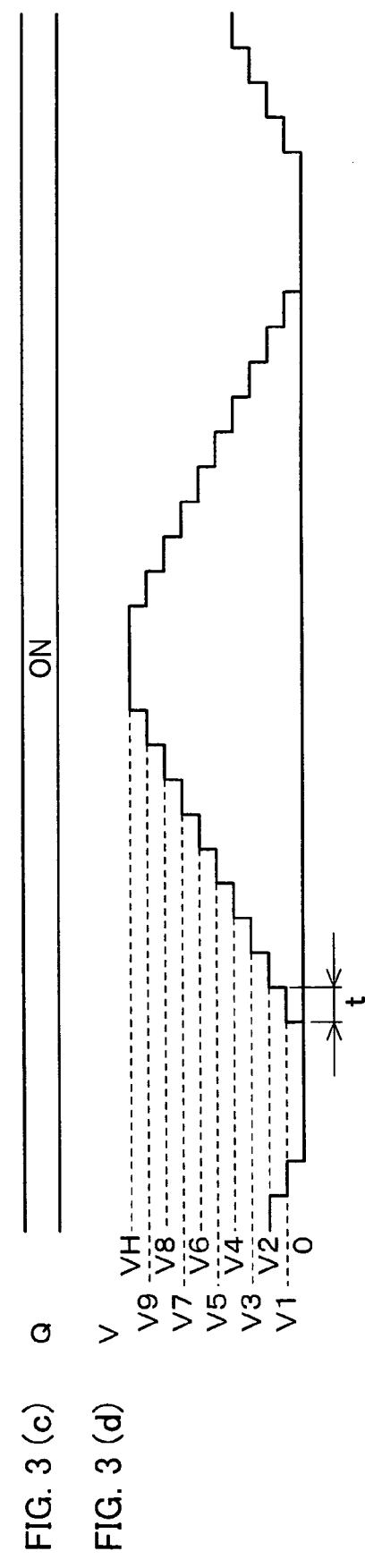
FIGS. 3(a) through 3(d), which show enlarged parts of the timing charts shown in FIGS. 2(a) through 2(c), illustrate how a switch operates.

As is understood from comparison between FIGS. 3(*a*) through 3(*d*) and FIGS. 6(*a*) through 6(*d*), the capacitive load drive circuit 20 of the present embodiment operates in the same manner as the capacitive load drive circuit 1 of Embodiment 1 except that the switch 17 is switched to the contact T1 so as to cause the voltage V of the condenser 11 to be V1, during the period in which the switch 7 is switched to the contact point T0 in the capacitive load drive circuit 1 of Embodiment 1.

Specifically, in preparatory operation before starting the driving operation of the condenser 11, the control voltage Q becomes a high level as shown in FIG. 5(*b*), so as to switch ON the transistor 6. With this, the predetermined voltages V1 through V9 are applied to the condensers 2a through 2i of the accumulating device 3 as terminal voltages, so as to charge the condensers 2a through 2i. Here, the switch 17 is switched to the contact point T1. As a result, the voltage V of the condenser 11 rises to the voltage V1.

Next, the synchronizing signal SYNC is activated as shown in FIG. 5(*a*), so as to start the driving operation. Then, by sequentially switching the switch 17 from the contact point T1 through the contact point T9, the condensers 2b through 2i sequentially supply electrostatic energy to the condenser 11, so as to raise the voltage V of the condenser 11 from the voltage V1 to the voltage V9. Next, when the switch 17 is switched form the contact point T9 to the contact point T10, the condenser 11 is connected to the power supply terminal 9, so that the voltage V applied to the condenser 11 equals to the power supply voltage VH from the outside.

Next, the switch 17 is kept switched to the contact point T10 so as to hold the voltage V of the condenser 11 at the power supply voltage VH, then the switch 17 is sequentially switched from the contact point T10 through the contact point T1. With this, the condensers 2a through 2i sequentially collect energy from the condenser 11, so as to lower the voltage V of the condenser 11 from the voltage VH to the voltage V1.

Then, the voltage V1, which is not 0, keeps being applied to the condenser 11 until the voltage V of the condenser 11 rises again, as described above. Because of this, it is possible to retain the electrostatic energy which is accumulated in the condenser 11, without discarding the electrostatic energy.

As described above, the output voltage V is stepped up by sequentially switching the switch 17; the output voltage V is then stepped down to the voltage V1 which is not 0 by sequentially switching the switch 17 reversely; and this voltage is retained until the next step-up. With this arrangement, the electrostatic energy accumulated in the condenser 11 can be retained and is not discarded. As a result, the condensers 2a through 2i of the accumulating device 3 can collect almost all of the electrostatic energy accumulated in the condenser 11, thereby further improving the efficiency in collecting electrostatic energy.

In the capacitive load drive circuit 20 of the present embodiment, the condenser 11 retains, as accumulated, electrostatic energy corresponding to the voltage V1 at the last step-down, namely when the switch 17 is switched to the contact point T1. Thus, the electrostatic energy accumulated in the condenser 11 can be supplied to other capacitive load or circuit, when the switch 17 is switched to the contact point T1. Specifically, the electrostatic energy that the condenser 2a collects from the condenser 11 can be supplied to an external element other than the condenser 11 via an energy output path 15 that is connected to the condenser 2a having the smallest terminal voltage, as shown in FIG. 4. This can reduce energy consumption of a whole apparatus including the capacitive load drive circuit 20 and the external element. This can also correct imbalance between energy supply and energy collection in the condenser 2a.

As a result, almost all of the electrostatic energy accumulated in the condenser 11 can be reused. This can further improve efficiency in reusing electrostatic energy. Note that, the external element other than the condenser 11 may be, for example, a memory circuit that consumes electrical power.

Embodiment 2A

The following will explain yet another embodiment of the present invention with reference to FIGS. 72, 73(a) to 73(c), and 74(a) to 74(d). Note that, for convenience, members having the same functions as those used in Embodiment 1, 1A, or 2 will be given the same reference symbols, and explanation thereof will be omitted here.

A capacitive load drive circuit 20A of the present embodiment has the same arrangement as the capacitive load drive circuit 20 of Embodiment 2 except the following differences.

Figure 72:
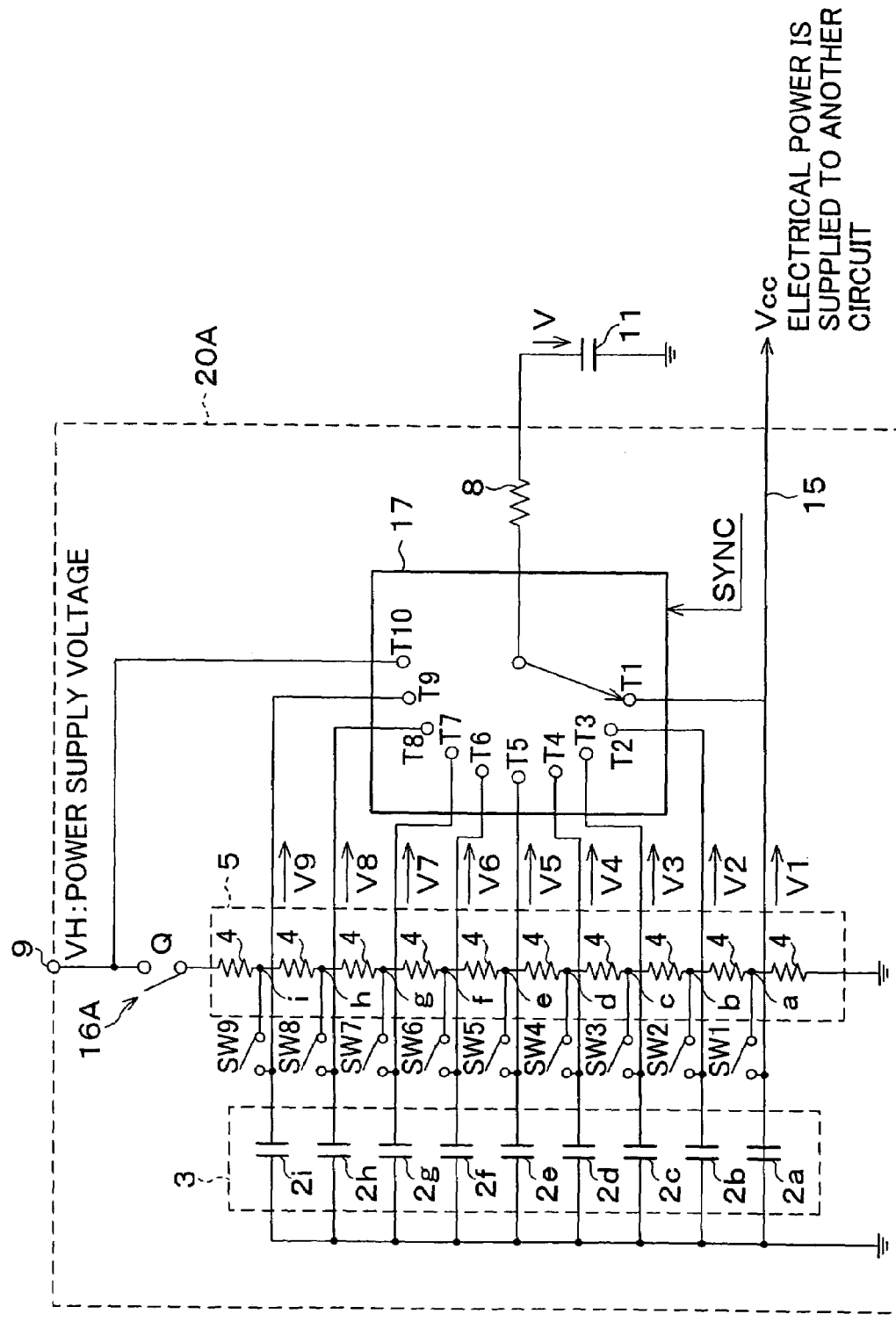
FIG. 72 is a circuit diagram showing an arrangement of a capacitive load drive circuit in accordance with still another embodiment of the. present invention.

As a first difference, switches SW1 through SW9, which are similar to those in Embodiment 1A, are respectively provided between (i) nine connection points (voltage dividing points) a through i of the voltage divider 5 and (ii) lines that respectively connect to the contact points T1 through T9 in a capacitive load drive circuit 20A of the present embodiment, as shown in FIG. 72; whereas the nine connection points (voltage dividing points) a through i of the voltage divider 5 are directly connected to the lines that respectively connect to the contact points T1 through T9 in the capacitive load drive circuit 20 of Embodiment 2.

As a second difference, the capacitive load drive circuit 20 of Embodiment 2 is provided with the transistor 6, and operates in accordance with the timing charts shown in FIGS. 5 and 6, but the capacitive load drive circuit 20A is provided with a switch 16A as in Embodiment 1A, instead of the transistor 6, and operates in accordance with timing charts shown in 73(a) to 73(c), or 74(a) to 74(d).

FIGS. 73(a) through 73(c) are timing charts showing the operation of the capacitive load drive circuit 20A. FIG. 73(a) is a waveform chart showing a waveform of the synchronizing signal SYNC which is supplied to the switch 7. FIG. 73(b) is a waveform chart showing a waveform of the control voltage Q, which controls the operation of the switch 16A. FIG. 73(c) is a waveform chart showing a waveform of the voltage V which is applied to the condenser 11.

FIGS. 74(a) through 74(d) show another operation example of the capacitive load drive circuit 20A. FIG. 74(a) is an enlarged waveform chart showing a part of the waveform of the synchronizing signal SYNC shown in FIG. 73(a). FIG. 74(b) is a timing chart showing how the switch 7 of FIG. 1 operates, namely, which one of the contact points T0 through T10 is connected. FIG. 74(c) is an enlarged waveform chart showing a part of the waveform of the control voltage Q which controls the operation of the switch 16A. FIG. 74(d) is an enlarged waveform chart showing a part of the waveform of the voltage V shown in FIG. 73(c).

Note that, the operation example of FIGS. 73(a) through 73(c) differs from the operation example of FIGS. 74 (a) through 74(d) in the same manner that the operation example of FIGS. 70(a) through 70(c) differs from the operation example of FIGS. 71(a) through 71(d).

In the capacitive load drive circuit 20A of the present embodiment, the condenser 11 retains, as accumulated, electrostatic energy corresponding to the voltage V1 at the last step-down, namely when the switch 17 is switched to the contact point T1. Thus, the electrostatic energy accumulated in the condenser 11 can be supplied to another capacitive load or circuit, when the switch 17 is switched to the contact point T1. Specifically, the electrostatic energy that the condenser 2a collects from the condenser 11 can be supplied to an external element other than the condenser 11 via an energy output path 15 that is connected to the condenser 2a having the smallest terminal voltage, as shown in FIG. 72. This can reduce energy consumption of a whole apparatus including the capacitive load drive circuit 20 and the external element. This can also correct imbalance between energy supply and energy collection in the condenser 2a.

As a result, almost all of the electrostatic energy accumulated in the condenser 11 can be reused. This can further improve efficiency in reusing electrostatic energy. Note that, other than the condenser 11, the external element includes a memory circuit that consumes electrical power, for example.

Further, energy is not supplied from another circuit to the accumulating device 3 between rising and falling edges of the voltage pulse in the present embodiment, as a result of the foregoing first and second differences. This can prevent lowering of efficiency of the accumulating device 3 in collecting energy from the condenser 11, the lowering caused by the energy supply from the other circuit.

Embodiment 3

Figure 7:
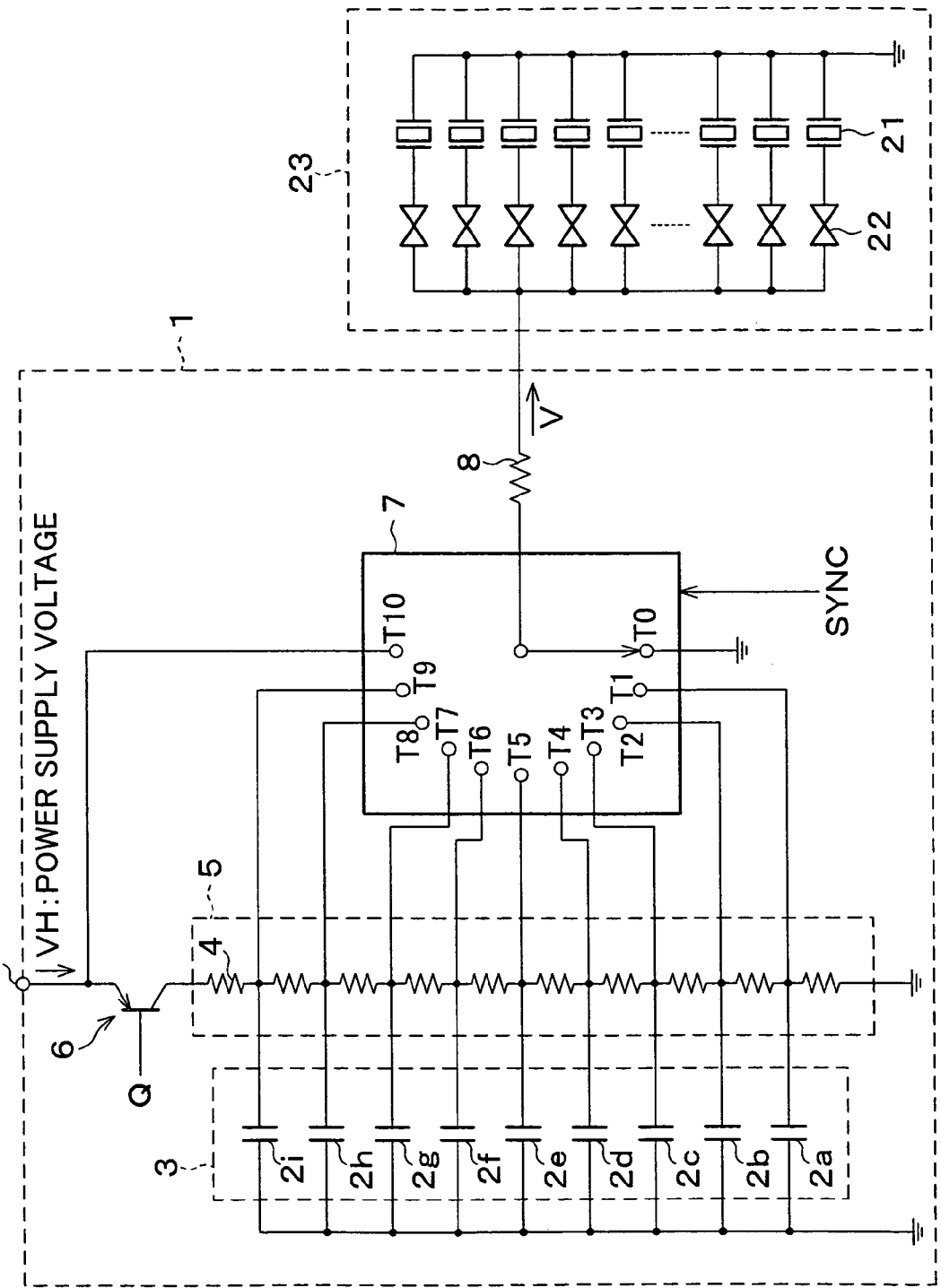
FIG. 7 is a circuit diagram showing an arrangement of a capacitive load drive circuit in accordance with a further embodiment of the present invention.

The following will explain still another embodiment of the present invention with reference to FIG. 7. Note that, for convenience, members having the same functions as those used in Embodiment 1 will be given the same reference symbols, and explanation thereof will be omitted here.

Figure 75:
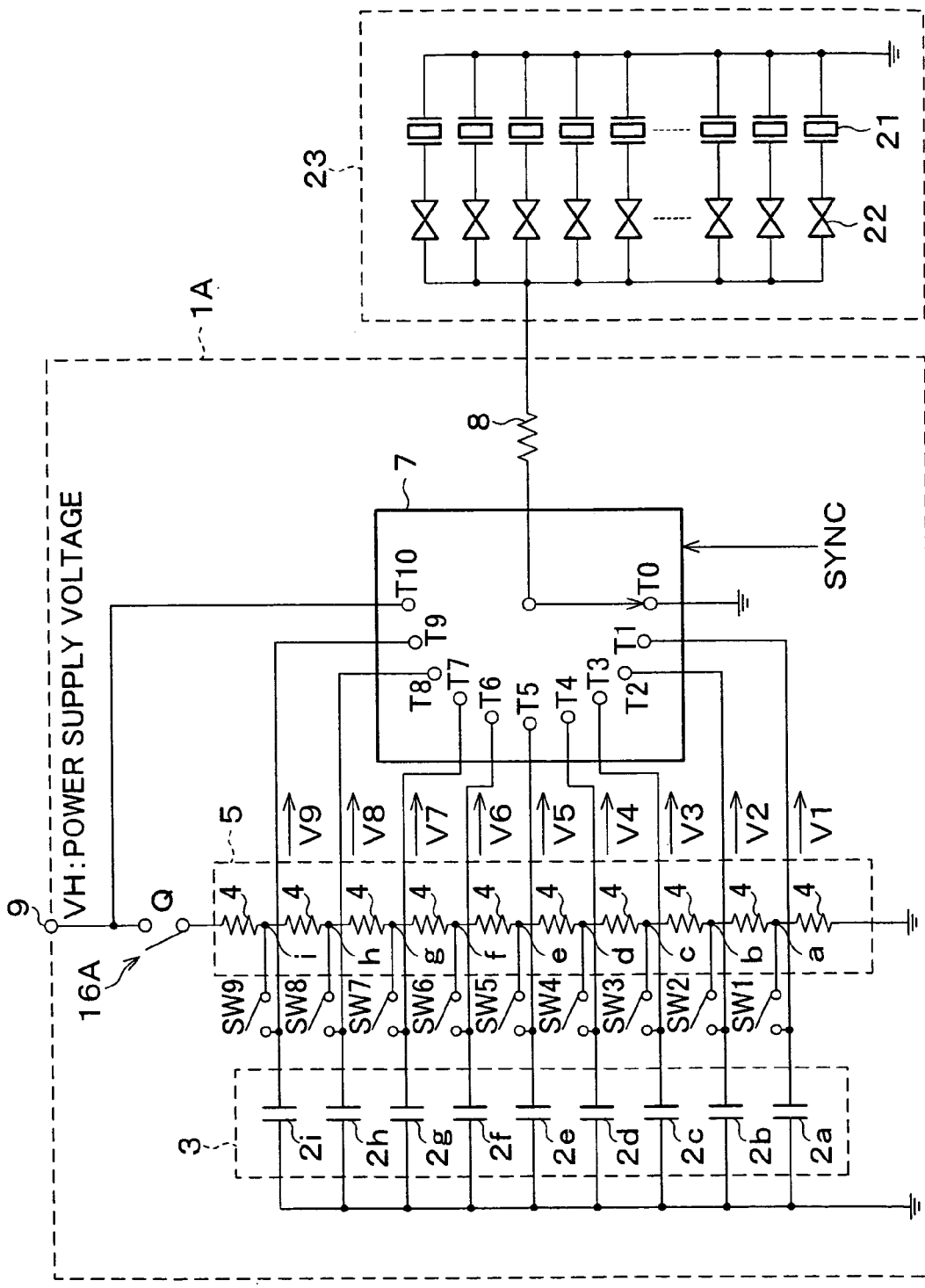
FIG. 75 is a circuit diagram showing an arrangement of a capacitive load drive circuit in accordance with yet another embodiment of the present invention.

As shown in FIG. 7, a capacitive load drive circuit of the present embodiment is either the capacitive load drive circuit 1 of Embodiment 1 or the capacitive load drive circuit 1A of Embodiment 1A shown in FIG. 75.

The present embodiment is the same as Embodiments 1 and 1A except for an arrangement of the capacitive load driven by the capacitive load drive circuit 1 or 1A. In other words, the present embodiment differs form Embodiments 1 and 1A only in methods for using the capacitive load drive circuit 1 or 1A.

Namely, the capacitive load to be driven is the condenser 11 in Embodiment 1 or 1A; whereas the capacitive load to be driven is a plurality of piezoids 21 provided in an ink-jet head 23, as shown in FIGS. 7 and 75. In addition to the piezoids 21, the ink-jet head 23 is provided with analog switches 22 for connecting/disconnecting the capacitive load drive circuit 1 or 1A and the piezoids 21.

According to this method, the piezoids 21 having a high dielectric constant and a high capacitance are charged and discharged. With this, it is possible to collect and reuse energy highly efficiently when driving the ink-jet head 23 which is driven at a high repeating frequency and which consumes large electrical power.

The following will estimate electrical power consumption for driving the ink-jet head 23 in (i) the capacitive load drive circuit 1A of the present embodiment and (ii) the conventional capacitive load drive circuit which does not collect electrostatic energy.

First, it is assumed that the ink-jet head 23 has four heads of YMCK, each of which is provided with sixty-four piezoids 21 and an ink jetting-out nozzle; and three color heads are simultaneously turned ON at most among the color heads. Here, the number of piezoids 21 connected to the capacitive load drive circuit is up to 64×3. Accordingly, when a capacitance of each piezoid 21 is 80 pF, a sum of the capacitances of the piezoids 21 which are connected to the capacitive load drive circuit at the maximum is expressed as follows.

$$80 \times 64 \times 3 = 0.0153 \ \mu F$$

Then, when a rectangular wave having a crest value of 20 V and a pulse width of 8 μs is applied to the piezoids 21 as a drive voltage in the conventional load drive circuit, a current I that flows from the capacitive load drive circuit to the piezoids 21 is expressed as follows.

$$I = 0.0153 \ \mu F \times 20 V \div 8 \ \mu s = 0.0384 A$$

Accordingly, electrical power consumption E per pulse in the conventional capacitive load drive circuit is expressed as follows.

$$E = 0.0384 A \times 20 V = 0.768 W$$

On the other hand, when the ink-jet head 23 in the capacitive load drive circuit 1A of the present embodiment operates in the same manner as that in the conventional capacitive load drive circuit, and when V1=2(V), V2=4(V), V3=6(V), V4=8(V), V5=10(V), V6=12(V), V7=14(V), V8=16(V), V9=18(V), and VH=20(V), electrical power consumption per pulse is 0.077 W.

Therefore, the capacitive load drive circuit 1A of the present embodiment consumes only a one-tenth amount of electrical power as the conventional capacitive load drive circuit. This one-tenth amount of electrical power is required for energy that is not sent back to the condensers of the accumulating device 3 and is emitted to the ground at the end. The remaining amount of energy is sent back to the condensers and is not consumed.

In the present example, a capacitance of each condenser 2 that makes up the accumulating device 3 needs to be larger than a load capacitance for driving the maximum number of piezoids 21 of the ink-jet head 23 (80×64×3=0.0153 μF in the above example) in order to sufficiently collect electrical power.

Note that, unlike a circuit which uses the LC resonance to collect electrical power, the apparatus of the present embodiment uses the condensers to collect electrical power. With this, it is possible to simultaneously drive many capacitive loads (piezoids 21) with operating characteristics (regeneration efficiency and the like) similar to those of the arrangement in which one capacitive load is driven.

Embodiment 4

The following will explain yet another embodiment of the present invention with reference to FIGS. 8, 9(a) to 9(c), 10(a) to 10(d), 11, and 12. Note that, for convenience, members having the same functions as those used in Embodiment 1 will be given the same reference symbols, and explanation thereof will be omitted here.

Figure 8:
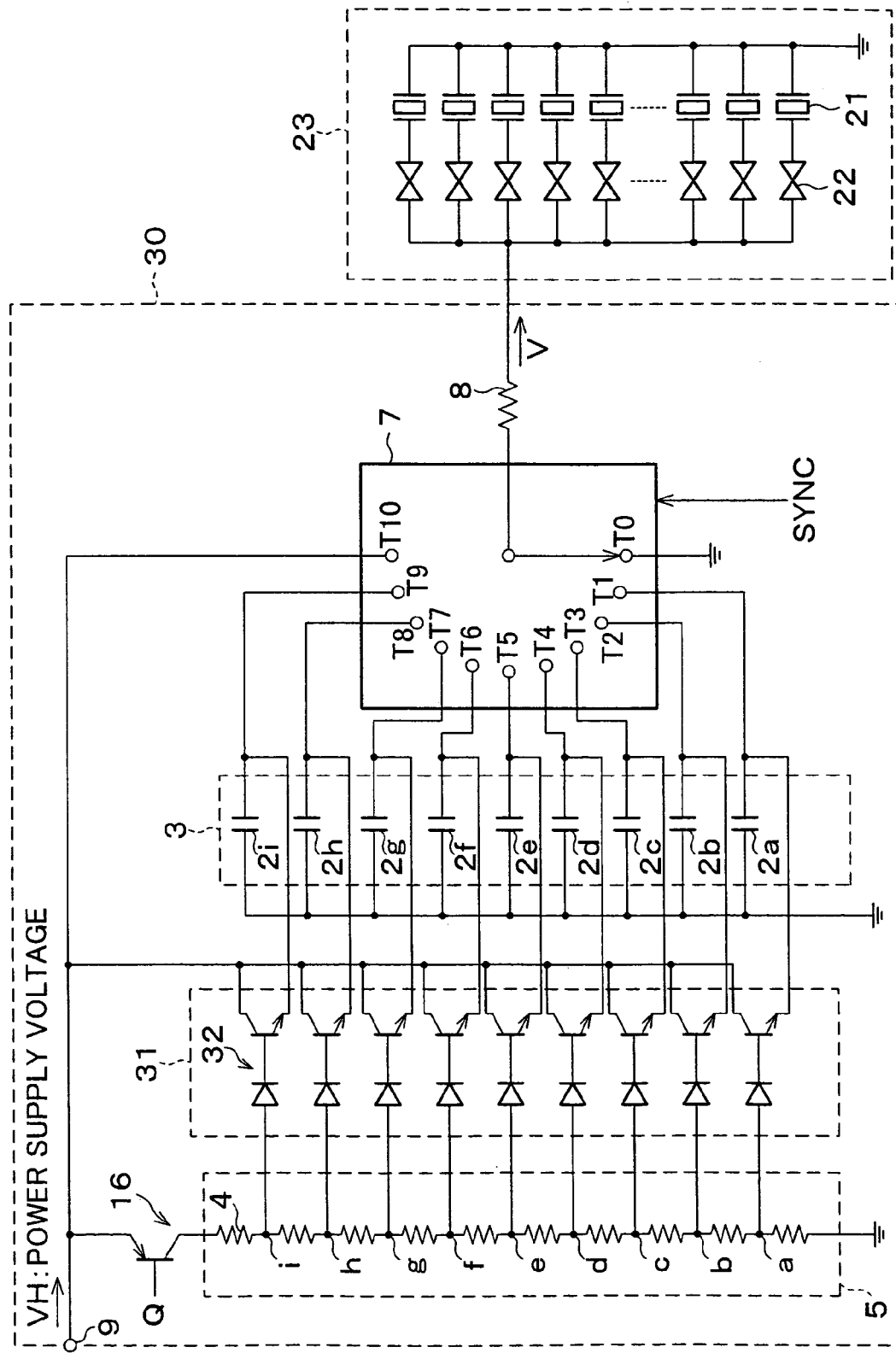
FIG. 8 is a circuit diagram showing an arrangement of a capacitive load drive circuit in accordance with yet another embodiment of the present invention.

As shown in FIG. 8, a capacitive load drive circuit 30 of the present embodiment is the same as the capacitive load drive circuit 1 of Embodiment 1 except that a buffer circuit (buffer amplification means) 31 is provided between the accumulating device 3 and the voltage divider 5, and a transistor 16 is provided instead of the transistor 6.

Further, the capacitive load driven by the capacitive load drive circuit 30 is the piezoids 21 which are provided in the ink-jet head 23 as in Embodiment 3. In addition to the piezoids 21, the ink-jet head 23 is provided with analog switches 22 as in Embodiment 3.

The voltage divider 5 divides a power supply voltage VH, which is supplied from the outside of the resistors 4, into voltages V1 through V9 using ten resistors; and outputs the voltages V1 through V9 via connection points a through i between each resistor 4.

The buffer circuit 31 is composed of nine emitter followers 32, each of which is respectively inserted between (i) the connection points a through i between each resistor 4 of the voltage divider 5 and (ii) the condensers 2a through 2i.

The buffer circuit 31 adjusts the voltages V1 through V9 of the voltage divider 5, and supplies the adjusted voltages V1' through V9' to the condensers 2a through 2i as terminal voltages. The emitter follower 32 is an NPN emitter follower that uses an NPN transistor 32a to raise the output voltages V1 through V9 to values higher than the input voltages V1' through V9'. With this, it is possible to prevent the condensers 2a through 2i of the accumulating device 3 from having the terminal voltages lower than the predetermined voltages V1' through V9', in case where the electric charge in the condensers 2a through 2i of the accumulating device 3 becomes smaller than the initial electric charge after collecting electric charge from the piezoids 21 which are driven, where the voltages V1 through V9 and VH are positive voltages. Thus, it becomes possible to precisely adjust the terminal voltages of the condensers 2a through 2i of the accumulating device 3 to the predetermined voltages V1' through V9'.

Further, the buffer circuit 31 amplifies a current flowing in the voltage divider 5 and outputs the amplified current to the condensers 2a through 2i. This can reduce the amount of currents which flow through the resistors 4 of the voltage divider 5, so as to reduce electrical power consumed at the voltage divider 5. As a result, it is possible to further reduce the electrical power consumption.

Further, the transistor 16 is a switch for switching ON/OFF the power supply to the accumulating device 3 and the voltage divider 5. The transistor 16 is switched ON only during a predetermined period (period for supplying electrostatic energy), unlike the transistor 6 of Embodiments 1 through 3.

Next, the operation of the capacitive load drive circuit 30 will be explained with reference to FIGS. 9(a) to 9(c), and FIGS. 10(a) to 10(d).

FIGS. 9(a) through 9(c) are timing charts showing the operation of the capacitive load drive circuit 30. FIG. 9(a) is a waveform chart showing a waveform of the synchronizing signal SYNC which is supplied to the switch 17. FIG. 9(b) is a waveform chart showing a waveform of the control voltage Q of the transistor 16, which controls the transistor 16. FIG. 9(c) is a waveform chart showing a waveform of the voltage V which is applied to the condenser 11.

FIGS. 10(a) through 10(d), which show enlarged parts of the timing charts shown in FIGS. 9(a) through 9(c), illustrate how the switch 7 operates. FIG. 10(a) is an enlarged waveform chart showing a part of the waveform of the synchronizing signal SYNC shown in FIG. 9(a). FIG. 10(b) is a timing chart showing how the switch 7 of FIG. 8 operates, namely, which one of the contact points T1 through T10 is connected. FIG. 10(c) is an enlarged waveform chart showing a part of the waveform of the control voltage Q shown in FIG. 9(b). FIG. 10(d) is an enlarged waveform chart showing a part of the waveform of the voltage V shown in FIG. 9(c).

First, in preparatory operation before starting the driving operation of the condenser 11, the control voltage Q becomes a high level as shown in FIG. 9(b), so as to switch ON the transistor 16. With this, the output voltages V1' through V9' of the buffer circuit 31 are applied to the condensers 2a through 2i of the accumulating device 3 as terminal voltages. Then, after a predetermined period, the control voltage turns to a low level as shown in FIG. 9(b), so as to switch OFF the transistor 16. The predetermined period is set enough to fully charge the condensers 2a through 2i.

After the transistor 16 is switched OFF, the synchronizing signal SYNC is activated as shown in FIG. 9(a), so as to start the driving operation.

The driving operation is the same as that of Embodiment 1. Specifically, by sequentially switching the switch 7 from the contact point T0 through the contact point T9, the condensers 2a through 2i sequentially supply electrostatic energy to the condenser 11, so as to raise the voltage V of the condenser 11 from 0 to the voltage V9'. Next, when the switch 7 is switched from the contact point T9 to the contact point T10, the condenser 11 is connected to the power supply terminal 9, so that the voltage V applied to the condenser 11 equals to the power supply voltage VH from the outside.

Next, the switch 7 is kept switched to the contact point T10 so as to hold the voltage V of the condenser 11 at the power supply voltage VH over a longer period than the pulse width t of the synchronizing signal SYNC, and then the switch 7 is sequentially switched from the contact point T10 through the contact point T1. With this, the condensers 2a through 2i sequentially collect energy from the condenser 11, so as to lower the voltage V of the condenser 11 from the power supply voltage VH to the voltage V1'.

Then, by switching the switch 7 from the contact point T1 to the contact point T0, the condenser 11 is grounded so that the voltage V applied to the condenser 11 becomes 0, which is equal to the ground.

After this, the transistor 16 is switched ON for the predetermined period until the condenser 11 starts a next driving operation.

In this way, the transistor 16 is switched ON for the predetermined period when the drive voltage is not applied to the condenser 11, namely when the condenser 11 is grounded. With this, the power supply voltage VH is applied to the voltage divider 5 only during the predetermined period, thereby further reducing electrical power consumption.

Note that, the capacitive load drive circuit 30 of the present embodiment is provided with the NPN emitter follower 32 that raises the output voltages V1' through V9' to values higher than the input voltages V1 through V9 by using the NPN transistor 32a, in order to deal with the drop of the positive voltage.

Figure 11:
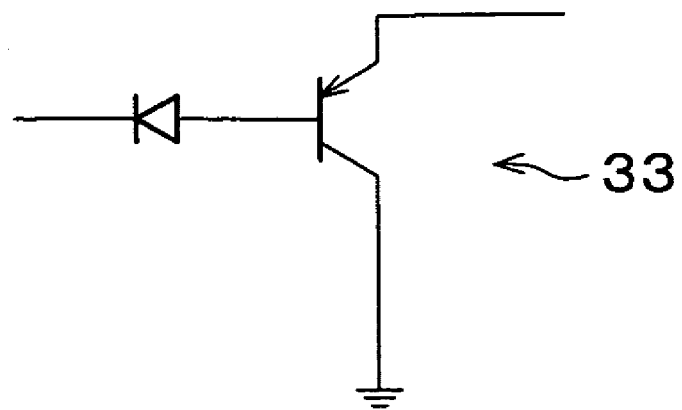
FIG. 11 is a circuit diagram showing an arrangement of an emitter follower used in a modification of the capacitive load drive circuit of FIG. 8.

When a negative voltage drops (absolute value of the negative voltage decreases), however, it is preferable to replace the NPN emitter follower 32 with a PNP emitter follower 33 that lowers the output voltage than the input voltage by using a PNP transistor 33a, as shown in FIG. 11. With this, it is possible to prevent the condensers 2a through 2i of the accumulating device 3 from having the terminal voltages lower than the predetermined voltages V1' through V9', in case where the electric charge in the condensers 2a through 2i of the accumulating device 3 becomes smaller than the initial electric charge after collecting electric charge from the piezoids 21 which are driven, where the voltages V1 through V9 and VH are negative voltages. Thus, it becomes possible to precisely adjust the terminal voltages of the condensers 2a through 2i of the accumulating device 3 to the predetermined voltages V1' through V9'.

Further, if a positive voltage V is outputted to the piezoids 21, the PNP emitter follower 33 as shown in FIG. 11 may be similarly used instead of the NPN emitter follower 32, in order to prevent the terminal voltages of the condensers 2a through 2i of the accumulating device 3 from being higher than the predetermined voltages V1' through V9', in case electric charge in the condensers 2a through 2i becomes larger than the initial electric charge because of the piezoelectric effect due to machine vibration, the influence of an inductive component of the load, and the like.

Figure 12:
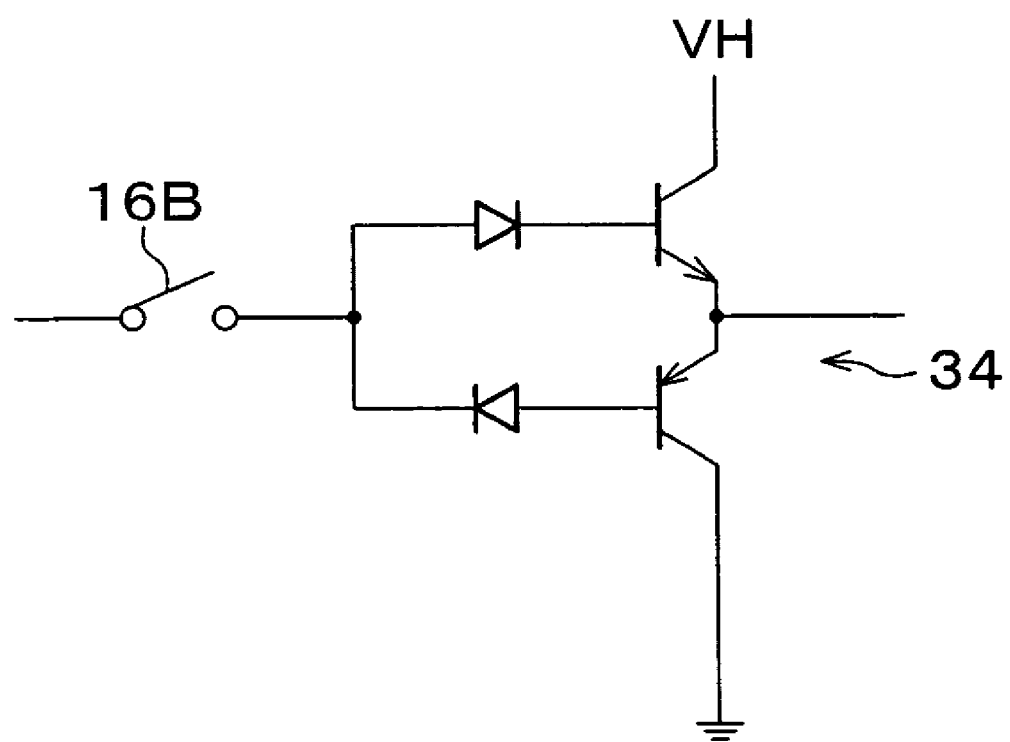
FIG. 12 is a circuit diagram showing an arrangement of an emitter follower used in another modification of the capacitive load drive circuit of FIG. 8.

Further, if it is not predictable whether the terminal voltages of the condensers 2a through 2i become higher or lower than the predetermined voltages V1' through V9' when the circuit is operated, it is preferable to use an emitter follower of a totem-pole type 34 as shown in FIG. 12, instead of the NPN emitter follower 32. With this arrangement in which a switch 16B is provided on the input side of each channel, it is possible to surely prevent the formation of an unexpected stray-current path through which a base current flows to cause the incorrect operation of the circuit.

The capacitive load drive circuit 30 of the present embodiment is provided with the emitter follower 32 as buffer amplification means (buffer means) having a voltage adjusting function, as described above. With this, it is possible to more precisely obtain the terminal voltages (V1' through V9') which are adjusted by the voltage divider 5, and reduce electrical power consumed by the voltage divider 5.

Further, in the capacitive load drive circuit 30 of the present embodiment, the transistor 16 used as the switching section applies the power supply voltage VH to the voltage divider 5 only during the predetermined period, thereby further reducing electrical power consumption.

Embodiment 4A

Figure 76:
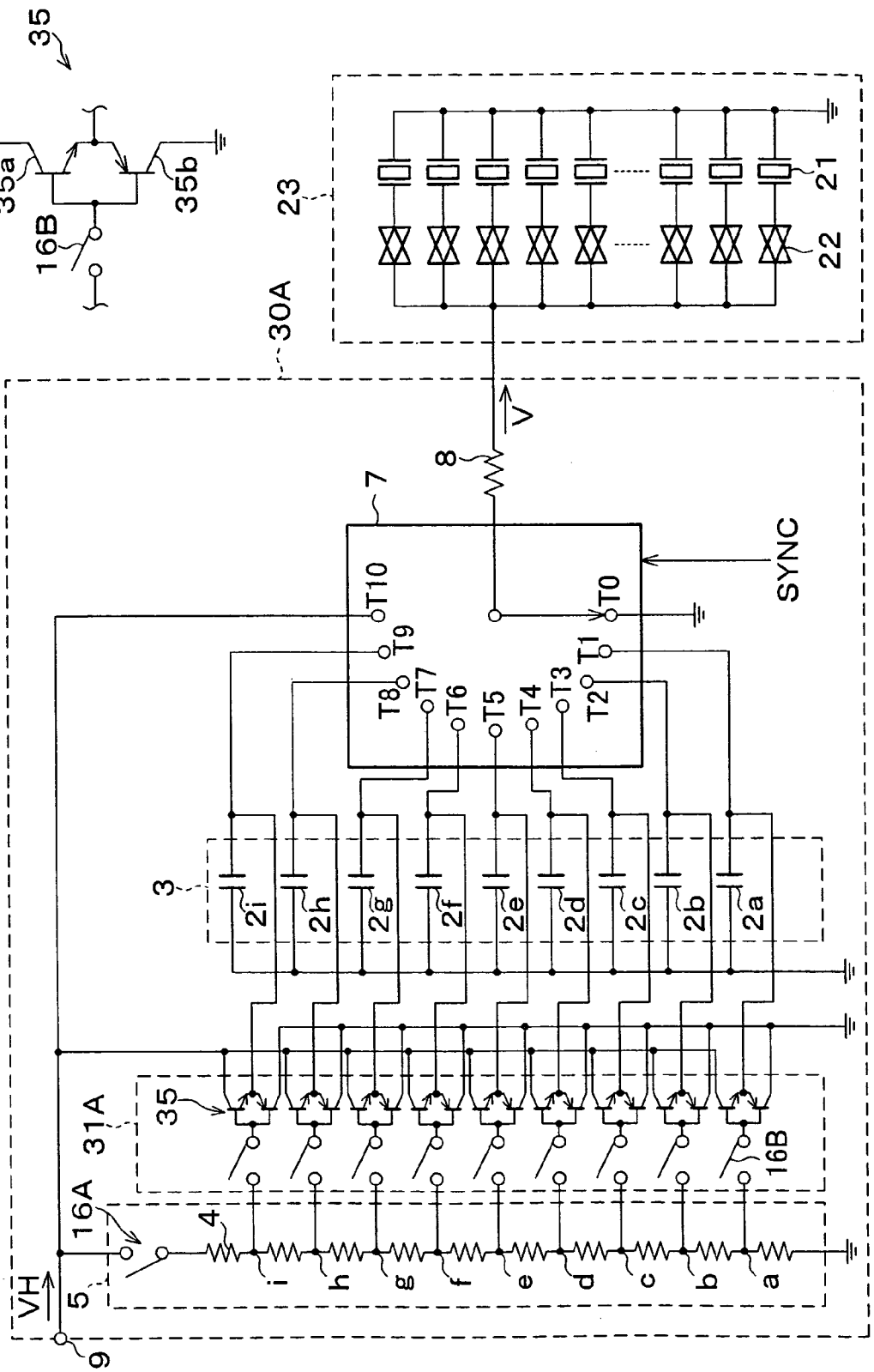
FIGS. 76(a) and 76(b) are circuit diagrams showing an arrangement of a capacitive load drive circuit in accordance with still another embodiment of the present invention.

The following will explain still another embodiment of the present invention with reference to FIGS. 76(a) and 76(b). Note that, for convenience, members having the same functions as those used in Embodiment 1, 1A, or 3 will be given the same reference symbols, and explanation thereof will be omitted here.

As shown in FIG. 76(a), a capacitive load drive circuit 30A is the same as the capacitive load drive circuit 1A of Embodiment 1A, except that a buffer circuit (buffer amplification means) 31A is provided between the accumulating device 3 and the voltage divider 5.

Further, the capacitive load driven by the capacitive load drive circuit 30A is the piezoids 21 provided in the ink-jet head 23, as in Embodiments 3 and 4. In addition to the piezoids 21, the ink-jet head 23 is provided with the analog switches 22, as in Embodiments 3 and 4.

The voltage divider 5 divides a power supply voltage VH, which is supplied from the outside of the resistors 4, into voltages V1 through V9 using ten resistors; and outputs the voltages V1 through V9 via connection points a through i between each resistor 4.

The buffer circuit 31A is composed of nine push-pulls 35, each of which is respectively inserted between (i) the connection points a through i between each resistor 4 of the voltage divider 5 and (ii) the condensers 2a through 2i.

The buffer circuit 31A adjusts the voltages V1 through V9 of the voltage divider 5, and supplies the adjusted voltages V1' through V9' to the condensers 2a through 2i as terminal voltages. The push-pull 35 is an emitter follower that uses an NPN transistor 35a and a PNP transistor 35b to tune the output voltages V1 through V9 to the input voltages V1' through V9', as shown in FIG. 76(b). With this, it is possible to prevent the condensers 2a through 2i of the accumulating device 3 from having the terminal voltages lower than the predetermined voltages V1' through V9', in case where the electric charge in the condensers 2a through 2i of the accumulating device 3 becomes smaller than the initial electric charge after collecting electric charge from the piezoids 21 which are driven, where the voltages V1 through V9 and VH are positive voltages. Thus, it is possible to precisely adjust the terminal voltages of the condensers 2a through 2i of the accumulating device 3 to the predetermined voltages V1' through V9'. Conversely, it is also possible to prevent the condensers 2a through 2i of the accumulating device 3 from having the terminal voltages higher than the predetermined voltages V1' through V9', in case where the electric charge in the condensers 2a through 2i of the accumulating device 3 becomes larger than the initial electric charge after collecting electric charge from the piezoids 21 which are driven. Thus, it is possible to precisely adjust the terminal voltages of the condensers 2a through 2i of the accumulating device 3 to the predetermined voltages V1' through V9'.

Further, the buffer circuit 31A amplifies a current flowing in the voltage divider 5 and outputs the amplified current to the condensers 2a through 2i. This can reduce the amount of currents which flow through the resistors 4 of the voltage divider 5, so as to reduce electrical power consumed by the voltage divider 5. As a result, it is possible to further reduce the electrical power consumption.

The operation of the switch 16A is controlled by the control voltage Q whose waveform is shown in FIGS. 9(b) and 10(b).

The driving operation is the same as that of Embodiment 1A. Specifically, by sequentially switching the switch 7 from the contact point T0 through the contact point T9, the condensers 2a through 2i sequentially supply electrostatic energy to the piezoids 21, so as to raise the voltage V of the piezoids 21 from 0 to the voltage V9'. Next, when the switch 7 is switched from the contact point T9 to the contact point T10, the piezoids 21 are connected to the power supply terminal 9, so that the voltage V applied to the piezoids 21 equals to the power supply voltage VH from the outside.

Next, the switch 7 is kept switched to the contact point T10 so as to hold the voltage V of the piezoids 21 at the power supply voltage VH over a longer period than the pulse width t of the synchronizing signal SYNC, and then the switch 7 is sequentially switched from the contact point T10 through the contact point T1. With this, the condensers 2a through 2i sequentially collect energy from the piezoids 21, so as to lower the voltage V of the piezoids 21 from the power supply voltage VH to the voltage V1'.

Then, by switching the switch 7 from the contact point T1 to the contact point T0, the piezoids 21 are grounded so that the voltage V applied to the piezoids 21 becomes 0, which is equal to the ground.

The capacitive load drive circuit 30A of the present embodiment is provided with the push-pulls 35 as buffer amplification means (buffer means) having a voltage adjusting function, as described above. With this, it is possible to more precisely obtain the terminal voltages (V1' through V9') which are adjusted by the voltage divider 5, and reduce electrical power consumed by the voltage divider 5.

Embodiment 5

Next, the following will explain yet another embodiment of the present invention with reference to FIGS. 13 and 14(a) to 14(c). Note that, for convenience, members having the same functions as those used in Embodiment 1 will be given the same reference symbols, and explanation thereof will be omitted here.

Figure 13:
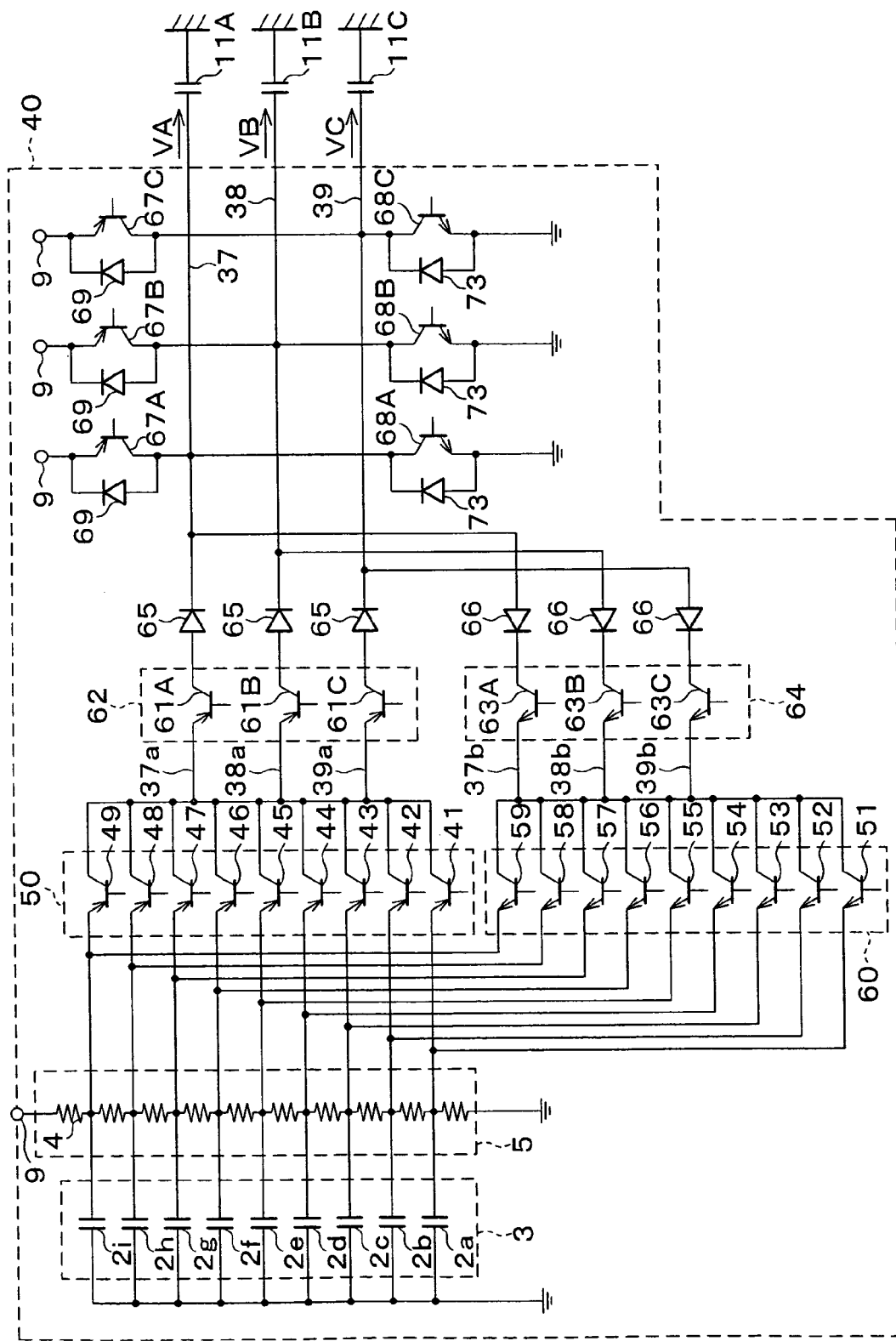
FIG. 13 is a circuit diagram showing an arrangement of a capacitive load drive circuit in accordance with still another embodiment of the present invention.
Figure 15:
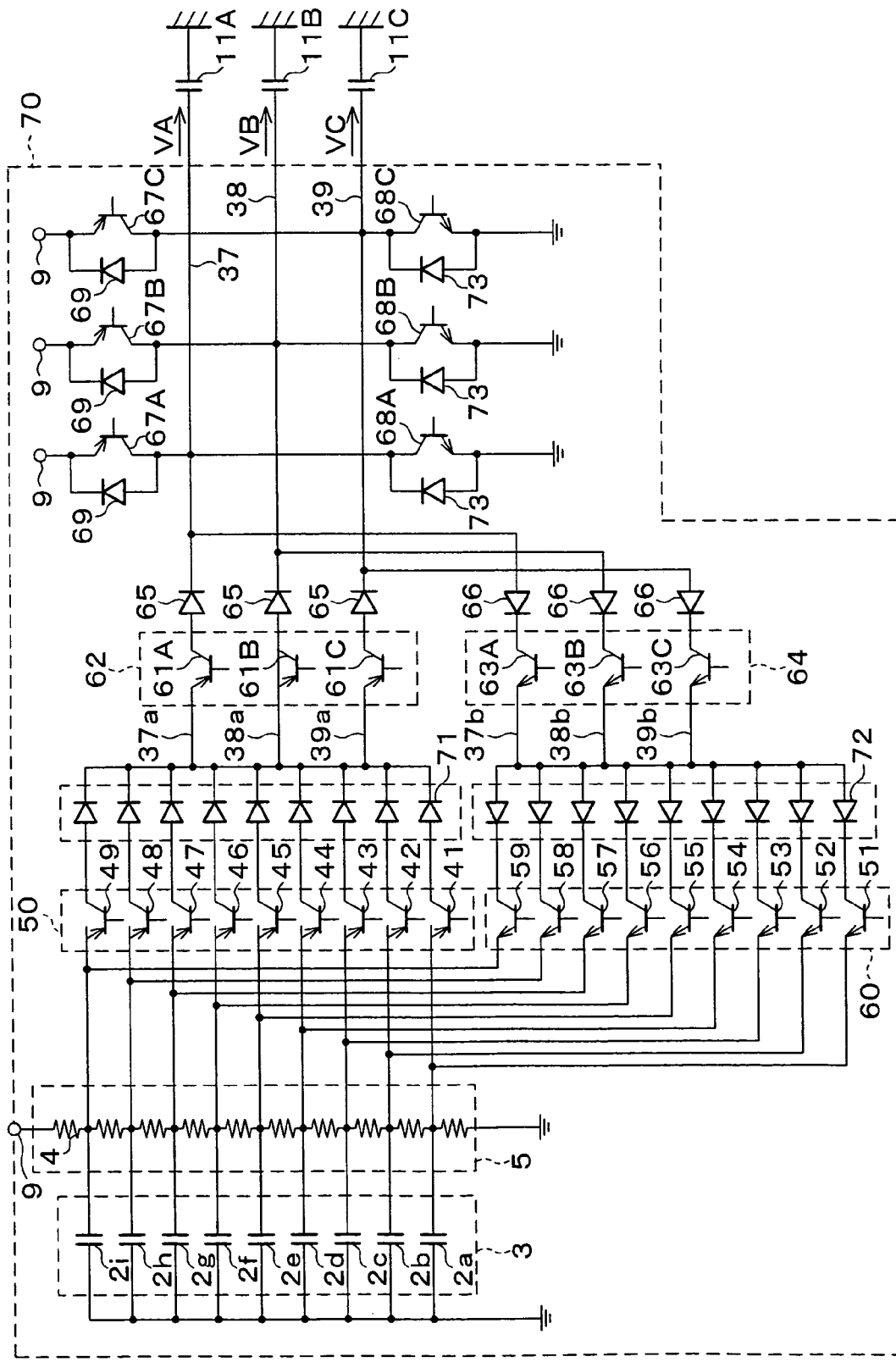
FIG. 15 is a circuit diagram showing an arrangement of a capacitive load drive circuit in accordance with yet another embodiment of the present invention.

As shown in FIG. 13, a capacitive load drive circuit 40 of the present embodiment is provided with the accumulating device 3 composed of the condensers 2a through 2i, and the voltage divider 5 composed of the resistors 4 each having a resistance of 1 kΩ, for example, like the capacitive load drive circuit 1 of Embodiment 1.

The capacitive load drive circuit 40 of the present embodiment applies voltages VA, VB, and VC having different phases from one another, respectively to condensers 11A, 11B, and 11C which are capacitive loads, so as to charge and discharge the condensers 11A, 11B, and 11. In other words, the capacitive load to be driven is divided into three phases: namely, the condenser 11A to which the voltage VA in A phase is applied, the condenser 11B to which the voltage VB in B phase is applied, and the condenser 11C to which the voltage VC in C phase is applied.

In the present embodiment, unlike previous Embodiments, output lines 37, 38, and 39 through which the accumulating device 3 and the voltage divider 5 output the voltages VA, VB, and VC to the condensers 11A, 11B, and 11C, respectively, are separated into two different kinds of paths. Namely, the output lines 37, 38, and 39 are separated into (i) charge paths (energy supplying path) 37a, 38a, and 39a through which the accumulating device 3 supplies electrostatic energy to the condensers 11A, 11B, and 11C, and (ii) discharge paths (energy collecting path) 37b, 38b, and 39b through which the accumulating device 3 collects electrostatic energy from the condensers 11A, 11B, and 11C.

The charge paths 37a, 38a, and 39a are provided with rectifying diodes (rectifying means) 65 that regulate a current to flow in a direction from the accumulating device 3 toward the condensers 11A, 11B, and 11C; whereas the discharge paths 37b, 38b, and 39b are provided with rectifying diodes (rectifying means) 66 that regulate a current to flow in a direction from the condensers 11A, 11B, and 11C toward the accumulating device 3. With this, a voltage from the accumulating device 3 is applied to the capacitive load via the charge paths 37a, 38a, and 39a, and electrostatic energy discharged from the condensers 11A, 11B, and 11C are sent back to the accumulating device 3 via the discharge paths 37b, 38b, and 39b.

Further, instead of the rotary switch 7 in Embodiment 1, the capacitive load drive circuit 40 of the present embodiment is provided with (A) transistors 67A, 67B, 67C, 68A, 68B, and 68C, (B) switching circuits (switching means) 50 composed of nine transistors 41 through 49 and switching circuits (switching means) 60 composed of nine transistors 51 through 59, (C) a selecting circuit (selecting means) 62 composed of transistors 61A, 61B, and 61C, and (D) a selecting circuit (selecting means) 64 composed of transistors 63A, 63B, and 63C.

The transistors 67A, 67B, and 67C correspond to the contact point T10 of the switch 7 in Embodiment 1. The transistors 67A, 67B, and 67C supply the power supply voltage VH which is sent from the power supply terminal 9 to the condensers 11A, 11B, and 11C via the output lines 37, 38, and 39; and are switched ON only during a period corresponding to the period when the switch 7 is switched to the contact point T10 in Embodiment 1. Note that, the transistors 67A, 67B, and 67C are provided with diodes 69 for protecting the transistors 67A, 67B, and 67C.

The transistors 68A, 68B, and 68C correspond to the contact point T0 of the switch 7 in Embodiment 1. The transistors 68A, 68B, and 68C ground the condensers 11A, 11B, and 11C via the output lines 37, 38, and 39; and are switched ON only during a period corresponding to the period when the switch 7 is switched to the contact point T0 in Embodiment 1. Note that, the transistors 68A, 68B, and 68C are provided with diodes 73 for protecting the transistors 68A, 68B, and 68C.

The nine transistors 41, 42, 43, 44, 45, 46, 47, 48, and 49 of the switching circuit 50 and the nine transistors 51, 52, 53, 54, 55, 56, 57, 58, and 59 of the switching circuit 60 respectively correspond to the contact points T1, T2, T3, T4, T5, T6, T7, T8, and T9 of the switch 7 in Embodiment 1.

The switching circuit 50 is provided at the charge paths 37a, 38a, and 39a. The transistors 41, 42, 43, 44, 45, 46, 47, 48, and 49 respectively have one ends respectively connected to the condensers 2a, 2b, 2c, 2d, 2e, 2f, 2g, 2h, and 2i via the voltage divider 5, and the other ends commonly connected to the transistors 61A, 61B, and 61C to be described later. The transistors 41, 42, 43, 44, 45, 46, 47, 48, and 49 are switched ON only during periods corresponding to the periods where the switch 7 is switched to the contact points T1, T2, T3, T4, T5, T6, T7, T8, and T9, respectively, during the period (charge period) in which the voltage is stepped up in Embodiment 1.

The switching circuit 60 is provided at the discharge paths 37b, 38b, and 39b. The transistors 51, 52, 53, 54, 55, 56, 57, 58, and 59 have one ends respectively connected to the condensers 2a, 2b, 2c, 2d, 2e, 2f, 2g, 2h, and 2i via the voltage divider 5, and the other ends commonly connected to the transistors 63A, 63B, and 63C to be described later. The transistors 51, 52, 53, 54, 55, 56, 57, 58, and 59 are switched ON only during periods corresponding to the periods where the switch 7 is switched to the contact points T1, T2, T3, T4, T5, T6, T7, T8, and T9, respectively, during the period (discharge period) in which the voltage is stepped down in Embodiment 1.

Thus, only one of the transistor 68A (or 68B or 68C), the transistor 67A (or 67B or 67C), the transistors 41, 42, 43, 44, 45, 46, 47, 48, and 49, and the transistors 51, 52, 53, 54, 55, 56, 57, 58, and 59 is selectively switched ON. Further, the transistors 68A (or 68B or 68C), 41, 42, 43, 44, 45, 46, 47, 48, 49, 67A (or 67B or 67C), 59, 58, 57, 56, 55, 54, 53, 52, 51, and 68A (or 68B or 68C) are sequentially selected in this order. Accordingly, pulse voltages stepping up and down in an approximately trapezoidal shape as shown in FIGS. 14(a) through 14(c) are applied to the condensers 11A, 11B, and 11C as the voltages VA, VB, VC, as in Embodiment 1. Further, the condensers 2a, 2b, 2c, 2d, 2e, 2f, 2g, 2h, and 2i supply electrostatic energy to the condensers 11A, 11B, and 11C when the voltages VA, VB, and VC rise, and the condensers 2a, 2b, 2c, 2d, 2e, 2f, 2g, 2h, and 2i collect electrostatic energy from the condensers 11A, 11B, and 11C when the voltages VA, VB, and VC fall, as in Embodiment 1.

The selecting circuit 62 is provided at the charge paths 37a, 38a, and 39a, and switches ON/OFF the transistors 61A, 61B, and 61C provided inside, so as to selectively charge one of the condensers 11A through 11C. By using, as switches, the transistors 61A, 61B, and 61C provided at the charge paths 37a, 38a, and 39a, an output voltage of the switching circuit 50 can be selectively applied to one of the condensers 11A through 11C, thereby charging the condensers 11A through 11C at different timings.

The selecting circuit 64 is provided at the discharge paths 37b, 38b, and 39b, and switches ON/OFF the transistors 63A, 63B, and 63C provided inside, so as to selectively charge one of the condensers 11A through 11C. By using, as switches, the transistors 63A, 63B, and 63C provided at the discharge paths 37b, 38b, and 39b, an output voltage of the switching circuit 60 can be selectively applied to one of the condensers 11A through 11C, thereby charging the condensers 11A through 11C at different timings.

An example of such an operation is shown in timing charts of FIGS. 14(a), 14(b), and 14(c). FIGS. 14(a), 14(b), and 14(c) respectively show how the voltages VA, VB, and VC, which are applied to the condensers 11A, 11B, and 11C, respectively, change as time elapses. The transistors 61A, 61B, and 61C provided at the charge paths 37a, 38a, and 39a, and the transistors 63A, 63B, and 63C provided at the discharge paths 37b, 38b, and 39b are used as switches to adjust the ON/OFF timings, so as to drive the condensers 11A through 11C at the timings shown in FIGS. 14(a) through 14(c).

As described above, in the capacitive load drive circuit 40 of the present embodiment, the condensers 2a, 2b, 2c, 2d, 2e, 2f, 2g, 2h, and 2i can collect and reuse most of the electrostatic energy which are accumulated in the condensers 11A, 11B, and 11C, as in Embodiment 1.

Further, the capacitive load drive circuit 40 of the present embodiment is provided with the selecting circuits 62 and 64 for selecting the plurality of condensers 11A through 11C, so as to apply voltages to the plurality of condensers 11A through 11C at different timings.

Further, the capacitive load drive circuit 40 of the present embodiment is so arranged that the charge paths 37a, 38a, and 39a and the discharge paths 37b, 38b, and 39b are separated from each other.

With this, it is possible to control the timing for charging and the timing for discharging independently, so as to allow one condenser 11B to be charged during a discharge period of the other condenser 11A, as shown in FIGS. 14(a) through 14(c). Further, by separating the charge paths 37a, 38a, and 39a and the discharge paths 37b, 38b, and 39b from each other, it is possible to optimize the charge characteristic and the discharge characteristic independently.

Embodiment 5A

Figure 77:
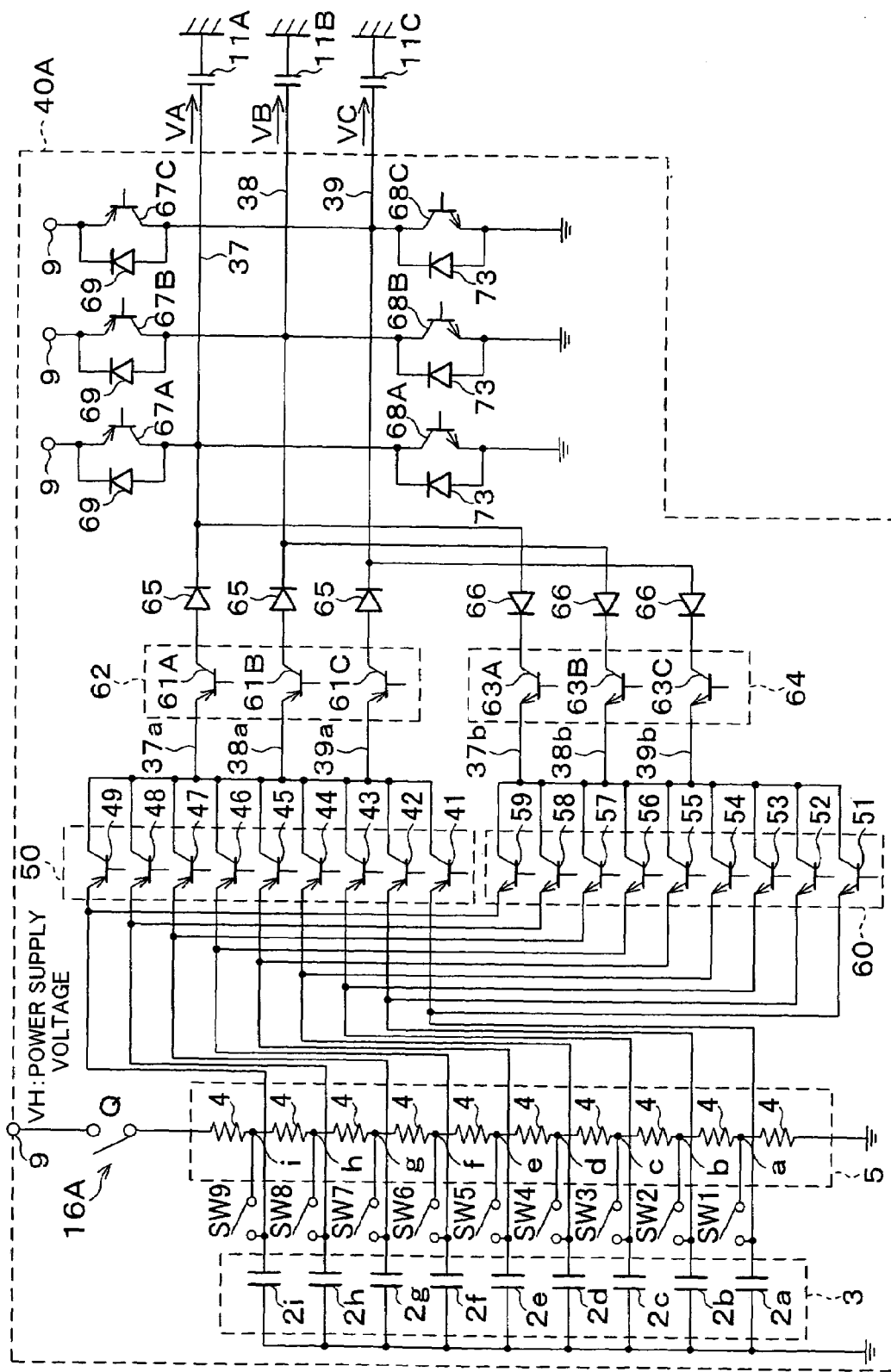
FIG. 77 is a circuit diagram showing an arrangement of a capacitive load drive circuit in accordance with yet another embodiment of the present invention.

The following will explain still another embodiment of the present invention with reference to FIG. 77. Note that, for convenience, members having the same functions as those used in Embodiment 1, 1A, or 5 will be given the same reference symbols, and explanation thereof will be omitted here.

A capacitive load drive circuit 40A of the present embodiment has the same arrangement as the capacitive load drive circuit 40 of Embodiment 2 except the following differences.

As a first difference, switches SW1 through SW9 as in Embodiment 1A are respectively provided between (i) nine connection points (voltage dividing points) a through i of the voltage divider 5 and (ii) lines that respectively connect to the contact points T1 through T9 in a capacitive load drive circuit 40A of the present embodiment, as shown in FIG. 77; whereas the nine connection points (voltage dividing points) a through i of the voltage divider 5 are directly connected to the lines that respectively connect to the contact points T1 through T9 in the capacitive load drive circuit 40 of Embodiment 5.

As a second difference, the capacitive load drive circuit 40A is provided with the switch 16A as in Embodiment 1A.

In the present embodiment, energy is not supplied from another circuit to the accumulating device 3 between rising and falling edges of the voltage pulse in the present embodiment, as a result of the foregoing first and second differences. This can prevent lowering of efficiency of the accumulating device 3 in collecting energy from the condenser 11, the lowering caused by the energy supply from the other circuit.

Embodiment 6

The following will explain yet another embodiment of the present invention with reference to FIGS. 15 and 16(a) to 16(c). Note that, for convenience, members having the same functions as those used in Embodiment 1 or 5 will be given the same reference symbols, and explanation thereof will be omitted here.

A capacitive load drive circuit 70 of the present embodiment is the same as the capacitive load drive circuit 40 of Embodiment 5 except that rectifying diodes (rectifying means) 71 and 72 are respectively provided to the switching circuits 50 and 60 between the switching circuits 50 and 60 and the selecting circuits 62 and 64.

The rectifying diodes 71 are respectively provided to the transistors 41 through 49 of the switching circuit 50 on the side of the selecting circuit 62. The rectifying diodes 72 are respectively provided to the transistors 51 through 59 of the switching circuit 60 on the side of the selecting circuit 64.

By providing the rectifying diodes 71 and 72 as described above, a short-circuit current does not flow even when the delay in the ON/OFF operation of the switching circuits 50 and 60 and the like causes a plurality of transistors (41 through 49, and 51 through 59) to be switched ON in the switching circuit 50 or the switching circuit 60, thereby preventing the breakage of the circuit.

In the present embodiment, the capacitive load to be driven is divided into three phases: namely, the condenser 11A to which the voltage VA in A phase is applied, the condenser 11B to which the voltage VB in B phase is applied, and the condenser 11C to which the voltage VC in C phase is applied, as in Embodiment 5.

Further, in the present embodiment, as in Embodiment 5, by using, as switches, the transistors 61A, 61B, and 61C provided at the charge paths 37a, 38a, and 39a and the transistors 63A, 63B, and 63C provided at the discharge paths 37b, 38b, and 39b, an output voltage of the switching circuit 60 can be selectively applied to one of the condensers 11A through 11C, thereby charging the condensers 11A through 11C at different timings.

An example of such an operation is shown in timing charts of FIGS. 16(a), 16(b), and 16(c). FIGS. 16(a), 16(b), and 16(c) respectively show how the voltages VA, VB, and VC, which are applied to the condensers 11A, 11B, and 11C, respectively, change as time elapses. The transistors 61A, 61B, and 61C provided at the charge paths 37a, 38a, and 39a, and the transistors 63A, 63B, and 63C provided at the discharge paths 37b, 38b, and 39b are used as switches to adjust the ON/OFF timings, so as to drive the condensers 11A through 11C at the timings shown in FIGS. 16(a) through 16(c).

Embodiment 6A

Figure 78:
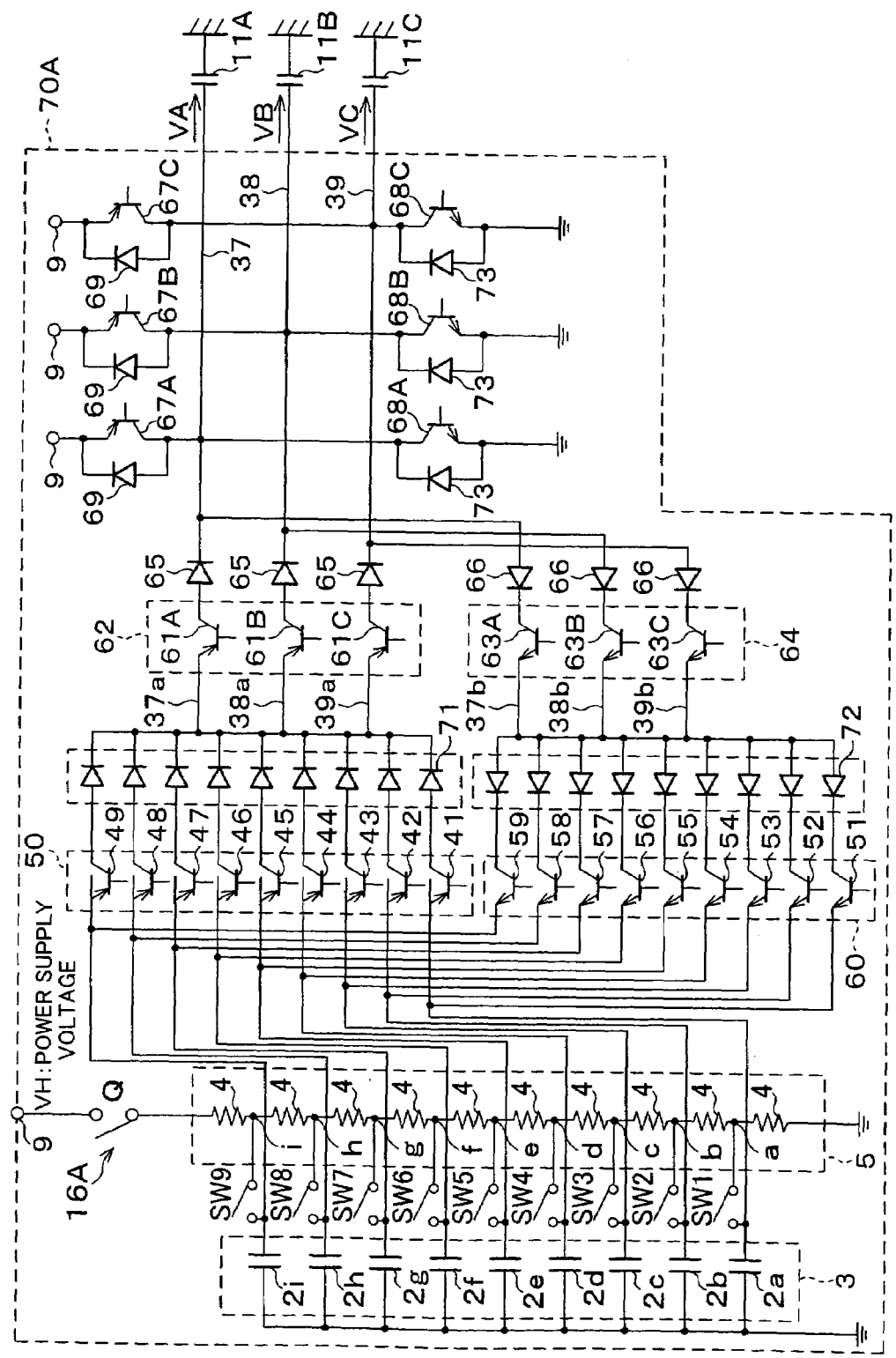
FIG. 78 is a circuit diagram showing an arrangement of a capacitive load drive circuit in accordance with still another embodiment of the present invention.

The following will explain still another embodiment of the present invention with reference to FIG. 78. Note that, for convenience, members having the same functions as those used in Embodiment 1, 1A, or 6 will be given the same reference symbols, and explanation thereof will be omitted here.

A capacitive load drive circuit 70A of the present embodiment has the same arrangement as the capacitive load drive circuit 70 of Embodiment 2 except the following differences.

As a first difference, switches SW1 through SW9 as in Embodiment 1A are respectively provided between (i) nine connection points (voltage dividing points) a through i of the voltage divider 5 and (ii) lines that respectively connect to the contact points T1 through T9 in a capacitive load drive circuit 70A of the present embodiment, as shown in FIG. 78; whereas the nine connection points (voltage dividing points) a through i of the voltage divider 5 are directly connected to the lines that respectively connect to the contact points T1 through T9 in the capacitive load drive circuit 70 of Embodiment 6.

As a second difference, the capacitive load drive circuit 70A is provided with the switch 16A as in Embodiment 1A.

In the present embodiment, energy is not supplied from another circuit to the accumulating device 3 between rising and falling edges of the voltage pulse in the present embodiment, as a result of the foregoing first and second differences. This can prevent lowering of efficiency of the accumulating device 3 in collecting energy from the condenser 11, the lowering caused by the energy supply from the other circuit.

Embodiment 7

The following will explain yet another embodiment of the present invention with reference to FIGS. 17, 18(a), 18(b), and 19. Note that, for convenience, members having the same functions as those used in Embodiment 1 will be given the same reference symbols, and explanation thereof will be omitted here.

Figure 17:
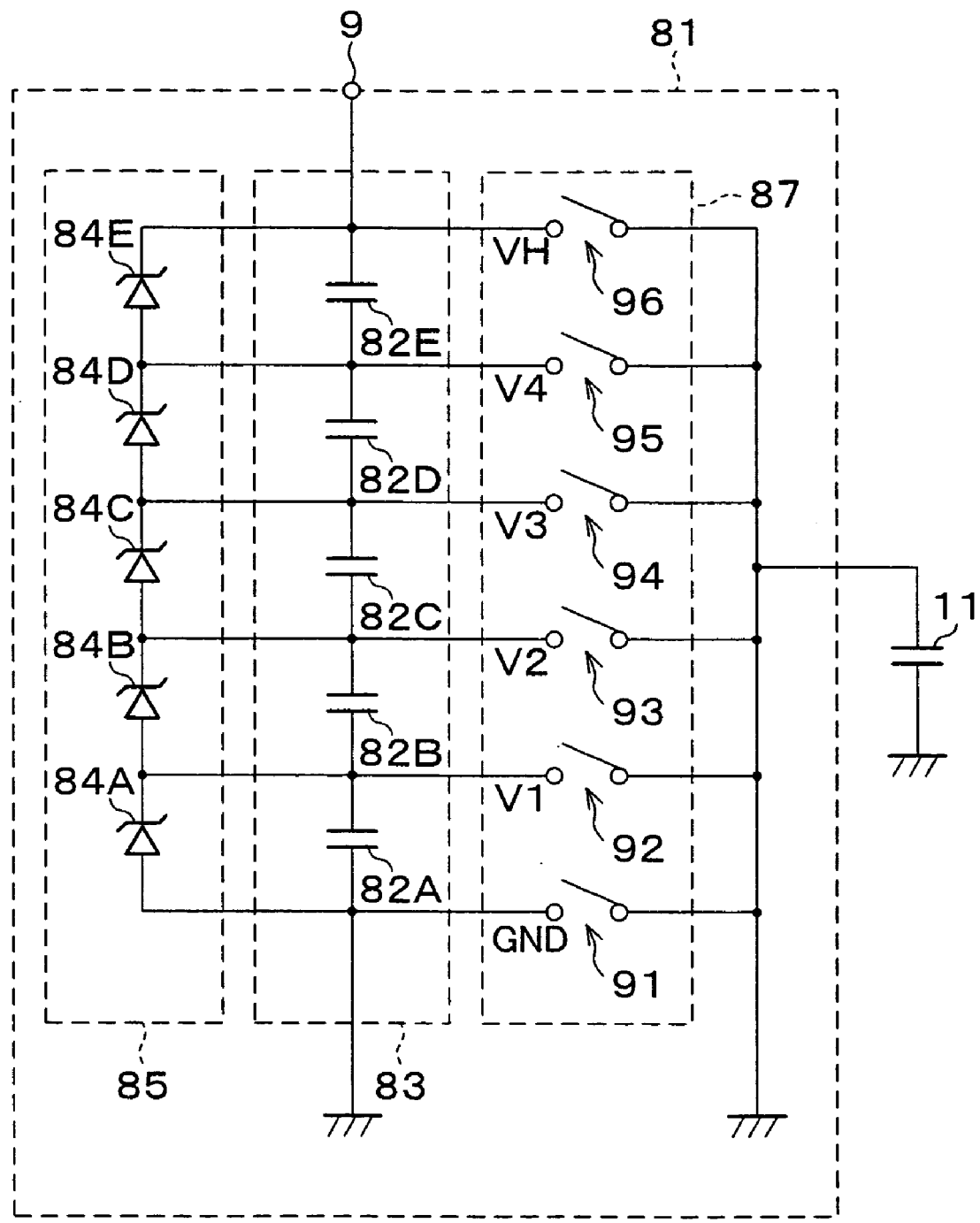
FIG. 17 is a circuit diagram showing an arrangement of a capacitive load drive circuit in accordance with still another embodiment of the present invention.

A capacitive load drive circuit 81 of the present embodiment differs from the capacitive load drive circuit 1 of Embodiment 1 in that, as shown in FIG. 17, the capacitive load drive circuit 81 of the present embodiment is provided with a voltage divider 85 which divides and sets a voltage using zener diodes 84A through 84E as constant voltage means (constant voltage elements) for stabilizing the divided voltages; whereas the capacitive load drive circuit of Embodiment 1 is provided with the voltage divider 5 which divides and sets a voltage using the resistors 4.

Further, the capacitive load drive circuit 81 of the present embodiment differs from the capacitive load drive circuit 1 of Embodiment 1 in that an accumulating device 83 in which condensers (energy accumulating elements) 82A through 82E are connected in series is provided instead of the accumulating device 3 in which the condensers 2a through 2i are connected in parallel.

Further, the capacitive load drive circuit 81 of the present embodiment differs from the capacitive load drive circuit 1 of Embodiment 1 in that a switching circuit (switching means) 87 composed of a plurality of switches 91 through 96 is provided instead of the rotary switch 7.

The voltage divider 85 divides the power supply voltage VH into predetermined voltages V1 through V4 using the zener diodes 84A, 84B, 84C, 84D, and 84E which are a plurality of constant voltage elements connected in series between the power supply terminal 9 and the ground. Then, the voltage divider 85 outputs the predetermined voltages V1 through V4 to the accumulating device 83 from connection points between the zener diodes 84A, 84B, 84C, 84D, and 84E.

The accumulating device 83 is so arranged that the condensers 82A, 82B, 82C, 82D, and 82E are sequentially connected in series in this order from the ground to the power supply terminal 9. The condenser 82A has one end grounded and the other end to which the voltage V1 is applied from the voltage divider 85. Further, the voltage V1 and the voltage V2 are respectively applied to ends of the condenser 82B, the voltage V2 and the voltage V3 are respectively applied to ends of the condenser 82C, and the voltage V3 and the voltage V4 are respectively applied to ends of the condenser 82D. Further, the condenser 82E has one end to which the power supply voltage VH is supplied from the power supply terminal 9, and the other end to which the voltage V4 is applied from the voltage divider 85.

The six switches 91 through 96 of the switching circuit 87 basically correspond to the contact points T0 through T10 of the switch 7. In other words, the switching circuit 87 selectively switches ON one of the switches 91 through 96. The switch 91 is grounded, the voltages V1, V2, V3, and V4 supplied from the accumulating device 83 and the voltage divider 85 are respectively applied to the switches 92 through 95, and the switch 96 is connected to the power supply terminal 9. In an initial state, the switch 91 is selected. Then, by sequentially selecting the switches 92, 93, 94 and 95 in this order, electrostatic energy is sequentially supplied from the condensers 82A through 82E to the condenser 11, so as to raise the voltage V of the condenser 11 from 0 to the voltage V4. Next, by selecting the switch 96, the condenser 11 is connected to the power supply terminal 9, so that the voltage V applied to the condenser 11 becomes equal to the power supply voltage VH from the outside.

Next, the switch 96 is kept switched ON for a predetermined period so as to hold the voltage of the condenser 11 at the power supply voltage VH. Then, by sequentially selecting the switches 95, 94, 93 and 92 in this order, energy is sequentially collected from the condenser 11 to the condensers 82A through 82E, so as to lower the voltage V of the condenser 11 from the power supply voltage VH to the voltage V1.

After this, by selecting the switch 91, the condenser 11 is grounded so that the voltage V applied to the condenser 11 becomes 0, which is equal to the ground.

Next, the operation principle of the voltage divider 85 will be explained with reference to FIGS. 18($a$) and 18($b$).

Figure 18:
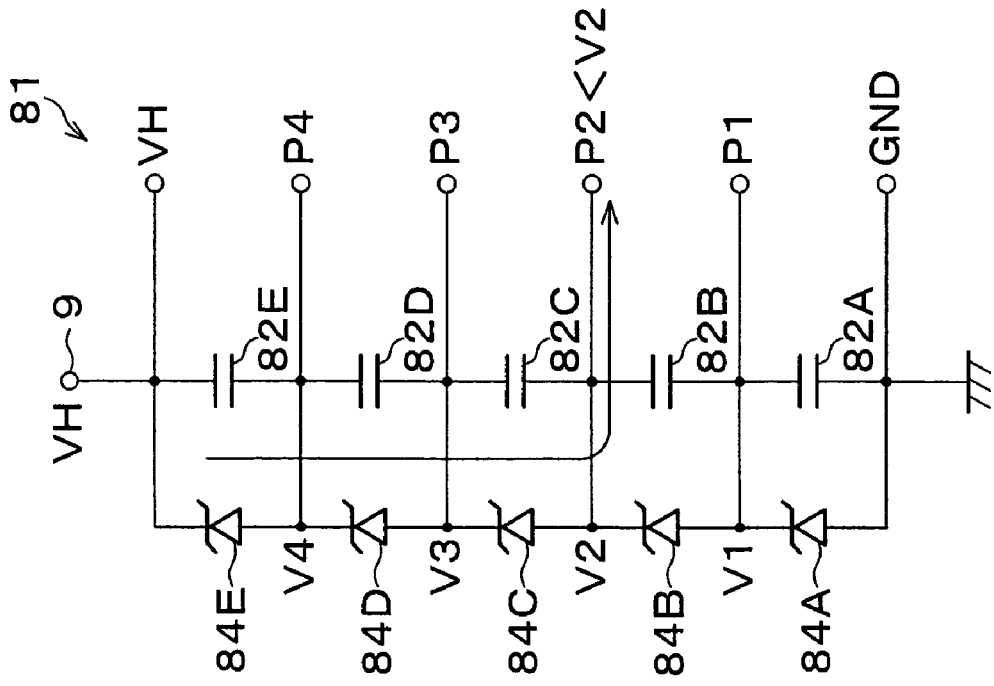
FIGS. 18(a) and 18(b) are circuit diagrams used for explaining the operation of a voltage divider provided in the capacitive load drive circuit of FIG. 17.
Figure 18:
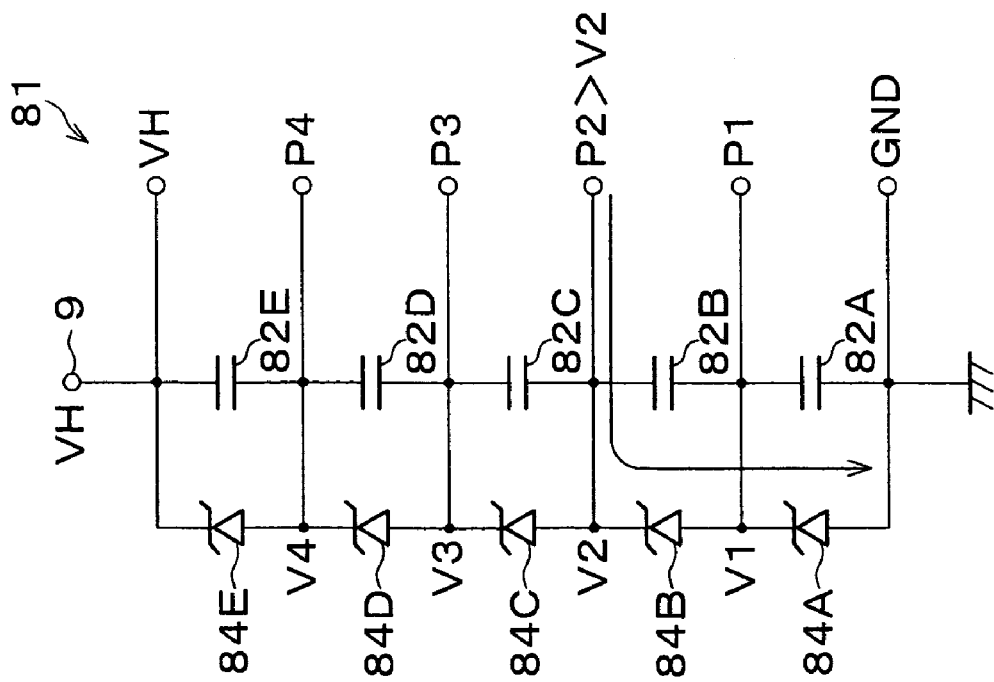

As shown in FIG. 18($a$), when a current from the condenser 11 flows into the terminal voltage V2 of the zener diode 84B on the cathode side in such a direction as to raise an output terminal voltage (potential of the switch 93) P2, a load current flows into the condensers 82A and 82B in response to the current flowing in and out of the condenser 11, so as to absorb the current from the condenser 11. Concurrently, the zener diodes 84A and 84B have deeper operating point so that their impedances are lowered. Thus, a current flows from the condenser 11 to the ground line via the zener diodes 84A and 84B so that the output terminal voltage P2 maintains the zener voltage V2.

Further, as shown in FIG. 18($b$), when a current from the condenser 11 flows in and out of the terminal voltage V2 of the zener diode 84C on the anode side in such a direction as to lower the output terminal voltage P2, a current flows from the condensers 82C, 82D, and 82E to the condenser 11 in response to the current flowing in and out of the condenser 11, so as to absorb the current flowing in and out of the condenser 11. Concurrently, the zener diodes 84C, 84D and 84E have deeper operating point so that their impedances are lowered. Thus, a current flows from the power supply line to the condenser 11 via the zener diodes 84C, 84D, and 84E so that the output terminal voltage P2 maintains the zener voltage V2.

As described above, the zener diodes 84A, 84B, 84C, 84D, and 84E absorb the current flowing in and out of the condenser 11 which raises or lowers the output terminal voltage P2. Strictly speaking, the zener voltages of the zener diodes 84A, 84B, 84C, 84D, and 84E change as the operating point varies. However, the changes are so slight as to be practically negligible. Therefore, the output terminal voltages P1 through P4, namely the terminal voltages 82A through 82E, can be maintained to be constant.

Figure 19:
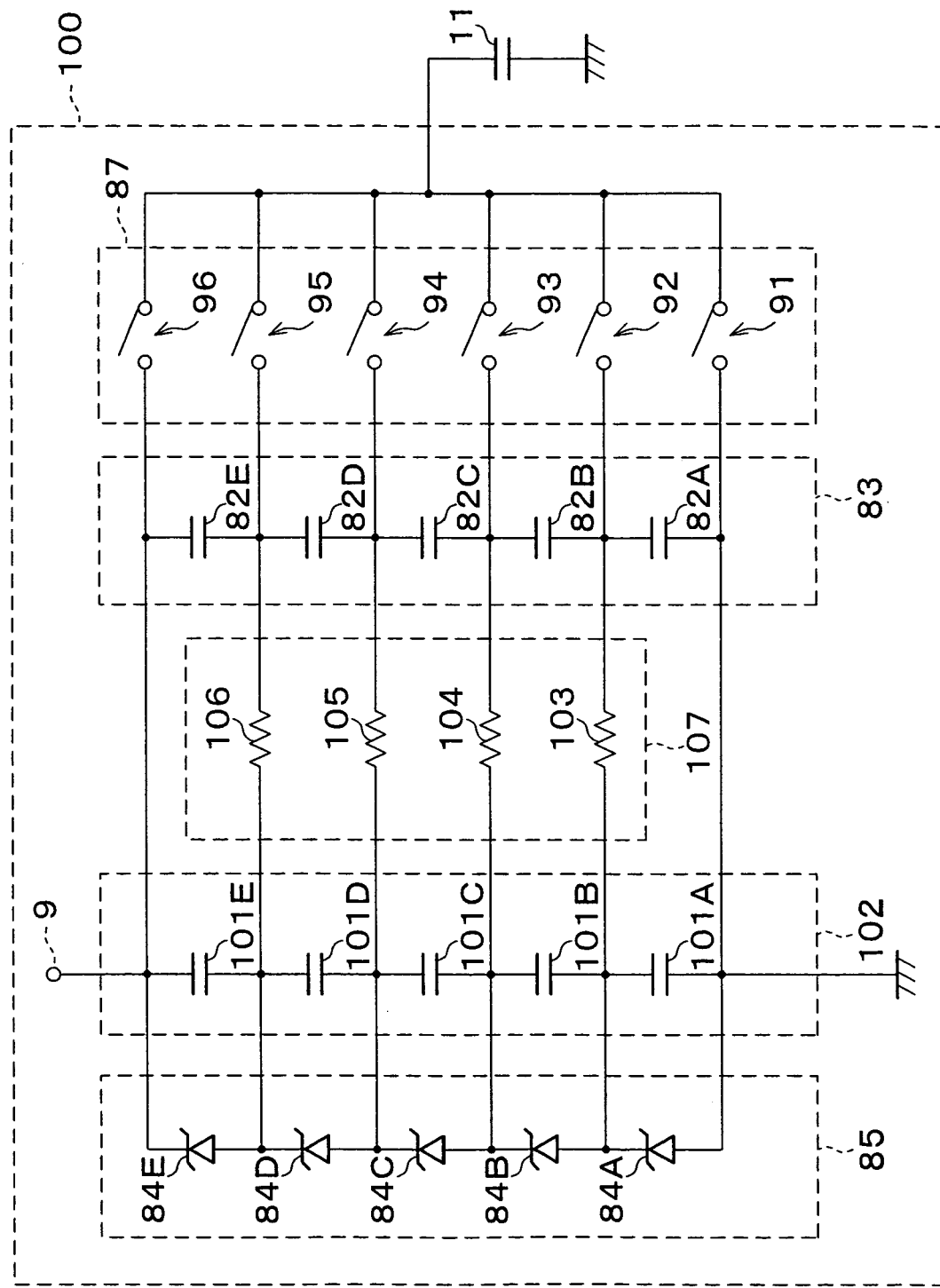
FIG. 19 is a circuit diagram showing a modification of the capacitive load drive circuit of FIG. 17.

Note that, the capacitive load drive circuit 81 of the present embodiment may be provided with a buffer circuit 102 in which condensers 101A, 101B, 101C, 101D, and 101E are sequentially connected in series in this order from the ground to the power supply terminal 9, as in a capacitive load drive circuit 100 shown in FIG. 19. With this, it is possible to buffer and absorb a current flowing from the condenser 11 into the voltage divider 85, or a current flowing out of the voltage divider 85 to the condenser 11. This can reduce the workload of the zener diodes 84A, 84B, 84C, 84D, and 84E.

Further, as in the capacitive load drive circuit 100 shown in FIG. 19, current-limit resistors 103, 104, 105, and 106 may be respectively inserted between (i) connection points between the zener diodes 84A, 84B, 84C, 84D, and 84E and (ii) connection points between the condensers 82A, 82B, 82C, 82D, and 82E, so as to form a counter-change adjusting section 107. This can further reduce the workload of the zener diodes 84A, 84B, 84C, 84D, and 84E.

Embodiment 7A

Figure 79:
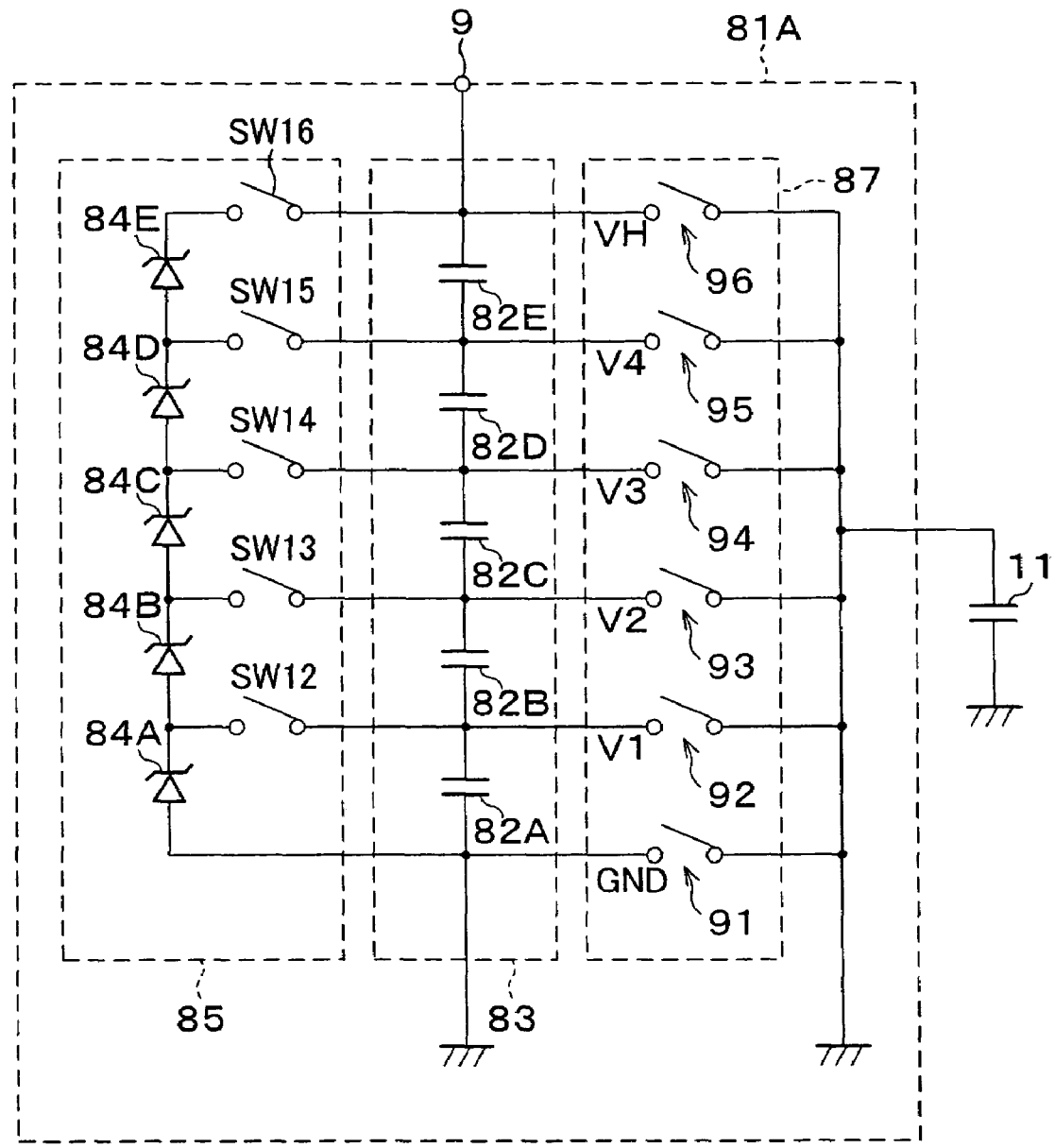
FIG. 79 is a circuit diagram showing an arrangement of a capacitive load drive circuit in accordance with yet another embodiment of the present invention.
Figure 80:
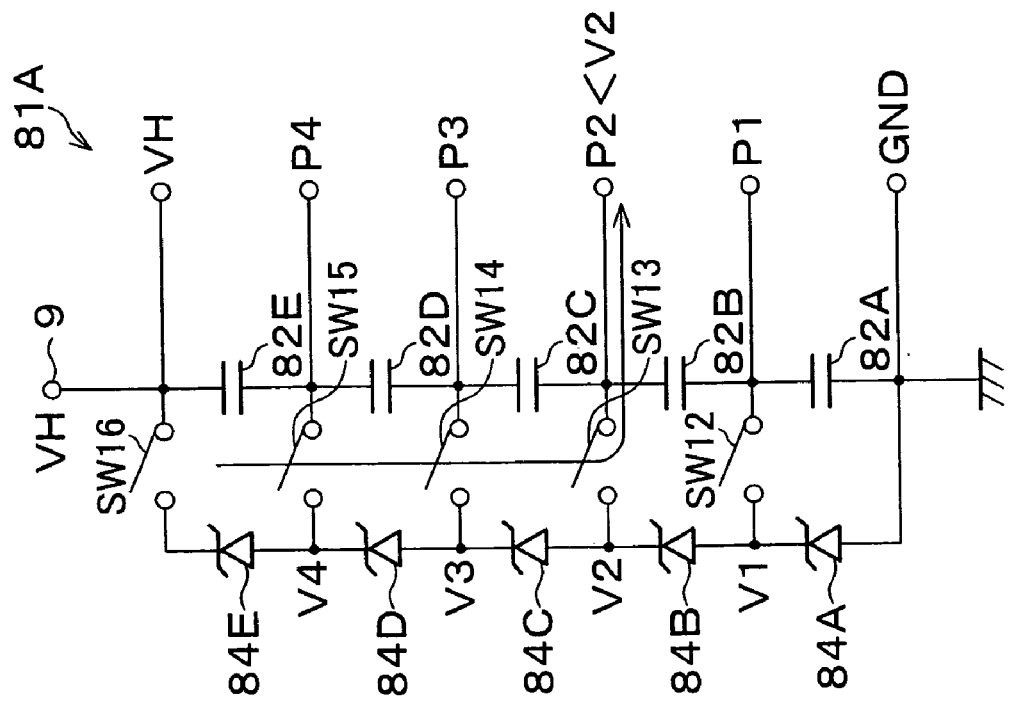
FIGS. 80(a) and 80(b) are circuit diagrams used for explaining the operation of a voltage divider provided in the capacitive load drive circuit of FIG. 79.
Figure 80:
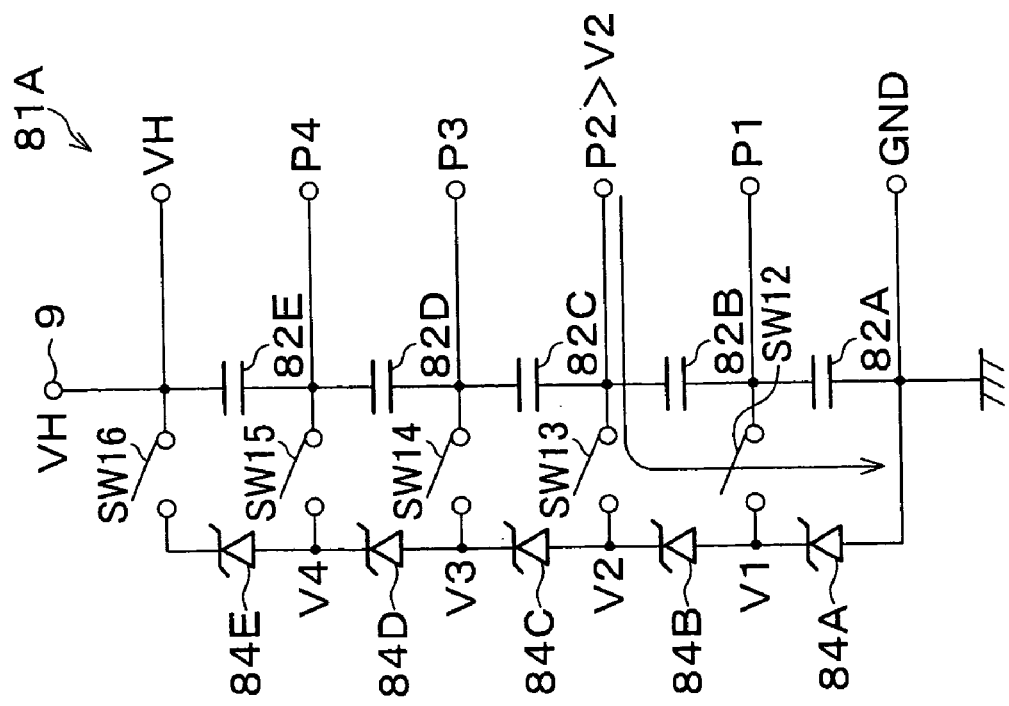

The following will explain still another embodiment of the present invention with reference to FIGS. 79 and 80.

Note that, for convenience, members having the same functions as those used in Embodiment 1 or 7 will be given the same reference symbols, and explanation thereof will be omitted here.

A capacitive load drive circuit 81A of the present embodiment has the same arrangement as the capacitive load drive circuit 81 of Embodiment 2 except the following difference.

As the difference, switches SW12 through SW16 similar to the switches SW1 through SW9 of Embodiment 1A are respectively provided between (i) five connection points other than the grounded connection point among the six connection points of the voltage divider 5 and (ii) the switches 92 through 96 in the capacitive load drive circuit 70A of the present embodiment, as shown in FIGS. 79 and 80; whereas the six connection points of the voltage divider 5 are directly connected to the switches 91 through 96 in the capacitive load drive circuit 70 of Embodiment 6.

In the present embodiment, energy is not supplied from another circuit to the accumulating device 3 between rising and falling edges of the voltage pulse in the present embodiment, as a result of the foregoing first and second differences. This can prevent lowering of efficiency of the accumulating device 3 in collecting energy from the condenser 11, the lowering caused by the energy supply from the other circuit.

Embodiment 8

Figure 20:
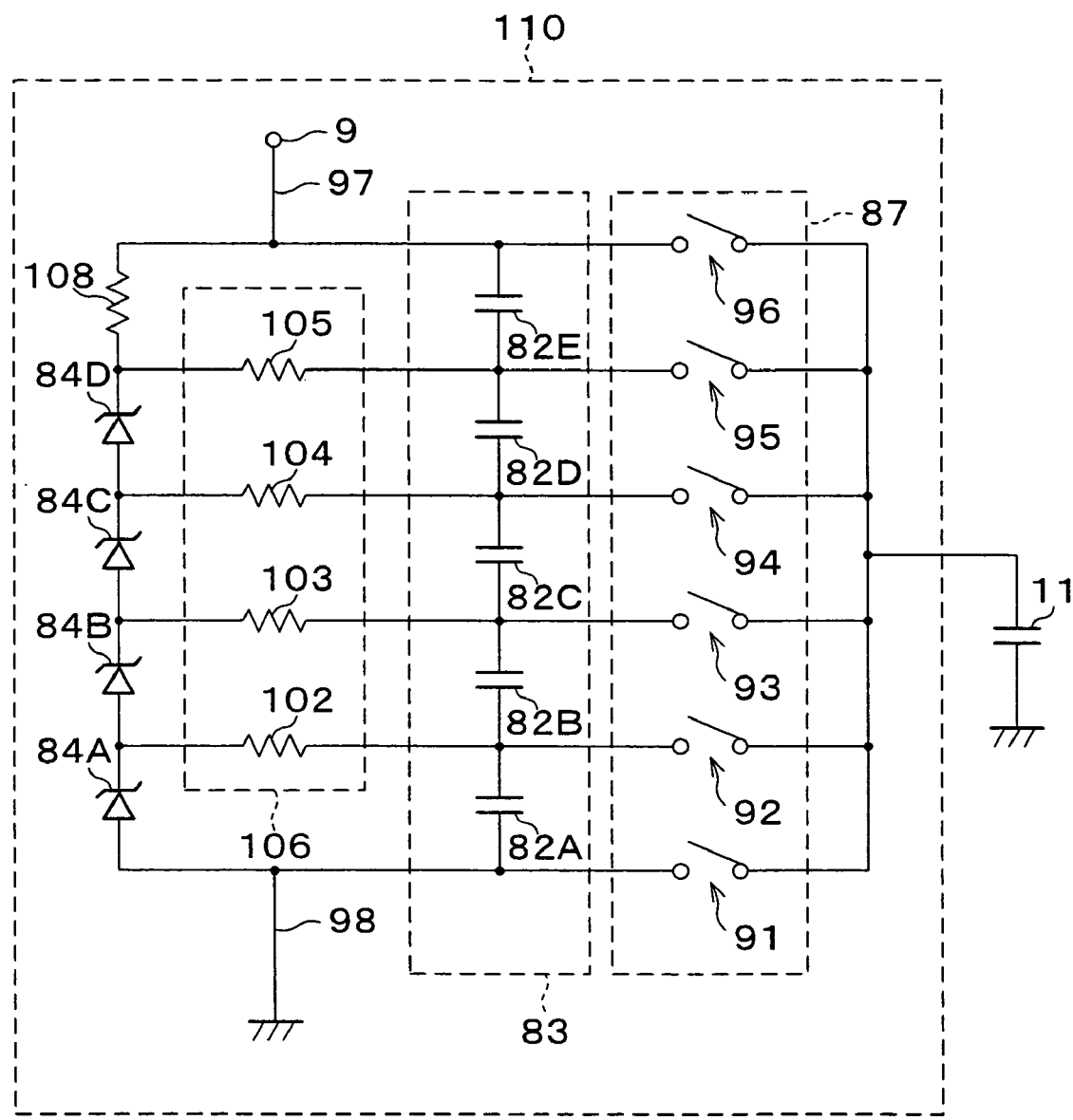
FIG. 20 is a circuit diagram showing an arrangement of a capacitive load drive circuit in accordance with yet another embodiment of the present invention.

The following will explain yet another embodiment of the present invention with reference to FIG. 20. Note that, for convenience, members having the same functions as those used in Embodiment 1 or 8 will be given the same reference symbols, and explanation thereof will be omitted here.

In the arrangement of Embodiment 7, the zener diodes 84A, 84B, 84C, 84D, and 84E may burn out when the power supply voltage VH becomes larger than a sum of zener voltages of the zener diodes 84A, 84B, 84C, 84D, and 84E due to (i) unevenness in the power supply voltage and in each of zener voltages of the zener diodes 84A, 84B, 84C, 84D, and 84E; (ii) changes over time; and (iii) temperature changes. Further, in the arrangement of Embodiment 7, each terminal voltage of the zener diodes 82A, 82B, 82C, 82D, and 82E may become uncertain when the power supply voltage VH becomes smaller than a sum of zener voltages of the zener diodes 84A, 84B, 84C, 84D, and 84E.

The present embodiment will explain a capacitive load drive circuit that solves the above problems.

As shown in FIG. 20, a capacitive load drive circuit 110 of the present embodiment is so arranged that a pull-up resistor 108 is used instead of the zener diode 84E, and a terminal of the zener diode 84D is pulled up to a power supply line 97 by using the pull-up resistor 108 in the capacitive load drive circuit 81 of Embodiment 7. Namely, the capacitive load drive circuit 110 is so arranged that the stage that is closest to the power supply line 97 (uppermost stage) absorbs a difference between (i) the sum of zener voltages of the zener diodes 84A, 84B, 84C, 84D, and 84E and (ii) the power supply voltage VH. With this arrangement, the power supply line 97 supplies a bias current to the zener diodes 84A, 84B, 84C, and 84D via the pull-up resistor 108, thereby stabilizing the terminal voltages of the condensers 82A, 82B, 82C, 82D, and 82E. Here, the sum of zener voltages of the zener diodes 84A, 84B, 84C, 84D, and 84E is set lower than the power supply voltage VH.

Further, as in the capacitive load drive circuit 100 shown in FIG. 19, current-limit resistors 103, 104, 105, and 106 may be respectively inserted between (i) connection points between the zener diodes 84A, 84B, 84C, and 84D and the pull-up resistor 108 and (ii) connection points between the condensers 82A, 82B, 82C, 82D, and 82E so as to form a counter-change adjusting section 107 in the capacitive load drive circuit 110 of the present embodiment. This can further reduce the workload of the zener diodes 84A, 84B, 84C, and 84D.

Note that, apart from the arrangement in which the pull-up resistor 108 is provided, a pull-down resistor may be used instead of the zener diode 84A in the capacitive load drive circuit 81 of Embodiment 7, so as to pull down a terminal of the zener diode 84D to a ground line 98 by using the pull-down resistor. With this, the same effects can be achieved as in the arrangement employing the pulling-up, thereby stabilizing the terminal voltages of the condensers 82A, 82B, 82C, 82D, and 82E.

Embodiment 9

Figure 21:
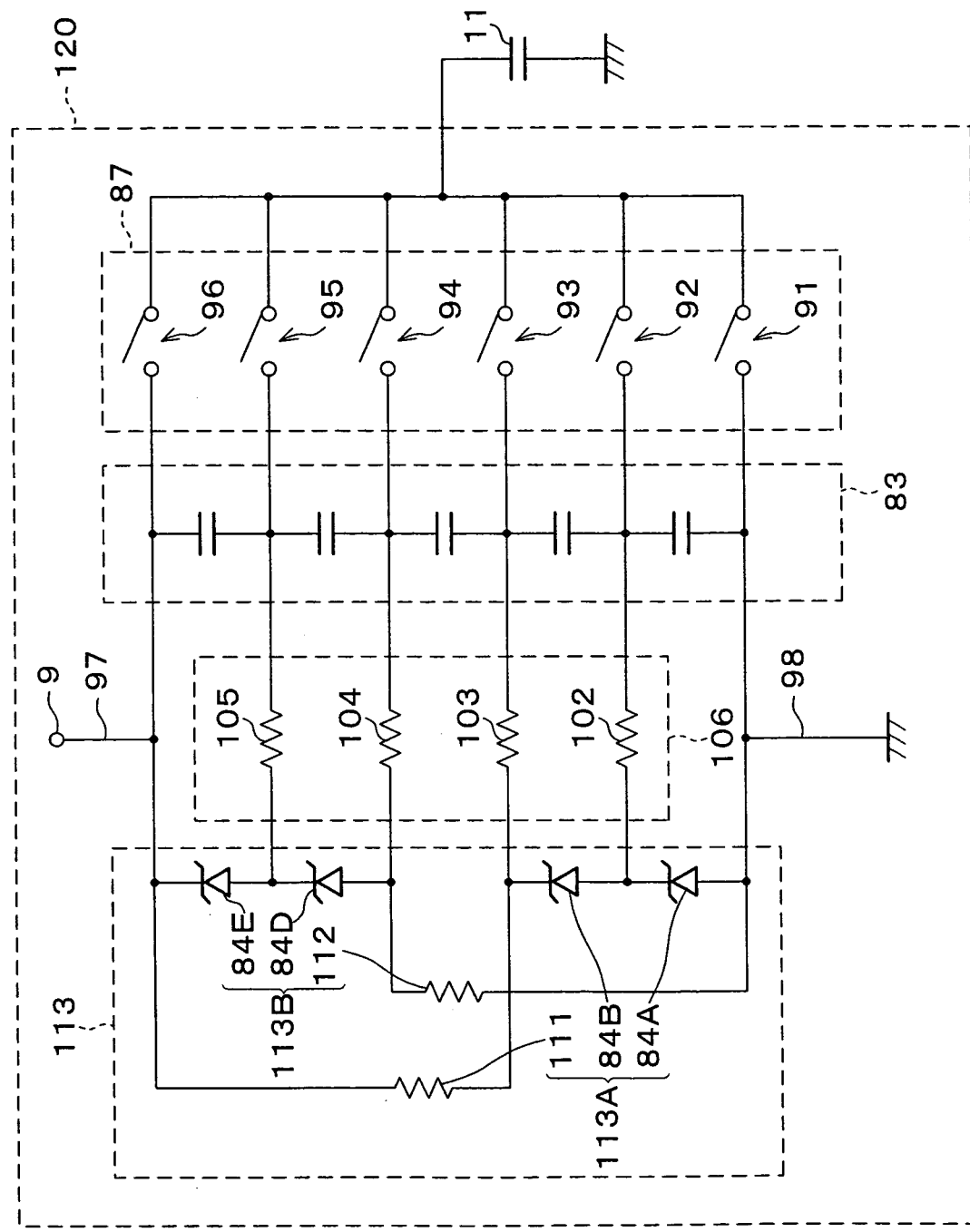
FIG. 21 is a circuit diagram showing an arrangement of a capacitive load drive circuit in accordance with still another embodiment of the present invention.

The following will explain still another embodiment of the present invention with reference to FIG. 21. Note that, for convenience, members having the same functions as those used in Embodiment 1 or 7 will be given the same reference symbols, and explanation thereof will be omitted here.

The present embodiment will explain a capacitive load drive circuit that solves the problems regarding the difference between (i) the sum of zener voltages of the zener diodes 84A, 84B, 84C, 84D, and 84E and (ii) the power supply voltage VH as described in Embodiment 8.

In order to arrange such that the intermediate stages absorb the difference between the power supply voltage VH and the sum of zener voltages of the zener diodes 84A, 84B, 84C, and 84D, a capacitive load drive circuit 120 of the present embodiment is so arranged that the zener diodes (84A, 84B, 84C, 84D, and 84E) are separated into those on the power supply line 97 side (84D and 84E) and those on the ground line 98 side (84A and 84B). Further, the zener diodes 84D and 84E on the power supply line 97 side are pulled up to the power supply line 97 by using a pull-up resistor 111, and the zener diodes 84A and 84B on the ground line 98 side are pulled down to the ground line 98 by using a pull-down resistor 112, so as to supply a bias current to the zener diodes 84A, 84B, 84D, and 84E. Here, the sum of zener voltages of the zener diodes 84A, 84B, 84C, 84D, and 84E is set lower than the power supply voltage VH.

The capacitive load drive circuit 120 is provided with a voltage divider 113 composed of a first voltage divider 113A and a second voltage divider 113B which are connected in parallel between the power supply line 97 and the ground line 98. The first voltage divider 113A includes the zener diodes 84A and 84B which are connected in series between the power supply line 97 and the ground line 98, and the pull-up resistor 111 is inserted between (i) the zener diodes 84A and 84B and (ii) the power supply line 97. The second voltage divider 113B includes the zener diodes 84D and 84E which are connected in series between the power supply line 97 and the ground line 98, and the pull-down resistor 112 is inserted between (i) the zener diodes 84D and 84E and (ii) the ground line 98.

In this way, by absorbing the difference between the power supply voltage VH and the sum of zener voltages of the zener diodes 84A, 84B, 84C, and 84D at the intermediate stages, it is possible to maintain the stability of terminal voltages in the vicinity of the power supply line 97 and in the vicinity of the ground line 98.

Further, as in the capacitive load drive circuit 100 shown in FIG. 19, current-limit resistors 103, 104, 105, and 106 are respectively inserted between (i) connection points between the zener diodes 84A, 84B, 84C, and 84D, the pull-up resistor 111, and the pull-down resistor 112 and (ii) connection points of the condensers 82A, 82B, 82C, 82D, and 82E so as to form a counter-change adjusting section 107 in the capacitive load drive circuit 120 of the present embodiment. This can further reduce the workload of the zener diodes 84A, 84B, 84C, and 84D, and 84E.

Embodiment 10

Figure 22:
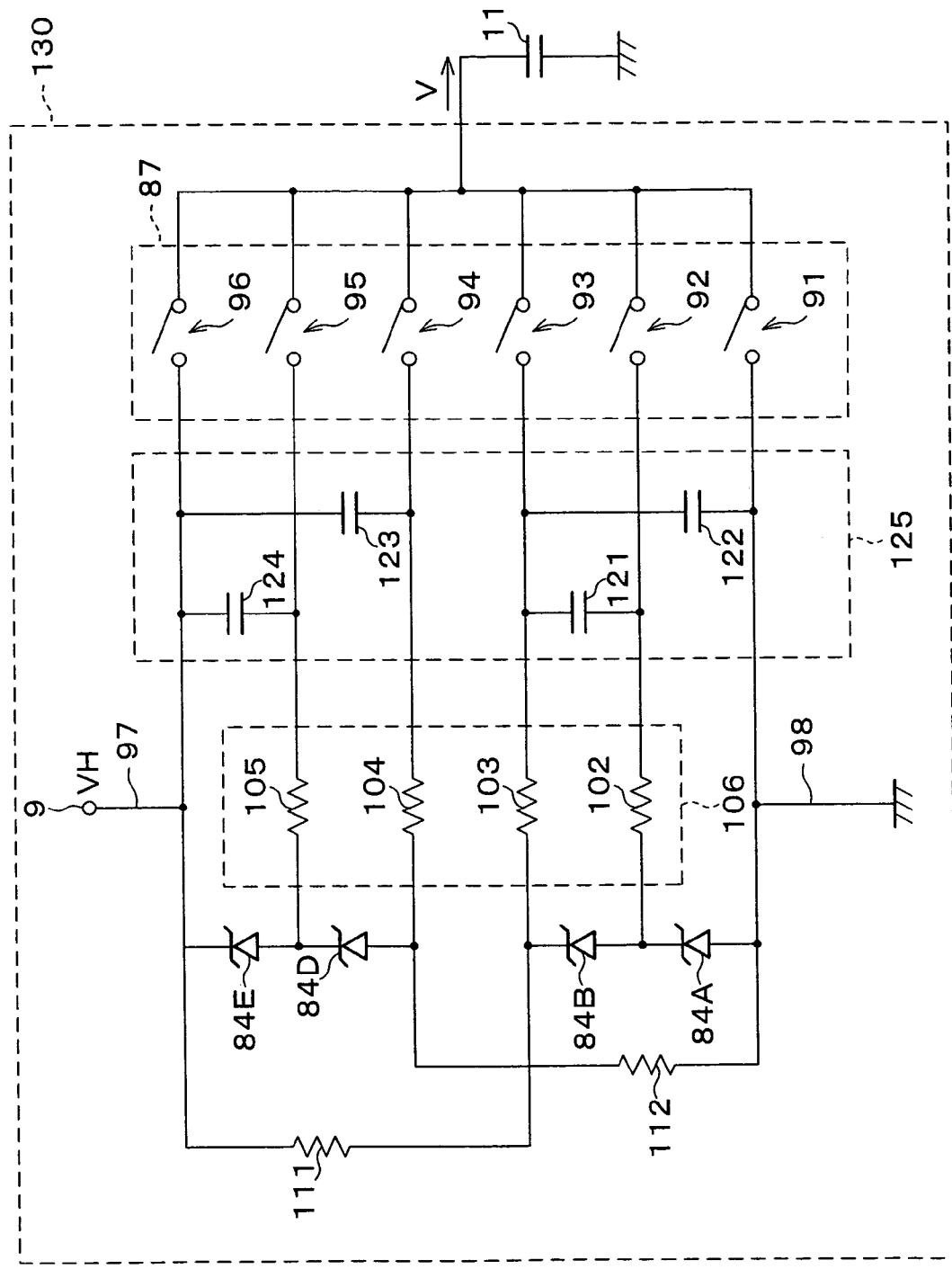
FIG. 22 is a circuit diagram showing an arrangement of a capacitive load drive circuit in accordance with yet another embodiment of the present invention.

The following will explain yet another embodiment of the present invention with reference to FIG. 22. Note that, for convenience, members having the same functions as those used in Embodiment 1, 7, or 9 will be given the same reference symbols, and explanation thereof will be omitted here.

The accumulating device 83 in which the condensers 82A through 82E are connected in series as in Embodiments 7 through 9 has the problem that a current flowing in and out of the condenser 11 affects all of the condensers 82A through 82E when any of the switches 91 through 96 is turned ON.

The present embodiment will explain a capacitive load drive circuit that solves the above problem, with reference to FIG. 22.

As shown in FIG. 22, a capacitive load drive circuit 130 of the present embodiment has the same arrangement as the capacitive load drive circuit 120 of Embodiment 9 except that an accumulating device 125 is provided instead of the accumulating device 83.

In the accumulating device 125, one ends of condensers (energy accumulating elements) 121 through 124 are connected to either the power supply line 97 or the ground line 98, and the other ends of the condensers 121 through 124 are connected to the switches 92 through 95 to which the voltages V1 through V4, which are obtained by dividing the power supply voltage VH, are applied. More specifically, the condenser 121 is interposed between the ground line 98 and the switch 92, the condenser 122 is interposed between the ground line 98 and the switch 93, the condenser 123 is interposed between the power supply line 97 and the switch 94, and the condenser 124 is interposed between the power supply line 97 and the switch 95.

With this, when one of the switches 92 through 95 is selected, only one of the condensers 121 through 124 is connected to the condenser 11. This separates the condensers 121 through 124 from one another, thereby preventing the condensers 121 through 124 from interfering with one another. In other words, when any of the switches 92 through 95 is switched ON, the current flowing in and out of the condenser 11 affects only one of the condensers 121 through 124.

When the intermediate stages absorbs the difference between the power supply voltage VH and the zener voltages as in Embodiments 9 and 10, the number of stages for absorption, namely, the number of the condensers 82A, 82B, 82C, 82D, and 82E interposed between the pulled-up line and the pulled-down line is not limited, but is preferably one.

Further, in the arrangement in which, as in Embodiments 9 and 10, the intermediate stages absorb the difference between the power supply voltage VH and the zener voltages, a difference between (i) the number of zener diodes on the ground line 98 side, namely the number of zener diodes included in the first voltage divider 113A, and (ii) the number of zener diodes on the power supply line 97 side, namely the number of zener diodes included in the second voltage divider 113B is preferably one or less, for better stability of the voltage.

Note that, Embodiments 7 through 10 explained the cases where zener diodes are used as constant voltage means (constant voltage element) for stabilizing the divided voltages, but other constant voltage means (constant voltage element) such as a shunt regulator, for example, may also be used instead of a zener diode.

Embodiment 11

Figure 23:
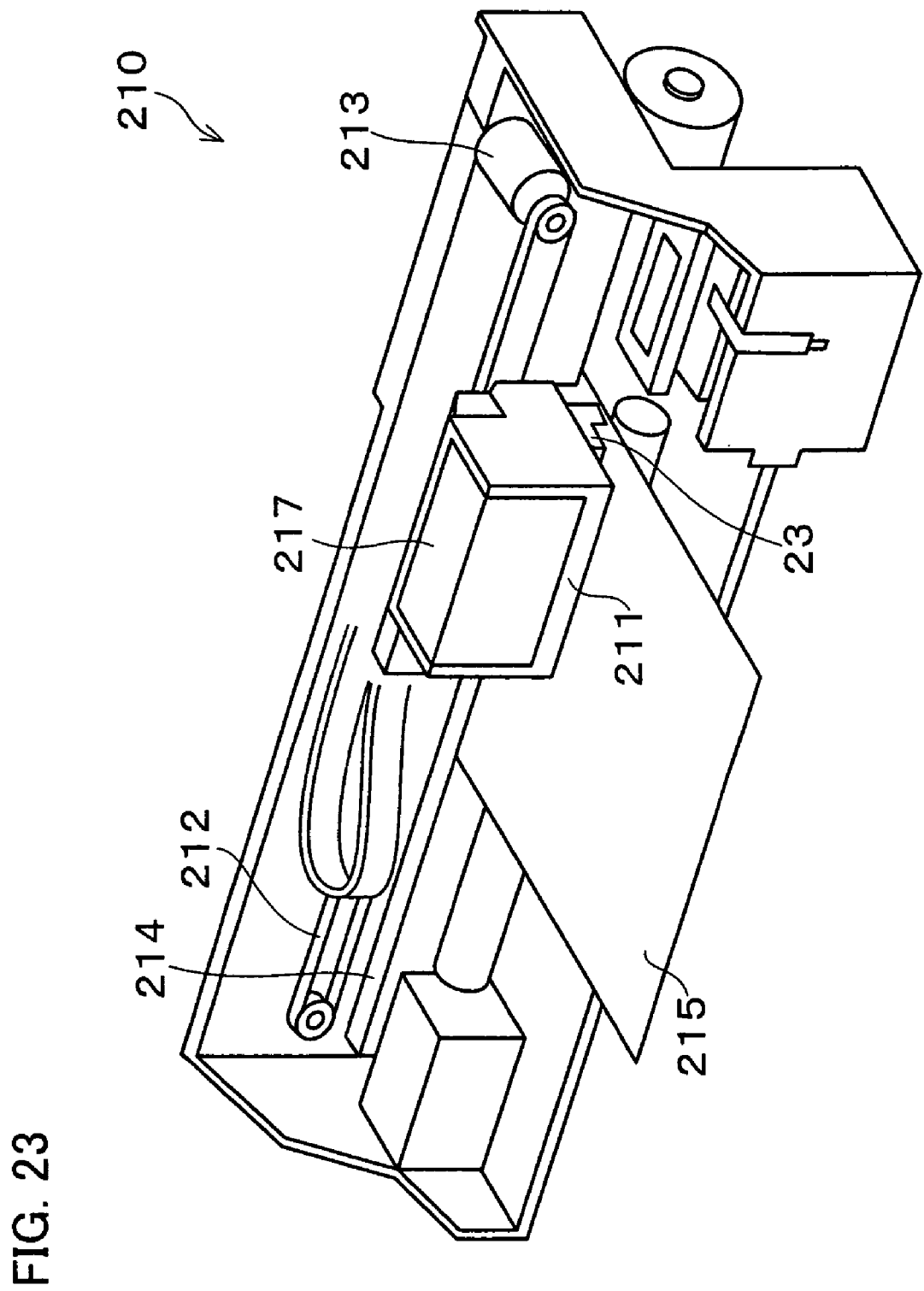
FIG. 23 is a perspective view showing chief members of an ink-jet printer (image forming apparatus) in accordance with an embodiment of the present invention.
Figure 24:
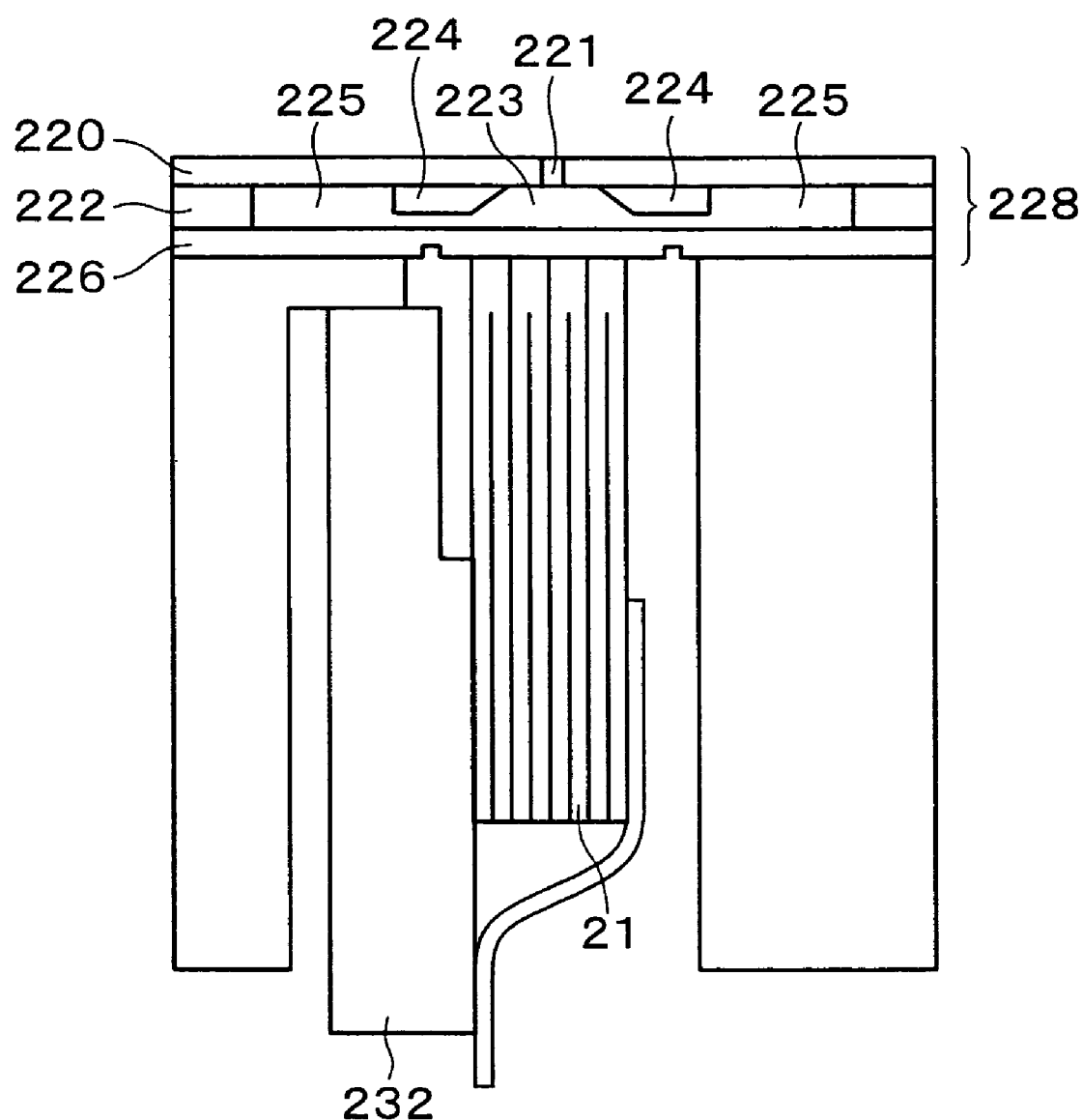
FIG. 24 is a cross-sectional view showing an arrangement of an ink-jet head provided in the ink-jet printer (image forming apparatus) of FIG. 23.
Figure 25:
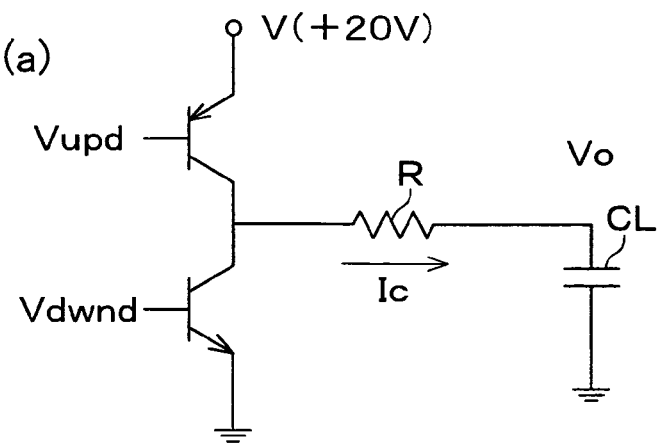
FIGS. 25(a) through 25(e) are a diagram and charts showing an example of a conventional capacitive load drive circuit.
Figure 25:
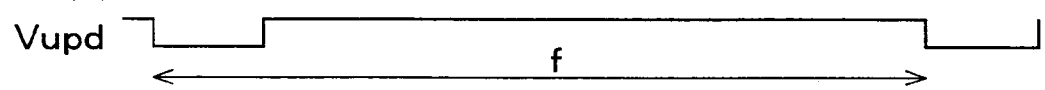
Figure 25:
Figure 25:
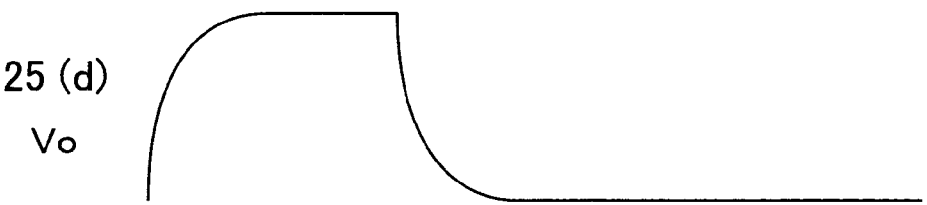
Figure 25:
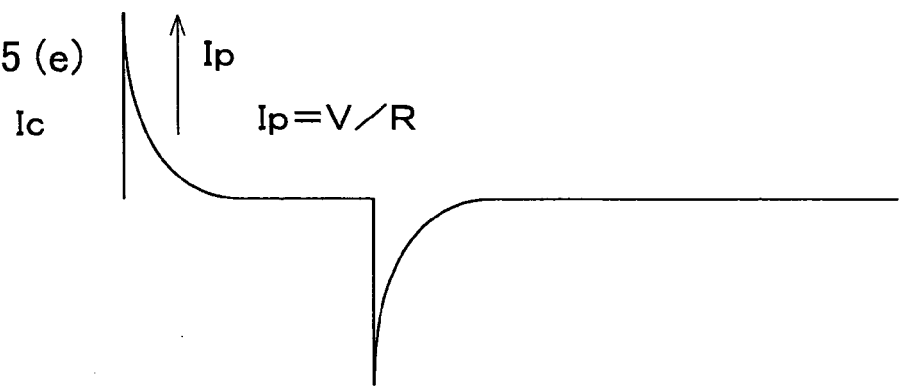
Figure 26:
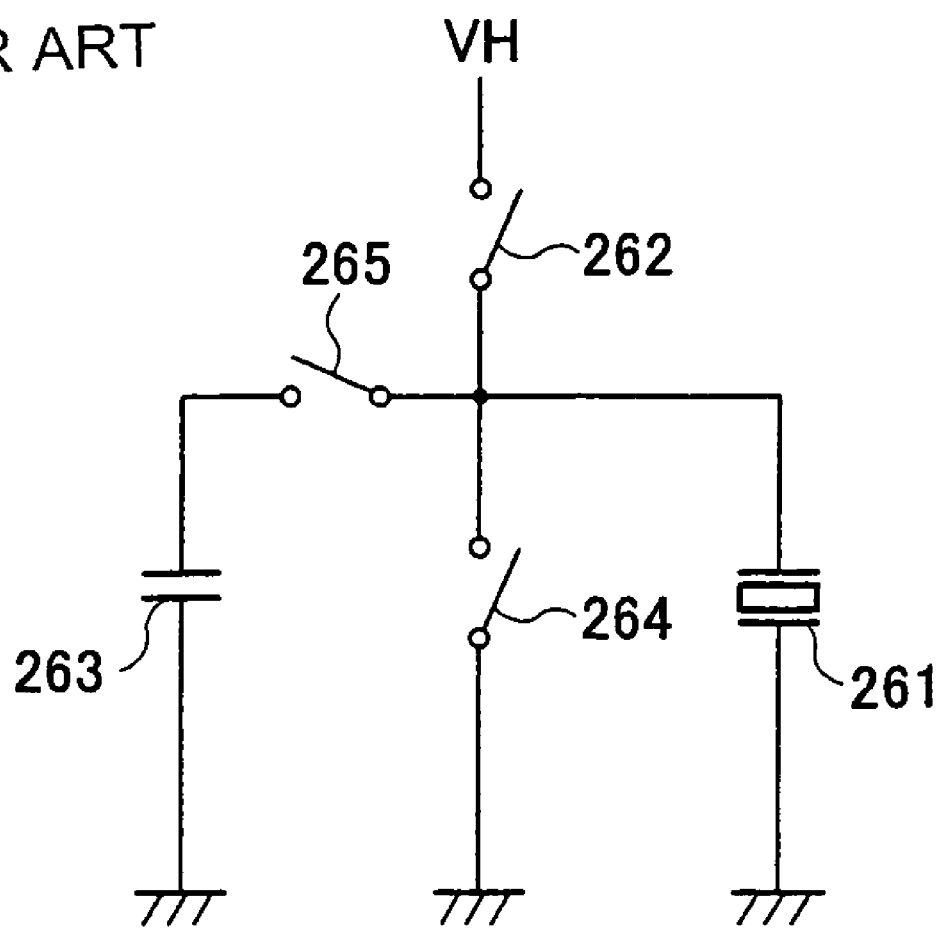
FIG. 26 is a circuit diagram showing an example of a conventional capacitive load drive circuit.
Figure 28:
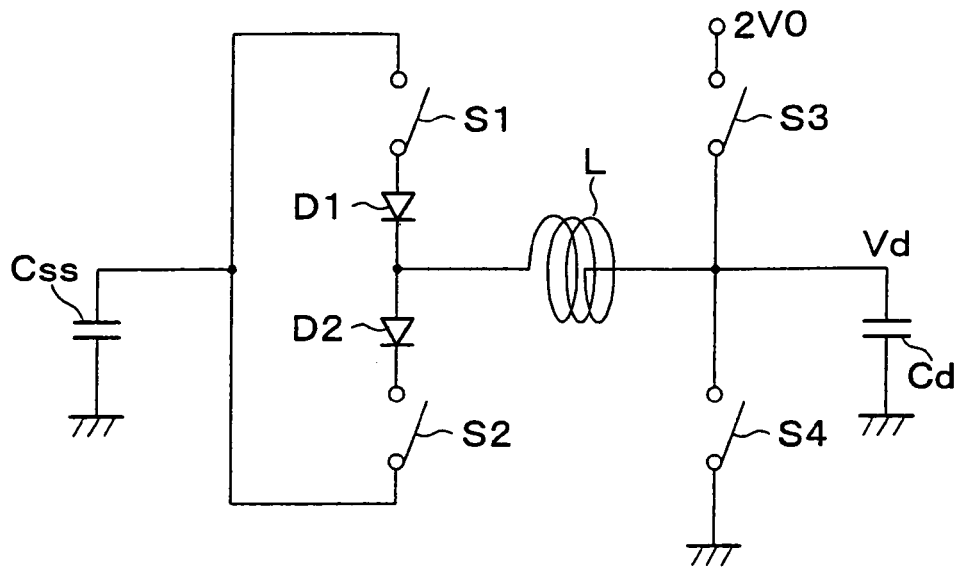
FIG. 28 is a circuit diagram showing another example of a conventional capacitive load drive circuit.

The following will explain an embodiment of an ink-jet printer (image forming apparatus) employing the present invention, with reference to FIGS. 7, 23, and 24.

FIG. 23 is a perspective view showing chief members of the ink-jet printer (image forming apparatus).

As shown in FIG. 23, an ink-jet printer (image forming apparatus) 210 of the present embodiment is so arranged that a carriage 211, which is connected to a pulse motor 213 via a timing belt 212, is guided by a guide member 214 to move back and forth in a direction of the width of a recording paper 215.

An ink-jet head 23 receives ink supplied from an ink cartridge 217 which is placed on the carriage 211, and jets out ink drops onto the recording paper 215 so as to form dots on the recording paper 215 in accordance with the motion of the carriage 211, thereby printing images and characters on the recording paper 215.

FIG. 24 is a cross-sectional view showing an arrangement of the ink-jet head 23.

As shown in FIG. 24, the ink-jet head 23 is so arranged that a nozzle plate 220 has a nozzle orifice 221; a flow path forming plate 222 has (i) a communicating hole which partitions a pressure generating chamber 223, (ii) a communicating hole or groove which partitions two ink supply ports that respectively communicate with the pressure generating chamber 223 on both sides, and (iii) a communicating hole which partitions two common ink chambers 225 that respectively communicate with the ink supply ports 224. A vibration plate 226 is made of a thin plate that is elastically deformable. The vibration plate 226 abuts on an edge of a piezoid 21 such as a piezoelectric element, and is so fixed that the vibration plate 226 and the nozzle plate 220 sandwich the flow path forming plate 222, whereby the vibration plate 226 and the flow path forming plate 222 are integrated in a liquid-tight manner. In this way, a flow path unit 228 is constituted. The piezoid 21 is fixed on a fixed substrate 232.

With this arrangement, ink in the common ink chambers 225 flow into the pressure generating chamber 223 via the ink supply ports 224, when the piezoid 21 contracts so as to expand the pressure generating chamber 223. The ink in the pressure generating chamber 223 is compressed so as to jet out ink drops through the nozzle orifice 221, when the piezoid 21 extends after a predetermined period so as to contract the pressure generating chamber 223.

The piezoid 21 of the ink-jet head 23 is connected to the capacitive load drive circuit 1 via the analog switch 22, as shown in FIG. 7. The capacitive load drive circuit 1 generates a trapezoidal wave of a voltage having a value required for jetting out ink drops through the nozzle orifice 221. Further, the analog switch 22 selectively applies the output voltage V of the capacitive load drive circuit 1 to the piezoid 21 which corresponds to data to be printed.

By using the capacitive load drive circuit 1 of the present invention to drive the piezoids of the ink-jet printer (image forming apparatus) 210 as described above, it is possible to reduce the electrical power consumption of the ink-jet printer (image forming apparatus) 210.

Note that, the foregoing explained the case where the capacitive load drive circuit of the present invention is used to drive the piezoids (capacitive load) in the ink-jet printer (image forming apparatus) 210 which uses piezoids as ink jetting-out means for pressurizing ink to jet out the ink in droplets. However, the capacitive load drive circuit of the present invention may also be used to drive electrostatic drive electrodes in an ink-jet printer employing an electrostatic method in which the electrostatic drive electrodes are used as the ink jetting-out means [such as a method to jet out ink using inter-electrode electrostatic attraction force which is generated by applying a voltage between two electrodes (electrostatic drive electrodes)]. With this, the same effects of reducing electrical power consumption can be achieved.

Further, the ink-jet printer or image forming apparatus of the present invention is of course not limited to a special apparatus for printing, but may be a complex machine having the functions of a copying machine, a facsimile machine, and the like.

Embodiment 12

Here, the principle of the present invention will be explained.

Figure 50:
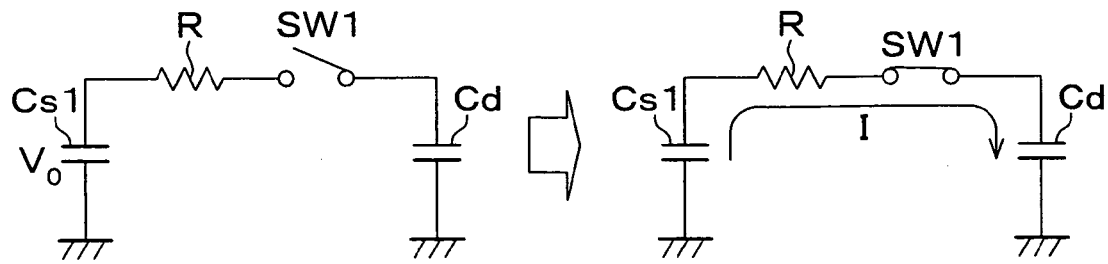
FIG. 50 is a circuit diagram used for explaining the principle of the present invention.

In a circuit of FIG. 50(*a*), it is assumed that an initial potential of an energy accumulating element Cs1 is V0 and an initial potential of the capacitive load Cd is 0, as shown in FIG. 50(*a*). When the switch SW1 is switched ON at t=0, a potential difference between the energy accumulating element Cs1 and the capacitive load Cd causes a current I to flow from the energy accumulating element Cs1 to the capacitive load Cd, so as to charge the capacitive load Cd, as shown in FIG. 50(*b*). Here, the both terminal voltages of the capacitive load Cd are given by the following expression.

$$V = \frac{Cs1}{Cd + Cs1} \cdot V_0 \cdot \left\{1 - \text{Exp}\left(-\frac{t}{\tau 1}\right)\right\}$$

$$\tau 1 = \frac{Cd \cdot Cs1}{Cd + Cs1} \cdot R$$

Figure 51:
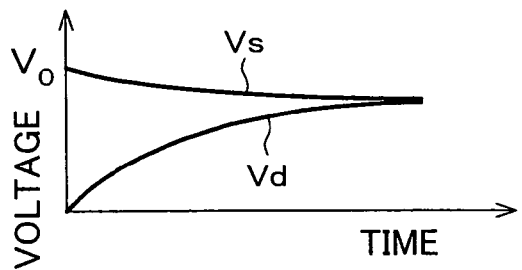
FIGS. 51(a) and 51(b) are diagrams used for explaining the principle of the present invention.
Figure 51:
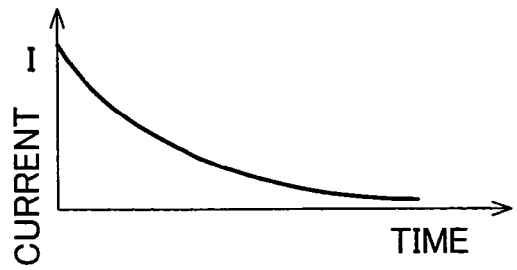

After the switch SW1 is kept turned ON for a sufficient time, the difference between a voltage Vs of the energy accumulating element Cs1 and a voltage Vd of the capacitive load Cd (potential difference between the energy accumulating element Cs1 and the capacitive load Cd) is eliminated so that the current I becomes 0. FIGS. 51(*a*) and 51(*b*) show how the voltages Vs and Vd and the current I change as time elapses. Here, V1 is the saturation voltage.

$$V_1 = \frac{Cs1}{Cd + Cs1} \cdot V_0$$

Figure 52:
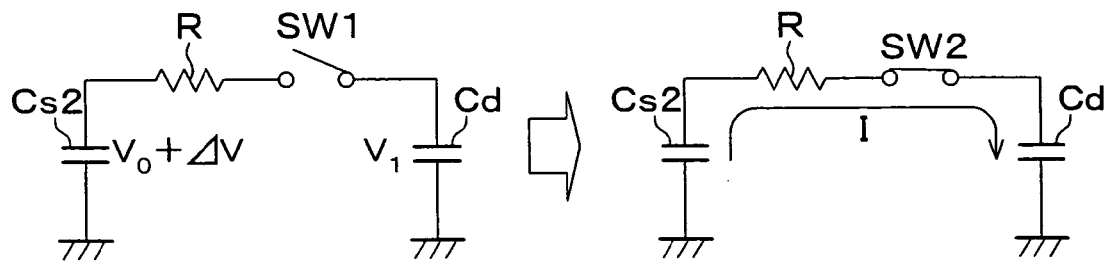
FIG. 52 is another circuit diagram used for explaining the principle of the present invention.

Next, the switch SW1 is turned OFF and the capacitive load Cd is connected to an energy accumulating element Cs2 having an initial potential of V0+ΔV (see FIG. 52). The potential difference between the capacitive load Cd and the energy accumulating element Cs2 charges the capacitive load Cd. Here, the both terminal voltages of the capacitive load Cd are given by the following expression.

$$V = \frac{Cs2}{Cd + Cs2} \cdot (V_0 + \Delta V - V_1) \cdot \left\{1 - \text{Exp}\left(-\frac{t}{\tau 2}\right)\right\} + V_1$$

$$\tau 2 = \frac{Cd \cdot Cs2}{Cd + Cs2} \cdot R$$

After the switch SW2 is kept switched ON for a sufficient time, the potential difference between the energy accumulating element Cs1 and the capacitive load Cd is eliminated so that the current I becomes 0 (see FIG. 52). Here, V2 is the saturation voltage.

$$V_2 = \frac{Cs2}{Cd + Cs2} \cdot (V_0 + \Delta V - V_1) = V_1$$

Figure 53:
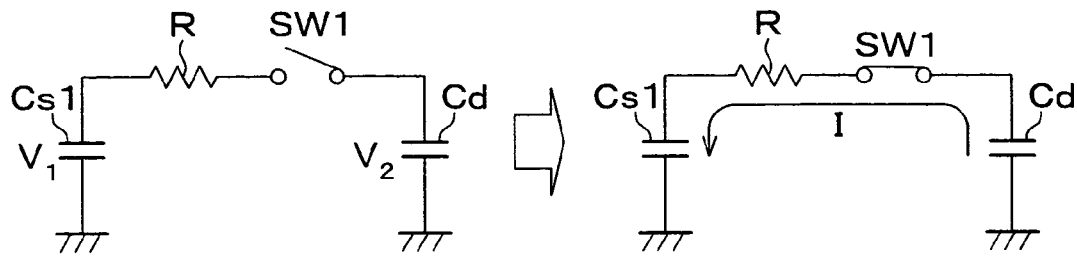
FIG. 53 is a further circuit diagram used for explaining the principle of the present invention.

Further, the switch SW2 is turned OFF and the switch SW1 is turned ON (see FIG. 53). The potential difference between the capacitive load Cd and the energy accumulating element Cs2 discharges the capacitive load Cd. Here, the both terminal voltages of the capacitive load Cd are given by the following expression.

$$V = \frac{Cs1}{Cd + Cs1} \cdot (V_1 - V_2) \cdot \left\{1 - \text{Exp}\left(-\frac{t}{\tau 1}\right)\right\} + V_2$$

After the switch SW1 is kept switched ON for a sufficient time, the potential difference between the energy accumulating element Cs1 and the capacitive load Cd is eliminated so that the current I becomes 0. Here, V3 is the saturation voltage.

$$V_3 = \frac{Cs1}{Cd + Cs1} \cdot (V_1 - V_2) + V_2$$

Here, if it is assumed that the capacitance Cs1 of the energy accumulating element Cs1 and the capacitance Cs2 of the energy accumulating element Cs2 are sufficiently larger than the capacitance Cd of the capacitive load Cd, the following expressions are obtained.

$$\frac{Cs1}{Cd + Cs1} \approx 1 \quad \frac{Cs2}{Cd + Cs2} \approx 1$$

$$V_3 = V_1 = V_0$$

Therefore, in the energy accumulating element Cs1, (i) initial potential V0, (ii) potential V1 after charging the capacitive load Cd, and (iii) potential V3 after being regenerated from the capacitive load Cd are approximately equivalent, so that apparent energy loss between the energy accumulating element Cs1 and the capacitive load Cd becomes 0.

Figure 30:
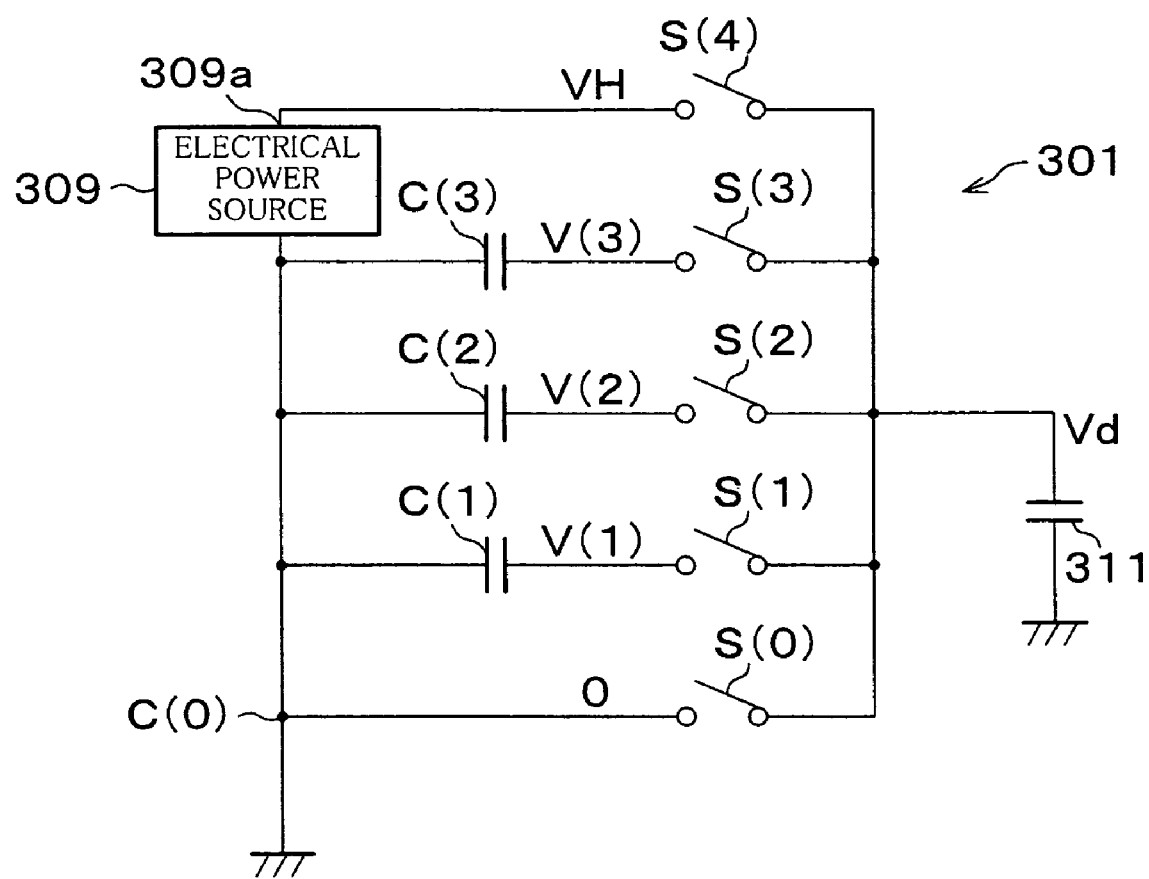
FIG. 30 is a circuit diagram showing an arrangement of a capacitive load drive circuit in accordance with still another embodiment of the present invention.
Figure 33:
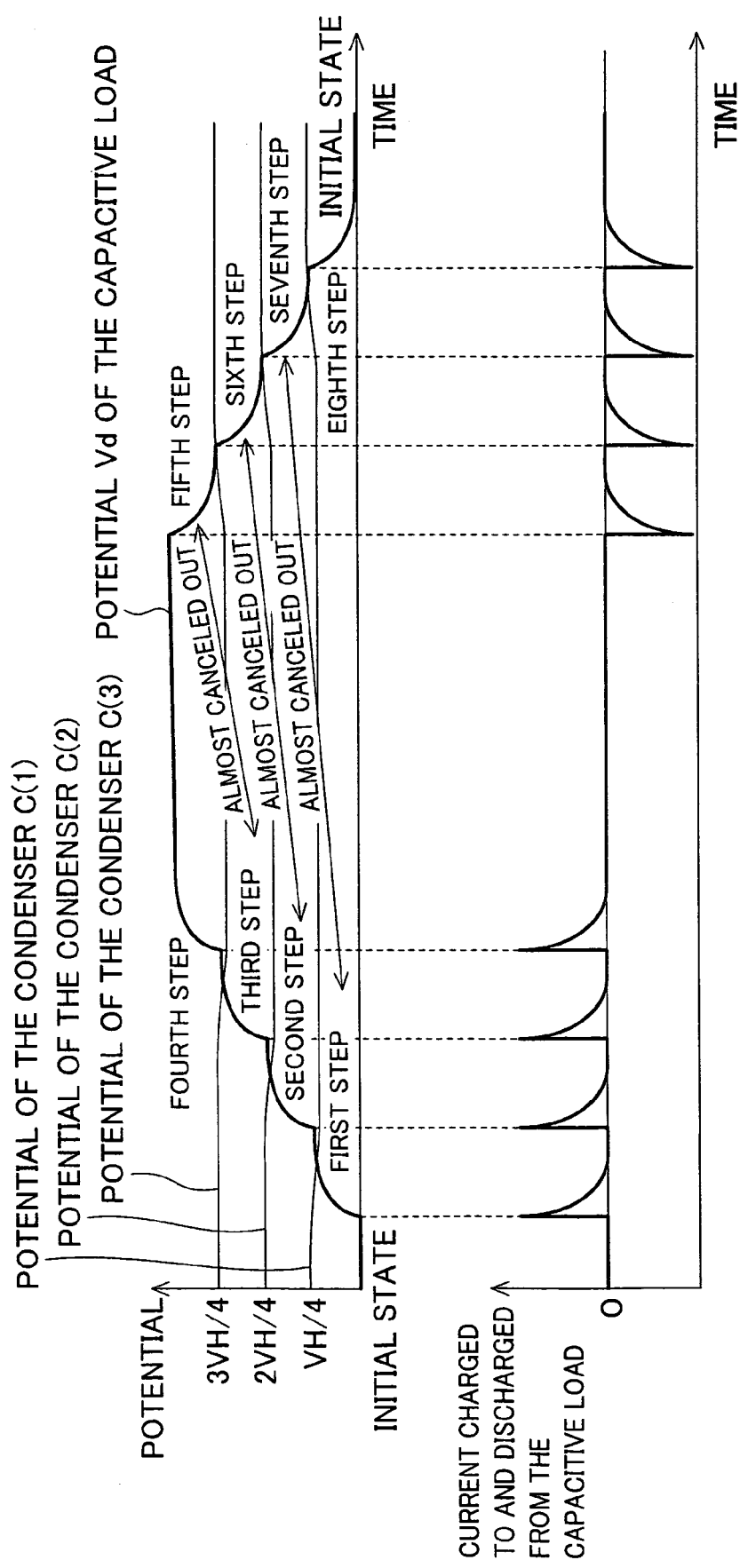
FIG. 33 is a waveform chart used for explaining the operation of the capacitive load drive circuit of FIG. 30.

Next, a capacitive load drive circuit 301 having four stages as shown in FIG. 30 will be exemplified as an embodiment to explain the principle of operation.

The capacitive load drive circuit 301 charges and discharges a capacitive load 311 such as a piezoid so as to drive the capacitive load 311. The capacitive load drive circuit 301 is provided with condensers C(1), C(2), and C(3) as energy accumulating elements which are connected in parallel between the capacitive load 311 and the ground. The capacitive load drive circuit 301 is further provided with an electrical power source 309 which is an AC power source (power source) for supplying the power supply voltage VH.

The capacitive load drive circuit 301 is provided with initial potential applying means (not shown) for applying initial potentials (initial electric charge) respectively to the condensers C(1) through C(3). The initial potential applying means splits (divides), into four equal parts, a potential difference (voltage) between (i) the ground potential (=0) and (ii) the power supply voltage VH which is supplied from the electrical power source 309; and applies three potentials V1 (=¼·VH), V2 (=²⁄₄·VH), and V3 (=¾·VH), which are generated by dividing the voltage, respectively to the condensers C(1) through C(3) as the initial potentials. The initial potential applying means is connected between the ground (ground point) and the electrical power source 309, for example. The initial potential applying means is voltage dividing means which divides the potential difference between the ground potential and the power supply voltage VH, and which supplies the divided voltages to voltage dividing points to which the condensers C(1) through C(3) are respectively connected. For example, like the voltage divider 5 as described before, the voltage dividing means may be a resistance type voltage dividing circuit having four resistors which are connected in series between (i) the ground (ground terminal) and (ii) a power supplying point VH (power supply terminal) to which the power supply voltage V is supplied.

Further, switching elements S(1), S(2), and S(3) are respectively connected between the capacitive load 311 and the condensers C(1), C(2), and C(3). A switching element S(4) is connected between the electrical power source 309 and the capacitive load 311. A switching element S(O) is connected between a ground potential G and the capacitive load 311. In this embodiment, the switching elements S(0) through S(4) make up switching means. On the other hand, the other terminal of the capacitive load 311, which is not connected to the switching elements S(0) through S(4), is connected to the ground. Further, the other terminals of the condensers C(1), C(2), and C(3), which are not connected to the capacitive load 311, are connected to the ground via a ground point (reference potential terminal, ground terminal) C(0).

The following will explain the operation of the capacitive load drive circuit 301 as arranged above, with reference to FIGS. 31(a) to 31(e), 32(a) to 32(d), and 33. Note that, for convenience, the following will explain a case where the power supply voltage VH is a positive potential. When the power supply voltage VH is a negative potential, the capacitive load drive circuit 301 operates in the same manner except that the potential has the opposite polarity and the electric charge moves in the opposite direction.

Figure 81:
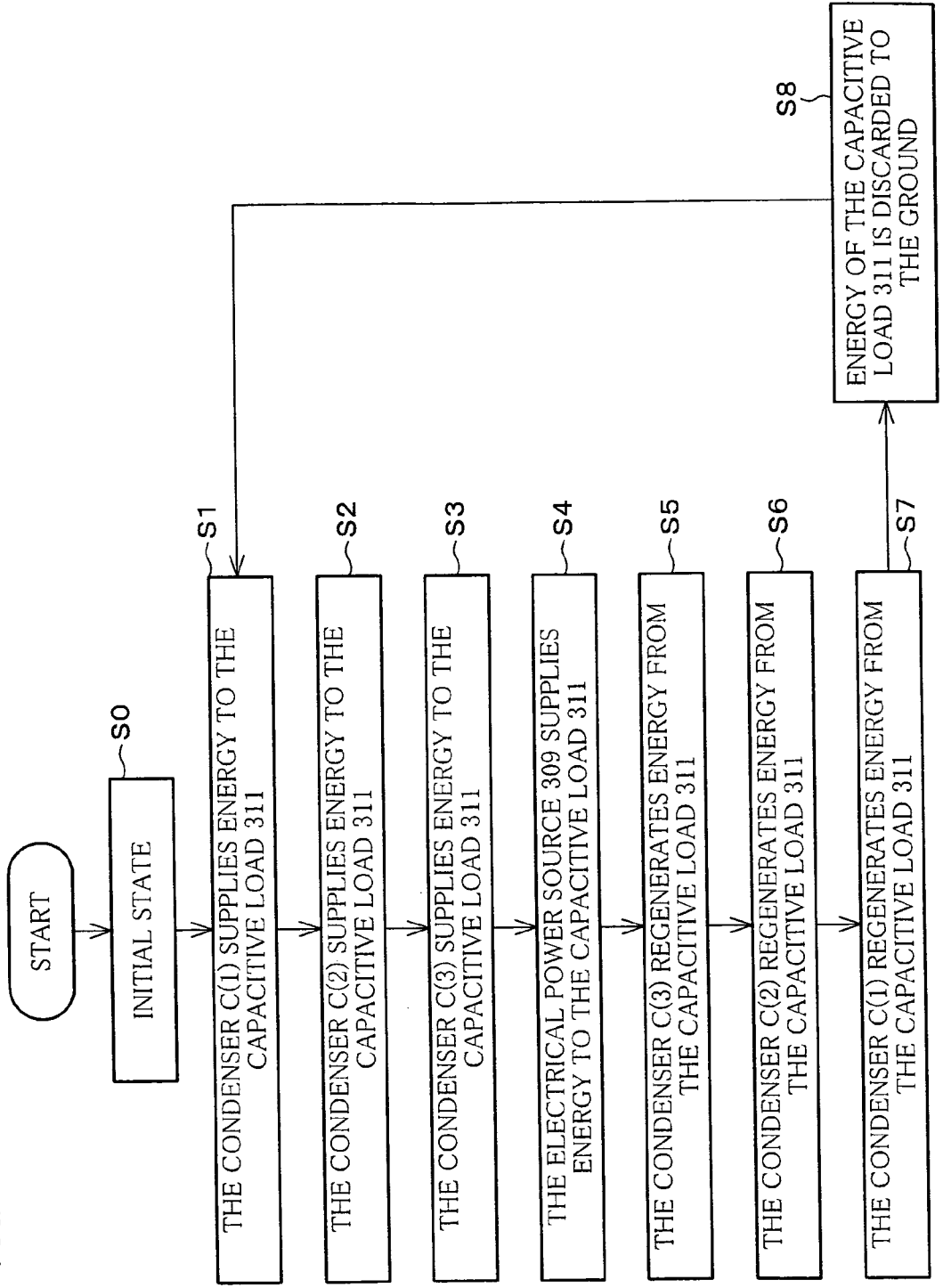
FIG. 81 is a flow chart showing a method for driving a capacitive load in accordance with an embodiment of the present invention.

Initially, only the switching element S(0) is switched ON (ON state) among the switching elements S(0) through S(4), as shown in FIG. 31(a); and the capacitive load 311 does not accumulate electric charge (initial state) (S0 in FIG. 81).

In a first step, the switching element S(0) is switched OFF (OFF state), and then the switching element S(1) is switched ON, as shown in FIG. 31(b). Here, the condenser C(1) accumulates energy of the potential V1 (=¼·VH), and the capacitive load 311 does not accumulate electric charge, resulting in a potential difference of VH/4 between the condenser C(1) and the capacitive load 311. With this potential difference of VH/4, electric charge in accordance with a ratio of a capacitance C1 of the condenser C(1) to the capacitance Cd of the capacitive load 311 moves from the condenser C(1) to the capacitive load 311. In other words, the condenser C(1) supplies electrostatic energy (hereinafter merely referred to as "energy" when appropriate) to the capacitive load 311, so as to charge the capacitive load 311 (S1 in FIG. 81). The potential of the condenser C(1) falls as much as an amount of electric charge flowing into the capacitive load 311, whereas the potential of the capacitive load 311 rises by an amount of electric charge flowing from the condenser C(1). When the capacitance C1 of the condenser C(1) is sufficiently larger than the capacitance Cd of the capacitive load 311 (C1>Cd), the change in potential of the condenser C(1) is small. When the switching element S(1) is kept switched ON for a sufficiently long time, the condenser C(1) and the capacitive load 311 have substantially the same potential as a result of the energy transfer. Consequently, the potentials of the condenser C(1) and the capacitive load 311 after charging are slightly lower than the initial potential VH/4 (=V1) of the condenser C(1) (see FIG. 33). This potential after charging is V1'.

In a second step, the switching element S(1) is switched OFF, and then the switching element S(2) is switched ON, as shown in FIG. 31(c). Here, the condenser C(2) accumulates energy of the potential V2 which is higher than the potential V1', so that electric charge in accordance with a ratio of a capacitance C2 of the condenser C(2) to the capacitance Cd of the capacitive load 311 moves from the condenser C(2) to the capacitive load 311. In other words, with the potential difference V2−V1' (=VH/4+α; α is a positive value extremely smaller than VH), the condenser C(2) supplies energy to the capacitive load 311, so as to further charge the capacitive load 311 (S2 in FIG. 81). The potential of the condenser C(2) falls as much as an amount of electric charge flowing into the capacitive load 311, whereas the potential of the capacitive load 311 rises by an amount of electric charge flowing from the condenser C(2). When the capacitance C2 of the condenser C(2) is sufficiently larger than the capacitance Cd of the capacitive load 311 (C2>Cd), the change in potential of the condenser C(2) is small. When the switching element S(2) is kept switched ON for a sufficiently long time, the condenser C(2) and the capacitive load 311 have substantially the same potential as a result of the energy transfer. Consequently, the potentials of the condenser C(2) and the capacitive load 311 after charging are slightly lower than the initial potential 2VH/4 (=V2) of the condenser C(2) (see FIG. 33). This potential after charging is V2'.

In a third step, the switching element S(2) is switched OFF, and then the switching element S(3) is switched ON, as shown in FIG. 31(d). Here, the condenser C(3) accumulates energy of the potential V3 which is higher than the potential V2', so that electric charge in accordance with a ratio of a capacitance C3 of the condenser C(3) to the capacitance Cd of the capacitive load 311 moves from the condenser C(3) to the capacitive load 311. In other words, with the potential difference V3−V2' (=VH/4+α), the condenser C(3) supplies energy to the capacitive load 311, so as to further charge the capacitive load 311 (S3 in FIG. 81). The potential of the condenser C(3) falls as much as an amount of electric charge flowing into the capacitive load 311, whereas the potential of the capacitive load 311 rises by an amount of electric charge flowing from the condenser C(3). When the capacitance C3 of the condenser C(3) is sufficiently larger than the capacitance Cd of the capacitive load 311 (C3>Cd), the change in potential of the condenser C(3) is small. When the switching element S(3) is kept switched ON for a sufficiently long time, the condenser C(3) and the capacitive load 311 have substantially the same potential as a result of the energy transfer. Consequently, the potentials of the condenser C(3) and the capacitive load 311 after charging are slightly lower than the initial potential 3VH/4 (=V3) of the condenser C(3) (see FIG. 33). This potential after charging is V3'.

In a fourth step, the switching element S(3) is switched OFF, and then the switching element S(4) is switched ON, as shown in FIG. 31(e). Here, the power supply voltage (power supply potential) VH is higher than the potential V3'. With this potential difference VH−V3'(=VH/4+α), the electrical power source 309 supplies energy to the capacitive load 311, so as to further charge the capacitive load 311 (S4 in FIG. 81). When the switching element S(4) is kept switched ON for a sufficiently long time, the potential of the capacitive load 311 after charging is boosted to the power supply voltage VH.

In a fifth step, the switching element S(4) is switched OFF, and then the switching element S(3) is switched ON, as shown in FIG. 32(a) (S5 in FIG. 81). Here, the capacitive load 311 accumulates VH, which is higher than the potential V3' of the condenser C(3). With this potential difference of VH−V3', which is VH/4+α, electric charge in accordance with a ratio of the capacitance C3 of the condenser C(3) to the capacitance Cd of the capacitive load moves to the condenser C(3). With this, the potential of the condenser C(3) rises by an amount of electric charge flowing from the capacitive load 311, whereas the potential of the capacitive load 311 falls as much as an amount of electric charge flowing into the condenser C(3). When the switching element S(3) is kept switched ON for a sufficiently long time, the condenser C(3) and the capacitive load 311 have the same potential as a result of the energy transfer. Consequently, the potential of the condenser C(3) substantially returns to the original V3=3VH/4, namely, energy is regenerated from the capacitive load 311 to the condenser C(3) (S5 in FIG. 81).

In a sixth step, the switching element S(3) is switched OFF, and then the switching element S(2) is switched ON, as shown in FIG. 32(b) (S6 in FIG. 81). Here, the capacitive load 311 accumulates V3, which is higher than the potential V2'. With this potential difference of V3−V2', which is VH/4+α, electric charge in accordance with a ratio of the capacitance C2 of the condenser C(2) to the capacitance Cd of the capacitive load 311 moves from the capacitive load 311 to the condenser C(2), so as to charge the condenser C(2). With this, the potential of the condenser C(2) rises by an amount of electric charge flowing from the capacitive load 311, whereas the potential of the capacitive load 311 falls as much as an amount of electric charge flowing into the condenser C(2). When the switching element S(2) is kept switched ON for a sufficiently long time, the condenser C(2) and the capacitive load 311 have the same potential as a result of the energy transfer. Consequently, the potential of the condenser C(2) substantially returns to the original V2=2VH/4. Namely, energy is regenerated from the capacitive load 311 to the condenser C(2) (S6 in FIG. 81).

In a seventh step, the switching element S(2) is switched OFF, and then the switching element S(1) is switched ON, as shown in FIG. 32(c) (S7 in FIG. 81). Here, the capacitive load 311 accumulates energy of the potential V2, which is higher than the potential V1'. With this potential difference of V2−V1', which is VH/4+α, electric charge in accordance with a ratio of the capacitance C1 of the condenser C(1) to the capacitance Cd of the capacitive load 311 moves from the capacitive load 311 to the condenser C(1), so as to charge the condenser C(1). With this, the potential of the condenser C(1) rises by an amount of electric charge flowing from the capacitive load 311, whereas the potential of the capacitive load 311 falls as much as an amount of electric charge flowing into the condenser C(1). When the switching element S(1) is kept switched ON for a sufficiently long time, the condenser C(1) and the capacitive load 311 have the same potential as a result of the energy transfer. Consequently, the potential of the condenser C(1) substantially returns to the original V1=VH/4. Namely, energy is regenerated from the capacitive load 311 to the condenser C(1) (S7 in FIG. 81).

In an eighth step, the switching element S(1) is switched OFF, and then the switching element S(2) is switched ON, as shown in FIG. 32(d). Here, the capacitive load 311 accumulates energy of the potential V1', which is higher than the ground potential'. With this potential difference of V1', which is the potential difference of VH/4+α, electric charge of the capacitive load 311 flows out (is discharged) to the ground potential, namely, is consumed (discarded) (S8 in FIG. 81). After this, the capacitive load drive circuit 301 resumes S1.

As described above, in terms of energy during the first through eighth steps S1 through S8, the energy accumulated in the condenser C(1) which is supplied into the capacitive load 311 in the first step S1 is regenerated by the energy sent back to the condenser C(1) from the capacitive load 311 in the seventh step S7. The energy supplied to the capacitive load 311 in the second step S2 is regenerated by the energy sent back to the condenser C(1) from the capacitive load 311 in the sixth step S6. The energy supplied to the capacitive load 311 in the third step S3 is regenerated by the energy sent back to the condenser C(1) from the capacitive load 311 in the fifth step S5. In summary, during the first through eighth steps S1 through S8, energy is supplied to the capacitive load 311 in the fourth step S4, energy is consumed in the eighth step S8, and energy transfer in the remaining steps is respectively canceled out between paired steps (see FIG. 33). Therefore, energy is not apparently supplied or consumed. As a result, consumed is only energy corresponding to 1/4·VH equivalently. In other words, it is possible to charge and discharge the capacitive load 311 while consuming 25% of energy that is consumed in a method such as the Push-Pull method which consumes the voltage VH to charge and discharge the capacitive load.

More specifically, the following will describe how the voltages change when the capacitive load drive circuit 301 having four stages is used to generate a pulse whose crest value is 10 Vpp. When 10V is divided by four, 10V is divided into five potentials, namely 2.5V, 5.0V, and 7.5V of the respective potentials of the condensers C(1) through C(3), 0V of the ground potential, and 10V of the power supply potential, at a potential difference of 2.5V between each stage. Further, the capacitance of the condensers C(1) through C(3) is preferably larger than the capacitance of the capacitive load 311. To make the operation easily understandable, it is assumed here that the capacitance of the condensers C(1) through C(3) is four times greater than the capacitance of the capacitive load 311. Further, each of the switching elements S(0) through S(4) used in the system is generally a semiconductor switch such as a half-FET (field effect transistor) and a GTO thyristor. The semiconductor switch charges and discharges the capacitive load 311 exponentially with a particular time constant, because the semiconductor switch has a considerable ON resistance. Accordingly, the relationship between (i) the time during which the switching elements S(0) through S(4) are ON and (ii) the time constant of charging and discharging the capacitive load 311 becomes important when forming a waveform. For simplicity, the calculation is performed here by assuming that the ON resistances of the switching elements S(0) through S(4) are very small, and the switching elements S(0) through S(4) are switched from one stage to another after a sufficiently long switching time to the degree that the influence of the ON resistances of the switching elements S(0) through S(4) are negligible in the system. Table 1 shows the results of the calculation. In Table 1, Vd is the potential of the capacitive load 311, Vs_0 is the ground potential, Vs_n (n=1 through 3) is the potential of the condenser C(n) at each stage, and Vs_4 is the power supply potential.

TABLE 1

| Vs_4 | Vs_3 | Vs_2 | Vs_1 | Vs_0 | Vd | |
|------|------|------|------|------|-----|---|
| 10.0 | 7.5 | 5.0 | 2.5 | 0.0 | 0.0 | INITIAL STATE (S0) |
| 10.0 | 7.5 | 5.0 | 2.0 | 0.0 | 2.0 | AFTER THE FIRST STEP S1 |
| 10.0 | 7.5 | 4.4 | 2.0 | 0.0 | 4.4 | AFTER THE SECOND STEP S2 |
| 10.0 | 6.9 | 4.4 | 2.0 | 0.0 | 6.9 | AFTER THE THIRD STEP S3 |
| 10.0 | 6.9 | 4.4 | 2.0 | 0.0 | 10.0 | AFTER THE FOURTH STEP S4 |
| 10.0 | 7.5 | 4.4 | 2.0 | 0.0 | 7.5 | AFTER THE FIFTH STEP S5 |
| 10.0 | 7.5 | 5.0 | 2.0 | 0.0 | 5.0 | AFTER THE SIXTH STEP S6 |
| 10.0 | 7.5 | 5.0 | 2.5 | 0.0 | 2.5 | AFTER THE SEVENTH STEP S7 |
| 10.0 | 7.5 | 5.0 | 2.5 | 0.0 | 0.0 | AFTER THE EIGHTH STEP S8 |

As can be seen from the results, the potential of each condenser decreases when each condenser supplies energy into the capacitive load. However, the potential of each condenser is restored when the capacitive load supplies energy back to each condenser. As a result, the electrical power is regenerated.

As described above, the capacitive load drive circuit 301 of the present embodiment is arranged so as to include a power supply terminal 309a to which a power supply voltage VH is applied from an electrical power source 309; a ground terminal C(0) (reference potential terminal) to which a ground potential (reference potential) is applied; three condensers C(1) through C(3) to which initial potentials V(1) through V(3) are respectively applied, the initial potentials V(1) through V(3) being different from one another and being between the ground potential and the power supply voltage VH; and switching elements S(0) through S(4) for selectively connecting the capacitive load 311 with the ground terminal C(0), the condensers C(1) through C(3), and the power supply terminal 309a, the switching elements S(0) through S(4) carrying out the steps of (i) connecting the capacitive load 311 with the ground terminal C(0) and then sequentially connecting the capacitive load 311 with the condensers C(1) through C(3) in an order of the initial potentials from the initial potential that is closest to the ground potential so as to change a terminal voltage of the capacitive load 311 toward the power supply potential VH (S1 through S3), (ii) selectively connecting the capacitive load 311 with the power supply terminal 309a so as to increase an absolute value of the terminal voltage of the capacitive load 311 (S4), and (iii) sequentially connecting the capacitive load 311 with the condensers C(1) through C(3) in an order of the initial potentials from the initial potential that is closest to the power supply potential VH so as to decrease the absolute value of the terminal voltage of the capacitive load 311 and so as to regenerate electrostatic energy to be accumulated in the condensers C(1) through C(3), the thus regenerated electrostatic energy being approximately equal to electrostatic energy as accumulated in the condensers C(1) through C(3) before the step (i) (S5 through S7), the steps (i) through (iii) being carried out in this order.

Note that, the foregoing described the case where the number of the condensers to which initial potentials are respectively applied are three, the initial potentials being different from one another and being between the ground potential and the power supply voltage VH, and the number of steps of charging (or discharging) the capacitive load 311 (which is smaller than the number of kinds of potentials of the switching elements S(0) through S(4) by one, and which is larger than the number of condensers by one; hereinafter referred to as "the number of stages") is four.

However, the number of stages is not particularly limited, provided that the number of stages is two or more. Ideally, the regeneration efficiency improves as the number of stages increases. For example, the regeneration efficiency is 50% with two stages, the regeneration efficiency is 66.7% with three stages, the regeneration efficiency is 75% with four stages, and the regeneration efficiency is 80% with five stages. However, as the number of stages increases, a rise time for the voltage becomes longer, and the number of required circuits becomes larger. Accordingly, the number of stages may be determined depending on a required waveform of the drive pulse, the size of the circuit, cost, and the like. Generally, the circuit is preferably arranged to have three to four stages when the voltage is required to rise quickly; whereas the circuit is preferably arranged to have four to five stages so as to reduce electrical power consumption.

Further, the foregoing described the case where the power supply voltage VH is equally divided by four stages, but it is not necessary that the power supply voltage VH is equally divided. However, the capacitive load drive circuit 301 of the present embodiment regenerates electrical power using the principle in which (A) energy which is reduced in the condenser (I) by supplying energy from the condenser C(I) (I=1, 2, 3) to the capacitive load 311 whose potential is V(I−1) (where V(0)=0) (S1 through S3) is regenerated by supplying (B) energy to C(I) from the capacitive load 311 whose potential is V(I) (where V(4)=VH) (S5 through S8). Accordingly, it is most preferable to equally divide the electrical power voltage VH, for ideally regenerating electrical power.

Here, the time constant of the capacitive load 311 and the switching time of the condenser C(I) will be discussed.

Figure 54:
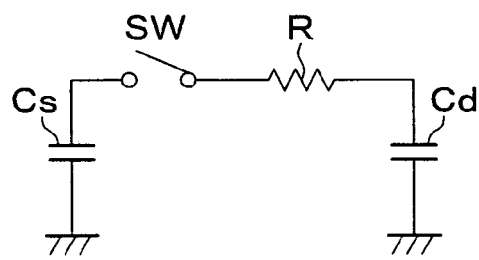
FIG. 54 is a diagram schematically showing energy supply to a capacitive load from one condenser in the capacitive load drive circuit in accordance with the present invention.
Figure 55:
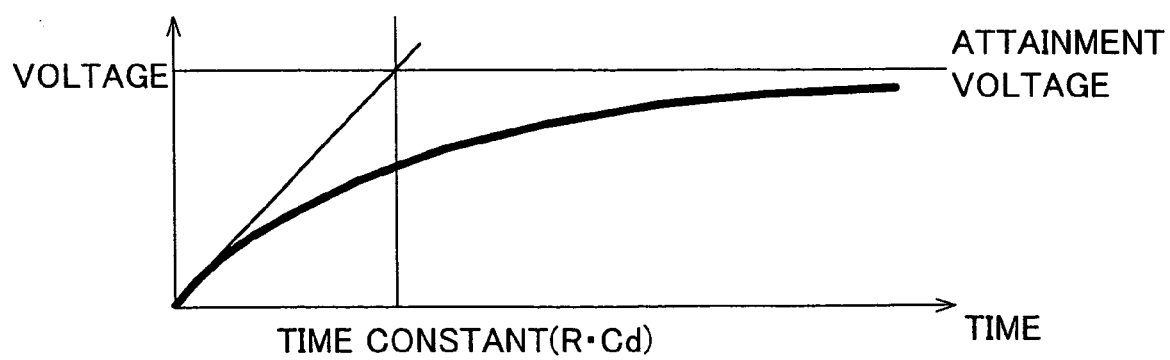
FIG. 55 is a graph showing how the voltage of the capacitive load changes in accordance with the energy supply from the condenser.

In the circuit shown in FIG. 54, first, it is assumed that the initial potential is applied to the condenser Cs, and the capacitive load Cd is discharged. Here, after the switch SW is turned ON, the voltage of the capacitive load Cd increases as time elapses, as shown in FIG. 55. After a sufficient time, the potential difference between the capacitive load Cd and the condenser Cs is eliminated so that the current I becomes 0. This saturation voltage will be referred to as "attainment voltage" in the present specification.

Figure 56:
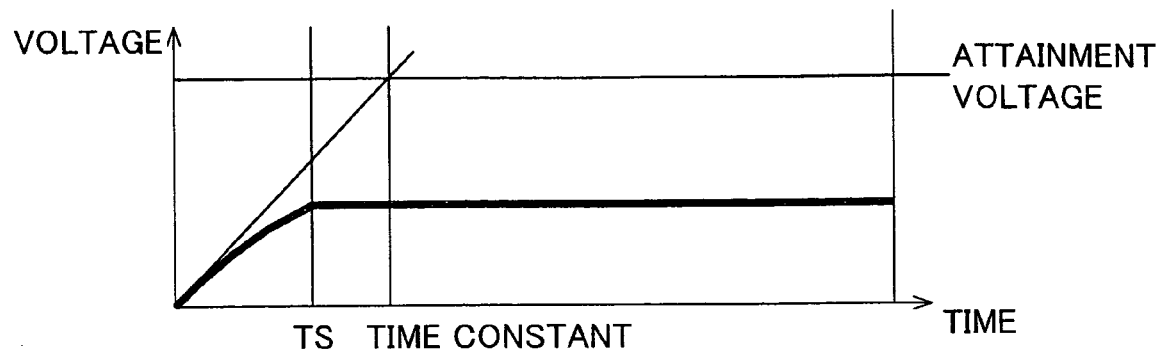
FIG. 56(a) is a graph showing how the voltage of the capacitive load changes in accordance with energy supply from one condenser.
FIG. 56(b) is a graph showing how the voltage of the capacitive load changes in accordance with energy supply from a plurality of condensers in the capacitive load drive circuit of the present invention. In both FIGS. 56(a) and 56(b), a switching time (Ts) is shorter than a time constant (R·Cd).
Figure 56:
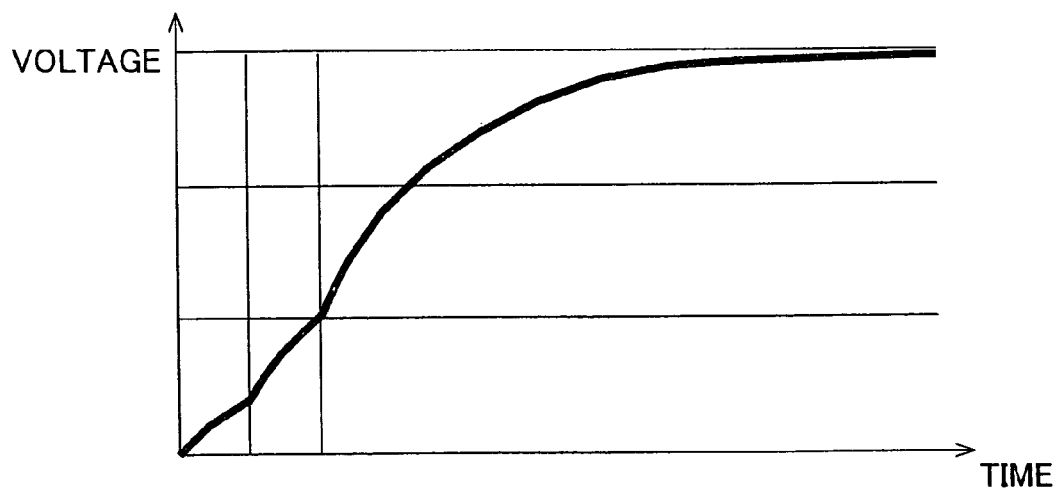

In the circuit shown in FIG. 54, it is assumed that the switch is turned OFF after a particular time (switching time (Ts)). When the switching time (Ts) is shorter than the time constant ($\tau_0 = R \cdot Cd$, where R is an DC resistive component of the charge or discharge path including the energy accumulating elements and the capacitive load, and Cd is the capacitance of the capacitive load), the voltage of the capacitive load Cd changes as shown in FIG. 56(a). Accordingly, the voltage of the capacitive load Cd changes as shown in FIG. 56(b) in the capacitive load drive circuit having three stages in accordance with the present invention.

Figure 57:
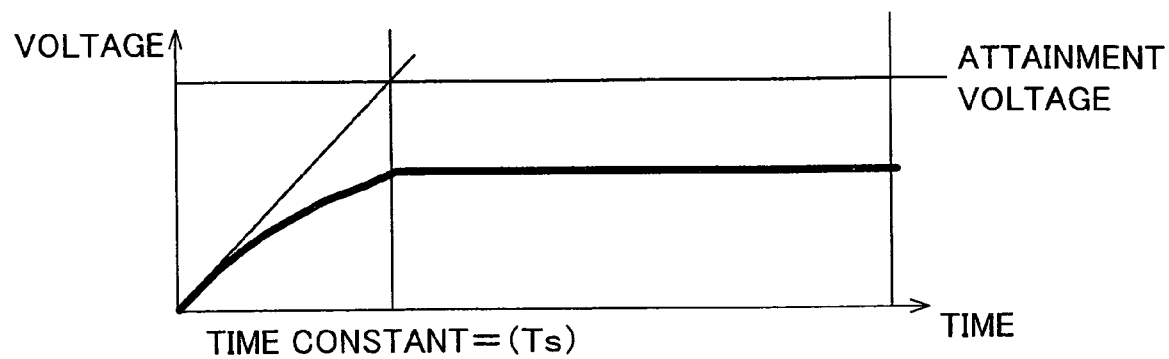
FIG. 57(a) is a graph showing how the voltage of the capacitive load changes in accordance with energy supply from one condenser.
FIG. 57(b) is a graph showing how the voltage of the capacitive load changes in accordance with energy supply from a plurality of condensers in the capacitive load drive circuit of the present invention. In both FIGS. 57(a) and 57(b), a switching time (Ts) is equal to a time constant.
Figure 57:
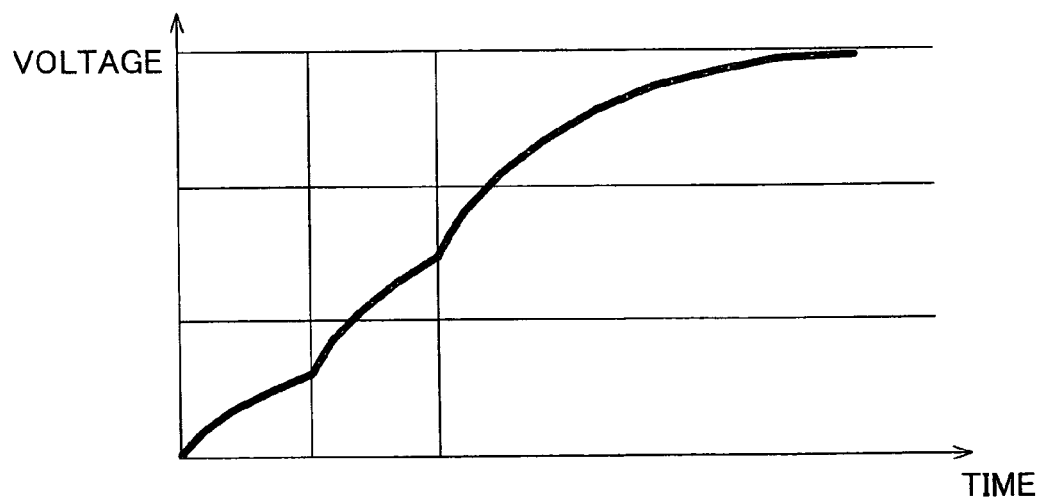

When the switching time (Ts) is equal to the time constant (τo=R·Cd), the voltage of the capacitive load Cd changes as shown in FIG. 57(a). Accordingly, the voltage of the capacitive load Cd changes as shown in FIG. 57(b) in the capacitive load drive circuit having three stages in accordance with the present invention.

Figure 58:
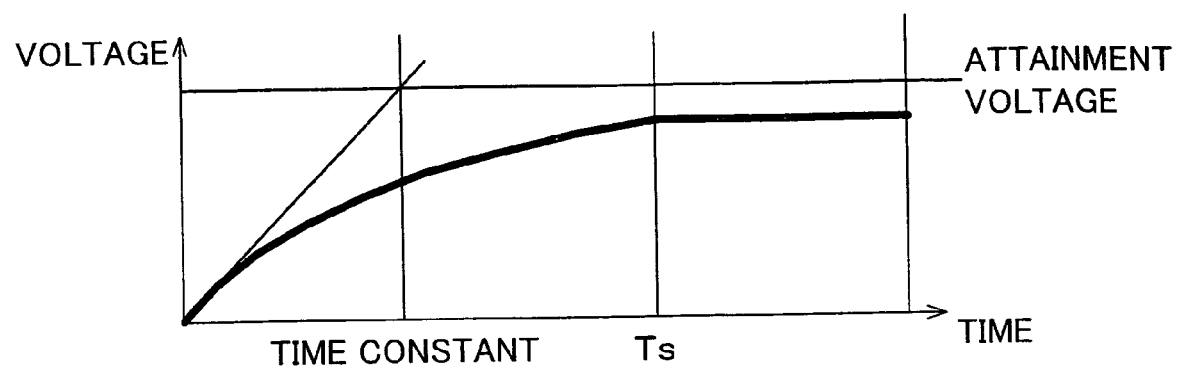
FIG. 58(a) is a graph showing how the voltage of the capacitive load changes in accordance with energy supply from one condenser.
FIG. 58(b) is a graph showing how the voltage of the capacitive load changes in accordance with energy supply from a plurality of condensers in the capacitive load drive circuit of the present invention. In both FIGS. 58(a) and 58(b), a switching time (Ts) is longer than a time constant.
Figure 58:
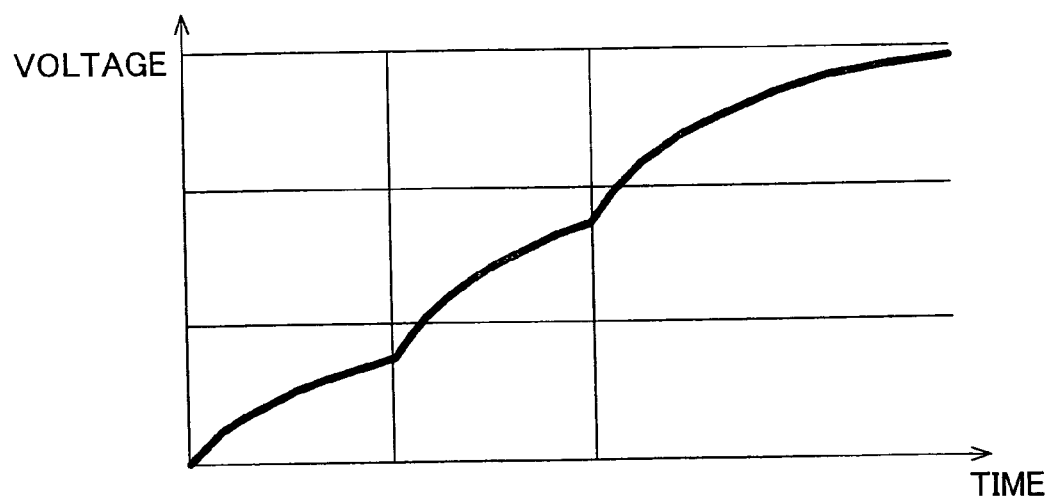

When the switching time (Ts) is longer than the time constant (τo=R·Cd), the voltage of the capacitive load Cd changes as shown in FIG. 58(a). Accordingly, the voltage of the capacitive load Cd changes as shown in FIG. 58(b) in the capacitive load drive circuit having three stages in accordance with the present invention.

The capacitive load drive circuit of the present invention preferably satisfies the following expression:

$$\tau o \lessapprox Ts \lessapprox 2.5 \cdot \tau o (\tau o = R \cdot Cd),$$

where Cs is the capacitive component of the energy accumulating elements, Cd is the capacitance of the capacitive load, R is a DC resistive component of the charge or discharge path including the energy accumulating elements and the capacitive load, and Ts is the time for switching the energy accumulating elements (switching time; a time to be kept connected to the capacitive load). When Ts<τo, the crest value of the obtained pulse is not more than 63% of the attainment voltage, thereby lowering the efficiency in supplying energy to the capacitive load. When Ts>2.5·τo, the switching time becomes extremely long.

Embodiment 13

Next, the following will explain still another embodiment of the present invention with reference to FIGS. 34, 35(a) to 35(f), 36, and 37. Note that, for convenience, members having the same functions as those used in Embodiment 12 will be given the same reference symbols, and explanation thereof will be omitted here.

A capacitive load drive circuit 302 of the present embodiment is different from the capacitive load drive circuit 301 of Embodiment 12 in that a condenser C(N) is additionally provided between the electrical power source 309 and the switching element S(4) which is connected to the electrical power source 309, and the number of stages (number of condensers) is generalized.

Figure 34:
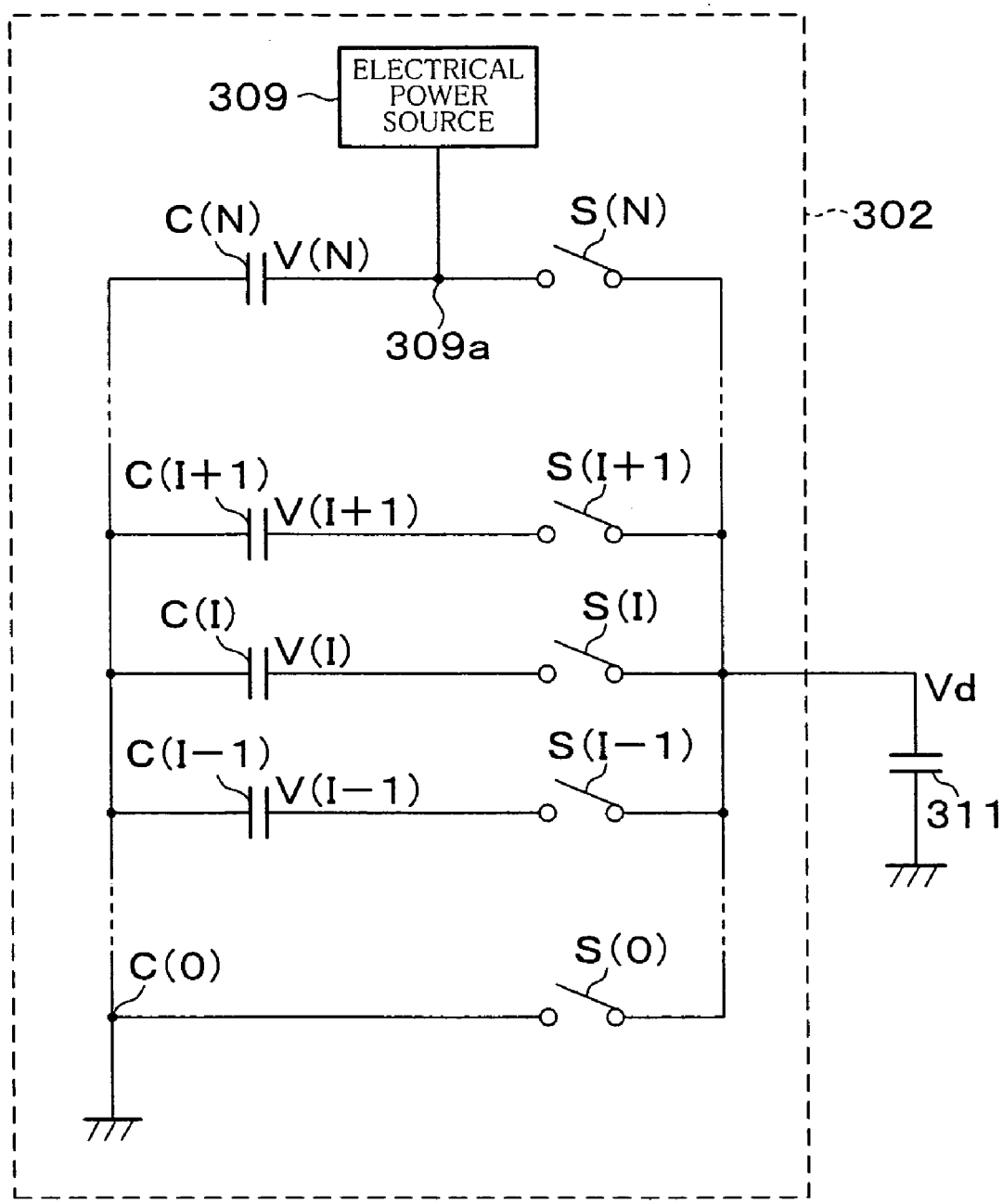
FIG. 34 is a circuit diagram showing an arrangement of a capacitive load drive circuit in accordance with yet another embodiment of the present invention.
Figure 35:
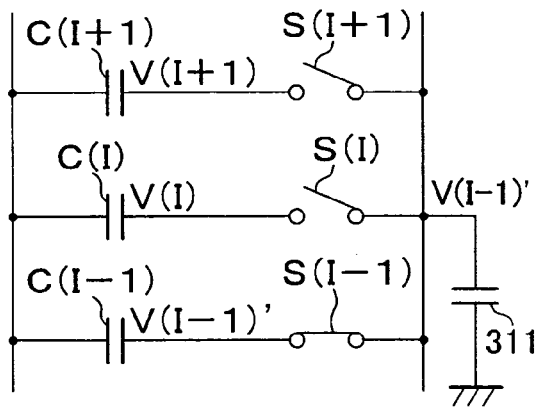
FIGS. 35(a) through 35(f) are circuit diagrams used for explaining the operation of the capacitive load drive circuit of FIG. 34.
Figure 35:
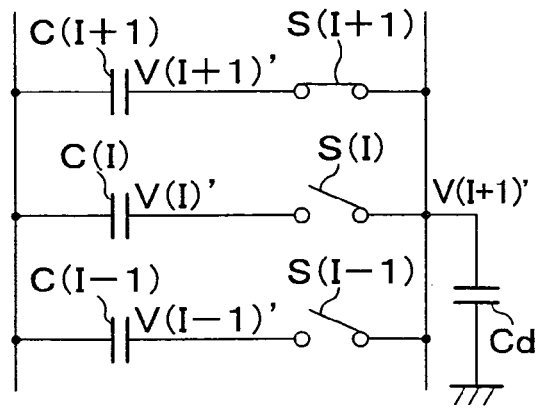
Figure 35:
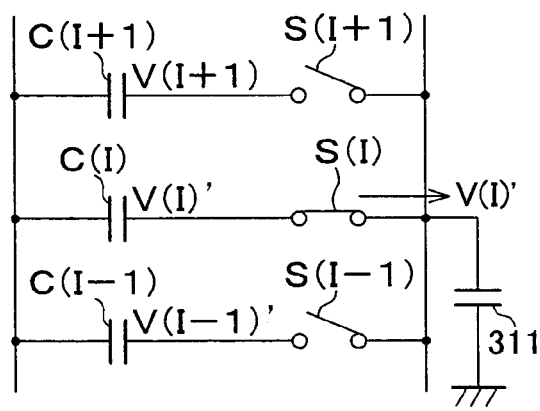
Figure 35:
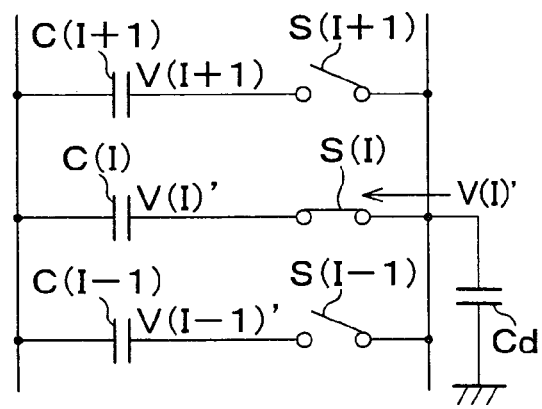
Figure 35:
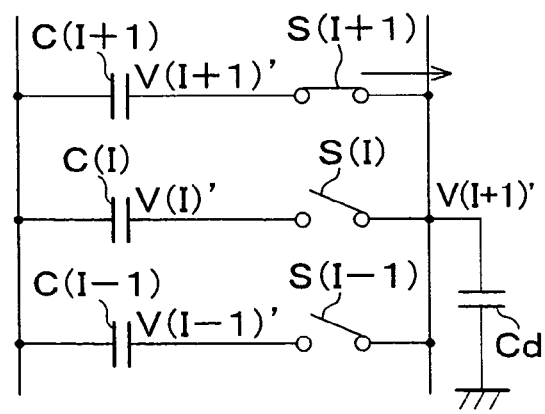
Figure 35:
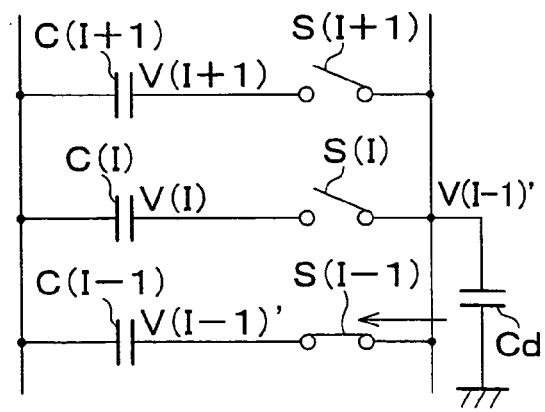

As shown in FIGS. 34 and 35, the capacitive load drive circuit 302 of the present embodiment is a pulse generating circuit which includes a ground terminal C(0) having a ground potential (reference potential) V(0) (=0); N condensers C(1) through C(N) (energy accumulating elements) having initial potentials V(1) through V(N) which are not 0 (N is a natural number not less than 2), the condenser C(N) connecting to an electrical power generating source (directly or via a circuit); a switching element S(0) (switching means) for connecting the capacitive load 311 with the ground terminal C(0) (reference potential terminal); and N switching elements S(1) through S(N) for selectively connecting the capacitive load 311 with the condensers C(1) through C(N) (switching means), one of the N condensers C(1) through C(N) being a condenser C(I) (first energy accumulating element) having a first initial potential V(I) which is not 0, one of the N condensers C(1) through C(N) being a condenser C(I+1) (second energy accumulating element) having a second initial potential V(I+1) which has the same polarity as the initial potential V(I) and which has a larger absolute value than the initial potential V(I), the switching elements S(0) through S(N) (switching means) carrying out (i) a first charging step of selectively connecting the capacitive load 311 with the ground terminal or the condenser C(I−1) (ground terminal or third energy accumulating element) and then selectively connecting the capacitive load 311 with the condenser C(I) so as to change a potential (terminal voltage) of the capacitive load 311 toward the initial potential of the condenser C(I); (ii) a second charging step of selectively connecting the capacitive load 311 with the condenser C(I+1) so as to increase an absolute value of the potential (terminal voltage) of the capacitive load 311; and (iii) a discharging step of selectively connecting the capacitive load 311 with the condenser C(I) so as to decrease the absolute value of the potential (terminal voltage) of the capacitive load 311 and so as to regenerate electrostatic energy to be accumulated in the condenser C(I), the thus regenerated electrostatic energy being approximately equal to electrostatic energy as accumulated in the condenser C(I) before the step (i), the steps (i) through (iii) being carried out in this order. Note that, the circuit for supplying initial electric charge is omitted in FIG. 34.

The operation of the above arrangement will be explained with reference to FIGS. 35(a) through 35(f).

When generating a pulse, energy is consumed in such a manner that electric charge which moves from the condenser C(N) to the condenser C(N−1) is transferred toward the ground potential so as to be consumed at the ground terminal C(0). The cycle of FIG. 35(a) through FIG. 35(f) achieves the same effects as the cycle of the steps S1 through S8 in Embodiment 12. In other words, by making (A) the electric charge flowing out of the condenser C(I) between FIGS. 35(a) and 35(b) to be approximately equal to (B) the electric charge flowing into the condenser C(I) between FIGS. 35(d) and 35(e), the condenser C(I) does not apparently consume energy during the cycle of FIGS. 35(a) through 35(f).

Thus, the capacitive load drive circuit may be arranged to carry out at least the cycle of FIGS. 35(a) through 35(f), and use all of the N condensers C(1) through C(N) or a part of the N condensers C(1) through C(N). The condensers may be appropriately used in accordance with a pulse to be generated. For example, all of the condensers C(1) through C(N) may be used to generate a pulse whose base potential is the ground potential and whose pulse amplitude is wide. Further, only a part of the condensers may be used to generate a pulse having a lower crest value than the power supply voltage VH or to generate a pulse whose base potential is not the ground potential.

Therefore, the capacitive load drive circuit 302 of the present embodiment may be arranged so as to include a plurality of condensers C(1) through C(N) to which a plurality of different initial potentials V(1) through V(N) (N is a natural number not less than 2) are applied; and switching elements S(1) through S(N) for selectively connecting the capacitive load 311 with the condensers C(1) through C(N), one of the plurality of condensers C(1) through C(N) being a condenser C(I) having a first initial potential V(I) which is not 0, one of the plurality of condensers C(1) through C(N) being a condenser C(I+1) having a second initial potential V(I+1) which has a larger absolute value than the initial potential V(I), one of the plurality of condensers C(1) through C(N) being a condenser C(I−1) having a third initial potential V(I−1) which has the same polarity as the first initial potential V(I) and which has a smaller absolute value than the first initial potential V(I), the switching elements S(0) through S(N) carrying out (i) a first charging step of selectively connecting the capacitive load 311 with the condenser C(I−1) and then selectively connecting the capacitive load 311 with the condenser C(I)

so as to change a terminal voltage 311 of the capacitive load toward the first initial potential; (ii) a second charging step of selectively connecting the capacitive load 311 with the second initial potential V(I+1) and an energy accumulating element so as to increase an absolute value of the terminal voltage of the capacitive load 311, and (iii) a discharging step of selectively connecting the capacitive load 311 with the condenser C(I) so as to decrease the absolute value of the terminal voltage of the capacitive load 311 and so as to regenerate electrostatic energy to be accumulated in the first condenser C(I), the thus regenerated electrostatic energy being approximately equal to electrostatic energy as accumulated in the first condenser C(I) before the step (i), the steps (i) through (iii) being carried out in this order.

Figure 36:
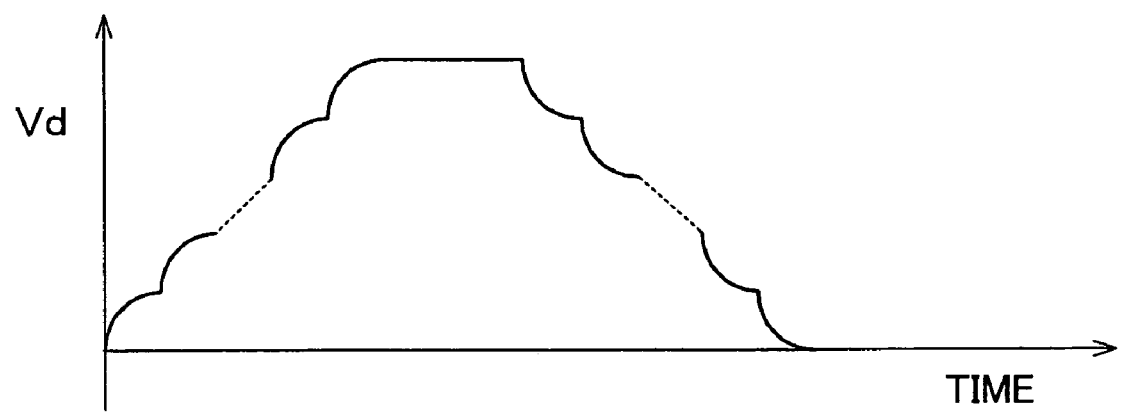
FIG. 36 is a waveform chart showing an example of a waveform of a pulse generated by the capacitive load drive circuit of FIG. 34.
Figure 37:
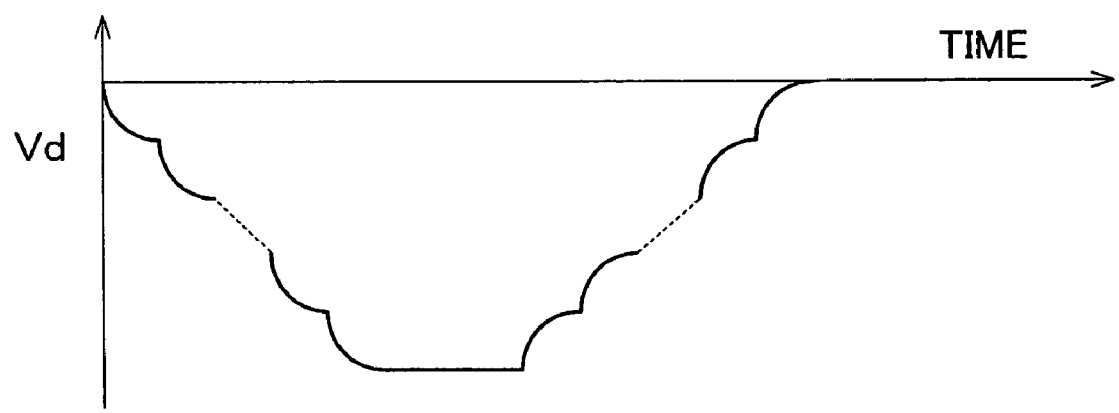
FIG. 37 is a waveform chart showing another example of a waveform of a pulse generated by the capacitive load drive circuit of FIG. 34.

Further, the initial potentials V(1) through V(N) may be positive or negative. A pulse as shown in FIG. 36, for example, can be generated when the initial potentials V(1) through V(N) are positive. A pulse as shown in FIG. 37, for example, can be generated when the initial potentials V(1) through V(N) are negative.

Note that, the capacitive load drive circuit can operate without the condenser C(N) which is connected to the electrical power source 309 in the present embodiment (the condenser C(N) is generally integrated in the electrical power source 309).

Therefore, the capacitive load drive circuit 302 of the present embodiment may be arranged so as to include a power supply terminal (VH) to which a power supply potential VH is applied form an electrical power source 309; N condensers C(1) through C(N) to which a plurality of different initial potentials V(1) through V(N) (N is a natural number not less than 2) are applied; and switching elements S(1) through S(N) for selectively connecting the capacitive load 311 with the condensers C(1) through C(N) and the power supply terminal (VH), the condensers C(1) through C(N) including a condenser C(I) having a first initial potential V(I) which has the same polarity as the power supply potential VH and which has a smaller absolute value than the power supply potential VH, and a condenser C(I−1) having a third initial potential V(I−1) which has the same polarity as the first initial potential V(I) and has a smaller absolute value than the first initial potential V(I), the switching elements S(0) through S(N) carrying out (i) a first charging step of selectively connecting the capacitive load 311 with the condenser C(I−1) and then selectively connecting the capacitive load 311 with the condenser C(I) so as to change a terminal voltage of the capacitive load 311 toward the first initial potential V(I); (ii) a second charging step of selectively connecting the capacitive load 311 with the power supply terminal (VH) so as to increase an absolute value of the terminal voltage of the capacitive load 311, and (iii) a discharging step of selectively connecting the capacitive load 311 with the condenser C(I) so as to decrease the absolute value of the terminal voltage of the capacitive load 311 and so as to regenerate electrostatic energy to be accumulated in the condenser C(I), the thus regenerated electrostatic energy being approximately equal to electrostatic energy as accumulated in the condenser C(I) before the step (i), the steps (i) through (iii) being carried out in this order.

Next, the following will discuss how to set the capacitive components of the condensers C(1) through C(3), the capacitance of the capacitive load 311, the switching time of the switching elements S(1) through S(3), and the resistance value of the charge and discharge paths, in the capacitive load drive circuit 301 having four stages as shown in FIG. 30. It is considered to be desirable that the voltage of the capacitive load 311 reaches 90% of the attainment voltage (final voltage attained by the capacitive load 311 after repeating the first through third steps infinitely) during the first through third steps. Thus, the conditions for achieving this result will be discussed.

First, it is assumed that a switching time of the switching element S(1) is a time of the first step, a switching time of the switching element S(2) is a time of the second step, and a switching time of the switching element S(3) is a time of the third step, which are all equivalent to one another.

Figure 82:
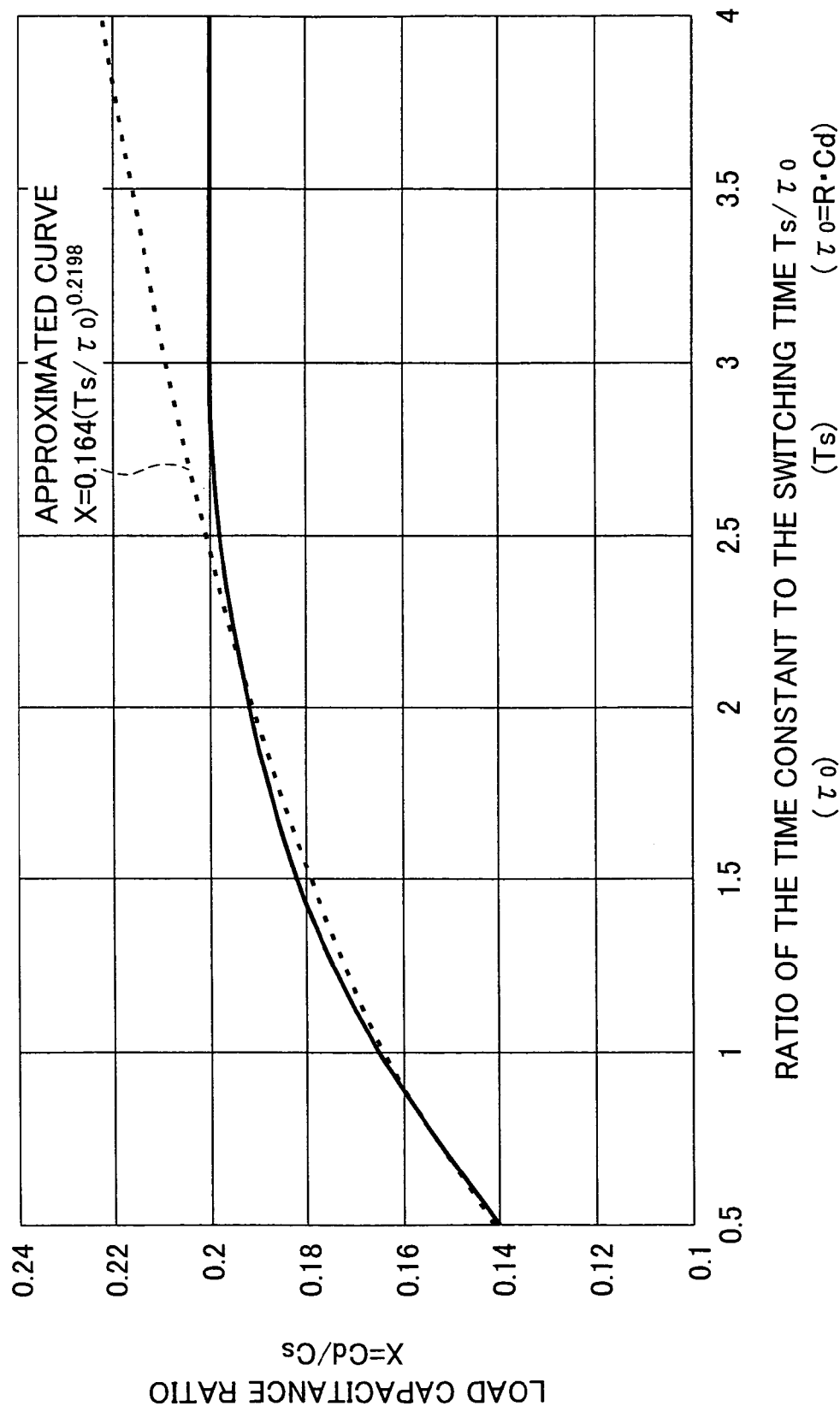
FIG. 82 is a graph showing a maximum load capacitance ratio that causes a voltage of the capacitive load to be not less than 90% of an attainment voltage during first through third steps, with respect to a ratio of a time constant to a switching time, in the capacitive load drive circuit of FIG. 30.

Here, the time constant $\tau 0$ (unit sec) for charging and discharging each of the condensers C(1) through C(3) is given by the following expression:

$$\tau 0 = R \cdot Cd,$$

where Cd (unit F) is the capacitance of the capacitive load 311, R (unit Ω) is the resistance value of the charge and discharge paths of each of the condensers C(1) through C(3) with respect to the capacitive load 311. When Cs (unit F) is the capacitive component of the condensers C(1) through C(3), X is the load capacitance ratio Cd/Cs, and Ts (unit sec) is the switching time of the switching elements S(1) through S(3), the condition that causes the voltage of the capacitive load 311 to reach 90% of the attainment voltage during the first through third steps was obtained through theoretical calculation, as indicated by the solid line in FIG. 82. FIG. 82 shows the maximum load capacitance ratio X (=Cd/Cs) that causes the voltage of the capacitive load 311 to be not less than 90% of the attainment voltage during the first through third steps, with respect to a ratio Ts/τ0 of the time constant τ0 to the switching time Ts.

As shown in FIG. 82, when Ts/τ0<2.5, the condition that causes the voltage of the capacitive load 311 to reach 90% of the attainment voltage during the first through third steps is approximately equal to the following approximated curve.

$$X = 0.164 (Ts/\tau 0)^{0.2198}$$

On the other hand, when Ts/τ0^2.5, the condition that causes the voltage of the capacitive load 311 to reach 90% of the attainment voltage during the first through third steps is approximately equal to the following straight line.

$$X = 0.2$$

Consequently, the conditions that cause the voltage of the capacitive load 311 to reach 90% of the attainment voltage during the first through third steps are approximately expressed as follows:

when $Ts/(R \cdot Cd) < 2.5$, $$Cd/Cs \% 0.164 \{Ts/(R \cdot Cd)\}^{0.2198};$$

when $Ts/(R \cdot Cd)^{\wedge} 2.5$, $$Cd/Cs \% 0.2.$$

Therefore, when the foregoing conditions are satisfied, the capacitive load 311 can obtain not less than 90% of the attainment voltage during the first through third steps. When the above expressions are not satisfied, the voltages of the condensers C(1) through C(3) change more widely due to the electric charge flowing out of the condensers C(1) through C(3) to the capacitive load 311. As a result, the voltage of the capacitive load 311 does not reach 90% of the attainment voltage during the first through third steps. This deteriorates the power regeneration ratio in generating pulses, thereby preventing the energy-saving driving of the capacitive load drive circuit. Further, when the above expressions are not satisfied, the voltages of C(1) through C(3) widely change when generating one pulse, requiring that the changes in the voltages be corrected before generating the next pulse.

The foregoing described the examination of the conditions that cause the voltage of the capacitive load 311 to reach 90% of the attainment voltage during the first through third steps. Another important aspect is to improve the energy regeneration ratio.

Figure 85:
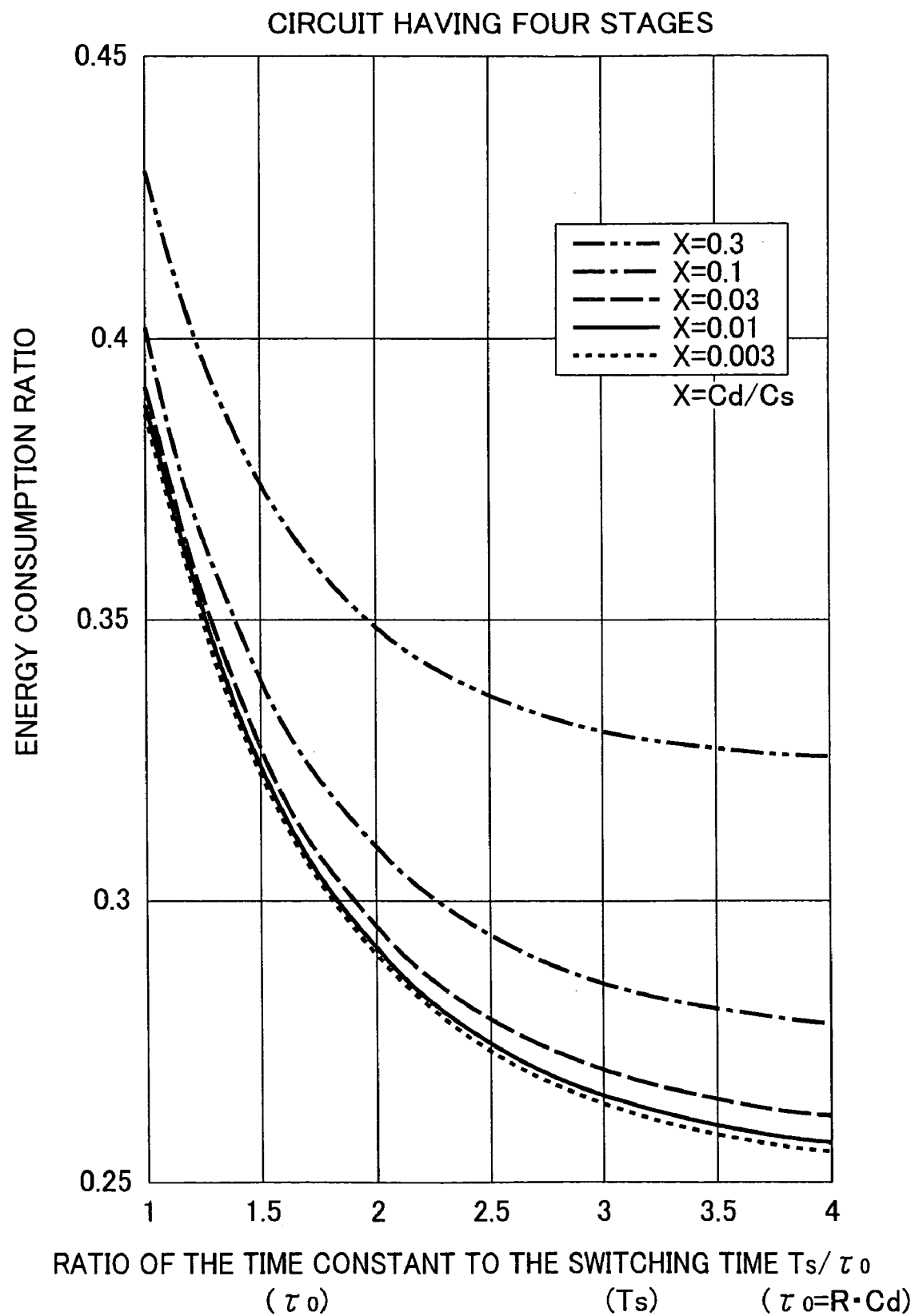
FIG. 85 is a graph showing how an energy consumption ratio changes with respect to the ratio of the time constant to the switching time when the load capacitance ratio varies from 0.003 to 0.3 in the capacitive load drive circuit of FIG. 30 having four stages.

In the capacitive load drive circuit 301 having four stages as shown in FIG. 30, the time constant τ0 (unit sec) for charging and discharging each of the condensers C(1) through C(3) is given by the following expression:

$$\tau 0 = R \cdot Cd,$$

where Cd (unit F) is the capacitance of the capacitive load 311, R (unit Ω) is the resistance value of the charge and discharge paths of each of the condensers C(1) through C(3) with respect to the capacitive load 311. When Cs (unit F) is the capacitive component of the condensers C(1) through C(3), X is the load capacitance ratio Cd/Cs, and Ts (unit sec) is the switching time of the switching elements S(1) through S(3), theoretical calculation gave how an energy consumption ratio (equal to a value obtained by subtracting the energy regeneration ratio from 1) changes with respect to the ratio Ts/τ0 of the time constant τ0 to the switching time Ts when the load capacitance ratio X varies from 0.003 to 0.3, as shown in FIG. 85.

Figure 83:
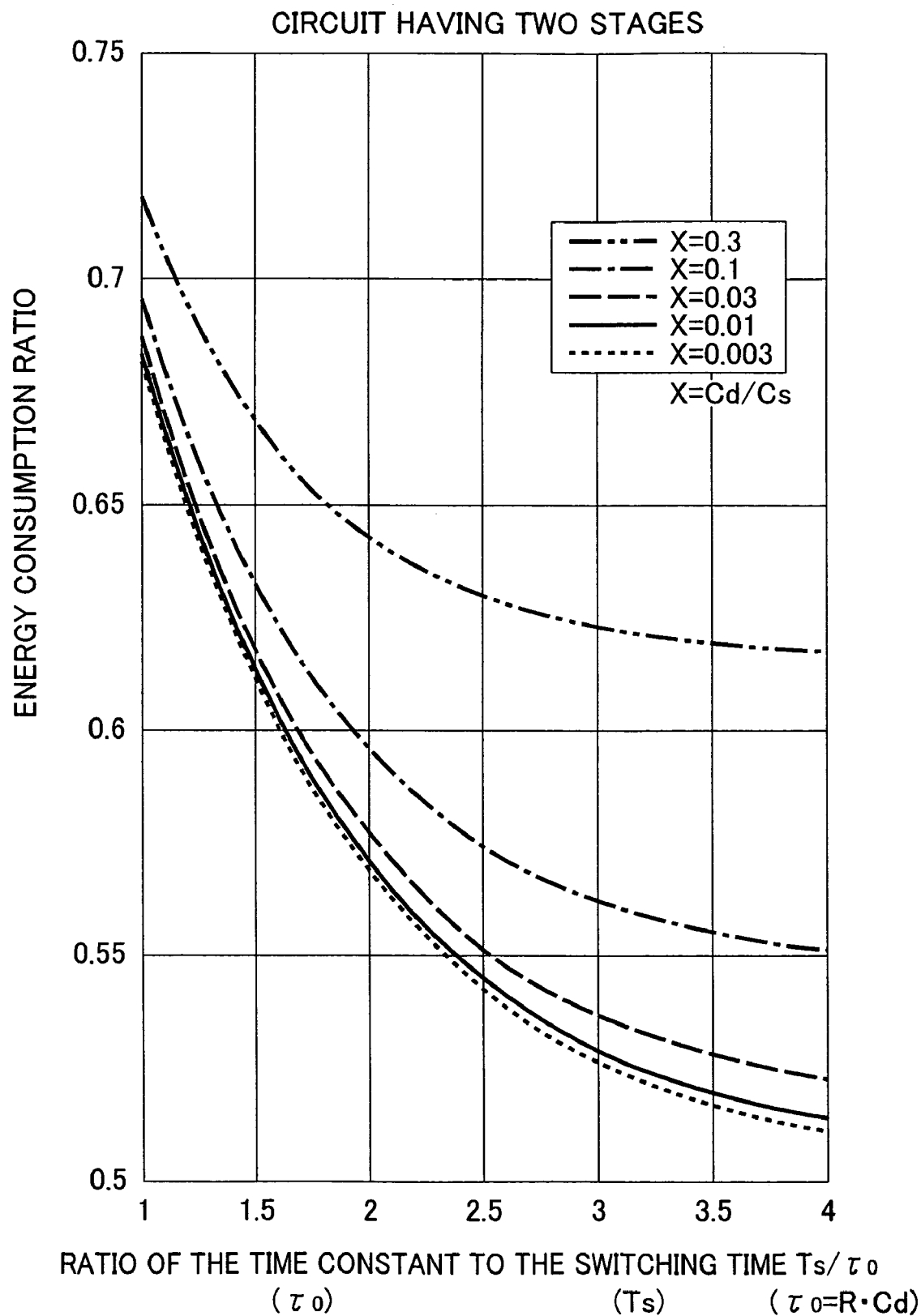
FIG. 83 is a graph showing how an energy consumption ratio changes with respect to the ratio of the time constant to the switching time when the load capacitance ratio varies from 0.003 to 0.3 in a capacitive load drive circuit having two stages, which is different from the capacitive load drive circuit of FIG. 30 having four stages only in the number of stages.

Further, FIG. 83 shows how the energy consumption ratio changes with respect to the ratio Ts/τ0 of the time constant τ0 to the switching time Ts when the load capacitance ratio X varies from 0.003 to 0.3 in a capacitive load drive circuit having two stages, which is different from the capacitive load drive circuit 301 of FIG. 30 having four stages only in the number of stages.

Figure 84:
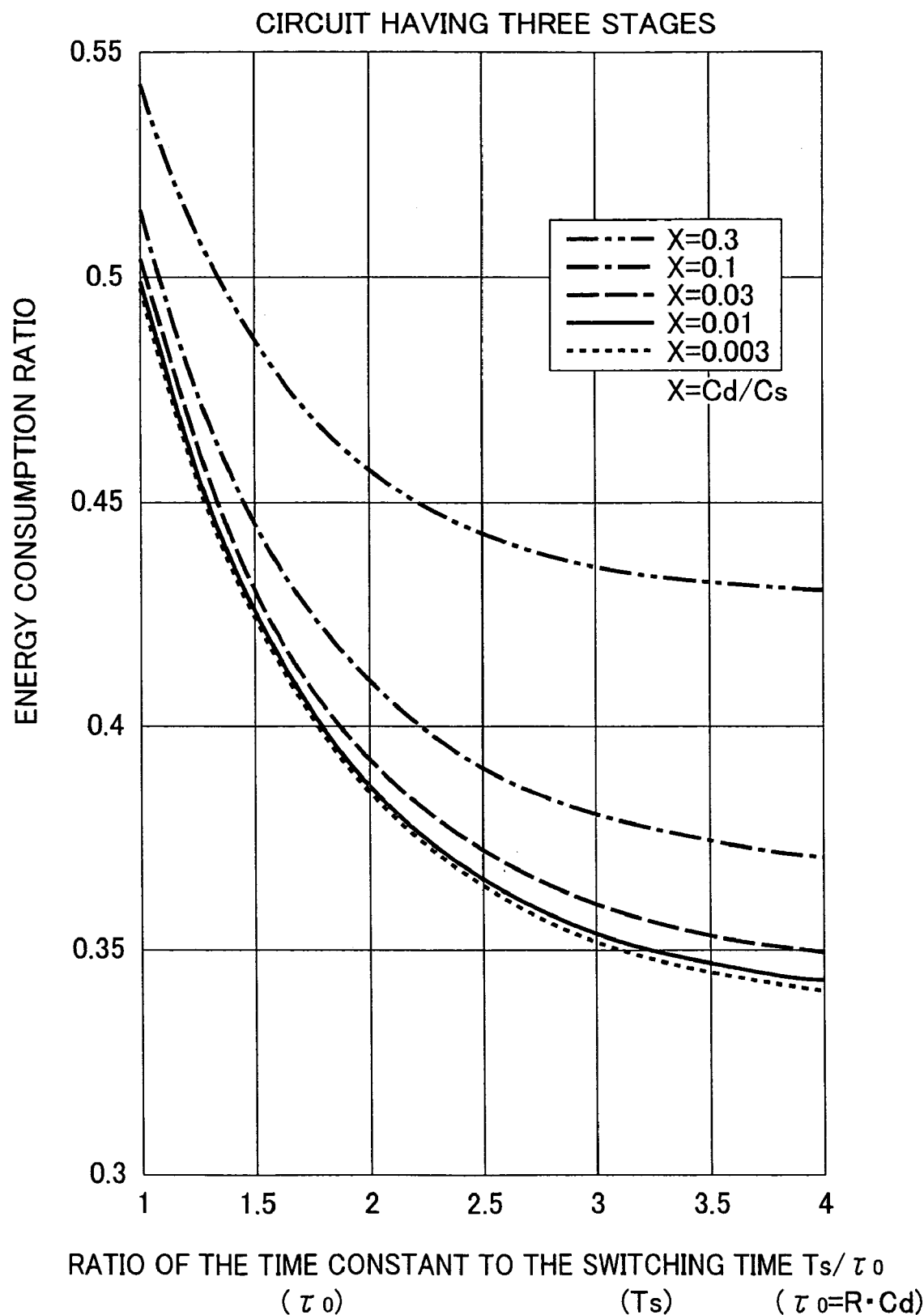
FIG. 84 is a graph showing how an energy consumption ratio changes with respect to the ratio of the time constant to the switching time when the load capacitance ratio varies from 0.003 to 0.3 in a capacitive load drive circuit having three stages, which is different from the capacitive load drive circuit of FIG. 30 having four stages only in the number of stages.

Further, FIG. 84 shows how the energy consumption ratio changes with respect to the ratio Ts/τ0 of the time constant τ0 to the switching time Ts when the load capacitance ratio X varies from 0.003 to 0.3 in a capacitive load drive circuit having three stages, which is different from the capacitive load drive circuit 301 of FIG. 30 having four stages only in the number of stages.

Figure 86:
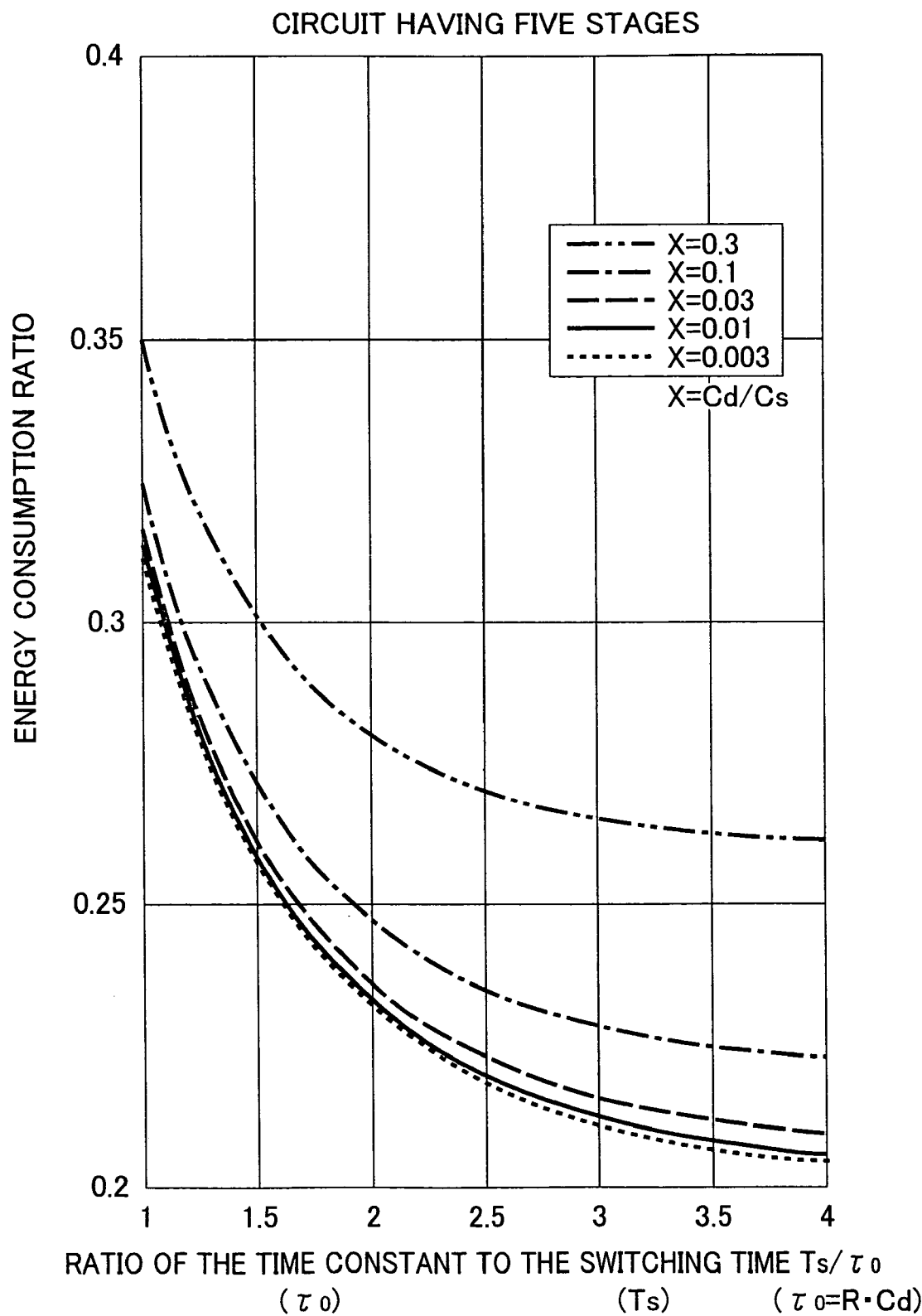
FIG. 86 is a graph showing how an energy consumption ratio changes with respect to the ratio of the time constant to the switching time when the load capacitance ratio varies from 0.003 to 0.3 in a capacitive load drive circuit having five stages, which is different from the capacitive load drive circuit of FIG. 30 having four stages only in the number of stages.

Further, FIG. 86 shows how the energy consumption ratio changes with respect to the ratio Ts/τ0 of the time constant τ0 to the switching time Ts when the load capacitance ratio X varies from 0.003 to 0.3 in a capacitive load drive circuit having five stages, which is different from the capacitive load drive circuit 301 of FIG. 30 having four stages only in the number of stages.

Figure 87:
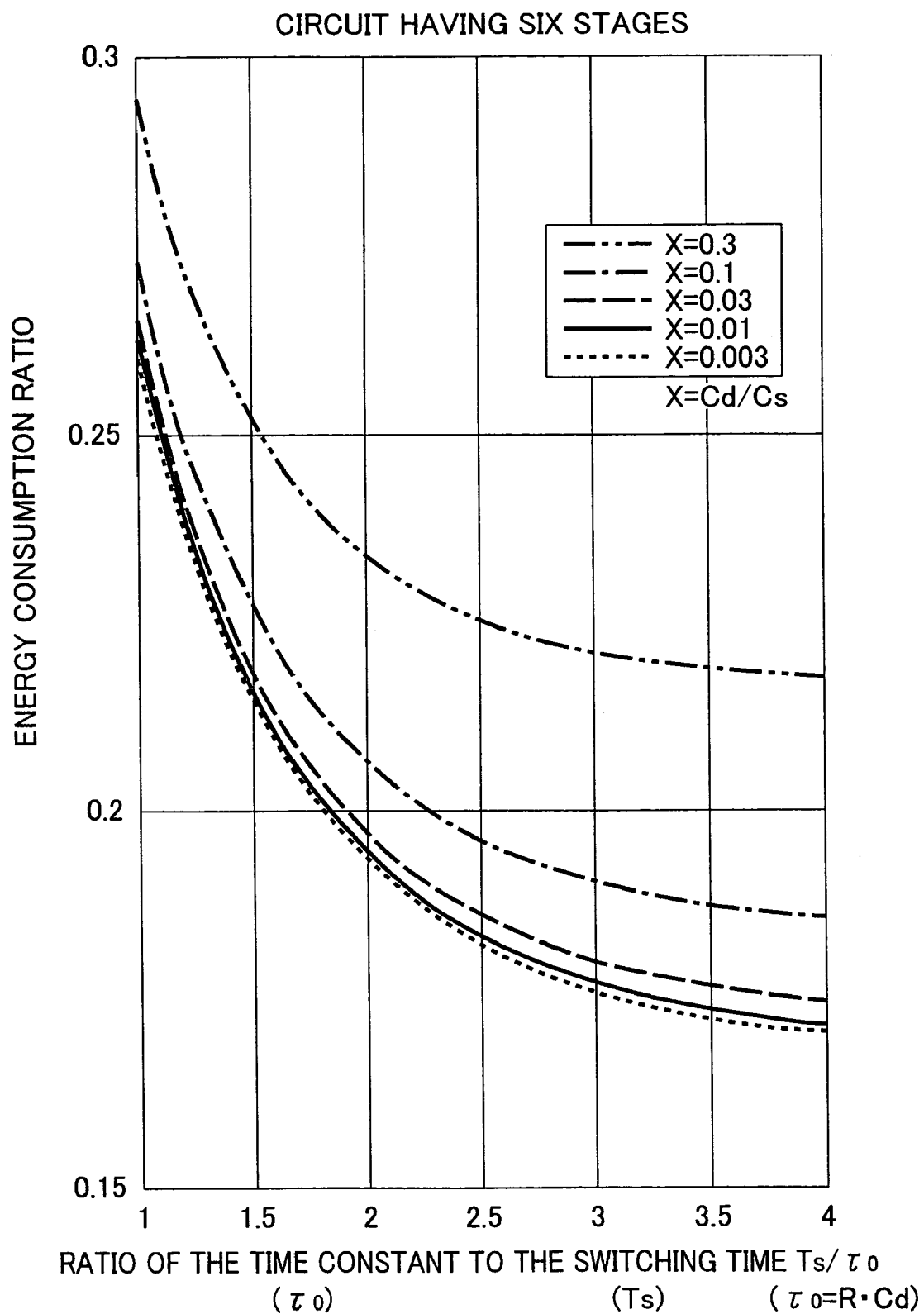
FIG. 87 is a graph showing how an energy consumption ratio changes with respect to the ratio of the time constant to the switching time when the load capacitance ratio varies from 0.003 to 0.3 in a capacitive load drive circuit having six stages, which is different from the capacitive load drive circuit of FIG. 30 having four stages only in the number of stages.

Further, FIG. 87 shows how the energy consumption ratio changes with respect to the ratio Ts/τ0 of the time constant τ0 to the switching time Ts when the load capacitance ratio X varies from 0.003 to 0.3 in a capacitive load drive circuit having six stages, which is different from the capacitive load drive circuit 301 of FIG. 30 having four stages only in the number of stages. Note that, when the load capacitance ratio X is 0.001 (which is not shown in FIGS. 83 through 87), the energy consumption ratio changes approximately in the same manner as in the case where the load capacitance ratio X is 0.003.

These results revealed that, through the energy consumption ratio largely depends on Ts/τ0, it is possible to sufficiently lower the energy consumption ratio in spite of the increase in the capacitance Cd of the capacitive load if the load capacitance ratio X satisfies the following expression.

$$X \leq 0.01$$

When the above expression is satisfied, it is possible to effectively supply the output voltages of the condensers to the capacitive load 311 without reducing the output voltages of the condensers. Further, when X≤0.01, it is possible to reduce changes in the drive voltage caused by unevenness and changes (temperature changes, and the like) in the capacitance of the condensers or capacitive load. This can realize highly reliable jetting-out operation, thereby stably operating the drive system (system driven by the capacitive load drive circuit) including the capacitive load 311. In contrast, when the above expression is not satisfied, the energy regeneration ratio lowers when the capacitance Cd of the capacitive load increases.

Next, the conditions that achieve a good slew rate of a waveform of a pulse to be applied to the capacitive load (10% to 90%) (amount of voltage change when the pulse rises from a crest value of 10% to 90%, with respect to a time required for the pulse to rise from the crest value of 10% to 90%) will be discussed.

In the capacitive load drive circuit 301 having four stages as shown in FIG. 30, the time constant τ0 (unit sec) for charging and discharging each of the condensers C(1) through C(3) is given by the following expression:

$$\tau 0 = R \cdot Cd,$$

where Cd (unit F) is the capacitance of the capacitive load 311, R (unit Ω) is the resistance value of the charge and discharge paths of each of the condensers C(1) through C(3) with respect to the capacitive load 311. Then, it is assumed that Cs (unit F) is the capacitive component of the condensers C(1) through C(3), Ts (unit sec) is the switching time of the switching elements S(1) through S(3), V(=3VH/4) is a final attainment voltage (voltage attained by the capacitive load 311 after charged by the condensers C(1) through C(3) for an infinite time), SR (unit V/μsec) is a slew rate (10% to 90%) of a waveform of a pulse to be applied to the capacitive load 311, and:

$$x = Ts/\tau 0.$$

Figure 90:
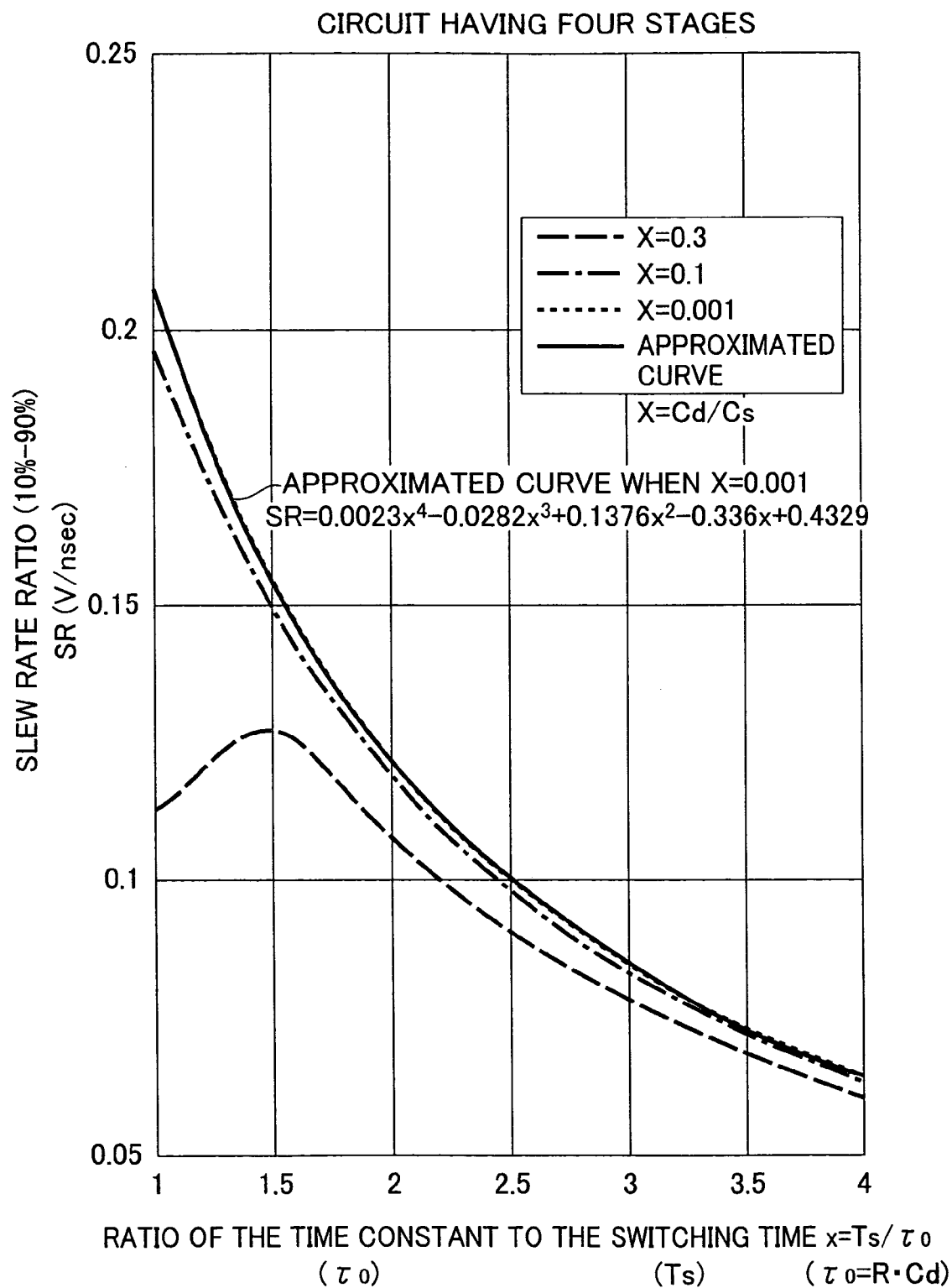
FIG. 90 is a graph showing how a slew rate (10% to 90%) changes with respect to the ratio of the time constant to the switching time when the load capacitance ratio varies from 0.001 to 0.3 in the capacitive load drive circuit of FIG. 30 having four stages.

With this, theoretical calculation gave how a slew rate (10% to 90%) SR changes with respect to the ratio x=Ts/τ0 of the time constant τ0 to the switching time Ts when the load capacitance ratio X varies from 0.001 to 0.3, as shown in FIG. 90. Note that, when the load capacitance ratio X is 0.003 to 0.03 (which is not shown in FIG. 90), the slew rate (10% to 90%) SR changes approximately in the same manner as in the case where the load capacitance ratio X is 0.001.

Figure 88:
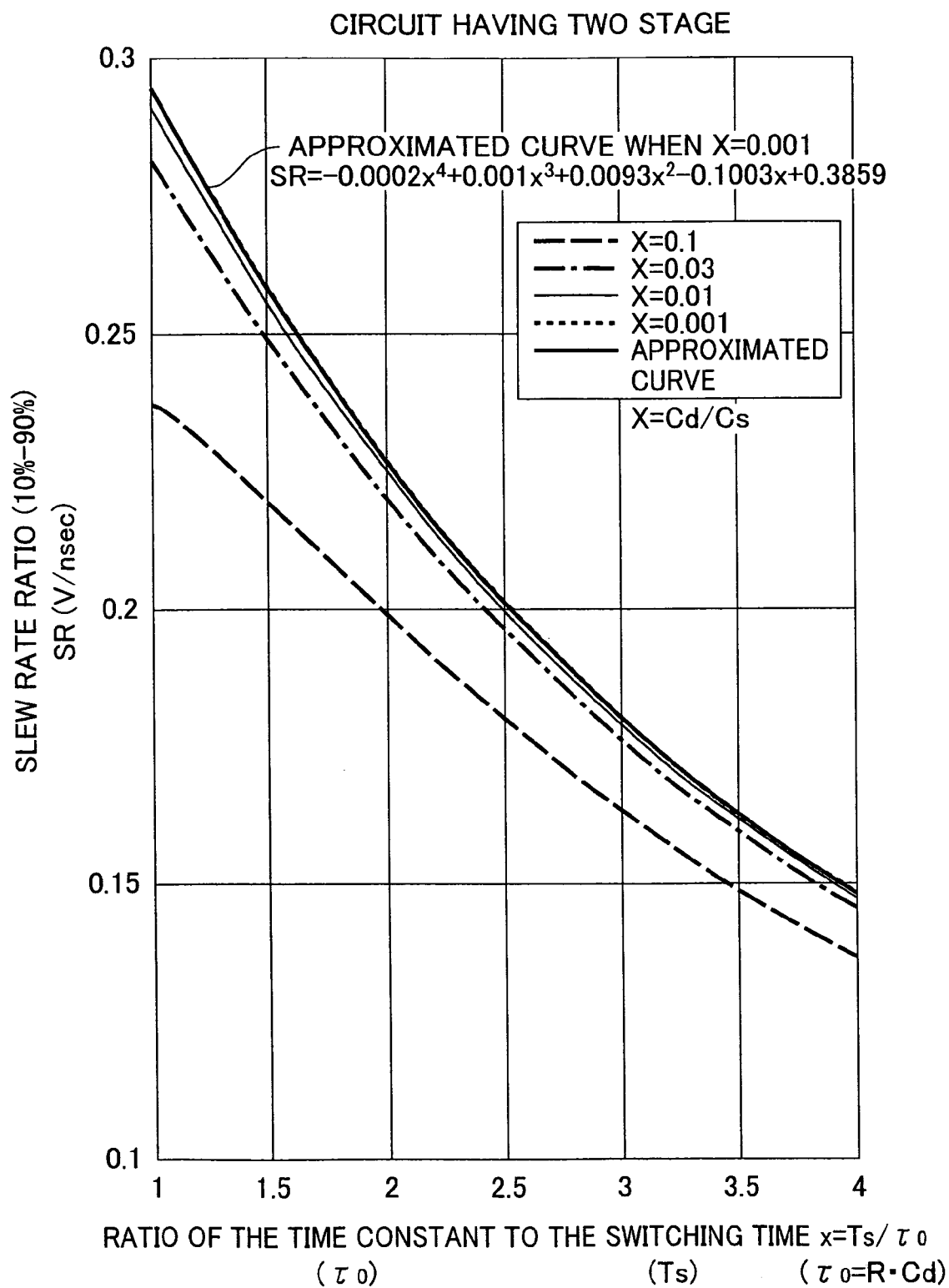
FIG. 88 is a graph showing how a slew rate (10% to 90%) changes with respect to the ratio of the time constant to the switching time when the load capacitance ratio X varies from 0.001 to 0.1 in a capacitive load drive circuit having two stages, which is different from the capacitive load drive circuit of FIG. 30 having four stages only in the number of stages.

Further, FIG. 88 shows how the slew rate (10% to 90%) SR changes with respect to the ratio x=Ts/τ0 of the time constant τ0 to the switching time Ts when the load capacitance ratio X varies from 0.001 to 0.1 in a capacitive load drive circuit having two stages, which is different from the capacitive load drive circuit 301 having four stages of FIG. 30 only in the number of stages. Note that, when the load capacitance ratio X is 0.003 (which is not shown in FIG. 88), the slew rate (10% to 90%) SR changes approximately in the same manner as in the case where the load capacitance ratio X is 0.001.

Figure 89:
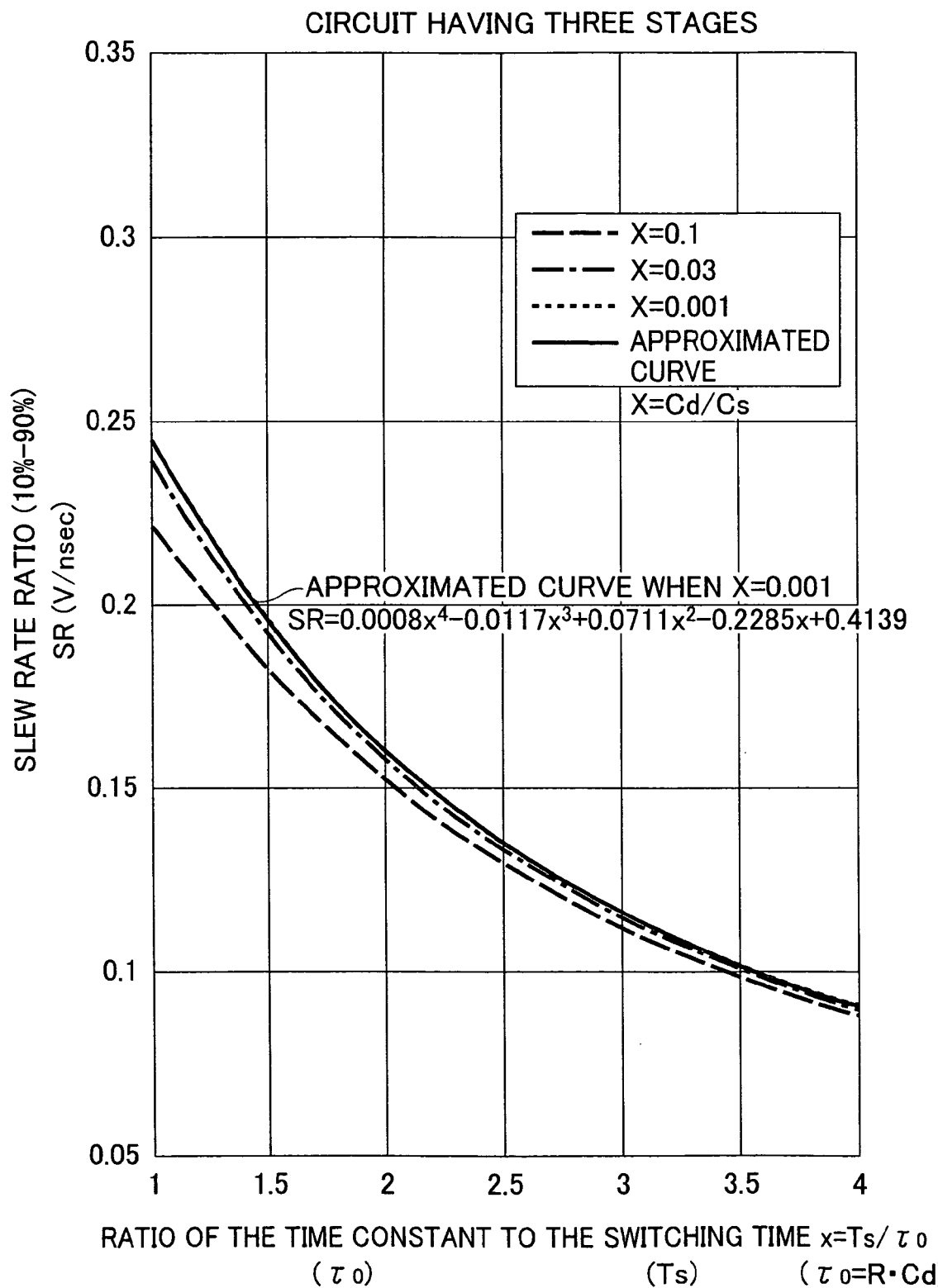
FIG. 89 is a graph showing how a slew rate (10% to 90%) changes with respect to the ratio of the time constant to the switching time when the load capacitance ratio X varies from 0.001 to 0.1 in a capacitive load drive circuit having three stages, which is different from the capacitive load drive circuit of FIG. 30 having four stages only in the number of stages.

Further, FIG. 89 shows how the slew rate (10% to 90%) SR changes with respect to the ratio x=Ts/τ0 of the time constant τ0 to the switching time Ts when the load capacitance ratio X varies from 0.001 to 0.1 in a capacitive load drive circuit having three stages, which is different from the capacitive load drive circuit 301 having four stages of FIG. 30 only in the number of stages. Note that, when the load capacitance ratio X is 0.003 to 0.01 (which is not shown in FIG. 89), the slew rate (10% to 90%) SR changes approximately in the same manner as in the case where the load capacitance ratio X is 0.001.

Figure 91:
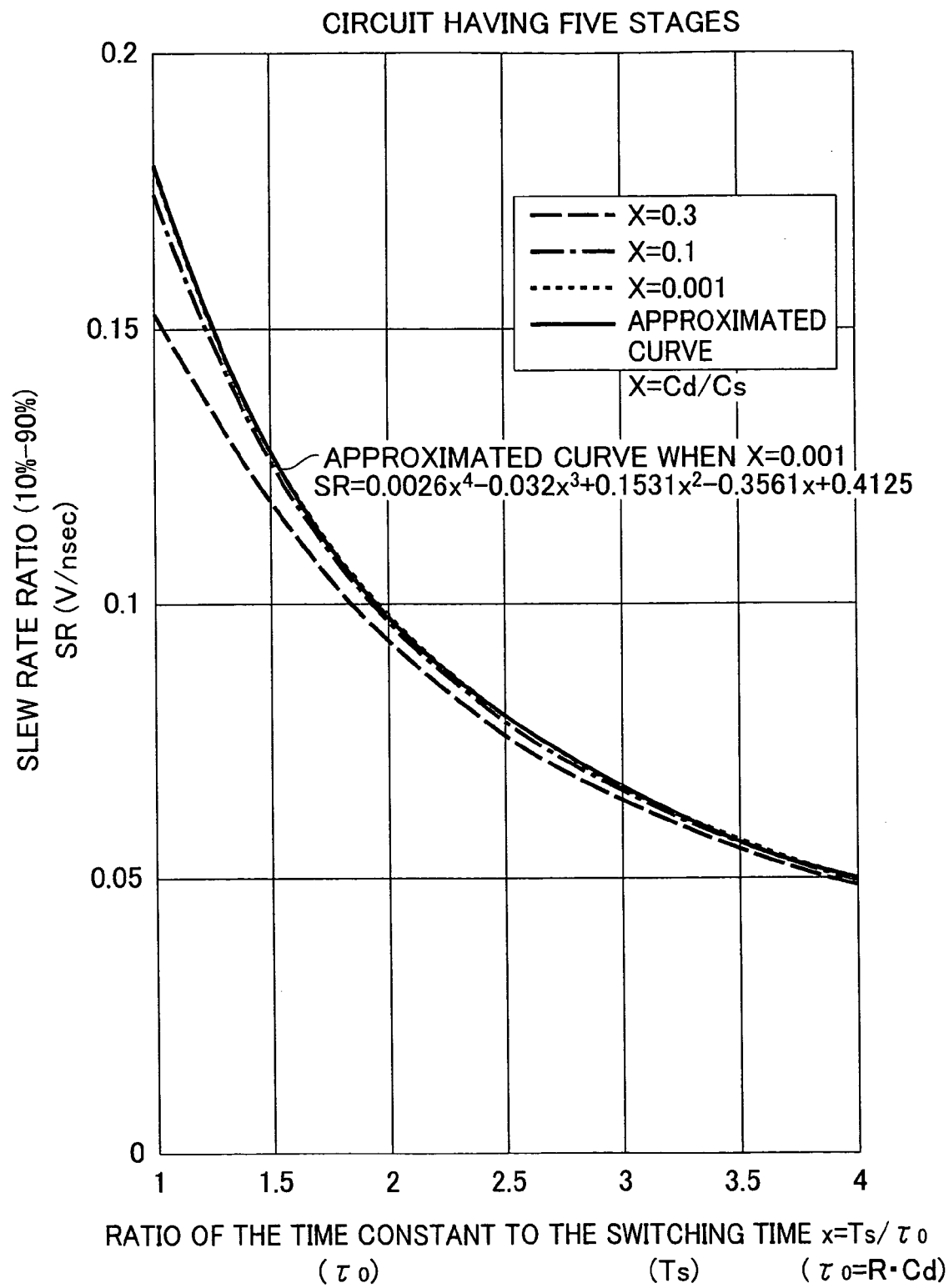
FIG. 91 is a graph showing how a slew rate (10% to 90%) changes with respect to the ratio of the time constant to the switching time when the load capacitance ratio X varies from 0.003 to 0.3 in a capacitive load drive circuit having five stages, which is different from the capacitive load drive circuit of FIG. 30 having four stages only in the number of stages.

Further, FIG. 91 shows how the slew rate (10% to 90%) SR changes with respect to the ratio x=Ts/τ0 of the time constant τ0 to the switching time Ts when the load capacitance ratio X varies from 0.003 to 0.3 in a capacitive load drive circuit having five stages, which is different from the capacitive load drive circuit 301 having four stages of FIG. 30 only in the number of stages. Note that, when the load capacitance ratio X is 0.003 to 0.03 (which is not shown in FIG. 91), the slew rate (10% to 90%) SR changes approximately in the same manner as in the case where the load capacitance ratio X is 0.001.

Figure 92:
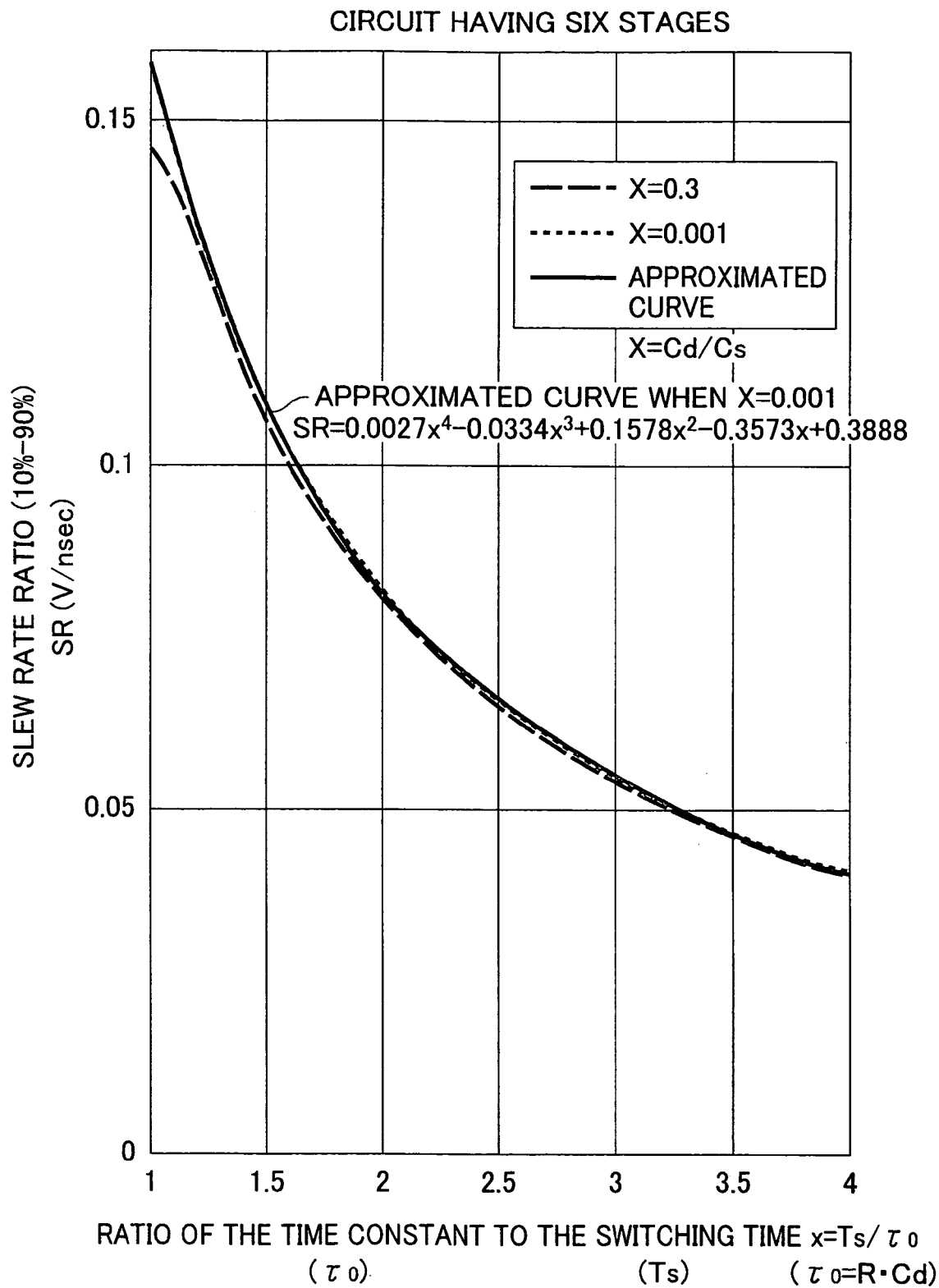
FIG. 92 is a graph showing how a slew rate (10% to 90%) changes with respect to the ratio of the time constant to the switching time when the load capacitance ratio X varies from 0.003 to 0.3 in a capacitive load drive circuit having six stages, which is different from the capacitive load drive circuit of FIG. 30 having four stages only in the number of stages.

Further, FIG. 92 shows how the slew rate (10% to 90%) SR changes with respect to the ratio x=Ts/τ0 of the time constant τ0 to the switching time Ts when the load capacitance ratio X varies from 0.003 to 0.3 in a capacitive load drive circuit having six stages, which is different from the capacitive load drive circuit 301 having four stages of FIG. 30 only in the number of stages. Note that, when the load capacitance ratio X is 0.003 to 0.1 (which is not shown in FIG. 92), the slew rate (10% to 90%) SR changes approximately in the same manner as in the case where the load capacitance ratio X is 0.001.

The foregoing results revealed that a limit value of the slew rate (10% to 90%) SR is given by the following expressions:

when N=2(two stages), $$SR = V/(R \cdot Cd)*(-0.0002y^4 + 0.001y^3 + 0.009y^2 - 0.100y + 0.386);$$

when N=3 (three stages), $$SR = V/(R \cdot Cd)*(0.0008y^4 - 0.012y^3 + 0.071y^2 - 0.229y + 0.414);$$

when N=4(four stages), $$SR = V/(R \cdot Cd)*(0.0023y^4 - 0.028y^3 + 0.138y^2 - 0.336y + 0.434); \text{ and}$$

when N^5(five or more stages), $$SR = V/(R \cdot Cd)*(0.0026y^4 - 0.032y^3 + 0.153y^2 - 0.356y + 0.413),$$

where N is the number of times each condenser repeats the step of charging within one cycle of the drive pulse (number of stages). Accordingly, the switching time and the number of stages can be set with reference to the above expressions, when designing the slew rate.

Accordingly, circuit parameters and the switching time should satisfy the following expressions, in order to satisfy the slew rate SR required for the apparatus:

when N=2(two stages), $$SR \% V/(R \cdot Cd)*(-0.0002y^4 + 0.001y^3 + 0.009y^2 - 0.100y + 0.386);$$

when N=3(three stages), $$SR \% V/(R \cdot Cd)*(0.0008y^4 - 0.012y^3 + 0.071y^2 - 0.229y + 0.414);$$

when N=4(four stages), $$SR \% V/(R \cdot Cd)*(0.0023y^4 - 0.028y^3 + 0.138y^2 - 0.336y + 0.434); \text{ and}$$

when N^5(five or more stages), $$SR \% V/(R \cdot Cd)*(0.0026y^4 - 0.032y^3 + 0.153y^2 - 0.356y + 0.413).$$

Further, the apparatus that requires a high slew rate more than 50(V/μsec), such as the apparatus employing an ink-jet method, should satisfy the following conditions:

when N=2(two stages), $$50(V/\mu sec) \% V/(R \cdot Cd)*(-0.0002y^4 + 0.001y^3 + 0.009y^2 - 0.100y + 0.386);$$

when N=3(three stages), $$50(V/\mu sec) \% V/(R \cdot Cd)*(0.0008y^4 - 0.012y^3 + 0.071y^2 - 0.229y + 0.414);$$

when N=4(four stages), $$50(V/\mu sec) \% V/(R \cdot Cd)*(0.0023y^4 - 0.028y^3 + 0.138y^2 - 0.336y + 0.434); \text{ and}$$

when N^5(five or more stages), $$50(V/\mu sec) \% V/(R \cdot Cd)*(0.0026y^4 - 0.032y^3 + 0.153y^2 - 0.356y + 0.413).$$

Further, the results shown in FIGS. 88 through 92 show that the slew rate of the waveform decreases as the number of stages in the circuit increases.

Embodiment 14

Figure 38:
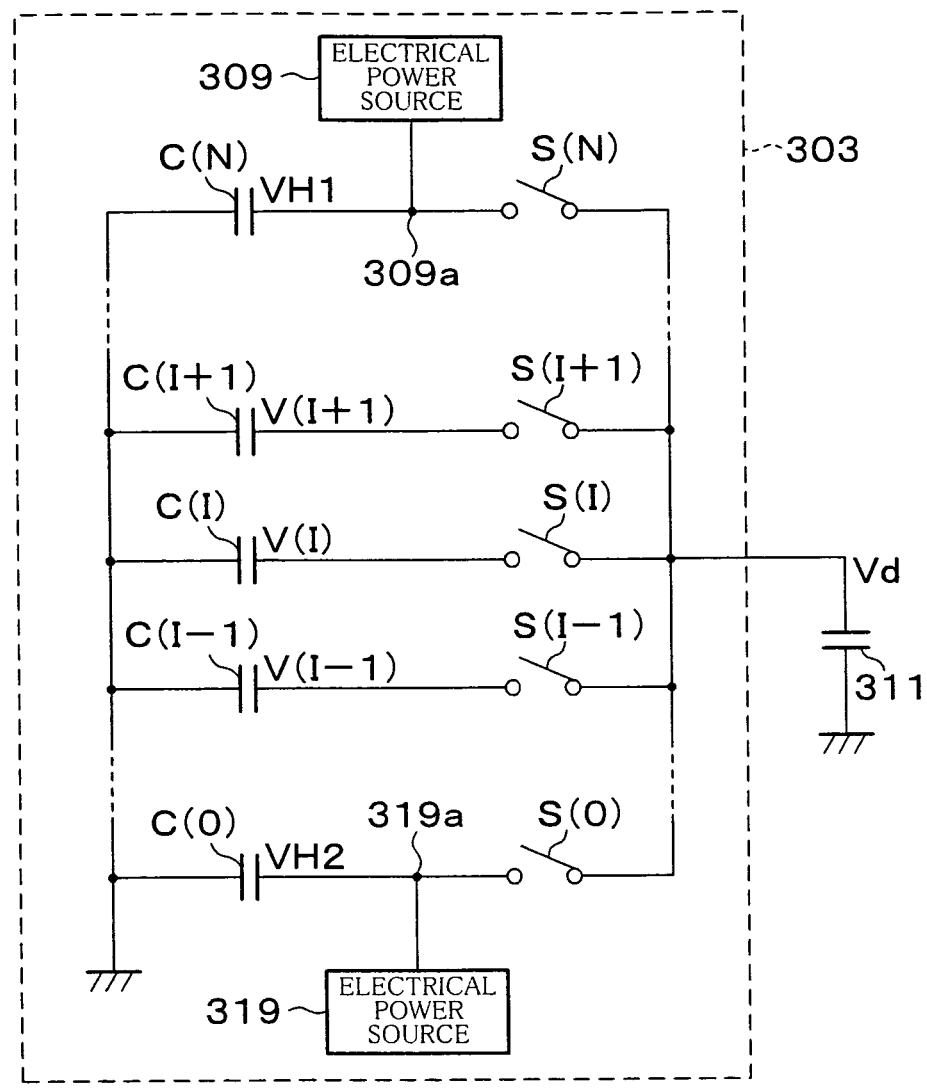
FIG. 38 is a circuit diagram showing an arrangement of a capacitive load drive circuit in accordance with still another embodiment of the present invention.
Figure 39:
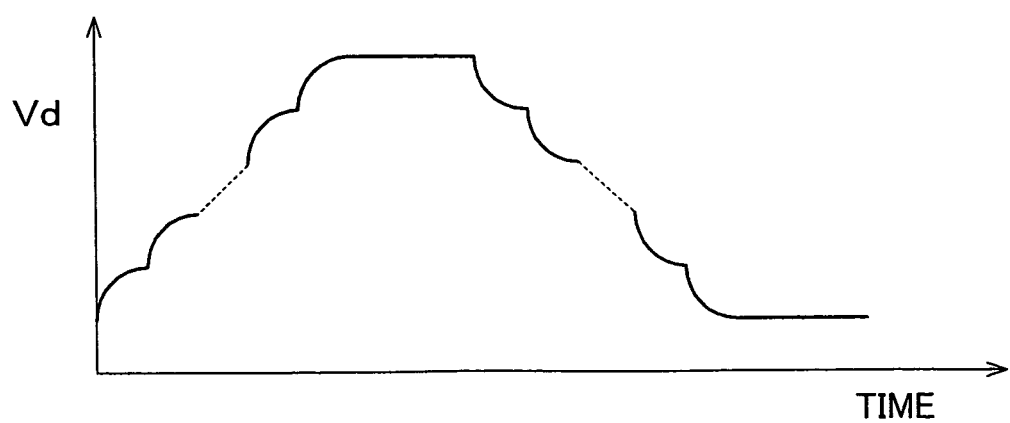
FIG. 39 is a waveform chart showing an example of a waveform of a pulse generated by the capacitive load drive circuit of FIG. 38.

Next, the following will explain yet another embodiment of the present invention with reference to FIGS. 38 and 39. Note that, for convenience, members having the same functions as those used in foregoing Embodiments will be given the same reference symbols, and explanation thereof will be omitted here.

As shown in FIG. 38, a capacitive load drive circuit 303 of the present embodiment has the same arrangement as the capacitive load drive circuit 302 of Embodiment 13 except that a second electrical power source (reference power source, reference potential terminal, and DC power source) 319 having the same polarity as the electrical power source 309, and a condenser C(0) are provided instead of the ground terminal C(0). In other words, the capacitive load drive circuit 303 of the present embodiment is provided with the first electrical power source 309 and the second electrical power source 319 which have the same polarity with each other, and generates a pulse of a voltage between the potential VH1 of the first electrical power source VH1 and the potential VH2 of the second electrical power source VH2. Here, the absolute value of the potential VH1 of the first electrical power source 309 is larger than the absolute value of the potential VH2 of the second electrical power source 319. Here, a circuit to supply initial electric charge is omitted in the drawing.

With this arrangement, the capacitive load drive circuit carries out the operation as shown in FIGS. 35(*a*) through 35(*f*), as in Embodiment 13. Thus, by making (A) the electric charge flowing out of the condenser C(I) between FIGS. 35(*a*) and 35(*b*) to be approximately equal to (B) the electric charge flowing into the condenser C(I) between FIGS. 35(*d*) and 35(*e*), the condenser C(I) does not apparently consume energy during the cycle of FIGS. 35(*a*) through 35(*f*).

When generating a pulse, energy is consumed in such a manner that the electric charge which moves from the condenser C(N) to the condenser C(N−1) is transferred toward the second electrical power source 319 so as to be consumed at the second electrical power source 319.

Note that, the absolute value of the potential VH1 of the first electrical power source 309 may be smaller than the absolute value of the potential VH2 of the second electrical power source 319. In this case, when generating a pulse, energy is consumed in such a converse manner that the electric charge which moves from the condenser C(0) to the condenser C(1) is transferred toward the first electrical power source 309 so as to be consumed at the first electrical power source 309.

Further, the capacitive load drive circuit can operate without the condenser C(N) which is connected to the first electrical power source 309 or the condenser C(0) which is connected to the second electrical power source 319 (the condenser is generally integrated in the electrical power source).

In this case, the first electrical power source 309 and the second electrical power source 319 can generate a pulse having a positive polarity as shown in FIG. 39, for example, when the first electrical power source 309 and the second electrical power source 319 are positively-polarized power sources. Further, the first electrical power source 309 and the second electrical power source 319 can generate a pulse having a negative polarity, which is obtained by reversing the polarity of the pulse having the positive polarity as shown in FIG. 39, for example, when the first electrical power source 309 and the second electrical power source 319 are positively-polarized power sources.

Embodiment 15

Figure 40:
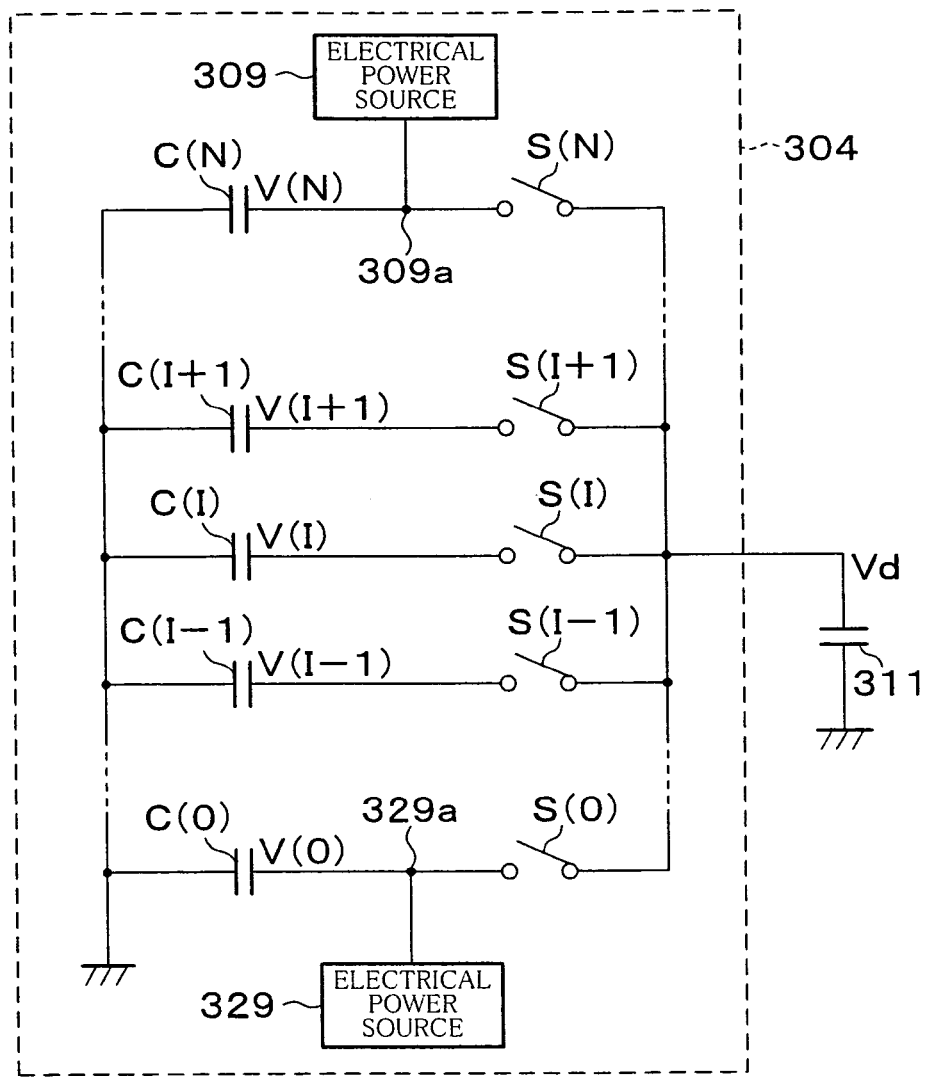
FIG. 40 is a circuit diagram showing an arrangement of a capacitive load drive circuit in accordance with yet another embodiment of the present invention.
Figure 41:
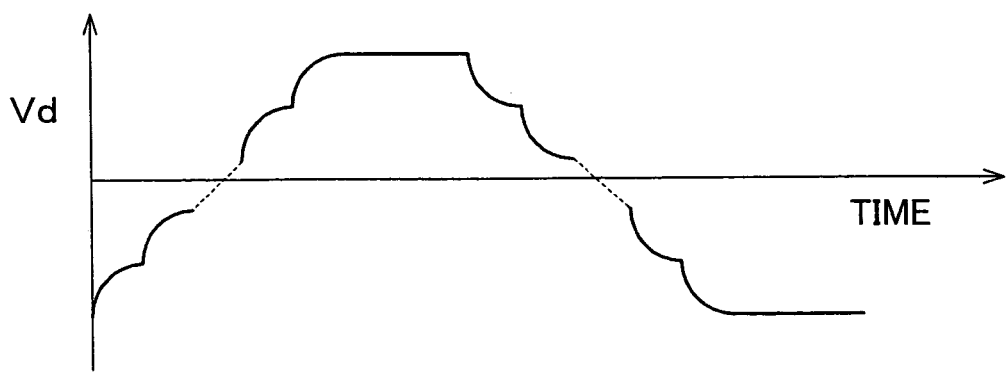
FIG. 41 is a waveform chart showing an example of a waveform of a pulse generated by the capacitive load drive circuit of FIG. 40.
Figure 42:
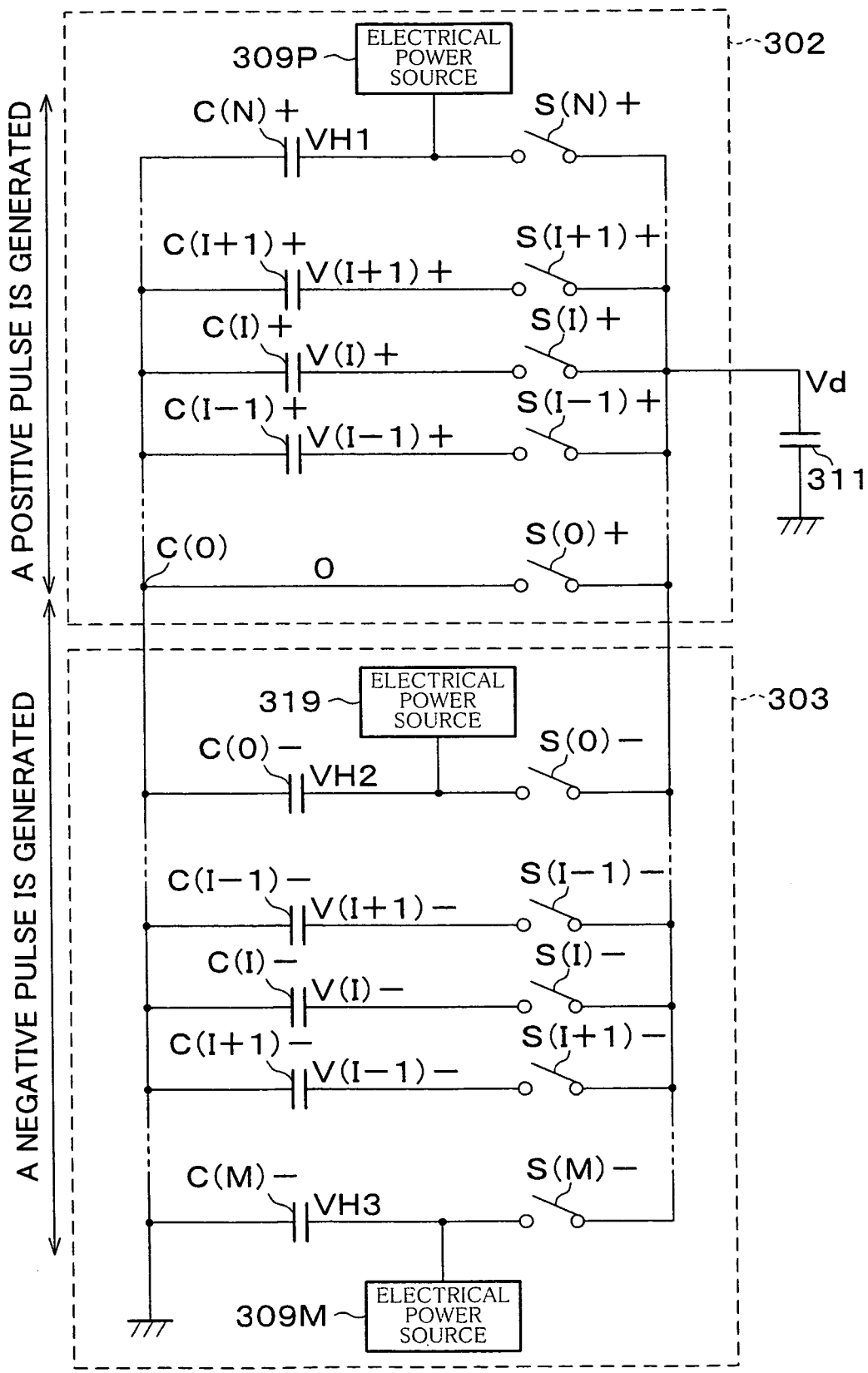
FIG. 42 is a circuit diagram showing an arrangement of a capacitive load drive circuit in accordance with still another embodiment of the present invention.

Next, the following will explain still another embodiment of the present invention with reference to FIGS. 40 and 41. Note that, for convenience, members having the same functions as those used in foregoing Embodiments will be given the same reference symbols, and explanation thereof will be omitted here.

As shown in FIG. 40, a capacitive load drive circuit 304 of the present embodiment has the same arrangement as the capacitive load drive circuit 302 of Embodiment 13 except that a second electrical power source (reference power source, reference potential terminal) 319 whose polarity is reverse to the electrical power source 309, and a condenser C(0) are provided instead of the ground terminal C(0). In other words, the capacitive load drive circuit 304 of the present embodiment is provided with the first electrical power source (power source or reference power source) 309 and the second electrical power source (reference power source or power source) 329, which are power sources having opposite polarities from each other; and generates a pulse of a voltage between the potential VH1 of the first electrical power source VH1 and the potential VH2 of the second electrical power source VH2. In this case, the potential of the first electrical power source 309 has a positive (+) polarity, and the potential of the second electrical power source 329 has a negative (−) polarity. Here, a circuit to supply initial electric charge is omitted in the drawing.

The capacitive load drive circuit 304 of the present embodiment also carries out the operation as shown in FIGS. 35(a) through 35(f), as in Embodiment 13. Thus, by making (A) the electric charge flowing out of the condenser C(I) between FIGS. 35(a) and 35(b) to be approximately equal to (B) the electric charge flowing into the condenser C(I) between FIGS. 35(d) and 35(e), the condenser C(I) does not apparently consume energy during the cycle of FIGS. 35(a) through 35(f).

When generating a positive pulse, energy is consumed in such a manner that the electric charge which moves from the condenser C(N) to the condenser C(N−1) is transferred toward the second electrical power source 329 so as to be consumed at a positively-charged condenser that has a potential closest to the ground potential. On the other hand, when generating a negative pulse, energy is consumed in such a manner that the electric charge which moves from the condenser C(0) to the condenser C(1) is transferred toward the first electrical power source 309 so as to be consumed at a negatively-charged condenser that has a potential closest to the ground potential. When the first electrical power source 309 and the second electrical power source 329 have the same absolute value, in particular, power consumed at the condenser having the potential closest to the ground potential of the positive energy and power consumed at the condenser having the potential closest to the ground potential of the negative energy are canceled out, thereby eliminating the need for an external circuit to consume electrical power.

The capacitive load drive circuit 304 of the present embodiment can generate a pulse having a substantially sinusoidal waveform, as shown in FIG. 41, for example, Embodiment 16

A capacitive load drive circuit of the present embodiment is arranged so that (A) the capacitive load drive circuit 302 of Embodiment 13 for generating a positive pulse, which includes a positively-polarized electrical power source 309P (power supply potential VH1), and (B) the capacitive load drive circuit 303 of Embodiment 14 for generating a negative pulse, which includes a second negatively-polarized electrical power source 319 (power supply potential VH2) and a first electrical power source 309M (power supply potential VH3), are connected in parallel. Here, a circuit to supply initial electric charge is omitted in the drawing.

Here, when a condenser C(I−1)− of the capacitive load drive circuit 303 has an initial potential of V(I−1)−, a condenser C(I)− of the capacitive load drive circuit 303 has an initial potential of V(I)−, a condenser C(I+1)− of the capacitive load drive circuit 303 has an initial potential of V(I+1)−, a condenser C(I−1)+ of the capacitive load drive circuit 302 has an initial potential of V(I−1)+, a condenser C(I)+ of the capacitive load drive circuit 302 has an initial potential of V(I)+, and a condenser C(I+1)+ of the capacitive load drive circuit 302 has an initial potential of V(I+1)+, the following relationships are obtained.

$$VH3 < \ldots < V(I-1)- < V(I)- < V(I+1)- \ldots < VH2 < 0$$

$$0 < \ldots < V(I-1)+ < V(I)+ < V(I-1)+ < \ldots < VH1$$

Figure 43:
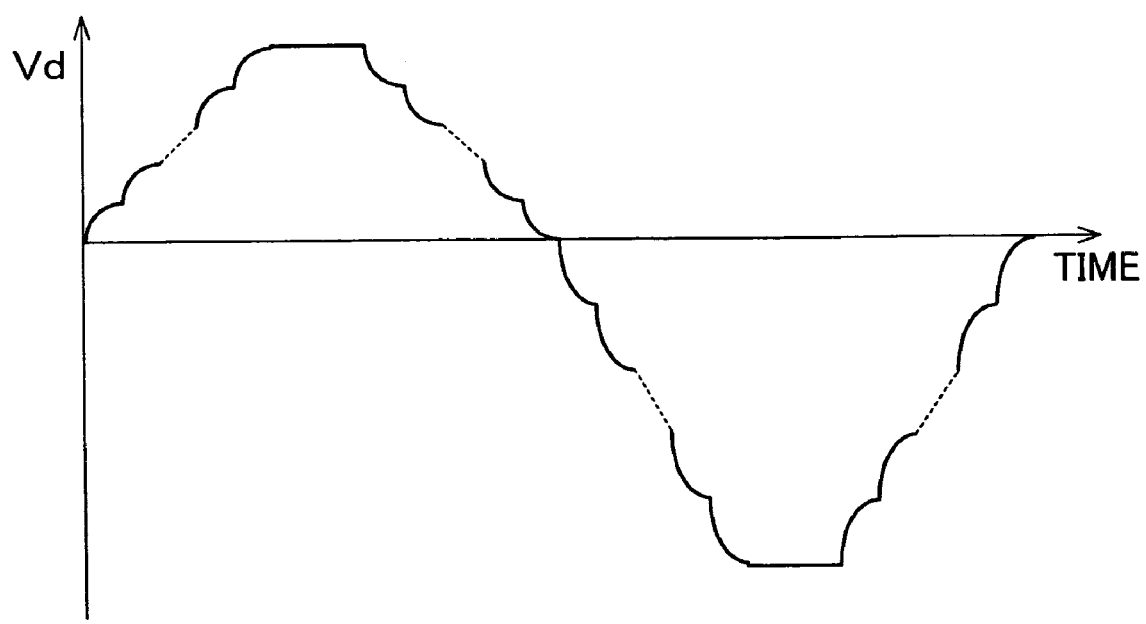
FIG. 43 is a waveform chart showing an example of a waveform of a pulse generated by the capacitive load drive circuit of FIG. 42.

In this case, it is possible to generate a pulse as shown in FIG. 43, for example.

Embodiment 17

Figure 44:
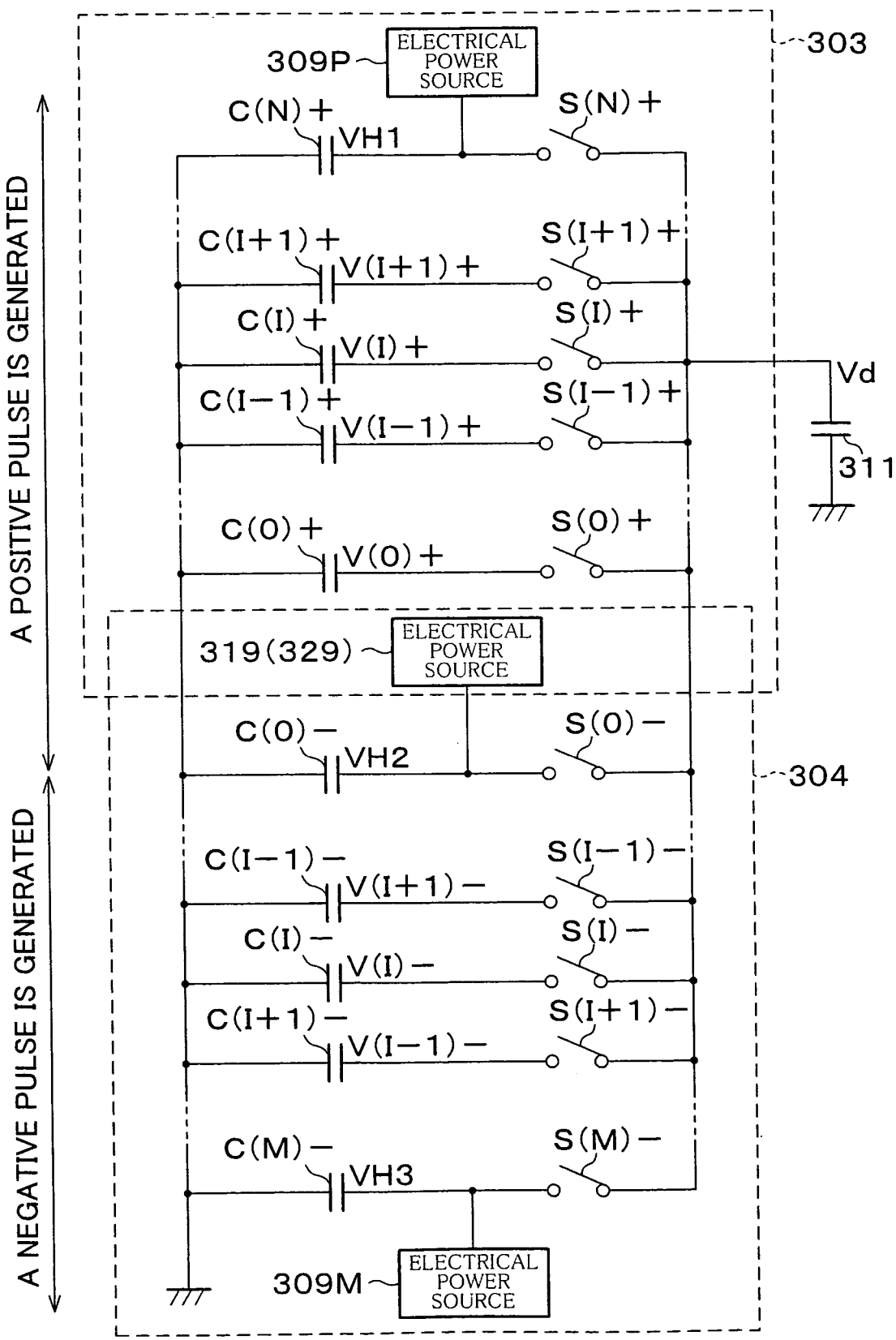
FIG. 44 is a circuit diagram showing an arrangement of a capacitive load drive circuit in accordance with yet another embodiment of the present invention.

A capacitive load drive circuit of the present embodiment is arranged so that (A) the capacitive load drive circuit 303 of Embodiment 14 for generating a positive pulse, the capacitive load drive circuit 303 including the positively-polarized first electrical power source 309P (power supply potential VH1) and the second electrical power supply source 319 (power supply potential VH2), and (B) the capacitive load drive circuit 304 of Embodiment 15 for generating a negative pulse, the capacitive load drive circuit 304 including the negatively-polarized first electrical power source 309M (power supply potential VH3) are connected in parallel, as shown in FIG. 44. The electrical power source 319 (power supply potential VH2) is also used as the second electrical power source 329 in the capacitive load drive circuit 304. Here, a circuit to supply initial electric charge to each condenser is omitted in the drawing.

Here, when a condenser C(I−1)− of the capacitive load drive circuit 303 has an initial potential of V(I−1)−, a condenser C(I)− of the capacitive load drive circuit 303 has an initial potential of V(I)−, a condenser C(I+1)− of the capacitive load drive circuit 303 has an initial potential of V(I+1)−, a condenser C(I−1)+ of the capacitive load drive circuit 304 has an initial potential of V(I−1)+, a condenser C(I)+ of the capacitive load drive circuit 304 has an initial potential of V(I)+, and a condenser C(I+1)+ of the capacitive load drive circuit 304 has an initial potential of V(I+1)+, the following relationships are obtained.

$$VH3 < \ldots < V(I-1)- < V(I)- < V(I+1)- \ldots < 0$$

$$0 < VH2 < V(0)+ < \ldots < V(I-1)+ < V(I) + < V(I-1)+ < \ldots < VH1$$

Figure 45:
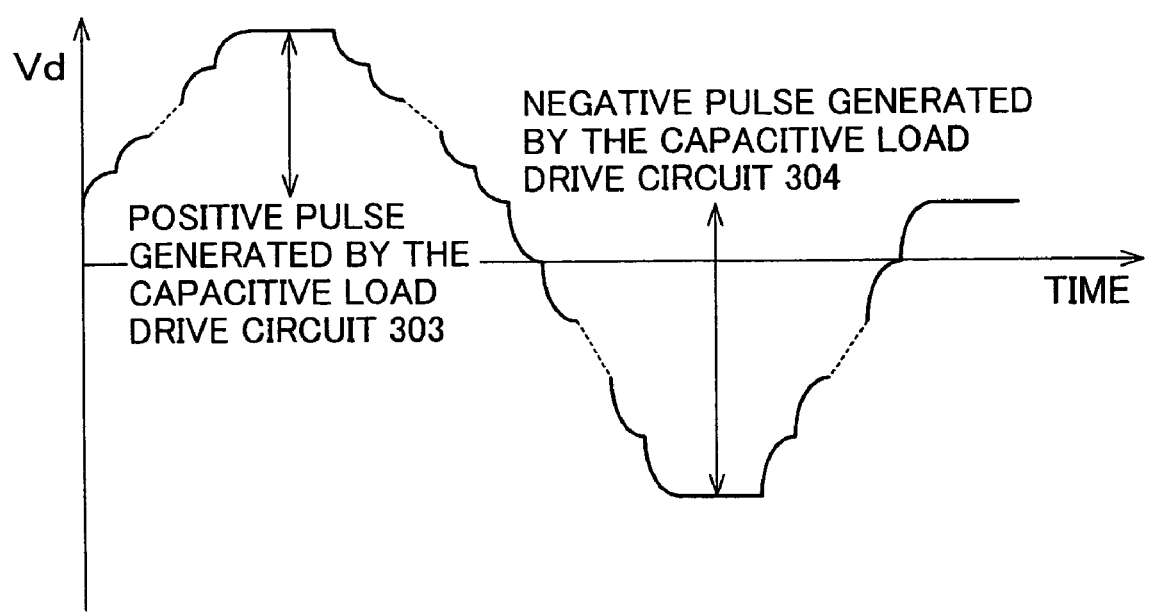
FIG. 45 is a waveform chart showing an example of a waveform of a pulse generated by the capacitive load drive circuit of FIG. 44.

The electrical power source 319 is provided at a stage closest to the ground potential, and has the function of absorbing electrical power so as to prevent the voltage drift. The power supply potential VH2 of the electrical power source 319 may be set depending on how the initial potentials of the condensers are set. In this case, it is possible to generate a pulse as shown in FIG. 45, for example.

Embodiment 18

Figure 68:
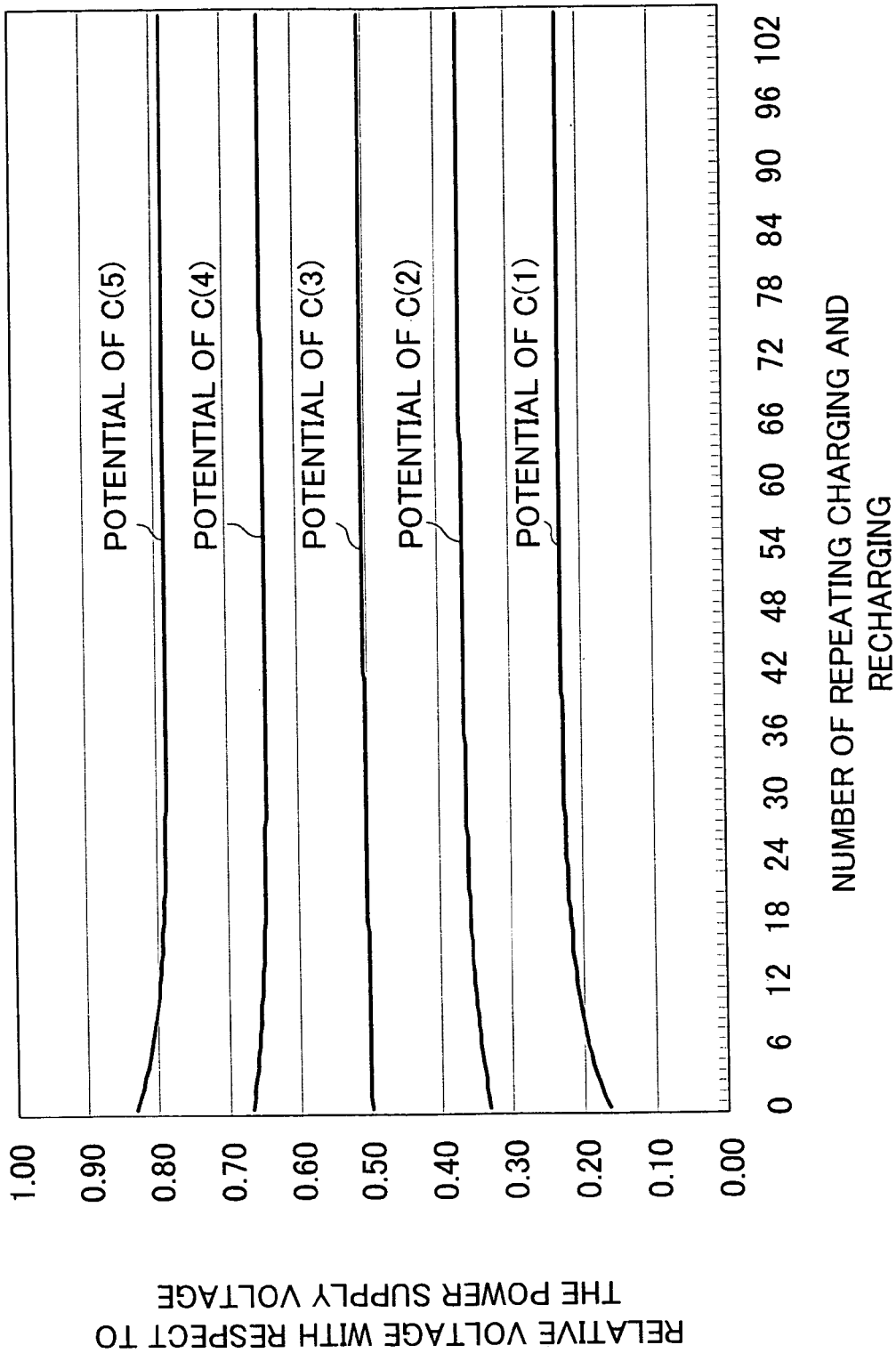
FIG. 68 is a diagram showing how voltages of the energy accumulating elements change in the capacitive load drive circuit in accordance with an embodiment of the present invention, when repeatedly charging and discharging the capacitive load.

The capacitive load drive circuit of the present invention supplies to the capacitive load the electrostatic energy which is accumulated in the plurality of energy accumulating elements, so as to charge the capacitive load; and then collects the energy discharged from the capacitive load into the energy accumulating elements, so as to regenerate the electrostatic energy accumulated in the energy accumulating elements to have a potential approximately equal to the potential before the electrostatic energy is supplied to the capacitive load. However, since the energy is regenerated only for a limited time, the energy accumulating elements do not completely regain the original potential. Thus, when charging and discharging are repeated without further energy supply after an initial potential is applied, the voltage of each energy accumulating element drifts (phenomenon in which the voltage approaches an intermediate value between the highest potential and the lowest potential), as shown in FIG. 68. Namely, an energy accumulating element having an initial potential higher than the intermediate value between the highest potential and the lowest potential insufficiently collects energy from the capacitive load, resulting in a gradual falling of the potential. On the other hand, an energy accumulating element having an initial potential lower than the intermediate value between the highest potential and the lowest potential excessively collects energy from the capacitive load, resulting in a gradual rising of the potential.

Note that, FIG. 68 is a view showing how the voltages of the condensers C(1) through C(5) change in a capacitive load drive circuit having the condensers C(1) through C(5), which is the capacitive load drive circuit 301 of FIG. 30 whose number of stages is modified into six, in a case where the capacitive load 311 repeats charging and discharging without further energy supply after initial potentials are applied to the condensers C(1) through C(5), the initial potentials being prepared by dividing the power supply voltage into six.

Thus, the capacitive load drive circuit 302 of Embodiment 13 is further provided with electrical power sources 339(1) through 339(N−1) (DC power sources) corresponding to the condensers C(1) through C(N−1) other than the ground terminal C(0) and the condenser C(N) that is connected to the electrical power source 309, the electrical power sources 339(1) through 339(N−1) connecting to the condensers C(1) through C(N−1) via resistance circuits R(1) through R(N−1) so as to supply energy, thereby preventing the above-described voltage drift.

Figure 46:
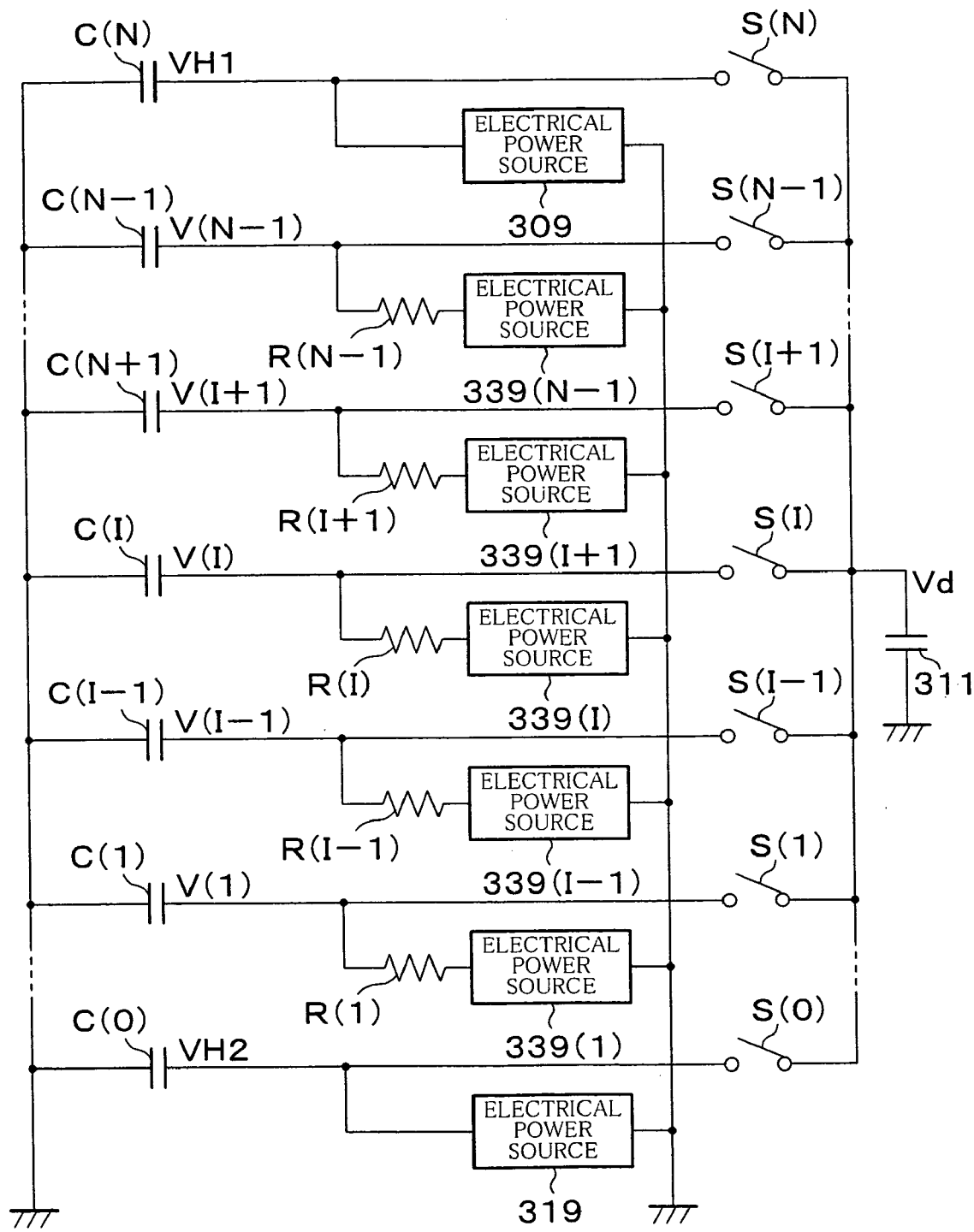
FIG. 46 is a circuit diagram showing an arrangement of a capacitive load drive circuit in accordance with still another embodiment of the present invention.
Figure 47:
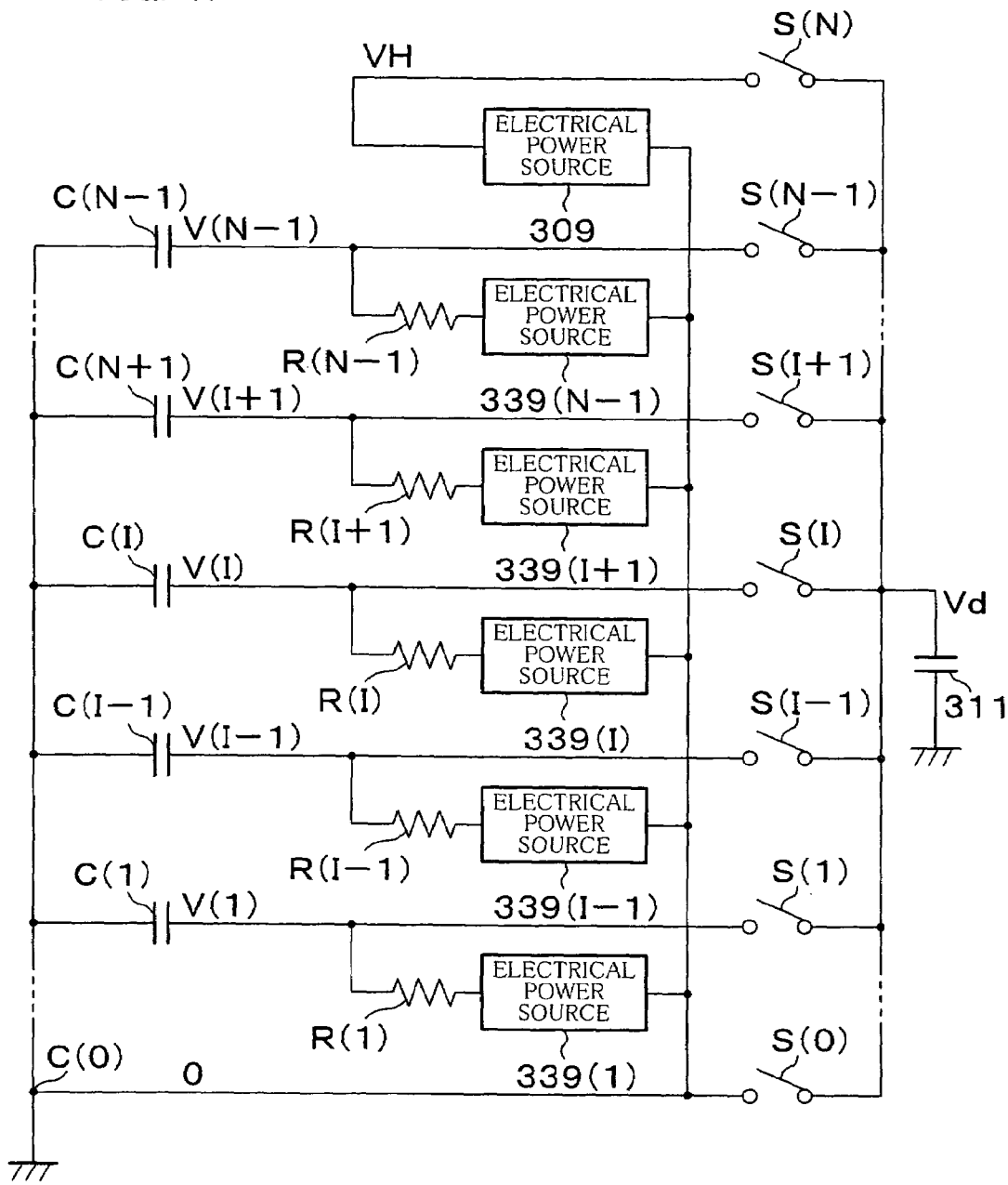
FIG. 47 is a circuit diagram showing an arrangement of a capacitive load drive circuit in accordance with yet another embodiment of the present invention.
Figure 48:
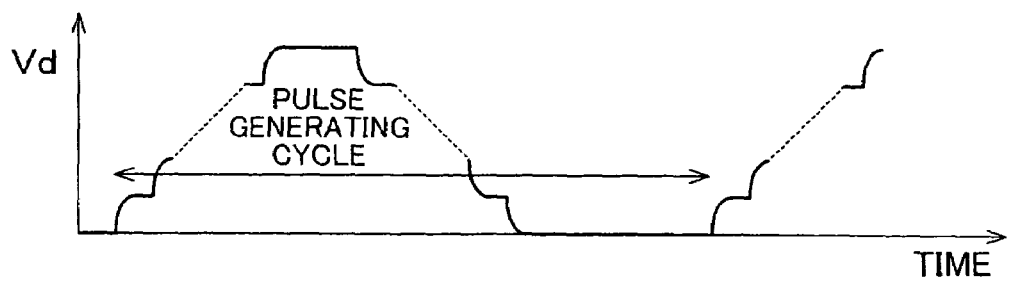
FIG. 48 is a waveform chart showing an example of a waveform of a pulse generated by the capacitive load drive circuit of FIG. 47.

As shown in FIG. 47, the capacitive load drive circuit 302 of Embodiment 13 may be additionally provided with the electrical power sources 339(1) through 339(N−1) which are respectively connected to the condensers C(1) through C(N−1), and the resistors R(1) through R(N−1) which are respectively attached to the electrical power sources 339(1) through 339(N−1). Alternatively, as shown in FIG. 46, the capacitive load drive circuit 303 of Embodiment 14 may be additionally provided with the electrical power sources 339(1) through 339(N−1) which are respectively connected to the condensers C(1) through C(N−1), and the resistors R(1) through R(N−1) which are respectively connected to the electrical power sources 339(1) through 339(N−1). With this arrangement of FIG. 47, it is possible to generate a pulse as shown in FIG. 48, for example.

Here, the resistors R(1) through R(N−1) which are respectively provided between the electrical power sources 339(1) through 339(N−1) and the condensers C(1) through C(N−1) are preferably arranged so that a time constant that is determined by the resistors R(1) through R(N−1) and the capacitive component of the condensers C(1) through C(N−1) is larger than the cycle of a drive pulse applied to the capacitive load 311, by not less than 50 times.

Namely, when the cycle of a drive pulse applied to the capacitive load 311 (see FIG. 48) is a pulse generating cycle Tp, the capacitance of the condenser C(I) (i=1, ... I−1, I, I+1, ... , N−1) is C(i), and the resistance value of the resistance R(i) provided between the electrical power source 339 and the condenser C(I) is R(i), the time constant τ(i) of the condenser C(i) is given as follows.

$$\tau(i) = C(i) \times R(i)$$

Here, it is preferable that the time constant τ(i) satisfies the following relation.

$$Tp * 10\% \tau(i) = C(i) \times R(i)$$

Further, it is more preferable that the time constant τ(i) satisfies the following relation.

$$Tp \times 50\% \tau(i) = C(i) \times R(i)$$

The following will explain the reasons for the above preferable ranges.

When the electrical power sources 339(1) through 339(N−1) supply electrical power at excessively high speed, the electrical power sources 339(1) through 339(N−1) supply electrical power to the condensers C(1) through C(N−1) before electrical power is regenerated by the circuit of the present invention, thereby deteriorating the efficiency in regenerating electrical power in the whole system.

The time constant of supplying electrical power from the electrical power sources 339(1) through 339(N−1) should be larger than the time interval between energy is supplied to and regenerated from the capacitive load 311, by not less than 20 times, in order that not more than 5% of the electrical power is supplied from the electrical power sources 339(1) through 339(N−1) during a time interval between energy is supplied to and regenerated from the capacitive load 311. Further, the time constant of supplying electrical power from the electrical power sources 339(1) through 339(N−1) should be larger than the time interval between energy is supplied to and regenerated from the capacitive load 311, by not less than 100 times, in order that not more than 1% of the electrical power is supplied from the electrical power sources 339(1) through 339(N−1) during a time interval between energy is supplied to and regenerated from the capacitive load 311.

On the other hand, the longest time interval between supplying and regenerating energy is considered to be a half of the pulse generating cycle Tp. Thus, the time constant $\tau(i)$ of supplying electrical power from the electrical power source 339(1) through 339(N−1) should be larger than the pulse generating cycle Tp by not less than 10 times so that the electrical power supplied from the electrical power sources 339(1) through 339(N−1) during a time interval between energy is supplied to and regenerated from the capacitive load 311 is reduced to be not more than 5%. The time constant $\tau(i)$ of supplying electrical power from the electrical power sources 339(1) through 339(N−1) should be not less than 50 times the pulse generating cycle Tp so that the electrical power supplied from the electrical power sources 339(1) through 339(N−1) during a time interval between energy is supplied to and regenerated from the capacitive load 311 is reduced to be not more than 1%. With this, the electrical power supplied from the electrical power sources 339(1) through 339(N−1) do not substantially affect the power regeneration.

There is no clear limitation on the upper limit of $\tau(i)/Tp$, but the electrical power sources 339(1) through 339(N−1) do not supply energy when $\tau(i)/Tp$ is too large. With this, the system cannot be stabilized when some reason causes the imbalance between energy supply and regeneration. Namely, the time constant $\tau(i)$ of energy supply from the electrical power sources 339(1) through 339(N−1) is preferably as small as possible within a range that does not significantly affect the energy regeneration ratio.

The following will further explain this point.

As described above, the capacitive load drive circuit of the present embodiment for selectively connecting a plurality of condensers C(1) through C(N−1) so as to control a voltage applied to the capacitive load 311 is so arranged that the electrical power sources 339(1) through 339(N−1) supply energy to the condensers C(1) through C(N−1) so as to prevent the voltage drift caused by the fact that the condensers C(1) through C(N−1) charge and discharge the capacitive load 311.

Here, it is preferable that the capacitive load drive circuit is so arranged that a drive pulse having a predetermined cycle is applied to the capacitive load 311, a charging step of selectively connecting the capacitive load 311 to the condensers C(1) through C(N) so that the condensers C(1) through C(N) supply electrostatic energy to the capacitive load 311, the charging step being repeated in a plurality of times within one cycle of the drive pulse, and the following relationship is satisfied:

when $N=2$, $3 \times Tp \leq Rs \cdot Cs \leq 6 \times Tp$;

when $N=3$, $3 \times Tp \leq Rs \cdot Cs \leq 7 \times Tp$;

when $N=4$, $3 \times Tp \leq Rs \cdot Cs \leq 8 \times Tp$;

when $N \geq 5$, $3 \times Tp \leq Rs \cdot Cs \leq 10 \times Tp$, where Cs (unit F) is the capacitive component of the condensers C(1) through C(N−1), Tp (unit Sec) is a cycle of the drive pulse applied to the capacitive load 311, Rs is a resistance value of the energy supplying path from the electrical power sources 339(1) through 339(N−1) to the condensers C(1) through C(N−1) (first energy accumulating elements), and N is the number of repeating the charging steps within one cycle of the drive pulse (number of stages).

The following effects can be obtained by satisfying the above relational expressions. Namely, when the above relationship is satisfied, it is possible to maintain the voltages of the condensers C(1) through C(N−1), without affecting the power collection when charging and discharging the capacitive load 311 which is a characteristic feature of the present invention. In contrast, when Rs·Cs is smaller than the above lower limit, the condensers C(1) through C(N−1) are supplied with energy from the electrical power sources 339(1) through 339(N−1) before electrical power is sufficiently regenerated, thereby deteriorating the efficiency in regenerating electrical power. On the other hand, when Rs·Cs is extremely larger than the above lower limit, the voltage drift of the condensers C(1) through C(N−1) become large, thereby deteriorating the efficiency in regenerating electrical power. The upper limit of Rs·Cs differs depending on the energy consumption in the capacitive load 311. In view of designing, Rs·Cs is preferably as small as possible provided that the above relationship is satisfied.

Figure 49:
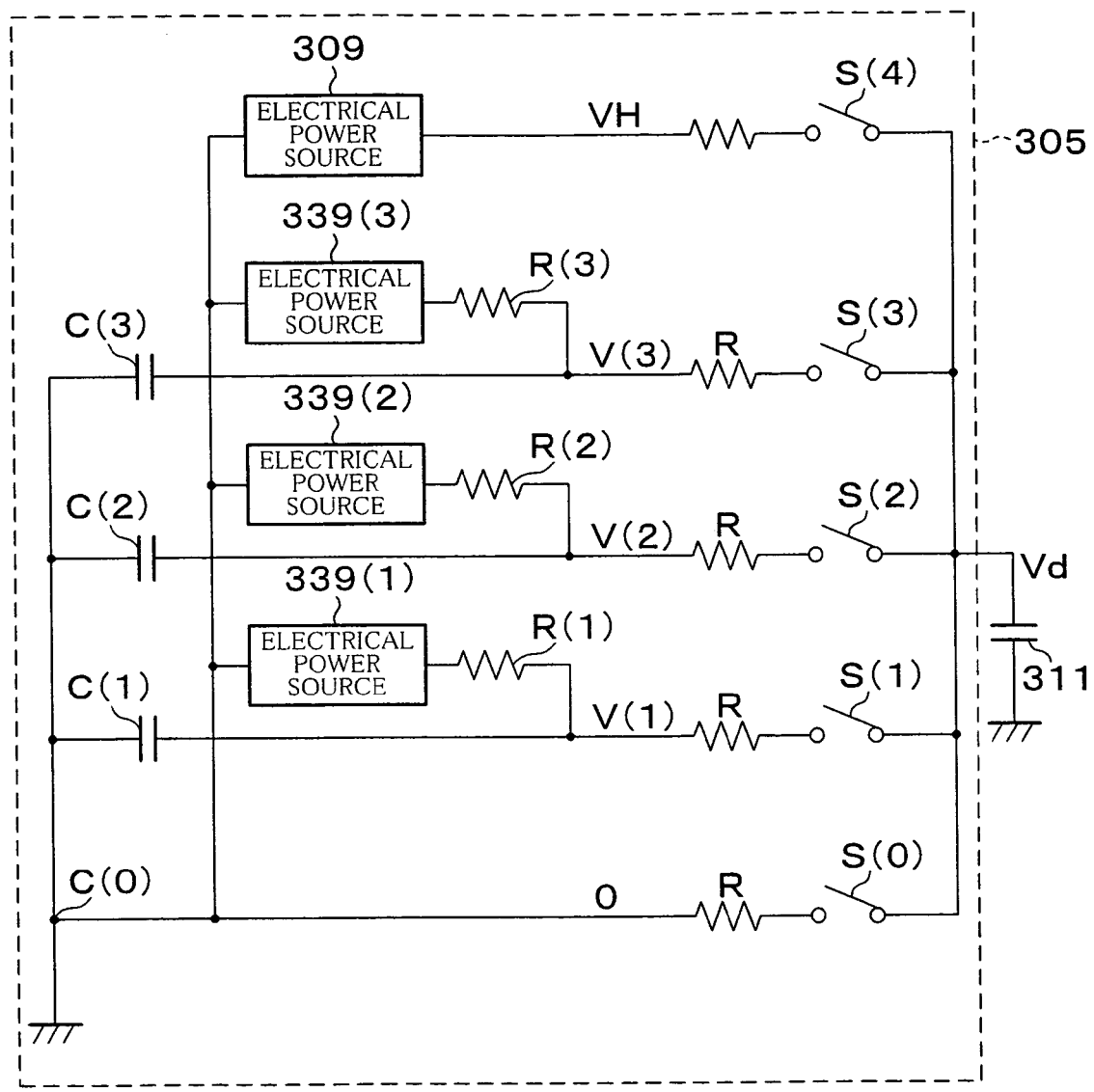
FIG. 49 is a circuit diagram showing an arrangement of a capacitive load drive circuit in accordance with still another embodiment of the present invention.

Next, FIG. 49 shows an example of a capacitive load drive circuit of the present embodiment, which is designed to satisfy the above relationship. In this example, the number of stages (=N−1) of the condensers C(1) through C(N−1), which are respectively connected to the electrical power sources 339(1) through C(N−1) for preventing the voltage drift, is modified to three (N=4) in the capacitive load drive circuit of FIG. 46. Further, an equivalent ON resistor of the switching element S(N) is referred to as R here.

Further, it is assumed here that the capacitance (equivalent capacitance of an ink jetting-out element (PZT) of an ink-jet printer) Cd of the capacitive load 311 is 1nF, the capacitances C(1) through C(3) of the condensers C(1) through C(3) are 10 nF (set to be 10 times as Cd), the equivalent ON resistor R of the switching element S(N) is 10 Ω, the power supply voltage VH of the electrical power source 309 is 10V, the power supply voltage V(3) of the electrical power source 339(3) is 7.5V, the power supply voltage V(2) of the electrical power source 339(2) is 5.0 V, the power supply voltage V(1) of the electrical power source 339(1) is 2.5 V, the pulse generating cycle Tp is 1 msec, and $R(1)=R(2)=R(3)=400$ kΩ.

Accordingly, the time constant of charging and discharging the capacitive load 311 is expressed as follows.

$R \times Cd = 10$ nSec

This is sufficiently shorter than the pulse generating cycle Tp. In this case, the right side of the relational expression Rs·Cs ≤ 8×Tp when the number of stages is four is as follows:

$8 \times Tp = 8$ mSec.

The left side of the relational expression Rs·Cs ≤ 8×Tp when the number of stages is four is as follows:

$Cs \times Rs = 400$ kΩ × 10 nF = 4 mSec.

Accordingly, the relational expression Rs·Cs ≤ 8×Tp when the number of stages is four is expressed as follows:

4 mSec ≤ 8 mSec, which is now satisfied. Thus, in this case, energy supply from the electrical power sources can prevent the voltage drift of the energy accumulating element Cs due to the application of a voltage pulse to the capacitive load 311.

Further, the examination of the relational expression $3 \times Tp \% Rs \cdot Cs$ revealed that it is possible to reduce the voltage drift in the exponential manner to be not more than 5%, by satisfying the relational expression, namely by setting the time constant to be three or more times the pulse cycle. Therefore, it is necessary that the relational expression be satisfied to fully improve the stability and regeneration efficiency of the circuit.

Embodiment 19

Figure 59:
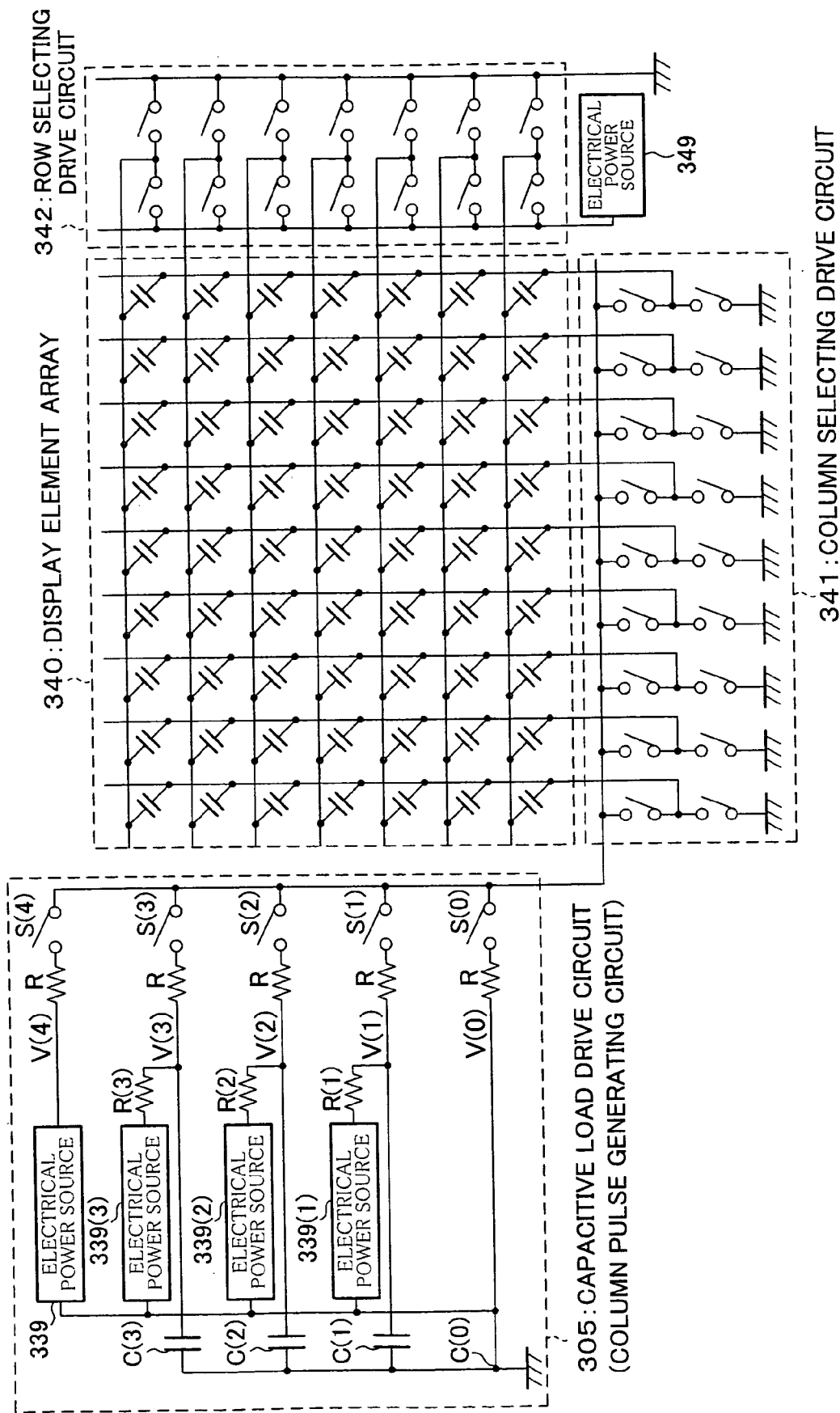
FIG. 59 is a diagram showing a display apparatus using the capacitive load drive circuit in accordance with an embodiment of the present invention.

A matrix display apparatus is provided with a display element array (display element) 340, a column selecting drive circuit 341, a row selecting drive circuit 342, and an electrical power source 349 which supplies electrical power to the row selecting drive circuit 342. Selection with respect to the display element array 340 is carried out by the row selecting drive circuit (drive circuit) 342 and the column selecting drive circuit (drive circuit) 341. A specified pulse is applied to the display element array 340. The display element array here refers to a liquid crystal display element array, a discharge display (plasma display), an EL element array, and the like. Here, the capacitive load drive circuit of the present invention is used as a column pulse generating circuit that supplies a column pulse to the column selecting drive circuit 341, so as to generate the column pulse and collect electrical power from the display element array. FIG. 59 shows the case where the capacitive load drive circuit 305 of Embodiment 18 is used as the column pulse generating circuit (including an electrical power regenerating circuit), but the arrangement of the capacitive load drive circuit is not particularly limited.

Note that, when the row selecting drive circuit 342 requires a pulse generating apparatus, the capacitive load drive circuit of the present invention may be used instead of the electrical power source 349.

Embodiment 20

Figure 60:
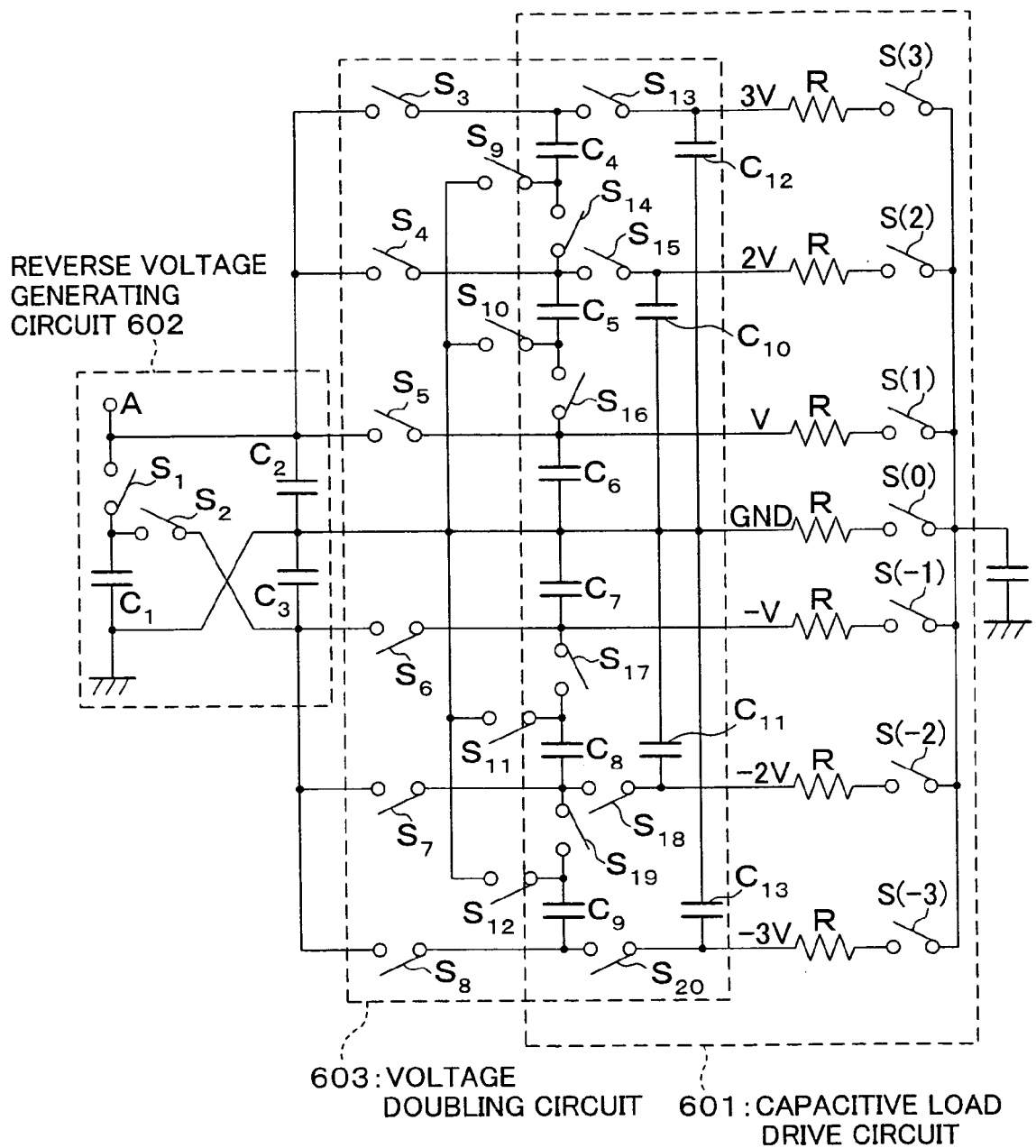
FIG. 60 is a diagram showing a DC-AC converter using the capacitive load drive circuit in accordance with an embodiment of the present invention.

FIG. 60 shows an application example where the capacitive load drive circuit of the present invention is used as a DC-AC converter which generates an AC voltage from a single voltage which is supplied from a DC power source.

As shown in FIG. 60, the DC-AC converter is provided with a capacitive load drive circuit 601 of the present invention, a reverse voltage generating circuit 602 which generates a voltage whose polarity is reverse to a polarity of the voltage from a DC power source (not shown), and a voltage doubling circuit (double voltage generating circuit) 603 which generates a plurality of voltages. The capacitive load drive circuit 601 has a function to generate an AC voltage while collecting electrical power. The DC-AC converter is arranged by combining the usual reverse voltage generating circuit 602 and voltage doubling circuit 603.

The operation of the DC-AC converter shown in FIG. 60 will be explained using symbols as described in FIG. 60.

(1) The voltage V is always applied to the terminal A. Further, the voltage V is applied to the condenser C2.

(2) Next, the switching elements S1, S3, S4, S5, S9, and S10 are switched ON so as to charge the condensers C1, C4, C5, and C6 to the voltage V.

(3) The switching elements S1, S3, S4, S5, S9, and S10 are switched OFF and then the switching elements S2, S6, S7, S8, S11, and S12, are switched ON, so as to charge the condensers C3, C7, C8, and C9 to the voltage V.

(4) The switching elements S2, S6, S7, S8, S11, and S12 are switched OFF, and then the switching elements S14, S16, S17, and S19 are switched ON. With this, the condensers C4, C5, C6, C7, C8, and C9 are all connected in series, so as to generate voltages of 3V, 2V, V, −V, −2V, and −3V. The ground terminal GND is located at their center.

(5) The switching elements S15, S13, S18, and S20 where the voltages of 2V, 3V, −2V, and −3V are respectively generated are switched ON so that C10, C12, C11, and C13 respectively accumulate the voltages of 2V, 3V, −2V, and −3V. With this, each of the voltages is taken out to the outside.

In sum, the DC-AC converter generates voltages by (i) connecting the condensers C4, C5, C6, C7, C8, and C9 in parallel with respect to the terminal A having the voltage V, so as to charge the condensers C4, C5, C6, C7, C8, and C9 to the voltage V, and then (ii) reconnecting the condensers C4, C5, C6, C7, C8, and C9 in series.

Embodiment 21

An ink-jet printer may use a record head of a shearing mode which uses a known piezoelectric material such as ceramic (Tokukaisho 63-247051, for example). The following will explain the arrangement and function of a record head which is used for an ink-jet printer of the shearing mode.

Figure 61:
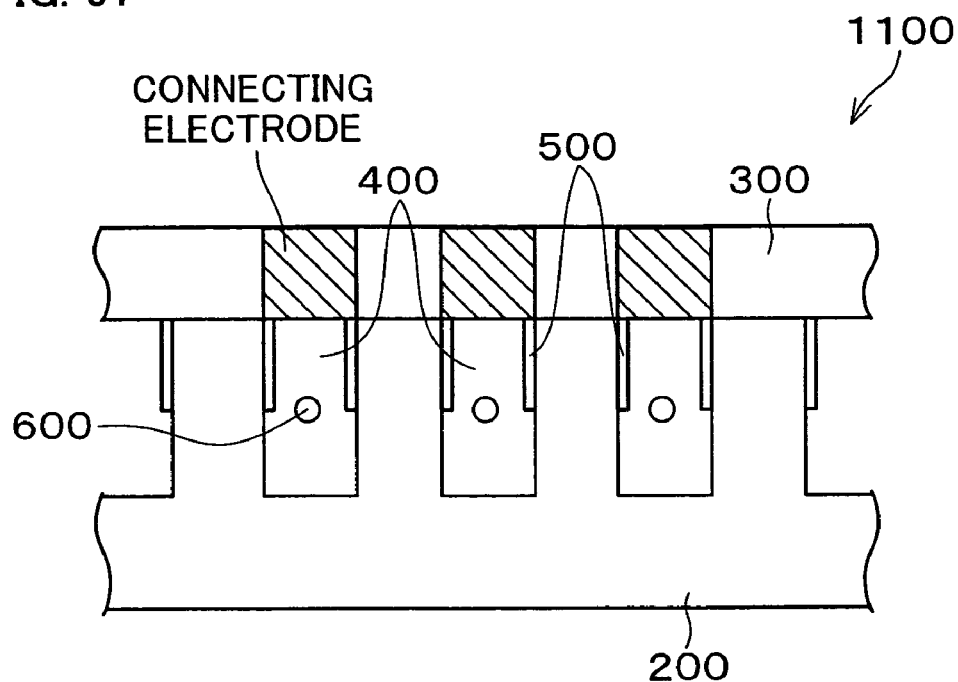
FIG. 61 is a plan view showing a part of a record head which is seen from a recording medium.
Figure 62:
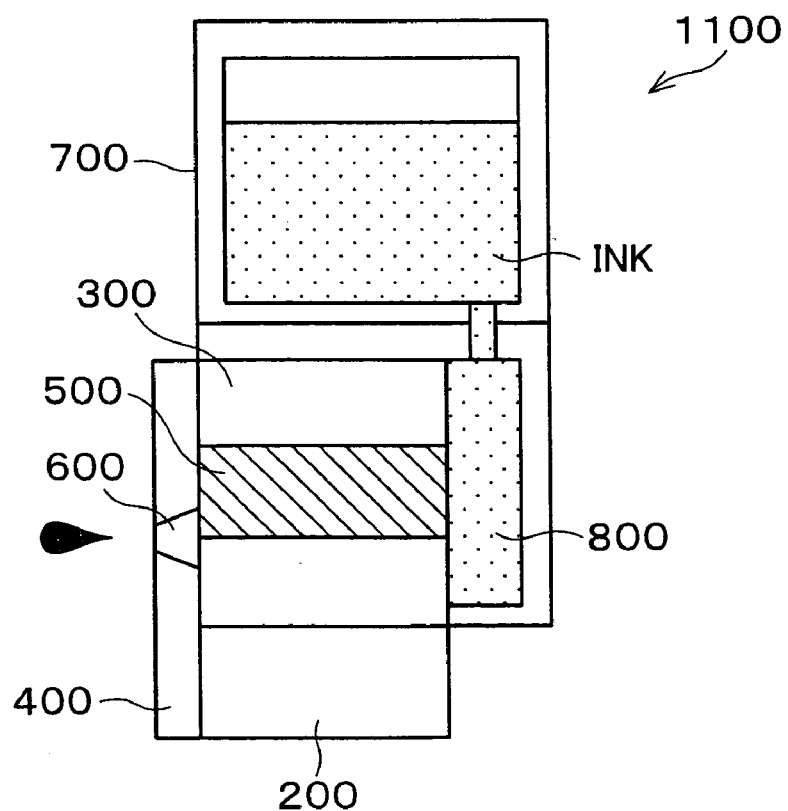
FIG. 62 is a longitudinal cross-sectional view showing the record head.

FIG. 61 is a plan view showing a part of the record head which is seen from a recording medium, and FIG. 62 is a longitudinal cross-sectional view of the record head.

As shown in FIG. 61, a record head 1100 is provided with a piezoelectric material 200, a top plate 300, and a plurality of ink chambers 400.

The piezoelectric material 200 is formed in a comb-teeth shape, and each of the ink chambers 400 is inlaid into a gap between each tooth.

The ink chamber 400 is provided with drive electrodes 500 which are respectively formed on both side faces, and a jetting-out nozzle 600. This ink-jet printer generates an electric field between the drive electrodes 500 which are respectively provided in adjacent ink chambers 400, so as to jet out ink through the jetting-out nozzle 600. The details will be described later.

The top plate 300 inlays the plurality of ink chambers 400 into the piezoelectric material 200, and is provided with connecting electrodes made of conductive resin.

Further, as shown in FIG. 62, ink is stored in an ink tank 700 in the record head 1100, and jetted out through the jetting-out nozzle in a manner to be described later via a common ink path 800 connected to the jetting-out nozzles 600 in the plurality of ink chambers 400.

Next, states how the ink-jet printer of the shearing mode jets out ink will be explained. Note that, adjacent three ink chambers are respectively referred to as A channel, B channel, and C channel in the following explanation. Further, the following explanation will deal with a case where the ink chamber of the B channel jets out ink, but the same applies to cases where the ink chamber of the A channel or C channel jets out ink.

The record head 1100 is so arranged that the capacitive load drive circuits of Embodiments 5, 5A, 6, 6A drive the drive electrodes 500 (capacitive load) in the ink chambers of the A channel, B channel, and C channel.

Figure 63:
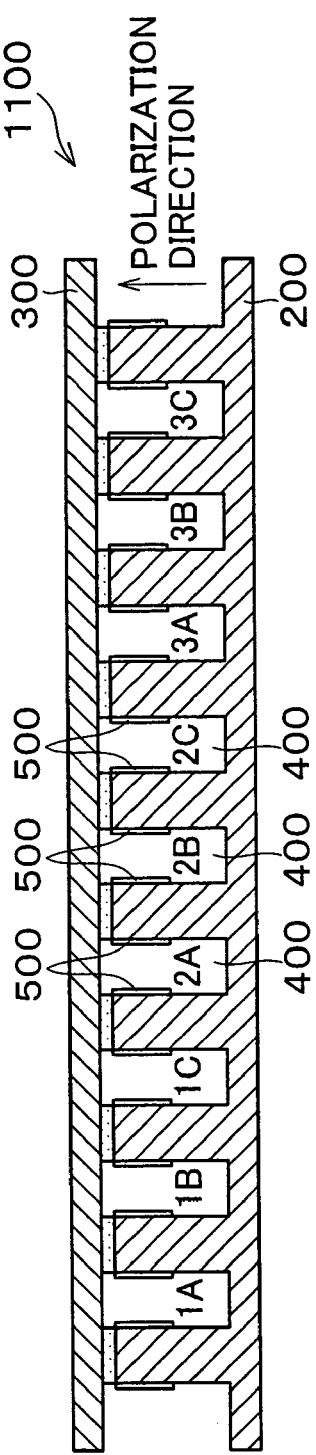
FIGS. 63(a) through 63(c) are cross-sectional views used for explaining the operation of the record head of FIG. 62.
Figure 63:
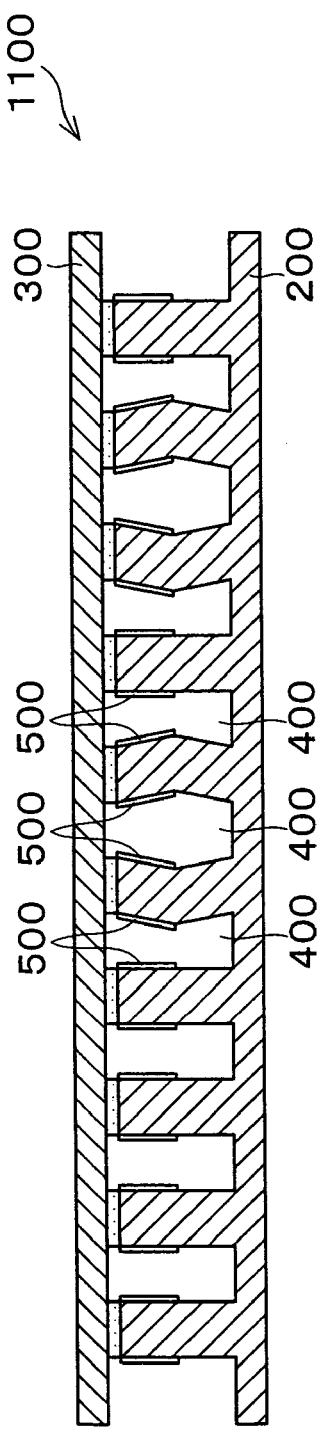
Figure 63:
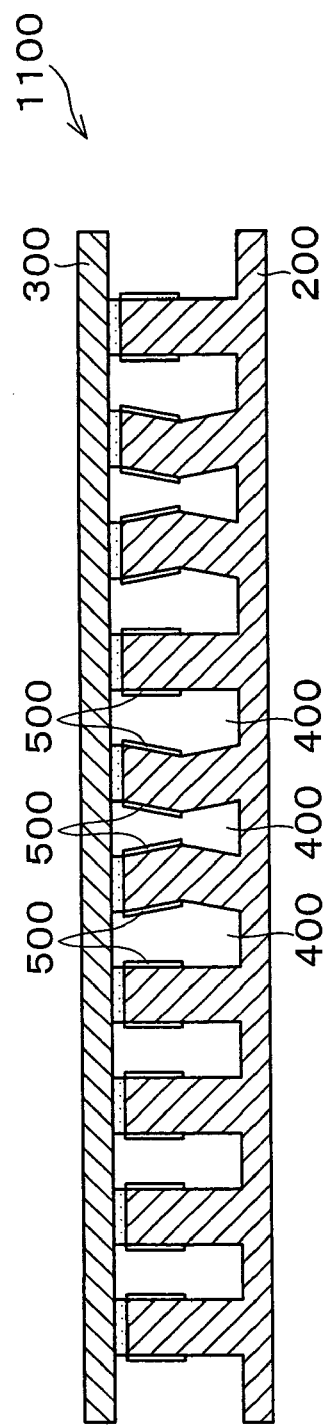

As shown in FIG. 63(a), in a normal state where ink is not jetted out, an electric field is not applied to any of the ink chambers of the A channel, B channel, and C channel. Further, the piezoelectric material is polarized in a direction parallel to the surface of the drive electrode, namely in a direction orthogonal to the drive electric field.

Figure 64:
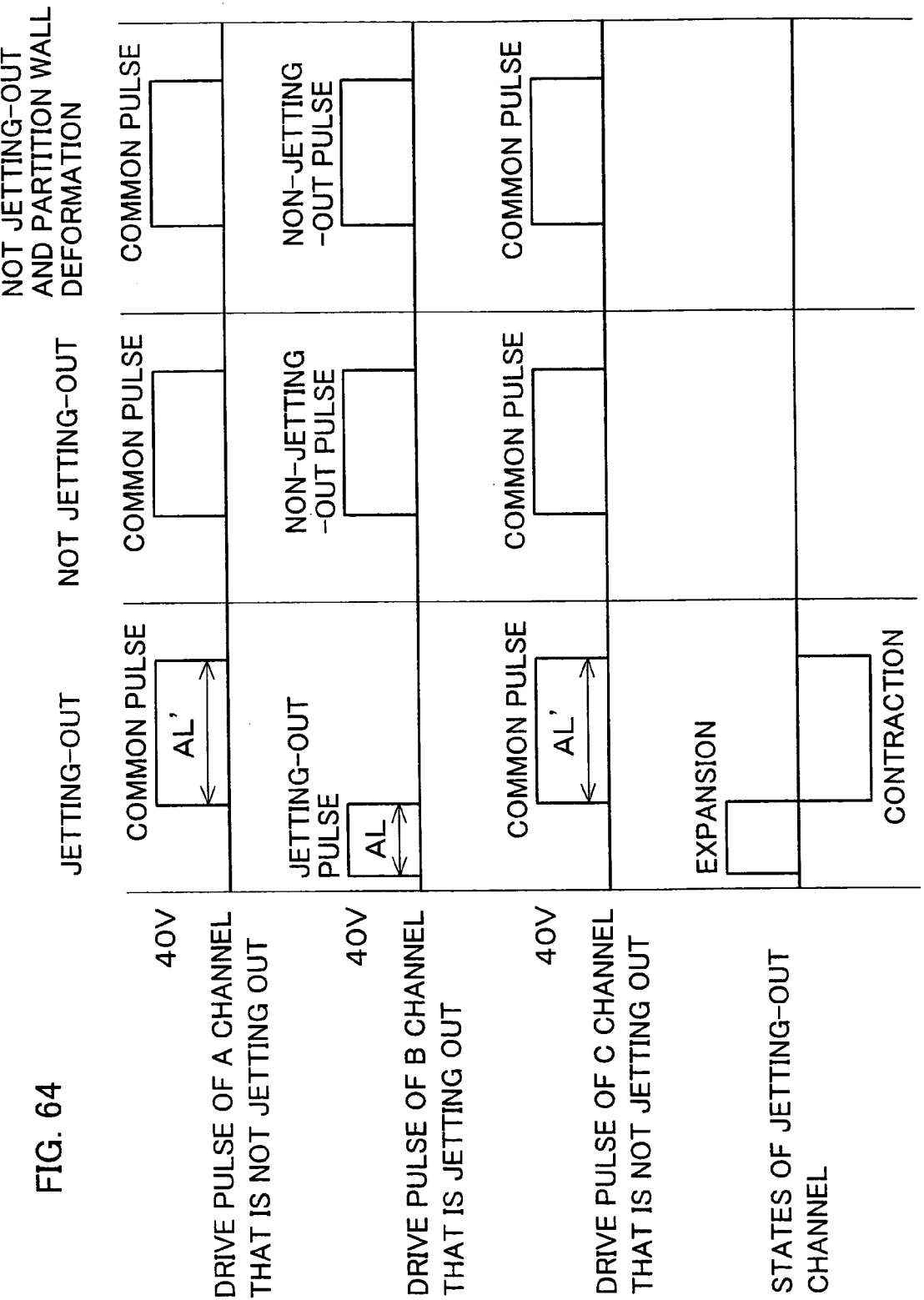
FIG. 64 are pulse waveform charts used for explaining the operation of the record head of FIG. 62.

Then, as shown in FIG. 64, a jetting-out pulse is supplied to the drive electrodes 500 in the ink chamber of the B channel. On the other hand, a jetting-out pulse is not supplied to the ink chambers of the A channel and B channel.

This generates an electric field from the drive electrodes 500 in the ink chamber of the B channel respectively toward the drive electrodes 500 in the ink chambers of the A channel and C channel. The piezoelectric material tries to move in accordance with the direction of this electric field. As a result, side walls of the ink chamber of the B channel expand, as shown in FIG. 63(a).

Then, as shown in FIG. 64, a common pulse is supplied to the drive electrodes 500 in the ink chambers of the A channel and C channel. This generates an electric field from the drive electrodes 500 in the ink chambers of the A channel and C channel respectively toward the drive electrodes 500 in the ink chamber of the B channel. As a result, the side walls of the ink chamber of the B channel contract so as to reduce the volume of the ink chamber of the B channel, as shown in FIG. 63(c). With this, ink is jetted out through the jetting-out nozzle of the ink chamber of the B channel.

Note that, when no channel jets out ink, a common pulse is supplied to the drive electrodes 500 in the ink chambers of the A channel and C channel, and a non-jetting-out pulse which has the same potential as the common pulse is supplied to the drive electrodes 500 in the ink chamber of the B channel. With this, the drive electrodes 500 in the ink chambers of the A through C channels have the same potential, so as to generate no electric field between each drive electrode 500. Accordingly, the side walls of the ink chambers of any channel do not expand or contract. Here, ink is not jetted out.

As described above, the record head 1100 realizes printing operation by repeating the sequential switching of the jetting-out channels A through C so as to jet out ink, namely by three-phase driving.

Further, a time AL for supplying the jetting-out pulse, and a time AL' for supplying the common pulse are determined by the following expression (1).

$$AL \text{ (or } AL') = \text{length of the ink chamber/speed of sound in ink} \quad (1)$$

Therefore, when the ink chambers of the three channels have the same length, the following relation is obtained.

$$AL' = 2AL$$

Note that, in a typical ink-jet printer, obtained is about AL=2 μs.

Embodiment 22

Next, the following will explain an embodiment of an ink-jet printer which performs printing by jetting out ink onto a recording medium, and is improved in the jetting-out operation during the recovering operation, thereby being capable of carrying out printing in higher definition and at higher speed than the ink-jet printer of Embodiment 21.

Figure 65:
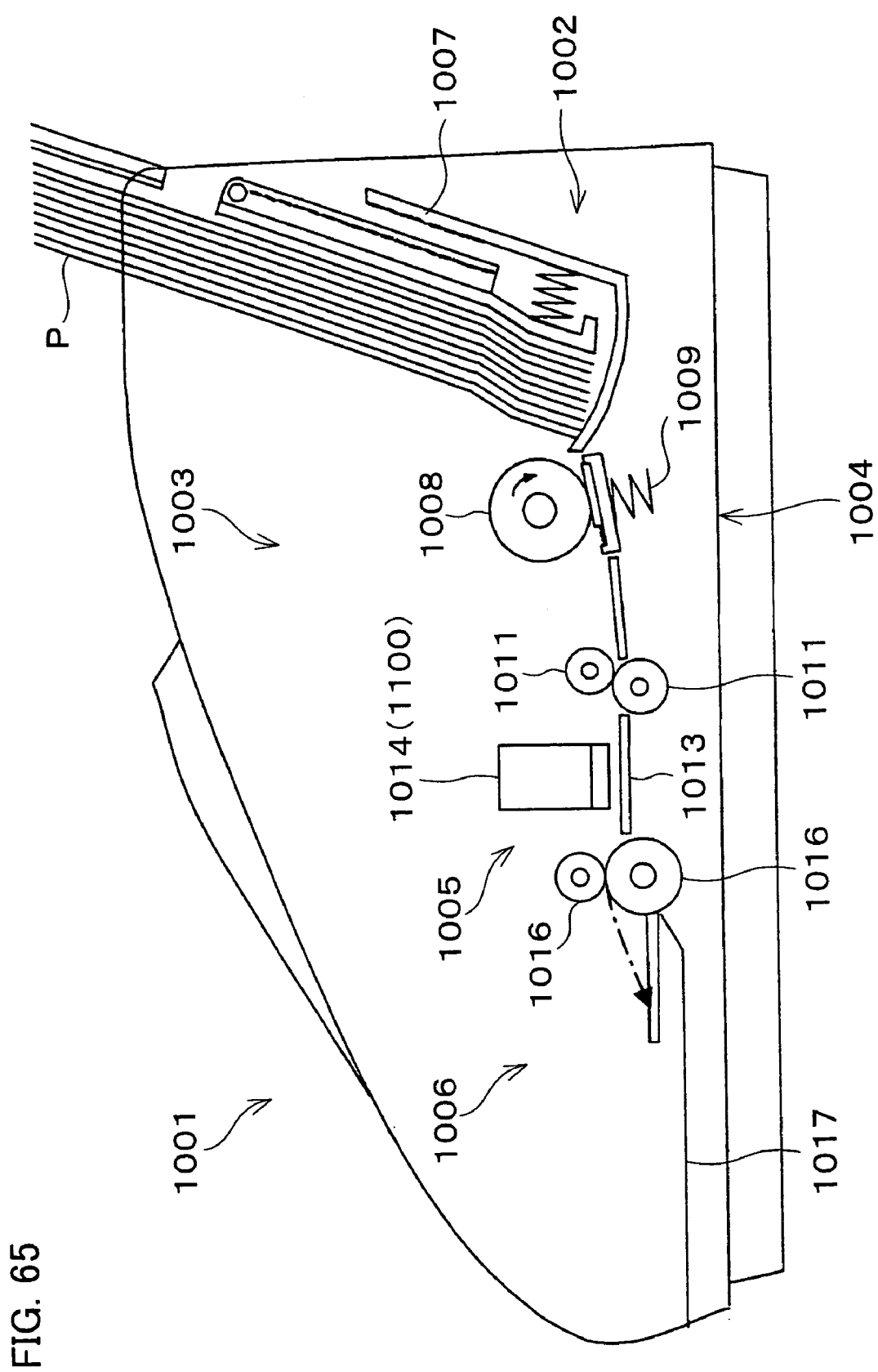
FIG. 65 is a cross-sectional view showing an ink-jet printer (image forming apparatus) which uses the capacitive load drive circuit in accordance with another embodiment of the present invention.

As shown in FIG. 65, an ink-jet printer 1001 is provided with a paper feeding section (paper feeding device) 1002, a separating section 1003, a conveying section 1004, a printing section (character-printing section) 1005, and a delivering-out section 1006.

The paper feeding section 1002 supplies a sheet P when printing, and is composed of a paper feeding tray 1007 and a pickup roller (not shown). When the printing is not carried out, the paper feeding section 1002 stores the sheet P.

The separating section 1003 separately supplies to the printing section 1005 a sheet P which is supplied from the paper feeding section 1002. The separating section 1003 is provided with a paper feeding roller 1008 and a separating device 1009. The separating device 1009 is set so that friction between a pad portion thereof (portion contacting sheet) and sheet is more than friction between sheets. Further, the paper feeding roller 1008 is set so that friction between the paper feeding roller 1008 and sheet is more than the friction between the pad and sheet, and the friction between sheets. Thus, even when two sheets are sent to the separating section 1003, the paper feeding roller 1008 can separate these two sheets so as to send only the upper sheet to the conveying section 1004.

The conveying section 1004 conveys to the printing section 1005 the sheet P which is supplied one by one from the separating section 1003. The conveying section 1004 is composed of a guide plate 1010 and a pair of rollers 1011 (conveying mechanism). The pair of rollers 1011 adjusts the conveying of the sheet P when conveying the sheet P into a space between a record head 1100 and a platen 1013 so that ink from the record head 1100 is sprayed on an appropriate portion of the sheet P.

Figure 66:
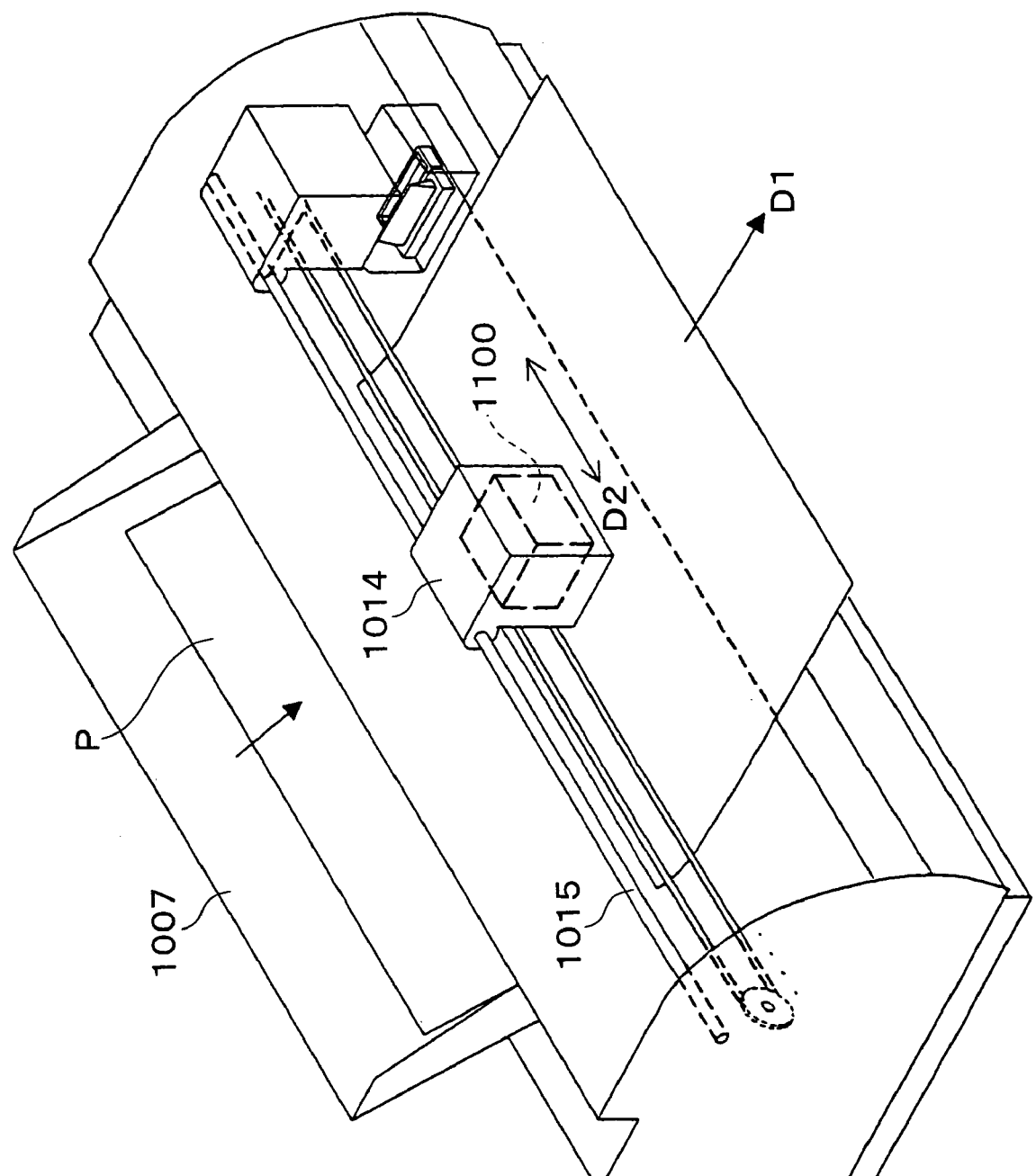
FIG. 66 is a perspective view showing an ink-jet printer (image forming apparatus) which uses the capacitive load drive circuit in accordance with another embodiment of the present invention.

The printing section 1005 prints on the sheet P which is supplied from the pair of rollers 1011 of the conveying section 1004. The printing section 1005 is composed of the record head 1100 (print head), a carriage 1014 on which the record head 1100 is mounted, a guide shaft 1015 which guides the carriage 1014 (see FIG. 66), and the platen 1013 which is a base plate for the sheet P upon printing.

The delivering-out section 1006 delivers the printed sheet P to the outside of the ink-jet printer 1001, and is composed of an ink drying section (not shown), a delivering-out roller 1016, and a delivering-out tray 1017.

With this arrangement, the ink-jet printer 1001 performs printing in such a manner as described below.

First, based on image information, a computer, etc. (not shown) sends request for printing to the ink-jet printer 1001. The ink-jet printer 1001 which receives the request for printing carries the sheet P on the paper feeding tray 1007 out of the paper feeding section 1002 using the pick-up roller.

Next, the carried-out sheet P is passed through the separating section 1003 and sent to the conveying section 1004 by the paper feeding roller 1008. At the conveying section 1004, the pair of rollers 1011 sends the sheet P into a space between the record head 1012 and the platen 1013.

Then, at the printing section 1005, the jetting-out nozzle of the record head 1012 sprays ink onto the sheet P on the platen 1013 in accordance with image information. Here, the sheet P is temporally stopped on the platen 1013. While spraying ink, the carriage 1014 sweeps for one line in a main scanning direction D2, guided by the guide shaft 1015. Then, the sheet P is moved for a certain width on the platen 1013 in a sub scanning direction D1. The printing section 1005 keeps carrying out this operation in accordance with image information. With this, the entire sheet P is subject to printing.

The printed sheet P passes through the ink drying section, and is delivered to the delivering-out tray 1017 by the delivering-out roller 1016. Then, the sheet P is supplied to a user as a printed product.

Next, the control system of the ink-jet printer 1001 of the present embodiment will be explained.

Figure 67:
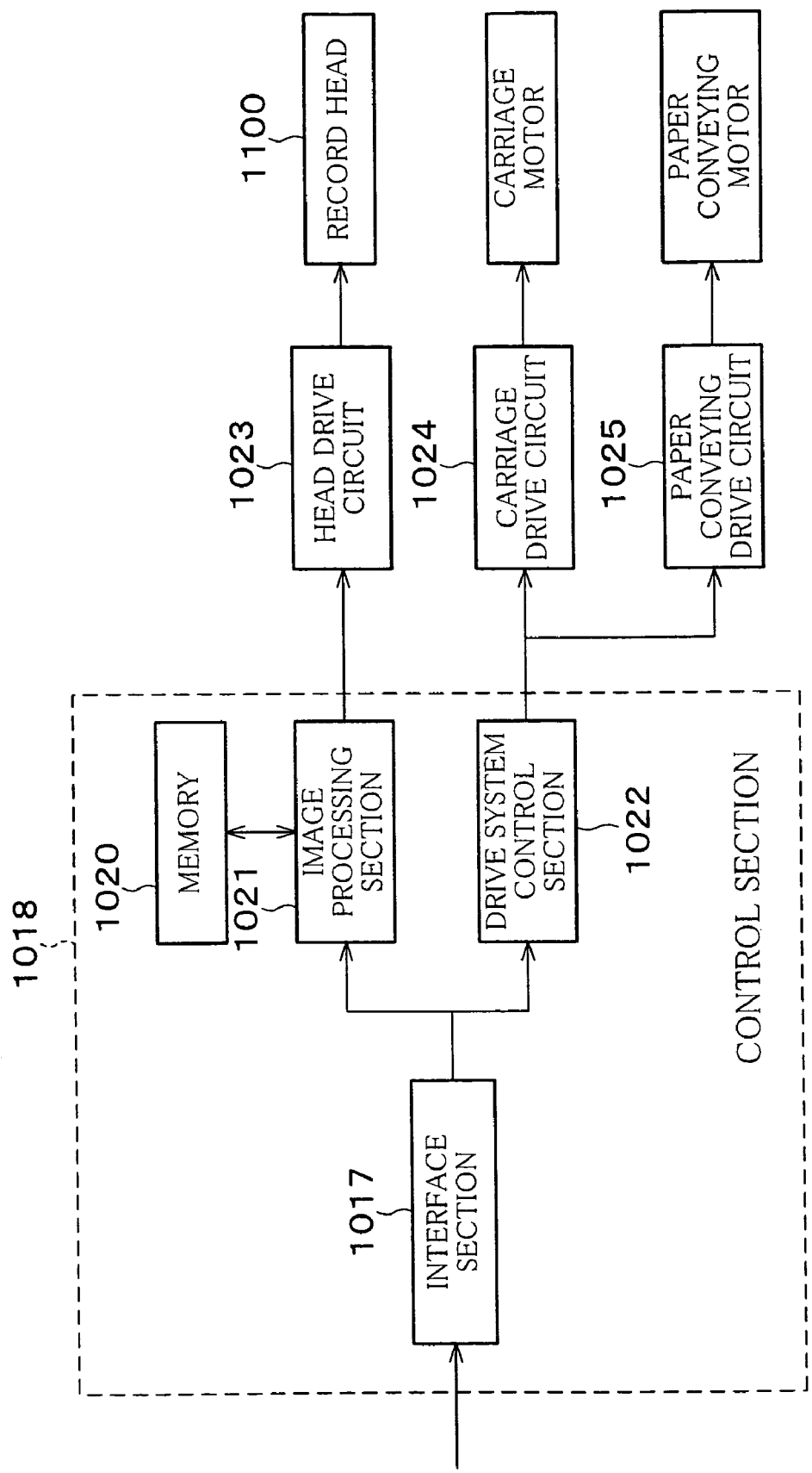
FIG. 67 is a block diagram showing a control system of the ink-jet printer (image forming apparatus) of FIG. 65.

As shown in FIG. 67, a control section 1018 of the ink-jet printer 1001 is provided with an interface section 1019, a memory 1020, an image processing section 1021, and a drive system control section 1022.

The interface section 1019 is a circuit for exchanging signals between (A) an external apparatus and (B) the image processing section 1021 and the drive system control section 1022.

The image processing section 1021 performs image processing in accordance with image information sent from the interface section 1019. Further, the image processing section 1021 is connected to a head drive circuit 1023 which controls the driving of the record head 1100.

The drive system control section 1022 controls the driving of the carriage 1014 and the conveying of the sheet P. More specifically, the drive system control section 1022 is connected to a carriage drive circuit 1024 which controls the driving of a carriage motor, and a paper conveying drive circuit 1025 which controls the driving of a paper conveying motor.

With this arrangement, the ink-jet printer drives the record head 1100, the carriage 1014, the paper conveying motor, and the like, so as to perform the printing operation.

Next, the ink jetting-out operation of the record head 1100, in which the present embodiment is characterized, will be explained.

The record head 1100 is used for an ink-jet printer of the shearing mode which is provided with the piezoelectric material 200, the top plate 300, the plurality of ink chambers 400, and the drive electrodes 500.

In jetting-out operation for printing, the plurality of ink chambers 400 are three-phase driven in such a manner that three adjacent ink chambers are separated into A channel, B channel, and C channel. The record head 1100 is so arranged that the drive electrodes 500 (capacitive load) in the ink chambers of the A channel, B channel, and C channel are driven by the capacitive load drive circuits of Embodiment 5, 5A, 6, and 6A. This is the three-phase driving which is explained in detail with reference to FIGS. 63 and 64, thus explanation thereof is omitted here.

As described above, a capacitive load drive circuit of the present invention is arranged so as to include a plurality of energy accumulating elements for dividedly accumulating electrostatic energy supplied from a power source; and switching means for selectively connecting the capacitive load and the plurality of energy accumulating elements, (A) when charging the capacitive load, the switching means selectively connecting the capacitive load and the plurality of energy accumulating elements so that the plurality of energy accumulating elements sequentially supply electrostatic energy to the capacitive load, and (B) when discharging the capacitive load, the switching means selectively connecting the capacitive load and the plurality of energy accumulating elements so that the plurality of energy accumulating elements sequentially collect electrostatic energy from the capacitive load.

With this arrangement, the plurality of energy accumulating elements sequentially supply electrostatic energy to the capacitive load when charging, whereas the plurality of energy accumulating elements sequentially collect electrostatic energy from the capacitive load when discharging. Accordingly, the system only consumes energy for an amount of uncollected electrostatic energy, thereby collecting and reusing energy highly efficiently. Further, the above capacitive load drive circuit is so arranged that the electrostatic energy accumulated in the energy accumulating elements is directly collected, thereby only requiring a simple circuit configuration. Therefore, the foregoing arrangement has a simple circuit configuration and is capable of efficiently collecting and reusing energy accumulated in the capacitive load so as to reduce electrical power consumption.

As described above, a capacitive load drive circuit of the present invention is arranged so as to include a plurality of energy accumulating elements to which a plurality of different initial potentials are respectively applied; a reference potential terminal to which either a reference power supply potential from a power source or a ground potential is applied as a reference potential; and switching means for selectively connecting (A) the energy accumulating elements and the reference potential terminal with (B) the capacitive load, one of the plurality of energy accumulating elements being a first energy accumulating element having a first initial potential which is not 0, one of the plurality of energy accumulating elements being a second energy accumulating element having a second initial potential whose polarity is the same as a polarity of the first initial potential and whose absolute value is larger than an absolute value of the first initial potential, the reference potential being either (a) the ground potential, (a) a potential which has the same polarity as the first initial potential supplied from a reference power source and which has a smaller absolute value than the first initial potential, or (c) a potential whose polarity is reverse to the polarity of the first initial potential supplied form the power source, the switching means carrying out (i) a first charging step of selectively connecting the capacitive load with the reference potential terminal and then selectively connecting the capacitive load with the first energy accumulating element so as to change, toward the first initial potential, a terminal voltage of the capacitive load, (ii) a second charging step of selectively connecting the capacitive load with the second energy accumulating element so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

As described above, a capacitive load drive circuit of the present invention for charging and discharging a capacitive load is arranged so as to include a power supply terminal to which a power supply potential from a power source is applied; a plurality of energy accumulating elements to which a plurality of different initial potentials are respectively applied; and switching means for selectively connecting (A) the energy accumulating elements and the power supply terminal with (B) the capacitive load, one of the plurality of energy accumulating elements being a first energy accumulating element having a first initial potential whose polarity is the same as a polarity of the power supply potential and whose absolute value is smaller than an absolute value of the power supply potential, one of the plurality of energy accumulating elements being a third energy accumulating element having either (a) a potential whose polarity is the same as the polarity of the first initial potential and whose absolute value is smaller than the absolute value of the first initial potential, (a) a ground potential, or (c) a third initial potential whose polarity is reverse to the polarity of the first initial potential, the switching means carrying out (i) a first charging step of selectively connecting the capacitive load with the third energy accumulating element and then selectively connecting the capacitive load with the first energy accumulating element so as to change, toward the first initial potential, a terminal voltage of the capacitive load, (ii) a second charging step of selectively connecting the capacitive load with the power supply terminal so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

As described above, a capacitive load drive circuit of the present invention for charging and discharging a capacitive load is arranged so as to include a plurality of energy accumulating elements to which a plurality of different initial potentials are respectively applied; and switching means for selectively connecting the plurality of energy accumulating elements with the capacitive load, one of the plurality of energy accumulating elements being a first energy accumulating element having a first initial potential which is not 0, one of the plurality of energy accumulating elements being a second energy accumulating element whose absolute value is larger than an absolute value of the first initial potential, one of the plurality of energy accumulating elements being a third energy accumulating element having either a potential whose polarity is the same as a polarity of the first initial potential and whose absolute value is smaller than the absolute value of the first initial potential, a ground potential, or a third initial potential whose polarity is reverse to the polarity of the first initial potential, the switching means carrying out (i) a first charging step of selectively connecting the capacitive load with the third energy accumulating element and then selectively connecting the capacitive load with the first energy accumulating element so as to change, toward the first initial potential, a terminal voltage of the capacitive load, (ii) a second charging step of selectively connecting the capacitive load with the second energy accumulating element so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

As described above, a capacitive load drive circuit of the present invention for charging and discharging a capacitive load is arranged so as to include a power supply terminal to which a power supply potential from a power source is applied; a reference potential terminal to which either a reference power supply potential that is different from the power supply potential supplied from the power source or a ground potential is applied as a reference potential; a plurality of first energy accumulating elements to which initial potentials are respectively applied, the initial potentials being different from one another and being between the reference potential and the power supply potential; and switching means for selectively connecting (A) the reference potential terminal, the plurality of energy accumulating elements, and the power supply terminal with (B) the capacitive load, the switching means carrying out the steps of (1) connecting the capacitive load with the reference potential terminal and then sequentially connecting the capacitive load with the first energy accumulating elements in an order of the initial potentials from the initial potential closest to the reference potential, so as to change, toward the power supply potential, a terminal voltage of the capacitive load, (2) selectively connecting the capacitive load with the power supply terminal so as to increase an absolute value of the terminal voltage of the capacitive load, and (3) selectively connecting the capacitive load with the first energy accumulating elements in an order of the initial potentials from the initial potential closest to the power supply potential, so as to decrease the absolute value of the terminal voltage of the capacitive load and so as to regenerate electrostatic energy to be accumulated in the first energy accumulating elements, the thus regenerated electrostatic energy being approximately equal to electrostatic energy as accumulated in the first energy accumulating elements before the step (1), the steps (1) through (3) being carried out in this order.

With these arrangements, when decreasing the absolute value of the terminal voltage of the capacitive load so as to discharge the capacitive load, it is possible to regenerate electrostatic energy accumulated in the first energy accumulating elements to be approximately equal to electrostatic energy as accumulated in the first energy accumulating elements before supplying energy to the capacitive load. Therefore, the first energy accumulating elements do not apparently consume energy, thereby regenerating electrical power highly efficiently.

Further, it is preferable that each of the energy accumulating elements is a condenser.

With this arrangement, by using the condenser which has a smaller internal resistance than a secondary battery, etc., it is possible to collect and reuse electrostatic energy highly efficiently. Further, by using the condenser which is not much degraded even after repeating charging and discharging many times and thus has a long life, it is possible to achieve a long-period use. Further, by using the condenser which has excellent frequency characteristics, it is possible to collect electrostatic energy efficiently when driving a pulse of about 10 μm.

Further, the capacitive load drive circuit of the present invention may be arranged so as to further include an energy output path which is connected to a part of the energy accumulating elements, the energy output path supplying to an external element other than the capacitive load the electrostatic energy that the energy accumulating element collects from the capacitive load.

With this arrangement, electrostatic energy collected to the energy accumulating elements can be used by an external element other than the capacitive load from which the electrostatic energy is collected, thereby efficiently reusing the electrostatic energy collected to the energy accumulating elements.

It is preferable that the plurality of energy accumulating elements respectively have terminal voltages which are different from one another; and (A) when charging the capacitive load, the switching means sequentially connects the capacitive load with the energy accumulating elements in an ascending order of absolute values of the terminal voltages and (B) when discharging the capacitive load, the switching means sequentially connects the capacitive load with the energy accumulating elements in a descending order of the absolute values of the terminal voltages.

With this arrangement, the energy accumulating elements are selectively connected sequentially in order of size of their terminal voltages. Because of this, an inrush current supplied to the energy accumulating elements and to the capacitive load is kept low, thereby reducing energy loss. As a result, it is possible to further reduce electrical power consumption.

The capacitive load drive circuit of the present invention may be so arranged that when discharging the capacitive load, the switching means grounds the capacitive load, after connecting the capacitive load with the energy accumulating element that has the terminal voltage of a smallest absolute value.

With this arrangement, the electric charge accumulated in the energy accumulating elements is reduced to 0 before the energy accumulating elements are charged, thereby achieving the stable repeating operation of the energy accumulating elements.

The capacitive load drive circuit of the present invention may be so arranged that when discharging the capacitive load, the switching means keeps connecting the capacitive load with the energy accumulating element that has the terminal voltage of a smallest absolute value until the capacitive load starts charging, after connecting the capacitive load with the energy accumulating element that has the terminal voltage of the smallest absolute value.

With this arrangement, the energy accumulated in the capacitive load can be retained and is not discarded, thereby collecting and reusing almost all of the electrostatic energy accumulated in the capacitive load.

Further, the capacitive load drive circuit of the present invention may be arranged so as to further include voltage dividing means for dividing into a plurality of different voltages, the voltage supplied from the power source and for supplying the divided voltages respectively to the energy accumulating elements.

With this arrangement, the voltage dividing means can compulsorily adjust the terminal voltages of the energy accumulating elements to predetermined voltages, even when the amount of electric charge in the energy accumulating elements is not restored to an initial value (value before supplying electrostatic energy) after collecting electrostatic energy from the capacitive load, due to the loss and energy emission at the capacitive load, etc. As a result, it is possible to supply a highly stable voltage to the capacitive load, thereby achieving stable repeating operation.

Further, with this arrangement, the plurality of energy accumulating elements can sequentially supply different voltages to the capacitive load so as to sequentially increase the drive voltage of the capacitive load when charging the capacitive load, whereas the plurality of energy accumulating elements sequentially supply different voltages to the capacitive load so as to sequentially decrease the drive voltage of the capacitive load. Therefore, it is possible to obtain a variety of waveforms for the drive voltage by adjusting switching timings of the switching means.

It is more preferable that the voltage dividing means equally divides the voltage supplied from the power source into n (n is not less than 2). With this, it is possible to further reduce an inrush current supplied to the energy accumulating elements and to the capacitive load, thereby reducing energy loss.

The capacitive load drive circuit of the present invention may be so arranged that the voltage dividing means includes a plurality of resistors which are connected in series with respect to the power source. With this arrangement, it is possible to realize the voltage dividing means in a simple configuration.

The capacitive load drive circuit that employs the voltage dividing means including the plurality of resistors is preferably arranged so as to further include buffer amplification means, which is provided between (A) the resistors and (B) the energy accumulating elements, for amplifying a current flowing through the resistors and for outputting a voltage that differs from an input voltage so as to adjust to predetermined voltages, the terminal voltages of the energy accumulating elements.

With this arrangement, the buffer amplification means can accurately adjust the terminal voltages of the energy accumulating elements to predetermined voltages, when the voltage divided by the resistors does not become exactly equal to the predetermined voltage, namely, for example, when the amount of electric charge in the energy accumulating elements is not restored to an initial value (value before supplying electrostatic energy) after collecting electrostatic energy from the capacitive load, due to the loss and energy emission at the capacitive load, etc. Further, with this arrangement, it is possible to reduce a current flowing through the resistors, thereby reducing electrical power consumed by the resistors.

The capacitive load drive circuit of the present invention may be so arranged that the voltage dividing means includes a constant voltage element such as a zener diode.

With this arrangement, the constant voltage element can accurately adjust the terminal voltages of the energy accumulating elements to predetermined voltages, even when the amount of electric charge in the energy accumulating elements is not restored to an initial value (value before supplying electrostatic energy) after collecting electrostatic energy from the capacitive load, due to the loss and energy emission at the capacitive load, etc. As a result, it is possible to supply a highly stable voltage to the capacitive load, thereby achieving stable repeating operation.

It is preferable that the voltage dividing means employing the constant voltage element further includes a plurality of constant voltage elements connected in series between the power source and a ground line; and a resistor is inserted between (A) the constant voltage elements and (B) the power source or the ground line.

With this arrangement, even when the sum of set voltages of the constant voltage elements is not equal to the power supply voltage, the resistor can absorb the difference in the voltages, thereby achieving stable repeating operation at a certain voltage.

The capacitive load drive circuit of the present invention may be so arranged that the voltage dividing means employing the constant voltage element includes a first voltage divider and a second voltage divider connected in parallel between the power source and a ground line; each of the first voltage divider and the second voltage divider includes the constant voltage means; a pull-up resistor is inserted between the constant voltage means and the power source in the first voltage divider; and a pull-down resistor is inserted between the constant voltage means and the ground line in the second voltage divider.

With this arrangement, even when the sum of set voltages of the constant voltage elements is not equal to the power supply voltage, the pull-up resistor and the pull-down resistor can absorb the difference in the voltages, thereby achieving stable repeating operation at a certain voltage.

It is preferable that a difference between the number of constant voltage elements included in the first voltage divider and the number of constant voltage elements included in the second voltage divider is not more than one.

With this arrangement, it is possible to further improve the stability of the terminal voltages of the energy accumulating elements, thereby achieving stable repeating operation.

The capacitive load drive circuit of the present invention that employs the voltage dividing means including the constant voltage element is preferably arranged so that a current-limit resistor which is inserted between the constant voltage means and the energy accumulating elements.

With this arrangement, the current-limit resistor can absorb a current suddenly flowing in and out of the capacitive load, and can limit a current flowing into the constant voltage elements, thereby reducing the workload of the constant voltage elements.

Further, it is preferable that all of the energy accumulating elements respectively have one ends connected to the power source or the ground line.

With this arrangement, the energy accumulating elements can be respectively separated so as not to interfere with one another. Thus, when a current from the capacitive load flows in and out of a particular energy accumulating element, the voltage change of the particular energy accumulating element does not affect the other energy accumulating elements. Therefore, it is possible to further improve the stability of the terminal voltages of the energy accumulating elements, thereby achieving stable repeating operation.

Further, the capacitive load drive circuit of the present invention is preferably arranged so that a switching section for controlling the supply of electrostatic energy from the power source to the energy accumulating elements, the switching section supplying electrostatic energy from the power source to the energy accumulating elements only during a predetermined period before the capacitive load is charged.

With this arrangement, the power source supplies electrostatic energy to the energy accumulating elements only for a predetermine period. Thus, compared with a case where the power source always supplies electrostatic energy to the energy accumulating elements, it is possible to reduce electrical power consumed by the capacitive load drive circuit, and can particularly reduce electrical power consumed by the resistors in the arrangement that employs the voltage dividing means including the plurality of resistors connected in series with respect to the power source.

Further, the capacitive load drive circuit of the present invention may be arranged so as to further include selecting means which switches over internal connecting states so as to selectively charge or discharge one or some of capacitive loads.

With this arrangement, the selecting means selectively charge or discharge one or some of the capacitive loads, thereby driving a plurality of capacitive loads at different timings.

Further, the capacitive load drive circuit that further employs the selecting means is preferably arranged so that (A) an energy supplying path for supplying to the capacitive load the electrostatic energy that is divided into the plurality of energy accumulating elements and (B) an energy collecting path for collecting the electrostatic energy from the plurality of energy accumulating elements are separately provided; and each of the energy supplying path and the energy collecting path includes the selecting means.

With this arrangement, by separately providing the energy supplying path (charge path) and the energy collecting path, it is possible to simultaneously charge a part of the capacitive loads and discharge the other part of the capacitive loads. With this, it is possible to increase the number of operating the capacitive loads per unit time when driving many capacitive loads at different timings. Therefore, it is possible to operate the capacitive loads at a high speed.

Further, the capacitive load drive circuit in which the energy supplying path and the energy collecting path are separately provided is preferably arranged so as to further include rectifying means for rectifying currents of the energy supplying path and the energy collecting path.

With this arrangement, a short-circuit current does not flow in a case of delay in the ON/OFF operation of the switching means and the like, thereby preventing the breakage of the circuit.

The capacitive load drive circuit can be applied to a piezoid for pressuring ink, the piezoid being provided in an ink-jet head that jets out ink in droplets.

With this arrangement, it is possible to collect and reuse energy highly efficiently when driving the piezoid of the ink-jet head which generally consumes large electrical power, have a high dielectric constant and a large capacitance, and is generally driven at a high repeating frequency. This especially achieves the effect of reducing electrical power consumption.

As described above, an ink-jet printer (image forming apparatus) of the present invention which includes an ink-jet head that uses a piezoid to pressurize ink so as to jet out the ink in droplets, and a drive circuit for driving the piezoid of the ink-jet head is so arranged that the drive circuit is one of the capacitive load drive circuits as arranged above.

With this arrangement, the plurality of energy accumulating elements sequentially supply electrostatic energy to the piezoid, and the plurality of energy accumulating elements sequentially collect electrostatic energy from the piezoid, thereby collecting and reusing energy highly efficiently. Therefore, it is possible to provide an ink-jet printer (image forming apparatus) that has a lower electrical power consumption.

As described above, a method for driving a capacitive load of the present invention is arranged so as to include an accumulating step of dividedly accumulating electrostatic energy in a plurality of energy accumulating elements; a charging step of sequentially supplying the electrostatic energy from the plurality of energy accumulating elements to the capacitive load so as to charge the capacitive load; and a collecting step of discharging the capacitive load so that the plurality of energy accumulating elements sequentially collect the electrostatic energy from the capacitive load.

With this method, the plurality of energy accumulating elements sequentially supply electrostatic energy to the piezoid, and the plurality of energy accumulating elements sequentially collect electrostatic energy from the piezoid, thereby collecting and reusing energy highly efficiently.

As described above, a method for driving a capacitive load of the present invention by charging and discharging the capacitive load is arranged so as to include (i) a step of preparing a first energy accumulating element having an first initial potential which is not 0, a second energy accumulating element, and a reference potential terminal to which either (a) a ground potential, (a) a potential which has the same polarity as the first initial potential supplied from a power source and which has a smaller absolute value than the first initial potential, or (c) a potential whose polarity is reverse to the polarity of the first initial potential supplied form the power source is applied as a reference potential; (ii) an initial potential applying step of applying the first initial potential to the first energy accumulating element, and applying to the second energy accumulating element a second initial potential which has the same polarity as the first initial potential and which has a larger absolute value than the first initial potential; (iii) a first charging step of selectively connecting the capacitive load with the reference potential terminal and then selectively connecting the capacitive load with the first energy accumulating element so as to change, toward the first initial potential, a terminal voltage of the capacitive load; (iv) a second charging step of selectively connecting the capacitive load with the second energy accumulating element so as to increase an absolute value of the terminal voltage of the capacitive load; and (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the first charging step, the steps (iii) through (v) being carried out in this order.

As described above, a method for driving a capacitive load of the present invention by charging and discharging the capacitive load is arranged so as to include (i) a step of preparing a power supply terminal to which a power supply potential is applied from a power source, a first energy accumulating element, and a third energy accumulating element; (ii) an initial potential applying step of applying to the first energy accumulating element a first initial potential which has the same polarity as the power supply potential and which has a smaller absolute value than the power supply potential, and applying to the third accumulating element either a potential which has the same polarity as the first initial potential and which has a smaller absolute value than the first initial potential, a ground potential, or a third initial potential whose potential is reverse to the polarity of the first initial potential; (iii) a first charging step of selectively connecting the capacitive load with the third energy accumulating element and then selectively connecting the capacitive load with the first energy accumulating element so as to change, toward the first initial potential, a terminal voltage of the capacitive load; (iv) a second charging step of selectively connecting the capacitive load with the power supply terminal so as to increase an absolute value of the terminal voltage of the capacitive load; and (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the first charging step, the steps (iii) through (v) being carried out in this order.

As described above, a method for driving a capacitive load of the present invention by charging and discharging the capacitive load is arranged so as to include (i) a step of preparing a first energy accumulating element, a second energy accumulating element, and a third energy accumulating element; (ii) an initial potential applying step of applying to the first energy accumulating element a first initial potential which is not 0, applying to the second energy accumulating element a second initial potential which has a larger absolute value than the initial potential of the first energy accumulating element, and applying to the third accumulating element either a potential which has the same polarity as the first initial potential and which has a smaller absolute value than the first initial potential, a ground potential, or a third initial potential whose potential is reverse to the polarity of the first initial potential; (iii) a first charging step of selectively connecting the capacitive load with the third energy accumulating element and then selectively connecting the capacitive load with the first energy accumulating element so as to change, toward the first initial potential, a terminal voltage of the capacitive load; (iv) a second charging step of selectively connecting the capacitive load with the second energy accumulating element so as to increase an absolute value of the terminal voltage of the capacitive load; and (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the first charging step, the steps (iii) through (v) being carried out in this order.

As described above, a method for driving a capacitive load of the present invention by charging and discharging the capacitive load is arranged so as to include a providing step of preparing a power supply terminal to which a power supply potential is applied from a power source, a reference potential terminal to which either a reference power supply potential supplied from the power source which is different from the power supply potential or a ground potential is applied as a reference potential, and a plurality of first energy accumulating elements; an initial potential applying step of respectively applying to the plurality of first energy accumulating elements initial potentials which are different from one another and which are between the reference potential and the power supply potential; and steps of (1) connecting the capacitive load with the reference potential terminal and then sequentially connecting the capacitive load with the first energy accumulating elements in an order of the initial potentials from the initial potential closest to the reference potential, so as to change, toward the power supply potential, a terminal voltage of the capacitive load, (2) selectively connecting the capacitive load with the power supply terminal so as to increase an absolute value of the terminal voltage of the capacitive load, and (3) selectively connecting the capacitive load with the first energy accumulating elements in an order of the initial potentials from the initial potential closest to the power supply potential, so as to decrease the absolute value of the terminal voltage of the capacitive load and so as to regenerate electrostatic energy to be accumulated in the first energy accumulating elements, the thus regenerated electrostatic energy being approximately equal to electrostatic energy as accumulated in the first energy accumulating elements before the step (1), the steps (1) through (3) being carried out in this order.

With these methods, (A) the flow of energy from the energy accumulating elements to the capacitive load when charging and (B) the flow of energy from the capacitive load to the energy accumulating elements when discharging are canceled out, thereby reducing the energy loss. As a result, it is possible to reduce electrical power consumption.

As described above, an apparatus of the present invention is so arranged that the capacitive load drive circuit includes a power supply terminal to which a power supply potential is applied from a power source; a reference potential terminal to which either a reference power supply potential supplied from the power source which is different from the power supply potential, or a ground potential is applied as a reference potential; an energy accumulating element to which an initial potential between the reference potential and the power supply potential is applied; and switching means for selectively connecting (A) the reference potential terminal, the energy accumulating element, and the power supply terminal with (B) the capacitive load, the switching means carrying out (i) a first charging step of connecting the capacitive load with the reference potential terminal and then connecting the capacitive load with the energy accumulating element, (ii) a second charging step of selectively connecting the capacitive load with the power supply terminal, and (iii) a discharging step of connecting the capacitive load with the energy accumulating element, the steps (i) through (iii) being carried out in this order, the following relationship being satisfied:

$$Cd/Cs \text{\%} 0.164 \{Ts/(R \cdot Cd)\}^{0.2198}, \text{ if } Ts/(R \cdot Cd) < 2.5;$$

and $$Cd/Cs \text{\%} 0.2, \text{ if } Ts/(R \cdot Cd) \wedge 2.5,$$

where Cs is a capacitive component of the energy accumulating element, Cd is a capacitance of the capacitive load, Ts is a time during which the energy accumulating element is kept connected to the capacitive load, and R is a resistance value of charge and discharge paths of the energy accumulating element with respect to the capacitive load, the charge and discharge paths including switching means.

Further, as described above, an apparatus of the present invention is arranged so that the capacitive load drive circuit includes a power supply terminal to which a power supply potential is applied from a power source; a reference potential terminal to which either a reference power supply potential supplied from the power source which is different from the power supply potential, or a ground potential is applied as a reference potential; a plurality of energy accumulating elements to which initial potentials are respectively applied, the initial potentials being different from one another and being between the reference potential and the power supply potential; and switching means for selectively connecting (A) the reference potential terminal, the plurality of energy accumulating elements, and the power supply terminal with (B) the capacitive load, the switching means carrying out (i) a first charging step of connecting the capacitive load with the reference potential terminal and then sequentially connecting the capacitive load with the energy accumulating elements in an order of the initial potentials from the initial potential closest to the reference potential, (ii) a second charging step of selectively connecting the capacitive load with the power supply terminal, and (iii) a discharging step of sequentially connecting the capacitive load with the energy accumulating elements in an order of the initial potentials from the initial potential closest to the power supply potential, the steps (i) through (iii) being carried out in this order, the following relationship being satisfied:

$$Cd/Cs \text{\%} 0.164 \{Ts/(R \cdot Cd)\}^{0.2198}, \text{ if } Ts/(R \cdot Cd) < 2.5;$$

and $$Cd/Cs \text{\%} 0.2, \text{ if } Ts/(R \cdot Cd) \wedge 2.5,$$

where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including switching means.

With these arrangements, when decreasing the absolute value of the terminal voltage of the capacitive load so as to discharge the capacitive load, it is possible to regenerate electrostatic energy accumulated in the first energy accumulating elements to be approximately equal to electrostatic energy as accumulated in the first energy accumulating elements before supplying energy to the capacitive load. Therefore, the first energy accumulating elements do not apparently consume energy, thereby regenerating electrical power highly efficiently.

Further, with these arrangements, the voltage of the capacitive load reaches 90% of the final attainment voltage (final voltage attained by the capacitive load after repeating the first through third steps infinitely) during the first through third steps. With this, change in the voltages of the energy accumulating elements due to the flowing of electric charge from the energy accumulating elements to the capacitive load is reduced, and the electrical power regeneration ratio in generating pulses is improved, thereby further reducing the electrical power consumption. Further, change in the voltages of the energy accumulating elements due to the generation of a pulse is reduced. This allows to generate a next pulse without correcting the voltage change.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

As describe above, the present invention can provide a capacitive load drive circuit for driving a capacitive load which can reduce electrical power consumption, a capacitive load driving method, and an apparatus using the same.

Therefore, the present invention can be preferably used for (A) a capacitive load drive circuit for driving a capacitive load, which is provided in an image forming apparatus that uses a piezoid and an electrostatic drive electrode to jet out ink, the piezoid and the electrostatic drive electrode being capacitive loads, a discharge electrode of a plasma display, a drive circuit of a liquid crystal display, or the like, (B) a capacitive load driving method, and (C) an apparatus using the same, such as an image forming apparatus, a display apparatus, a voltage pulse generating apparatus, and a DC-AC converter.

The invention claimed is:

1. A capacitive load driving apparatus for charging and discharging a capacitive load, comprising:
   a plurality of energy accumulating elements for substantially dividing and accumulating electrostatic energy supplied from a power source; and
   switching means for selectively connecting the capacitive load and the plurality of energy accumulating elements,
   (A) when charging the capacitive load, the switching means selectively connecting the capacitive load and the plurality of energy accumulating elements such that the plurality of energy accumulating elements sequentially supply electrostatic energy to the capacitive load, and (B) when discharging the capacitive load, the switching means selectively connecting the capacitive load and the plurality of energy accumulating elements such that the plurality of energy accumulating elements sequentially collect electrostatic energy from the capacitive load, wherein:

the plurality of energy accumulating elements respectively have terminal voltages which are different from one another; and when charging the capacitive load, the switching means sequentially connects the capacitive load with the energy accumulating elements in an ascending order of absolute values of the terminal voltages and when discharging the capacitive load, the switching means sequentially connects the capacitive load with the energy accumulating elements in a descending order of the absolute values of the terminal voltages.

2. The capacitive load driving apparatus as set forth in claim 1, wherein:

each of the energy accumulating elements has an initial potential whose polarity is positive.

3. The capacitive load driving apparatus as set forth in claim 1, wherein:

each of the energy accumulating elements has an initial potential whose polarity is negative.

4. The capacitive load driving apparatus as set forth in claim 1, wherein:

each of the energy accumulating elements is a condenser.

5. The capacitive load driving apparatus as set forth in claim 4, wherein:

when discharging the capacitive load, the switching means keeps connecting the capacitive load with the energy accumulating element that has the terminal voltage of a smallest absolute value until the capacitive load starts charging, after connecting the capacitive load with the energy accumulating element that has the terminal voltage of the smallest absolute value.

6. The capacitive load driving apparatus as set forth in claim 1, further comprising:

an energy output path which is connected to a part of the energy accumulating elements, the energy output path supplying to an external element other than the capacitive load the electrostatic energy that the energy accumulating element collects from the capacitive load.

7. The capacitive load driving apparatus as set forth in claim 6, wherein:

when discharging the capacitive load, the switching means grounds the capacitive load, after connecting the capacitive load with the energy accumulating element that has the terminal voltage of a smallest absolute value.

8. The capacitive load driving apparatus as set forth in claim 1, further comprising:

voltage dividing means for dividing into a plurality of different voltages, the voltage supplied from the power source and for supplying the divided voltages respectively to the energy accumulating elements.

9. The capacitive load driving apparatus as set forth in claim 8, further comprising:

a switching section for controlling the supply of the voltages from the voltage dividing means to the energy accumulating elements, the switching section being switched ON only during a predetermined period before the capacitive load is charged.

10. The capacitive load driving apparatus as set forth in claim 8, further comprising:

a ground terminal;
a DC power source for supplying a power supply voltage; and
voltage dividing means, which is connected between the ground terminal and the DC power source, for dividing a potential difference between a ground potential and the power supply voltage, the plurality of energy accumulating elements being respectively connected to voltage dividing points to which the voltages that are divided by the voltage dividing means are respectively supplied.

11. The capacitive load driving apparatus as set forth in claim 8, further comprising:

a plurality of DC power sources respectively having different power supply voltages; and
voltage dividing means, which is connected between the DC power sources, for dividing a potential difference among the power supply voltages, the plurality of energy accumulating elements being respectively connected to voltage dividing points to which the voltages that are divided by the voltage dividing means are respectively supplied.

12. The capacitive load driving apparatus as set forth in claim 8, wherein:

the voltage dividing means includes a plurality of resistors which are connected in series with respect to the power source.

13. The capacitive load driving apparatus as set forth in claim 8, further comprising:

buffer amplification means, which is provided between (A) the resistors and (B) the energy accumulating elements, for amplifying a current flowing through the resistors and for outputting a voltage that differs from an input voltage so as to adjust to predetermined voltages, the terminal voltages of the energy accumulating elements.

14. The capacitive load driving apparatus as set forth in claim 8, wherein:

the voltage dividing means includes constant voltage means for stabilizing the divided voltages.

15. The capacitive load driving apparatus as set forth in claim 14, wherein:

the voltage dividing means further includes a plurality of constant voltage elements connected in series between the power source and a ground line; and
a resistor is inserted between (A) the constant voltage elements and (B) the power source or the ground line.

16. The capacitive load driving apparatus as set forth in claim 15, further comprising:

a current-limit resistor which is inserted between the constant voltage means and the energy accumulating elements.

17. The capacitive load driving apparatus as set forth in claim 15, wherein:

the constant voltage means includes a constant voltage element,
the constant voltage element is a zener diode.

18. The capacitive load driving apparatus as set forth in claim 14, wherein:

the voltage dividing means includes a first voltage divider and a second voltage divider connected in parallel between the power source and a ground line;
each of the first voltage divider and the second voltage divider includes the constant voltage means;
a pull-up resistor is inserted between the constant voltage means and the power source in the first voltage divider; and
a pull-down resistor is inserted between the constant voltage means and the ground line in the second voltage divider.

19. The capacitive load driving apparatus as set forth in claim 18, wherein:

the constant voltage means includes a constant voltage element, the constant voltage element is a zener diode.

20. The capacitive load driving apparatus as set forth in claim 18, wherein:
a difference between the number of constant voltage elements included in the first voltage divider and the number of constant voltage elements included in the second voltage divider is not more than one.

21. The capacitive load driving apparatus as set forth in claim 20, further comprising:
a current-limit resistor which is inserted between the constant voltage means and the energy accumulating elements.

22. The capacitive load driving apparatus as set forth in claim 20, wherein:
the constant voltage means includes a constant voltage element,
the constant voltage element is a zener diode.

23. The capacitive load driving apparatus as set forth in claim 18, further comprising:
a current-limit resistor which is inserted between the constant voltage means and the energy accumulating elements.

24. The capacitive load driving apparatus as set forth in claim 14, further comprising:
a current-limit resistor which is inserted between the constant voltage means and the energy accumulating elements.

25. The capacitive load driving apparatus as set forth in claim 24, wherein:
the constant voltage means includes a constant voltage element,
the constant voltage element is a zener diode.

26. The capacitive load driving apparatus as set forth in claim 14, wherein:
the constant voltage means includes a constant voltage element,
the constant voltage element is a zener diode.

27. The capacitive load driving apparatus as set forth in claim 1, wherein:
all of the energy accumulating elements respectively have one end connected to the power source or a ground line.

28. The capacitive load driving apparatus as set forth in claim 1, further comprising:
a switching section for controlling the supply of electrostatic energy from the power source to the energy accumulating elements,
the switching section supplying electrostatic energy from the power source to the energy accumulating elements only during a predetermined period before the capacitive load is charged.

29. The capacitive load driving apparatus as set forth in claim 1, further comprising:
selecting means which switches over internal connecting states so as to selectively charge or discharge one or some of capacitive loads.

30. The capacitive load driving apparatus as set forth in claim 29, wherein:
(A) an energy supplying path for supplying to the capacitive load the electrostatic energy that is divided into the plurality of energy accumulating elements and (B) an energy collecting path for collecting the electrostatic energy from the plurality of energy accumulating elements are separately provided; and
each of the energy supplying path and the energy collecting path includes the selecting means.

31. The capacitive load driving apparatus as set forth in claim 30, further comprising:
rectifying means for rectifying currents of the energy supplying path and the energy collecting path.

32. The capacitive load driving apparatus as set forth in claim 1, further comprising:
an ink-jet head that jets out ink in droplets and includes a piezoid for pressuring the ink, wherein the capacitive load is the piezoid pressuring the ink.

33. The capacitive load driving apparatus as set forth in claim 1, further comprising:
an ink-jet head of an electrostatic method that uses electrostatic attraction force to jet out ink in droplets, the ink-jet head including an electrostatic drive electrode, wherein the capacitive load is the load of the electrostatic drive electrode.

34. An apparatus which includes the capacitive load driving apparatus as set forth in claim 1, and the capacitive load that is charged and discharged by the capacitive load driving apparatus, wherein:
the following relationship is satisfied:

$$Cd/Cs \gtrsim 0.164\{Ts/(R \cdot Cd)\}^{0.2198}, \text{ if } Ts/(R \cdot Cd) < 2.5; \text{ and}$$

$$Cd/Cs \gtrsim 0.2, \text{ if } Ts/(R \cdot Cd) \wedge 2.5,$$

where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including the switching means.

35. An apparatus which includes the capacitive load driving apparatus as set forth in claim 1, and the capacitive load that is charged and discharged by the capacitive load driving apparatus, wherein:
the capacitive component of the energy accumulating elements is larger than the capacitance of the capacitive load, by 100 times or more.

36. An image forming apparatus which includes an ink-jet head that uses an electrostatic drive electrode or a piezoid as a capacitive load to pressurize ink so as to jet out the ink in droplets, and a drive circuit for driving the electrostatic drive electrode or the piezoid of the ink-jet head, wherein:
the drive circuit is the capacitive load driving apparatus as set forth in claim 1.

37. The image forming apparatus as set forth in claim 36, wherein:
the ink-jet head uses the piezoid to pressurize ink so as to jet out the ink in droplets; and
the drive circuit drives the piezoid of the ink-jet head.

38. A display apparatus which includes a (display element, and a drive circuit for driving the display element, wherein:
the drive circuit generates a pulse to be applied to the display element and collects electrical power from the display element, by using the capacitive load driving apparatus as set forth in claim 1.

39. A DC-AC converter for generating an AC voltage from a single DC voltage, comprising:
a voltage generating circuit for generating a voltage from the DC power source; and the capacitive load driving apparatus as set forth in claim 1, wherein the driving apparatus generates the AC voltage from the generated voltage of the voltage generating circuit while collecting electrical power.

40. A capacitive load drive circuit for charging and discharging a capacitive load, comprising:
- a plurality of energy accumulating elements to which a plurality of different initial potentials are respectively applied;
- a reference potential terminal to which either a reference power supply potential from a power source or a ground potential is applied as a reference potential; and
- switching means for selectively connecting (A) the energy accumulating elements and the reference potential terminal with (B) the capacitive load,
- one of the plurality of energy accumulating elements being a first energy accumulating element having a first initial potential which is not 0, one of the plurality of energy accumulating elements being a second energy accumulating element having a second initial potential whose polarity is the same as a polarity of the first initial potential and whose absolute value is larger than an absolute value of the first initial potential,
- the reference potential being either (a) the ground potential, (b) a potential which has the same polarity as the first initial potential supplied from the power source and which has a smaller absolute value than the first initial potential, or (c) a potential whose polarity is reverse to the polarity of the first initial potential supplied form the power source,
- the switching means carrying out (i) a first charging step of selectively connecting the capacitive load with the reference potential terminal and then selectively connecting the capacitive load with the first energy accumulating element so as to change, toward the first initial potential, a terminal voltage of the capacitive load, (ii) a second charging step of selectively connecting the capacitive load with the second energy accumulating element so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

41. The capacitive load drive circuit as set forth in claim 40, wherein:
- the reference potential terminal is a ground terminal having the ground potential;
- the switching means is a plurality of switching elements, which are respectively provided between (A) the ground terminal and the plurality of energy accumulating elements and (B) the capacitive load, for selectively connecting (A) the ground terminal and the plurality of energy accumulating elements with (B) the capacitive load; and
- at least the accumulating element that has an initial potential whose absolute value is largest among the plurality of accumulating elements is directly or indirectly connected with the power source.

42. The capacitive load drive circuit as set forth in claim 40, further comprising:
- a DC power source which is connected to the first energy accumulating element via a resistance circuit, the DC power source supplying energy into the first energy accumulating element so as to prevent a voltage drift of the first energy accumulating element caused by the charging and discharging of the capacitive load.

43. The capacitive load drive circuit as set forth in claim 42, wherein:
- a drive pulse having a predetermined cycle is applied to the capacitive load; and
- a time constant determined by a resistance value of the resistance circuit and a capacitive component of the first energy accumulating element is larger than the cycle of the drive pulse applied to the capacitive load, by 50 times or more.

44. The capacitive load drive circuit as set forth in claim 42, wherein:
- a drive pulse having a predetermined cycle is applied to the capacitive load;
- the switching means carries out a charging step of selectively connecting the capacitive load to different points so as to supply electrostatic energy to the capacitive load, the charging step being repeated in a plurality of times within one cycle of the drive pulse; and
- the following relationship is satisfied:

$3 \times Tp \unlhd Rs \cdot Cs \unlhd 6 \times Tp$, where $N=2$;

$3 \times Tp \unlhd Rs \cdot Cs \unlhd 7 \times Tp$, where $N=3$;

$3 \times Tp \unlhd Rs \cdot Cs \unlhd 8 \times Tp$, where $N=4$; and $3 \times Tp \unlhd Rs \cdot Cs \unlhd 10 \times Tp$, where $N \wedge 5$, where Cs is a capacitive component of the first energy accumulating element, Tp is the cycle of the drive pulse applied to the capacitive load, Rs is a resistance value of an energy supplying path from the DC power source to the first energy accumulating element, and N is the number of repeating the charging step during the cycle of the drive pulse.

45. The capacitive load drive circuit as set forth in claim 40, wherein:
- each of the energy accumulating elements has an initial potential whose polarity is positive.

46. The capacitive load drive circuit as set forth in claim 40, wherein:
- the plurality of energy accumulating elements respectively have terminal voltages which are different from one another; and
- (A) when charging the capacitive load, the switching means sequentially connects the capacitive load with the energy accumulating elements in an ascending order of absolute values of the terminal voltages and (B) when discharging the capacitive load, the switching means sequentially connects the capacitive load with the energy accumulating elements in a descending order of the absolute values of the terminal voltages.

47. The capacitive load drive circuit as set forth in claim 40, wherein:
- each of the energy accumulating elements is a condenser.

48. The capacitive load drive circuit as set forth in claim 40, further comprising:
- an energy output path which is connected to a part of the energy accumulating elements, the energy output path supplying to an external element other than the capacitive load the electrostatic energy that the energy accumulating element collects from the capacitive load.

49. The capacitive load drive circuit as set forth in claim 40, further comprising:
- voltage dividing means for dividing into a plurality of different voltages, the voltage supplied from the power source and for supplying the divided voltages respectively to the energy accumulating elements.

50. The capacitive load drive circuit as set forth in claim 40, wherein:
all of the energy accumulating elements respectively have one ends connected to the power source or the ground line.

51. The capacitive load drive circuit as set forth in claim 40, further comprising:
a switching section for controlling the supply of electrostatic energy from the power source to the energy accumulating elements,
the switching section supplying electrostatic energy from the power source to the energy accumulating elements only during a predetermined period before the capacitive load is charged.

52. The capacitive load drive circuit as set forth in claim 40, further comprising:
selecting means which switches over internal connecting states so as to selectively charge or discharge one or some of capacitive loads.

53. The capacitive load drive circuit as set forth in claim 40, wherein:
the capacitive load is a piezoid for pressuring ink, the piezoid being provided in an ink-jet head that jets out ink in droplets.

54. The capacitive load drive circuit as set forth in claim 40, wherein:
the capacitive load is an electrostatic drive electrode, which is provided in an ink-jet head of an electrostatic method that uses electrostatic attraction force to jet out ink in droplets.

55. An apparatus which includes the capacitive load drive circuit as set forth in claim 40, and the capacitive load that is charged and discharged by the capacitive load drive circuit, wherein:
the following relationship is satisfied:

$$Cd/Cs \gtrless 0.164\{Ts/(R \cdot Cd)\}^{0.2198}, \text{ if } Ts/(R \cdot Cd) < 2.5; \text{ and}$$

$$Cd/Cs \gtrless 0.2, \text{ if } Ts/(R \cdot Cd) \hat{} 2.5,$$

where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including the switching means.

56. An apparatus which includes the capacitive load drive circuit as set forth in claim 40, and the capacitive load that is charged and discharged by the capacitive load drive circuit, wherein:
the capacitive component of the energy accumulating elements is larger than the capacitance of the capacitive load, by 100 times or more.

57. An image forming apparatus which includes an ink-jet head that uses an electrostatic drive electrode or a piezoid as a capacitive load to pressurize ink so as to jet out the ink in droplets, and a drive circuit for driving the electrostatic drive electrode or the piezoid of the ink-jet head, wherein:
the drive circuit is the capacitive load drive circuit as set forth in claim 40.

58. A display apparatus which includes a display element, and a drive circuit for driving the display element, wherein:
the drive circuit generates a pulse to be applied to the display element and collects electrical power from the display element, by using the capacitive load drive circuit as set forth in claim 40.

59. A DC-AC converter for generating an AC voltage from a single DC voltage, wherein:
the drive circuit generates the AC voltage while collecting electrical power, by using the capacitive load drive circuit as set forth in claim 40.

60. A capacitive load drive circuit for charging and discharging a capacitive load, comprising:
a power supply terminal to which a power supply potential from a power source is applied;
a plurality of energy accumulating elements to which a plurality of different initial potentials are respectively applied; and
switching means for selectively connecting (A) the energy accumulating elements and the power supply terminal with (B) the capacitive load,
one of the plurality of energy accumulating elements being a first energy accumulating element having a first initial potential whose polarity is the same as a polarity of the power supply potential and whose absolute value is smaller than an absolute value of the power supply potential, one of the plurality of energy accumulating elements being a third energy accumulating element having either (a) a potential whose polarity is the same as the polarity of the first initial potential and whose absolute value is smaller than the absolute value of the first initial potential, (b) a ground potential, or (c) a third initial potential whose polarity is reverse to the polarity of the first initial potential,
the switching means carrying out (i) a first charging step of selectively connecting the capacitive load with the third energy accumulating element and then selectively connecting the capacitive load with the first energy accumulating element so as to change, toward the first initial potential, a terminal voltage of the capacitive load, (ii) a second charging step of selectively connecting the capacitive load with the power supply terminal so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

61. The capacitive load drive circuit as set forth in claim 60, further comprising:
a DC power source which is connected to the first energy accumulating element via a resistance circuit, the DC power source supplying energy into the first energy accumulating element so as to prevent a voltage drift of the first energy accumulating element caused by the charging and discharging of the capacitive load.

62. The capacitive load drive circuit as set forth in claim 60, wherein:
each of the energy accumulating elements has an initial potential whose polarity is positive.

63. The capacitive load drive circuit as set forth in claim 60, wherein:
the plurality of energy accumulating elements respectively have terminal voltages which are different from one another; and (A) when charging the capacitive load, the switching means sequentially connects the capacitive load with the energy accumulating elements in an ascending order of absolute values of the terminal voltages and (B) when discharging the capacitive load, the switching means sequentially connects the capacitive load with the energy accumulating elements in a descending order of the absolute values of the terminal voltages.

64. The capacitive load drive circuit as set forth in claim 60, wherein:

each of the energy accumulating elements is a condenser.

65. The capacitive load drive circuit as set forth in claim 60, further comprising:

an energy output path which is connected to a part of the energy accumulating elements, the energy output path supplying to an external element other than the capacitive load the electrostatic energy that the energy accumulating element collects from the capacitive load.

66. The capacitive load drive circuit as set forth in claim 60, further comprising:

voltage dividing means for dividing into a plurality of different voltages, the voltage supplied from the power source and for supplying the divided voltages respectively to the energy accumulating elements.

67. The capacitive load drive circuit as set forth in claim 60, wherein:

all of the energy accumulating elements respectively have one ends connected to the power source or the ground line.

68. The capacitive load drive circuit as set forth in claim 60, further comprising:

a switching section for controlling the supply of electrostatic energy from the power source to the energy accumulating elements, the switching section supplying electrostatic energy from the power source to the energy accumulating elements only during a predetermined period before the capacitive load is charged.

69. The capacitive load drive circuit as set forth in claim 60, further comprising:

selecting means which switches over internal connecting states so as to selectively charge or discharge one or some of capacitive loads.

70. The capacitive load drive circuit as set forth in claim 60, wherein:

the capacitive load is a piezoid for pressuring ink, the piezoid being provided in an ink-jet head that jets out ink in droplets.

71. The capacitive load drive circuit as set forth in claim 60, wherein:

the capacitive load is an electrostatic drive electrode, which is provided in an ink-jet head of an electrostatic method that uses electrostatic attraction force to jet out ink in droplets.

72. An apparatus which includes the capacitive load drive circuit as set forth in claim 60, and the capacitive load that is charged and discharged by the capacitive load drive circuit, wherein:

the following relationship is satisfied:

$Cd/Cs \ge 0.164\{Ts/(R \cdot Cd)\}^{0.2198}$, if $Ts/(R \cdot Cd) < 2.5$; and $Cd/Cs \ge 0.2$, if $Ts/(R \cdot Cd)^{\wedge} 2.5$, where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including the switching means.

73. An apparatus which includes the capacitive load drive circuit as set forth in claim 60, and the capacitive load that is charged and discharged by the capacitive load drive circuit, wherein:

the capacitive component of the energy accumulating elements is larger than the capacitance of the capacitive load, by 100 times or more.

74. An image forming apparatus which includes an ink-jet head that uses an electrostatic drive electrode or a piezoid as a capacitive load to pressurize ink so as to jet out the ink in droplets, and a drive circuit for driving the electrostatic drive electrode or the piezoid of the ink-jet head, wherein:

the drive circuit is the capacitive load drive circuit as set forth in claim 60.

75. A display apparatus which includes a display element, and a drive circuit for driving the display element, wherein:

the drive circuit generates a pulse to be applied to the display element and collects electrical power from the display element, by using the capacitive load drive circuit as set forth in claim 60.

76. A DC-AC converter for generating an AC voltage from a single DC voltage, wherein:

the drive circuit generates the AC voltage while collecting electrical power, by using the capacitive load drive circuit as set forth in claim 60.

77. A capacitive load drive circuit for charging and discharging a capacitive load, comprising:

a plurality of energy accumulating elements to which a plurality of different initial potentials are respectively applied; and switching means for selectively connecting the plurality of energy accumulating elements with the capacitive load, one of the plurality of energy accumulating elements being a first energy accumulating element having a first initial potential which is not 0, one of the plurality of energy accumulating elements being a second energy accumulating element whose absolute value is larger than an absolute value of the first initial potential, one of the plurality of energy accumulating elements being a third energy accumulating element having either a potential whose polarity is the same as a polarity of the first initial potential and whose absolute value is smaller than the absolute value of the first initial potential, a ground potential, or a third initial potential whose polarity is reverse to the polarity of the first initial potential, the switching means carrying out (i) a first charging step of selectively connecting the capacitive load with the third energy accumulating element and then selectively connecting the capacitive load with the first energy accumulating element so as to change, toward the first initial potential, a terminal voltage of the capacitive load, (ii) a second charging step of selectively connecting the capacitive load with the second energy accumulating element so as to increase an absolute value of the terminal voltage of the capacitive load, and (iii) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the step (i), the steps (i) through (iii) being carried out in this order.

78. The capacitive load drive circuit as set forth in claim 77, further comprising:
   a ground terminal having the ground potential,
   the switching means being a plurality of switching elements, which are respectively provided between (A) the ground terminal and the plurality of energy accumulating elements and (B) the capacitive load, for selectively connecting (A) the ground terminal and the plurality of energy accumulating elements with (B) the capacitive load,
   at least the accumulating element that has an initial potential whose absolute value is largest among the plurality of accumulating elements being directly or indirectly connected with the power source.

79. The capacitive load drive circuit as set forth in claim 77, wherein:
   the switching means is a plurality of switching elements, which are respectively provided between the plurality of energy accumulating elements and the capacitive load, for selectively connecting the plurality of energy accumulating elements with the capacitive load,
   at least the accumulating element that has an initial potential whose absolute value is largest among the plurality of accumulating elements is directly or indirectly connected with the power source.

80. The capacitive load drive circuit as set forth in claim 77, further comprising:
   a DC power source which is connected to the first energy accumulating element via a resistance circuit, the DC power source supplying energy into the first energy accumulating element so as to prevent a voltage drift of the first energy accumulating element caused by the charging and discharging of the capacitive load.

81. The capacitive load drive circuit as set forth in claim 77, wherein:
   each of the energy accumulating elements has an initial potential whose polarity is positive.

82. The capacitive load drive circuit as set forth in claim 77, wherein:
   the plurality of energy accumulating elements respectively have terminal voltages which are different from one another; and
   (A) when charging the capacitive load, the switching means sequentially connects the capacitive load with the energy accumulating elements in an ascending order of absolute values of the terminal voltages and
   (B) when discharging the capacitive load, the switching means sequentially connects the capacitive load with the energy accumulating elements in a descending order of the absolute values of the terminal voltages.

83. The capacitive load drive circuit as set forth in claim 77, wherein:
   each of the energy accumulating elements is a condenser.

84. The capacitive load drive circuit as set forth in claim 77, further comprising:
   an energy output path which is connected to a part of the energy accumulating elements, the energy output path supplying to an external element other than the capacitive load the electrostatic energy that the energy accumulating element collects from the capacitive load.

85. The capacitive load drive circuit as set forth in claim 77, further comprising:
   voltage dividing means for dividing into a plurality of different voltages, the voltage supplied from the power source and for supplying the divided voltages respectively to the energy accumulating elements.

86. The capacitive load drive circuit as set forth in claim 77, wherein:
   all of the energy accumulating elements respectively have one ends connected to the power source or the ground line.

87. The capacitive load drive circuit as set forth in claim 77, further comprising:
   a switching section for controlling the supply of electrostatic energy from the power source to the energy accumulating elements,
   the switching section supplying electrostatic energy from the power source to the energy accumulating elements only during a predetermined period before the capacitive load is charged.

88. The capacitive load drive circuit as set forth in claim 77, further comprising:
   selecting means which switches over internal connecting states so as to selectively charge or discharge one or some of capacitive loads.

89. The capacitive load drive circuit as set forth in claim 77, wherein:
   the capacitive load is a piezoid for pressuring ink, the piezoid being provided in an ink-jet head that jets out ink in droplets.

90. The capacitive load drive circuit as set forth in claim 77, wherein:
   the capacitive load is an electrostatic drive electrode, which is provided in an ink-jet head of an electrostatic method that uses electrostatic attraction force to jet out ink in droplets.

91. An apparatus which includes the capacitive load drive circuit as set forth in claim 77, and the capacitive load that is charged and discharged by the capacitive load drive circuit, wherein:
   the following relationship is satisfied:

$Cd/Cs \% 0.164\{Ts/(R \cdot Cd)\}^{0.2198}$, if $Ts/(R \cdot Cd) < 2.5$; and $Cd/Cs \% 0.2$, if $Ts/(R \cdot Cd) \wedge 2.5$, where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including the switching means.

92. An apparatus which includes the capacitive load drive circuit as set forth in claim 77, and the capacitive load that is charged and discharged by the capacitive load drive circuit, wherein:
   the capacitive component of the energy accumulating elements is larger than the capacitance of the capacitive load, by 100 times or more.

93. An image forming apparatus which includes an ink-jet head that uses an electrostatic drive electrode or a piezoid as a capacitive load to pressurize ink so as to jet out the ink in droplets, and a drive circuit for driving the electrostatic drive electrode or the piezoid of the ink-jet head, wherein:
   the drive circuit is the capacitive load drive circuit as set forth in claim 77.

94. A display apparatus which includes a display element, and a drive circuit for driving the display element, wherein:

the drive circuit generates a pulse to be applied to the display element and collects electrical power from the display element, by using the capacitive load drive circuit as set forth in claim 77.

95. A DC-AC converter for generating an AC voltage from a single DC voltage, wherein:
the drive circuit generates the AC voltage while collecting electrical power, by using the capacitive load drive circuit as set forth in claim 77.

96. A capacitive load drive circuit for charging and discharging a capacitive load, comprising:
a power supply terminal to which a power supply potential from a power source is applied;
a reference potential terminal to which either a reference power supply potential that is different from the power supply potential or a ground potential is applied as a reference potential;
a plurality of first energy accumulating elements to which initial potentials are respectively applied, the initial potentials being different from one another and being between the reference potential and the power supply potential; and
switching means for selectively connecting (A) the reference potential terminal, the plurality of energy accumulating elements, and the power supply terminal with (B) the capacitive load,
the switching means carrying out the steps of (1) connecting the capacitive load with the reference potential terminal and then sequentially connecting the capacitive load with the first energy accumulating elements in an order of the initial potentials from the initial potential closest to the reference potential, so as to change, toward the power supply potential, a terminal voltage of the capacitive load, (2) selectively connecting the capacitive load with the power supply terminal so as to increase an absolute value of the terminal voltage of the capacitive load, and (3) selectively connecting the capacitive load with the first energy accumulating elements in an order of the initial potentials from the initial potential closest to the power supply potential, so as to decrease the absolute value of the terminal voltage of the capacitive load and so as to so as to regenerate electrostatic energy to be accumulated in the first energy accumulating elements, the thus regenerated electrostatic energy being approximately equal to electrostatic energy as accumulated in the first energy accumulating elements before the step (1), the steps (1) through (3) being carried out in this order.

97. The capacitive load drive circuit as set Forth in claim 96, further comprising:
a DC power source which is connected to the first energy accumulating element via a resistance circuit, the DC power source supplying energy into the first energy accumulating element so as to prevent a voltage drift of the first energy accumulating element caused by the charging and discharging of the capacitive load.

98. The capacitive load drive circuit as set forth in claim 96, wherein:
each of the energy accumulating elements has an initial potential whose polarity is positive.

99. The capacitive load drive circuit as set forth in claim 96, wherein:
the plurality of energy accumulating elements respectively have terminal voltages which are different from one another; and
(A) when charging the capacitive load, the switching means sequentially connects the capacitive load with the energy accumulating elements in an ascending order of absolute values of the terminal voltages and (B) when discharging the capacitive load, the switching means sequentially connects the capacitive load with the energy accumulating elements in a descending order of the absolute values of the terminal voltages.

100. The capacitive load drive circuit as set forth in claim 96, wherein:
each of the energy accumulating elements is a condenser.

101. The capacitive load drive circuit as set forth in claim 96, further comprising:
an energy output path which is connected to a part of the energy accumulating elements, the energy output path supplying to an external element other than the capacitive load the electrostatic energy that the energy accumulating element collects from the capacitive load.

102. The capacitive load drive circuit as set Forth in claim 96, further comprising:
voltage dividing means for dividing into a plurality of different voltages, the voltage supplied from the power source and for supplying the divided voltages respectively to the energy accumulating elements.

103. The capacitive load drive circuit as set forth in claim 96, wherein:
all of the energy accumulating elements respectively have one ends connected to the power source or the ground line.

104. The capacitive load drive circuit as set forth in claim 96, further comprising:
a switching section for controlling the supply of electrostatic energy from the power source to the energy accumulating elements,
the switching section supplying electrostatic energy from the power source to the energy accumulating elements only during a predetermined period before the capacitive load is charged.

105. The capacitive load drive circuit as set forth in claim 96, further comprising:
selecting means which switches over internal connecting states so as to selectively charge or discharge one or some of capacitive loads.

106. The capacitive load drive circuit as set forth in claim 96, wherein:
the capacitive load is a piezoid for pressuring ink, the piezoid being provided in an ink-jet head that jets out ink in droplets.

107. The capacitive load drive circuit as set forth in claim 96, wherein:
the capacitive load is an electrostatic drive electrode, which is provided in an ink-jet head of an electrostatic method that uses electrostatic attraction force to jet out ink in droplets.

108. An apparatus which includes the capacitive load drive circuit as set forth in claim 96, and the capacitive load that is charged and discharged by the capacitive load drive circuit, wherein:
the following relationship is satisfied:

$$Cd/Cs \gtrless 0.164\{Ts/(R \cdot Cd)\}^{0.2198}, \text{ if } Ts/(R \cdot Cd) < 2.5; \text{ and}$$

$$Cd/Cs \gtrless 0.2, \text{ if } Ts/(R \cdot Cd) \wedge 2.5,$$

where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including the switching means.

109. An apparatus which includes the capacitive load drive circuit as set forth in claim 96, and the capacitive load that is charged and discharged by the capacitive load drive circuit, wherein:
the capacitive component of the energy accumulating elements is larger than the capacitance of the capacitive load, by 100 times or more.

110. An image forming apparatus which includes an ink-jet head that uses an electrostatic drive electrode or a piezoid as a capacitive load to pressurize ink so as to jet out the ink in droplets, and a drive circuit for driving the electrostatic drive electrode or the piezoid of the ink-jet head, wherein:
the drive circuit is the capacitive load drive circuit as set forth in claim 96.

111. A display apparatus which includes a display element, and a drive circuit for driving the display element, wherein:
the drive circuit generates a pulse to be applied to the display element and collects electrical power from the display element, by using the capacitive load drive circuit as set forth in claim 96.

112. A DC-AC converter for generating an AC voltage from a single DC voltage, wherein:
the drive circuit generates the AC voltage while collecting electrical power, by using the capacitive load drive circuit as set forth in claim 96.

113. A capacitive load drive circuit, wherein:
the capacitive load drive circuit for charging and discharging a capacitive load, comprises:
a plurality of energy accumulating elements for dividedly accumulating electrostatic energy supplied from a power source; and
switching means for selectively connecting the capacitive load and the plurality of energy accumulating elements,
(A) when charging the capacitive load, the switching means selectively connecting the capacitive load and the plurality of energy accumulating elements so that the plurality of energy accumulating elements sequentially supply electrostatic energy to the capacitive load, and (B) when discharging the capacitive load, the switching means selectively connecting the capacitive load and the plurality of energy accumulating elements so that the plurality of energy accumulating elements sequentially collect electrostatic energy from the capacitive load,
wherein each of the energy accumulating elements has an initial potential whose polarity is positive,
and the capacitive load drive circuit for charging and discharging a capacitive load, comprises:
a plurality of energy accumulating elements for dividedly accumulating electrostatic energy supplied from a power source; and
switching means for selectively connecting the capacitive load and the plurality of energy accumulating elements,
(A) when charging the capacitive load, the switching means selectively connecting the capacitive load and the plurality of energy accumulating elements so that the plurality of energy accumulating elements sequentially supply electrostatic energy to the capacitive load, and (B) when discharging the capacitive load, the switching means selectively connecting the capacitive load and the plurality of energy accumulating elements so that the plurality of energy accumulating elements sequentially collect electrostatic energy from the capacitive load,
wherein each of the energy accumulating elements has an initial potential whose polarity is negative,
are connected in parallel.

114. An apparatus which includes a capacitive load, and a capacitive load drive circuit for charging and discharging the capacitive load, wherein:
the capacitive load drive circuit includes:
a power supply terminal to which a power supply potential is applied from a power source;
a reference potential terminal to which either a reference power supply potential supplied from the power source which is different from the power supply potential, or a ground potential is applied as a reference potential;
an energy accumulating element to which an initial potential between the reference potential and the power supply potential is applied; and
switching means for selectively connecting (A) the reference potential terminal, the energy accumulating element, and the power supply terminal with (B) the capacitive load,
the switching means carrying out (i) a first charging step of connecting the capacitive load with the reference potential terminal and then connecting the capacitive load with the energy accumulating element, (ii) a second charging step of selectively connecting the capacitive load with the power supply terminal, and (iii) a discharging step of connecting the capacitive load with the energy accumulating element, the steps (i) through (iii) being carried out in this order,
the following relationship being satisfied:

$$Cd/Cs \% 0.164\{Ts/(R \cdot Cd)\}^{0.2198}, \text{ if } Ts/(R \cdot Cd) < 2.5; \text{ and}$$

$$Cd/Cs \% 0.2, \text{ if } Ts/(R \cdot Cd) \wedge 2.5,$$

where Cs is a capacitive component of the energy accumulating element, Cd is a capacitance of the capacitive load, Ts is a time during which the energy accumulating element is kept connected to the capacitive load, and R is a resistance value of charge and discharge paths of the energy accumulating element with respect to the capacitive load, the charge and discharge paths including switching means.

115. The apparatus as set forth in claim 114, wherein the following relationship is satisfied:

$$SR \% V/(R \cdot Cd) * (-0.0002y^4 + 0.001y^3 + 0.009y^2 - 0.100y + 0.386),$$

where Cd is the capacitance of the capacitive load, R is the resistance value of the charge and discharge paths of the energy accumulating element with respect to the capacitive load, the charge and discharge paths including the switching means, Ts is the time during which the energy accumulating element is kept connected to the capacitive load, V is a final attainment voltage, SR is a slew rate (rate of rise from 10% to 90%) of a waveform of a generated voltage, and $y = Ts/(R \cdot Cd)$.

116. The apparatus as set forth in claim 115, wherein the following relationship is satisfied:

$$50(V/\mu sec) \% V/(R \cdot Cd) * (-0.0002y^4 + 0.001y^3 + 0.009y^2 - 0.100y + 0.386),$$

where Cd is the capacitance of the capacitive load, R is the resistance value of the charge and discharge paths of the energy accumulating element with respect to the capacitive load, the charge and discharge paths including the switching means, Ts is the time during which the energy accumulating element is kept connected to the capacitive load, V is the final attainment voltage, and y=Ts/(R·Cd).

117. The apparatus as set forth in claim 114, wherein the following relationship is satisfied:

$$Cd/Cs \leq 0.01,$$

where Cs is the capacitive component of the energy accumulating element, and Cd is the capacitance of the capacitive load.

118. The apparatus as set forth in claim 114, wherein:
the capacitive load is an electrostatic drive electrode or a piezoid which is provided in an ink-jet head that pressurizes ink so as to jet out the ink in droplets; and
the capacitive load driving the electrostatic drive electrode or the piezoid of the ink-jet head.

119. An image forming apparatus which includes an ink-jet head that uses an electrostatic drive electrode or a piezoid as a capacitive load to pressurize ink so as to jet out the ink in droplets, and a drive circuit for driving the electrostatic drive electrode or the piezoid of the ink-jet head, wherein:
the drive circuit is the capacitive load drive circuit as set forth in claim 114.

120. An apparatus which includes a capacitive load, and a capacitive load drive circuit for charging and discharging the capacitive load, wherein:
the capacitive load drive circuit includes:
a power supply terminal to which a power supply potential is applied from a power source;
a reference potential terminal to which either a reference power supply potential supplied from the power source which is different from the power supply potential, or a ground potential is applied as a reference potential;
a plurality of energy accumulating elements to which initial potentials are respectively applied, the initial potentials being different from one another and being between the reference potential and the power supply potential; and
switching means for selectively connecting (A) the reference potential terminal, the plurality of energy accumulating elements, and the power supply terminal with (B) the capacitive load,
the switching means carrying out (i) a first charging step of connecting the capacitive load with the reference potential terminal and then sequentially connecting the capacitive load with the energy accumulating elements in an order of the initial potentials from the initial potential closest to the reference potential, (ii) a second charging step of selectively connecting the capacitive load with the power supply terminal, and (iii) a discharging step of sequentially connecting the capacitive load with the energy accumulating elements in an order of the initial potentials from the initial potential closest to the power supply potential, the steps (i) through (iii) being carried out in this order,
the following relationship being satisfied:

$$Cd/Cs \leq 0.164\{Ts/(R \cdot Cd)\}^{0.2198}, \text{ if } Ts/(R \cdot Cd) < 2.5; \text{ and}$$

$$Cd/Cs \leq 0.2, \text{ if } Ts/(R \cdot Cd) \geq 2.5,$$

where Cs is a capacitive component of the energy accumulating elements, Cd is a capacitance of the capacitive load, Ts is a time during which the energy accumulating elements are kept connected to the capacitive load, and R is a resistance value of charge and discharge paths of the energy accumulating elements with respect to the capacitive load, the charge and discharge paths including switching means.

121. The apparatus as set forth in claim 120, wherein the following relationship is satisfied:

$$SR \geq V/(R \cdot Cd)*(0.0008y^4-0.012y^3+0.071y^2-0.229y+0.414), \text{ when } N=3;$$

$$SR \geq V/(R \cdot Cd)*(0.0023y^4-0.028y^3+0.138y^2-0.336y+0.434), \text{ where } N=4; \text{ and}$$

$$SR \geq V/(R \cdot Cd)*(0.0026y^4-0.032y^3+0.153y^2-0.356y+0.413), \text{ where } N \geq 5,$$

where Cd is the capacitance of the capacitive load, R is the resistance value of the charge and discharge paths of the energy accumulating elements with respect to the capacitive load, the charge and discharge paths including the switching means, Ts is the time during which the energy accumulating elements are kept connected to the capacitive load, V is a final attainment voltage, N is the number of times each of the energy accumulating elements repeats a charging step during a cycle of a drive pulse, the SR is a slew rate (rate of rise from 10% to 90%) of a waveform of a generated voltage, and y=Ts/(R·Cd).

122. The apparatus as set forth in claim 121, wherein the following relationship is satisfied:

$$50(V/\mu sec) \geq V/(R \cdot Cd)*(0.0008y^4-0.012y^3+0.071y^2-0.229y+0.414), \text{ where } N=3;$$

$$50(V/\mu sec) \geq V/(R \cdot Cd)*(0.0023y^4-0.028y^3+0.138y^2-0.336y+0.434), \text{ where } N=4; \text{ and}$$

$$50(V/\mu sec) \geq V/(R \cdot Cd)*(0.0026y^4-0.032y^3+0.153y^2-0.356y+0.413), \text{ when } N \geq 5,$$

where Cd is the capacitance of the capacitive load, R is the resistance value of the charge and discharge paths of the energy accumulating elements with respect to the capacitive load, the charge and discharge paths including the switching means, Ts is the time during which the energy accumulating elements are kept connected to the capacitive load, V is the final attainment voltage, N is the number of times each of the energy accumulating elements repeats the charging step during the cycle of the drive pulse, and y=Ts/(R·Cd).

123. The apparatus as set forth in claim 120, wherein the following relationship is satisfied:

$$Cd/Cs \leq 0.01,$$

where Cs is the capacitive component of the energy accumulating element, and Cd is the capacitance of the capacitive load.

124. The apparatus as set forth in claim 120, wherein:
the capacitive load is an electrostatic drive electrode or a piezoid which is provided in an ink-jet head that pressurizes ink so as to jet out the ink in droplets; and
the capacitive load driving the electrostatic drive electrode or the piezoid of the ink-jet head.

125. An image forming apparatus which includes an ink-jet head that uses an electrostatic drive electrode or a piezoid as a capacitive load to pressurize ink so as to jet out the ink in droplets, and a drive circuit for driving the electrostatic drive electrode or the piezoid of the ink-jet head, wherein:
the drive circuit is the capacitive load drive circuit as set forth in claim 120.

126. A method for driving a capacitive load by charging and discharging the capacitive load, comprising:
- an accumulating step of substantially dividing and accumulating electrostatic energy in a plurality of energy accumulating elements in accordance with a synchronization signal;
- a charging step of synchronously supplying the electrostatic energy from the plurality of energy accumulating elements to the capacitive load so as to charge the capacitive load; and
- a collecting step of discharging the capacitive load so that the plurality of energy accumulating elements synchronously collect the electrostatic energy from the capacitive load.

127. A method for driving a capacitive load by charging and discharging the capacitive load, comprising:
- (i) a step of preparing a first energy accumulating element having an first initial potential which is not 0, a second energy accumulating element, and a reference potential terminal to which either (a) a ground potential, (b) a potential which has the same polarity as the first initial potential supplied from a power source and which has a smaller absolute value than the first initial potential, or (c) a potential whose polarity is reverse to the polarity of the first initial potential supplied form the power source is applied as a reference potential;
- (ii) an initial potential applying step of applying the first initial potential to the first energy accumulating element, and applying to the second energy accumulating element a second initial potential which has the same polarity as the first initial potential and which has a larger absolute value than the first initial potential;
- (iii) a first charging step of selectively connecting the capacitive load with the reference potential terminal and then selectively connecting the capacitive load with the first energy accumulating element so as to change, toward the first initial potential, a terminal voltage of the capacitive load;
- (iv) a second charging step of selectively connecting the capacitive load with the second energy accumulating element so as to increase an absolute value of the terminal voltage of the capacitive load; and
- (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the First energy accumulating element before the first charging step, the steps (iii) through (v) being carried out in this order.

128. A method for driving a capacitive load by charging and discharging the capacitive load, comprising:
- (i) a step of preparing a power supply terminal to which a power supply potential is applied from a power source, a first energy accumulating element, and a third energy accumulating element;
- (ii) an initial potential applying step of applying to the first energy accumulating element a first initial potential which has the same polarity as the power supply potential and which has a smaller absolute value than the power supply potential, and applying to the third accumulating element either a potential which has the same polarity as the first initial potential and which has a smaller absolute value than the first initial potential, a ground potential, or a third initial potential whose potential is reverse to the polarity of the first initial potential;
- (iii) a first charging step of selectively connecting the capacitive load with the third energy accumulating element and then selectively connecting the capacitive load with the first energy accumulating element so as to change, toward the first initial potential, a terminal voltage of the capacitive load;
- (iv) a second charging step of selectively connecting the capacitive load with the power supply terminal so as to increase an absolute value of the terminal voltage of the capacitive load; and
- (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the first charging step, the steps (iii) through (v) being carried out in this order.

129. A method for driving a capacitive load by charging and discharging the capacitive load, comprising:
- (i) a step of preparing a first energy accumulating element, a second energy accumulating element, and a third energy accumulating element;
- (ii) an initial potential applying step of applying to the first energy accumulating element a first initial potential which is not 0, applying to the second energy accumulating element a second initial potential which has a larger absolute value than the initial potential of the first energy accumulating element, and applying to the third accumulating element either a potential which has the same polarity as the first initial potential and which has a smaller absolute value than the first initial potential, a ground potential, or a third initial potential whose potential is reverse to the polarity of the first initial potential;
- (iii) a first charging step of selectively connecting the capacitive load with the third energy accumulating element and then selectively connecting the capacitive load with the first energy accumulating element so as to change, toward the first initial potential, a terminal voltage of the capacitive load;
- (iv) a second charging step of selectively connecting the capacitive load with the second energy accumulating element so as to increase an absolute value of the terminal voltage of the capacitive load; and
- (v) a discharging step of selectively connecting the capacitive load with the first energy accumulating element so as to decrease the absolute value of the terminal voltage of the capacitive load and so as to regenerate electrostatic energy to be accumulated in the first energy accumulating element, the thus regenerated electrostatic energy being approximately equal to electrostatic energy as accumulated in the first energy accumulating element before the first charging step, the steps (iii) through (v) being carried out in this order.

130. A method for driving a capacitive load by charging and discharging the capacitive load, comprising:
- a providing step of preparing a power supply terminal to which a power supply potential is applied from a power source, a reference potential terminal to which either a reference power supply potential supplied from a reference power source which is different from the power supply potential or a ground potential is applied as a reference potential, and a plurality of first energy accumulating elements;

an initial potential applying step of respectively applying to the plurality of first energy accumulating elements initial potentials which are different from one another and which are between the reference potential and the power supply potential; and steps of (1) connecting the capacitive load with the reference potential terminal and then sequentially connecting the capacitive load with the first energy accumulating elements in an order of the initial potentials from the initial potential closest to the reference potential, so as to change, toward the power supply potential, a terminal voltage of the capacitive load, (2) selectively connecting the capacitive load with the power supply terminal so as to increase an absolute value of the terminal voltage of the capacitive load, and (3) selectively connecting the capacitive load with the first energy accumulating elements in an order of the initial potentials from the initial potential closest to the power supply potential, so as to decrease the absolute value of the terminal voltage of the capacitive load and so as to regenerate electrostatic energy to be accumulated in the first energy accumulating elements, the thus regenerated electrostatic energy being approximately equal to electrostatic energy as accumulated in the first energy accumulating elements before the step (1), the steps (1) through (3) being carried out in this order.

* * * * *